(12) United States Patent
Lin et al.

(10) Patent No.: US 6,846,735 B1
(45) Date of Patent: Jan. 25, 2005

(54) COMPLIANT TEST PROBE WITH JAGGED CONTACT SURFACE

(75) Inventors: Charles W. C. Lin, Singapore (SG); Cheng-Lien Chiang, Taipei (TW)

(73) Assignee: Bridge Semiconductor Corporation, Taipei (TW)

( * ) Notice: Subject to any disclaimer, the term of this patent is extended or adjusted under 35 U.S.C. 154(b) by 231 days.

(21) Appl. No.: 10/235,270

(22) Filed: Sep. 5, 2002

(51) Int. Cl.[7] .......................... H01L 21/44; H01L 23/48
(52) U.S. Cl. ...................... 438/613; 438/117; 438/614; 257/737; 257/780
(58) Field of Search .......................... 438/52, 117, 612, 438/613, 614; 257/737, 739, 738, 780, 781

(56) References Cited

U.S. PATENT DOCUMENTS

| | | | |
|---|---|---|---|
| 5,076,485 A | 12/1991 | MacKay | 228/177 |
| 5,083,697 A | 1/1992 | Defrancesco | 228/116 |
| 5,199,918 A | 4/1993 | Kumar | 445/50 |
| 5,625,298 A | 4/1997 | Hirano et al. | 324/754 |
| 5,635,846 A | 6/1997 | Beaman et al. | 324/754 |
| 5,785,538 A | 7/1998 | Beaman et al. | 439/91 |
| 5,838,160 A | 11/1998 | Beaman et al. | 324/754 |
| 5,931,685 A * | 8/1999 | Hembree et al. | 439/74 |
| 5,973,405 A * | 10/1999 | Keukelaar et al. | 257/780 |
| 6,159,770 A | 12/2000 | Tetaka et al. | 438/112 |
| 6,162,652 A * | 12/2000 | Dass et al. | 438/18 |
| 6,180,221 B1 * | 1/2001 | Crotzer et al. | 428/317.9 |
| 6,194,904 B1 | 2/2001 | Clayton et al. | 324/754 |
| D444,401 S | 7/2001 | Campbell | D10/80 |
| D444,720 S | 7/2001 | Campbell | D10/80 |
| 6,330,744 B1 | 12/2001 | Doherty et al. | 29/825 |
| 6,334,247 B1 | 1/2002 | Beaman et al. | 29/842 |
| 6,336,269 B1 | 1/2002 | Eldridge et al. | 29/885 |
| 6,518,781 B2 * | 2/2003 | Masuda | 324/757 |
| 6,653,742 B1 * | 11/2003 | Lin | 257/783 |
| 6,713,374 B2 * | 3/2004 | Eldridge et al. | 438/611 |

OTHER PUBLICATIONS

U.S. Appl. No. 09/878,626 filed Jun. 11, 2001 entitled "Method of Connecting a Conductive Trace to a Semiconductor Chip".
U.S. Appl. No. 09/997,973 filed Nov. 29, 2001, entitled "Method of Connecting a Bumped Conductive Trace to a Semiconductor Chip".
Crowley, "Socket Developments for CSP and FBGA Packages," Chip Scale Review, May 1998, pp. 37–40.
Forster, "Socket Challenges for Chip–Scale Packages," Chip Scale Review, May 1998, pp. 43–47.
Zou et al., "A New Electrical Surface Joining Technology For Flip Chip Application," 2001 International Symposium on Microelectronics, pp. 565–570.

* cited by examiner

Primary Examiner—Matthew Smith
Assistant Examiner—Lex H. Malsawma
(74) Attorney, Agent, or Firm—David M. Sigmond

(57) ABSTRACT

A test probe includes a conductive trace with a bumped terminal, the bumped terminal includes a jagged contact surface and a cavity that face in opposite directions, and the contact surface includes a plated metal. The contact surface is jagged due to particles which may protrude, be covered or dislodged. Preferably, the test probe includes an elastomer that fills the cavity so that the bumped terminal is compliant. The test probe is well-suited for pressure contact with semiconductor chips, BGA packages and other electronic devices.

155 Claims, 75 Drawing Sheets

COMPLIANT TEST PROBE WITH JAGGED CONTACT SURFACE

BACKGROUND OF THE INVENTION

1. Field of the Invention

The present invention relates to a test probe, and more particularly to a test probe for contacting an electronic device and its method of manufacture.

2. Description of the Related Art

In the field of electronic systems, there is a continuous need to increase performance and reduce size. This is largely achieved by improving semiconductor wafer manufacturing and semiconductor packaging technologies. Wafer manufacturing involves simultaneously fabricating numerous semiconductor chips as a batch on a silicon wafer using various etching, doping and depositing steps. After the wafer is complete, the chips are separated from one another and packaged.

Wafer manufacturing strives to reduce transistor or capacitor feature size in order to increase circuit density and enhance functionality. Device geometries with sub-micron line widths are so common that individual chips routinely contain millions of electronic devices. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for enhanced system performance.

Conventional single-chip packages typically have an area (or footprint) that is many times larger than the area of the chip, causing the printed circuit board to have excessively large area relative to the chips. However, as chip speeds increase, it becomes critical to position the chips close together since excessive signal transmission distance deteriorates signal integrity and propagation times. Other considerations such as manufacturing cost, reliability, heat transfer, moisture resistance, mounting and interconnect standardization, testability, and quality control have also become focal points of chip packaging.

Single-chip packages such as ball grid arrays (BGAs) have been developed to address these considerations. BGAs include a substrate with a top surface upon which the chip is mounted, an insulative housing that encapsulates the chip, and an array of solder balls that protrude from the bottom surface of the substrate. The solder balls are connected to the chip pads in one-to-one relation. Connection techniques widely used for connecting the chip pads to the BGA traces include wire bonding, tape automated bonding (TAB) and flip-chip bonding.

BGAs are tested before the next level assembly to assure a defect-free package.

Preferably, the chip has already been tested and is a known-good-die (KGD), and therefore the electrical test operation may contain fewer steps. However, electrical tests are performed to confirm proper electrical interconnection with the chip and the absence of opens, shorts, near-opens and near-shorts. Parametric testing using capacitance measurements can be used to supplement open/short testing to assure that the nets meet the required specifications for high-speed communication. Chip testing can also be used to supplement the open/short testing to assure that the chip has not been damaged during the package manufacturing. Burn-in testing is also common. The electrical testing provides important feedback to upstream processes and enhances the efficiency of downstream operations.

BGAs are tested using contact probes that contact the solder balls to provide temporary electrical signal paths between the BGA and an external tester. The solder balls are the most vulnerable elements of the package in terms of board-level reliability and place a premium on the contact test technology. The solder balls often are small and tightly spaced with a diameter of 0.5 mm or less and a pitch of 0.8 mm or less, are composed of 63Sn/37Pb eutectic that is susceptible to surface oxide, and have size variations that create coplanarity errors. Furthermore, the BGA substrate may exhibit warpage or thickness variations that compound the coplanarity errors.

Contact probes face significant challenges when used with BGAs. The contact probe should be small enough to fit within the geometric constraints yet have sufficient thickness and strength. The contact probe should also provide a contact force that is large enough to break through the surface oxide on the solder ball and provide a reliable connection, but not so great that it appreciably deforms or damages the solder ball. For instance, the contact probe might puncture the oxide and make a deep hole in a solder ball that leaves an air pocket in the solder joint after solder reflow during the next level assembly. The contact probe might also flatten the solder ball, and several semiconductor manufacturers require that no probe mark appear within a circular area 0.127 mm in diameter on the base of the solder ball. The contact probe should also deliver relatively uniform contact force over a wide range of solder ball displacements, thereby compensating for a reasonable amount of coplanarity error in the BGA.

Contact probes include the tweezer contact, side contact, Y contact, micro spring contact, spring and pin, probe and fuzzbutton, probe pin, conductive elastomer, metal contact in elastomer, etched pocket in silicon, conductive epoxy bump, plated metal bump on flex, metal-coated diamond/flex, and probe and conductive elastomer. The most common contact probes are spring-loaded pins and stamped metal contractors. Yet despite this extensive collection of contact probes, recent literature reports that at 0.5 mm pitch, many contact methods are being evaluated and the contacting problems are far from solved. See Crowley, "Socket Developments for CSP and FBGA Packages," *Chip Scale Review*, May 1998, pp. 37–40.

Test sockets contain contact probes. Test sockets are often used for high volume, low cost manufacturing. In high volume manufacturing, it is especially beneficial to design only a few universal test sockets with minimal variations so that the cost of customized test sockets for various packages can be minimized. However, as BGAs trend towards fine pitch, such as 0.5 mm, universal test sockets no longer provide the desired electrode configuration. Providing expensive, customized test sockets to accommodate evolving BGA designs is not an entirely satisfactory solution. Furthermore, test sockets with fine pitch are difficult to manufacture with adequate mechanical precision and are considered specialty items.

Test probes can be installed in a test socket to provide an interposer (or adapter) that includes contact probes that make pressure contact with the BGA and leads that are plugged into the test socket. Test probes are relatively inexpensive and can be economically customized for BGAs with varying format and pitch. Test probes can be manufactured with fine dimensions and high precision to accommodate BGAs with fine pitch. In addition, test probes can contain a flexible elastomer and provide relatively uniform contact force over a wide range of solder ball displacements to accommodate BGAs with coplanarity errors. Thus, test probes provide significant advantages for BGA testing.

In view of the various development stages and limitations in currently available test sockets and contact probes, there is a need for a test probe that is cost-effective, reliable, manufacturable, and provides excellent mechanical and electrical performance, particularly for BGAs with a solder ball pitch of 0.5 mm or less.

SUMMARY OF THE INVENTION

An object of the present invention is to provide a test probe for contacting semiconductor chips, chip scale packages, chip size packages, ball grid arrays, and other electronic devices.

Another object of the present invention is to provide a convenient, cost-effective method for manufacturing a test probe.

In accordance with one aspect of the invention, a test probe includes a conductive trace with a bumped terminal, the bumed terminal includes a jagged contact surface and a cavity that face in opposite directions, and the contact surface includes a plated metal. The contact surface is jagged due to particles which may protrude, be covered or dislodged. Preferably, the test probe includes an elastomer that fills the cavity so that the bumped terminal is compliant.

In accordance with another aspect of the invention, a method of making a test probe includes providing a conductive trace, particles and a base, wherein the conductive trace includes a bumped terminal, the bumped terminal includes an undercoat plated metal, the base includes a recess, the bumped terminal and the particles are disposed in the recess, the particles are embedded in the bumped terminal, and the base and the undercoat plated metal are different materials, then removing a portion of the base, thereby exposing the bumped terminal, and providing an exposed contact surface that is jagged due to the particles and proximate to the bumped terminal.

The method may include etching the base to form the recess, and then depositing the bumped terminal and the particles into the recess.

The method may include forming the conductive trace with the bumped terminal in the recess and a routing line outside the recess.

The method may include removing the portion of the base by applying a wet chemical etch that is selective of the base with respect to the particles and the undercoat plated metal. Alternatively, the method may include removing the portion of the base by applying a wet chemical etch that is selective of the base and the particles with respect to the undercoat plated metal.

The method may include forming the undercoat plated metal on the particles and then etching partially but not completely through the undercoat plated metal such that the particles protrude from the undercoat plated metal. Alternatively, the method may include forming a sacrificial plated metal on the particles, then forming the undercoat plated metal on the sacrificial plated metal, and then removing a portion of the sacrificial plated metal on the particles such that the particles are dislodged and the undercoat plated metal includes tips that were between the particles.

The method may include using the particles and the undercoat plated metal to provide the contact surface. Alternatively, the method may include removing the particles and using the undercoat plated metal as the contact surface. Alternatively, the method may include forming an overcoat plated metal over the particles and the undercoat plated metal such that the overcoat plated metal provides the contact surface.

The method may include forming an elastomer in a cavity of the bumped terminal before removing the portion of the base.

An advantage of the present invention is that the test probe can include a fine pitch contact surface that is sufficiently small to fit the geometric constraints of chips, chip scale packages, chip size packages, BGAs and other miniature electronic devices. Another advantage is that the jagged contact surface can puncture the oxide layer on a solder ball without appreciably deforming or damaging the solder ball. Another advantage is that the contact surface can overlay a bumped terminal with a cavity that is filled with an elastomer to provide vertical compliance and accommodate solder ball displacement variations. Another advantage is that the contact surface can be connected to a routing line that is adapted for connection to external test circuitry. Another advantage is that the test probe can be manufactured using low temperature processes which reduces stress and improves reliability. A further advantage is that the test probe can be manufactured using well-controlled wet chemical processes which can be easily implemented by circuit board, lead frame and tape manufacturers. Still another advantage is that the test probe is particularly well-suited for BGAs with a solder ball pitch of 0.5 mm or less.

These and other objects, features and advantages of the invention will be further described and more readily apparent from a review of the detailed description of the preferred embodiments which follows.

BRIEF DESCRIPTION OF THE DRAWINGS

The following detailed description of the preferred embodiments can best be understood when read in conjunction with the following drawings, in which.

DETAILED DESCRIPTION OF THE PREFERRED EMBODIMENTS

FIGS. 1A–1N, 2A–2N and 3A–3N are cross-sectional, top and bottom views, respectively, of a method of making a test probe in accordance with a first embodiment of the present invention.

Figure 1A:
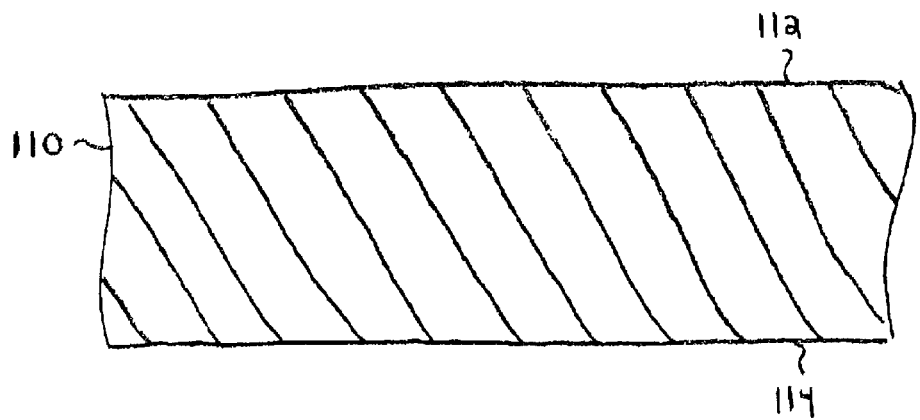
FIGS. 1A–1N are cross-sectional views showing a method of making a test probe in accordance with a first embodiment of the present invention.
Figure 2A:
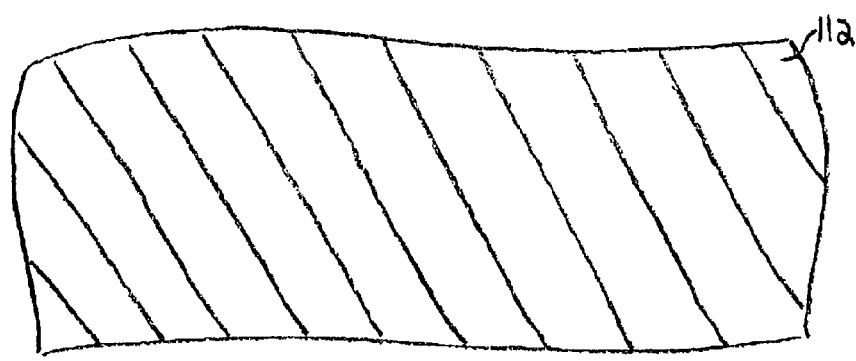
FIGS. 2A–2N are top plan views corresponding to FIGS. 1A–1N, respectively.
Figure 3A:
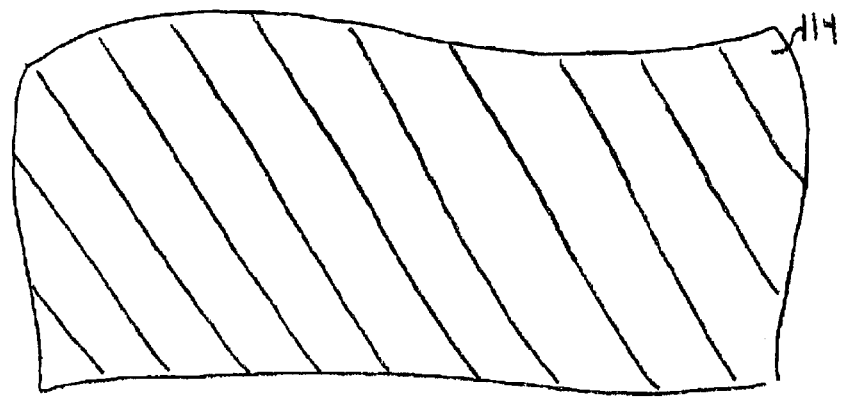
FIGS. 3A–3N are bottom plan views corresponding to FIGS. 1A–1N, respectively.

FIGS. 1A, 2A and 3A are cross-sectional, top and bottom views, respectively, of base 110 which includes opposing major surfaces 112 and 114. Base 110 is a copper foil with a thickness of 300 microns.

Figure 1B:
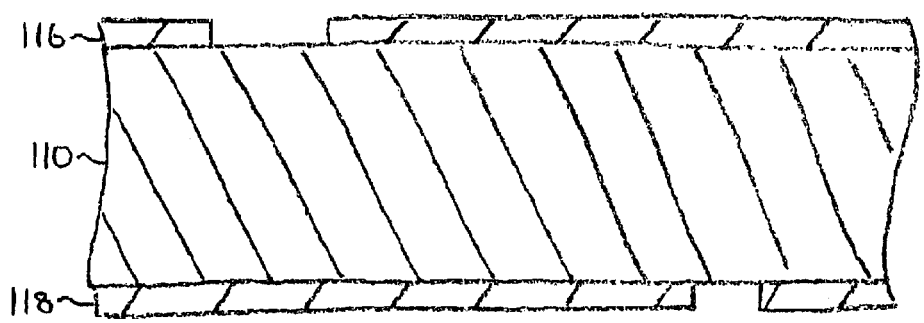
Figure 2B:
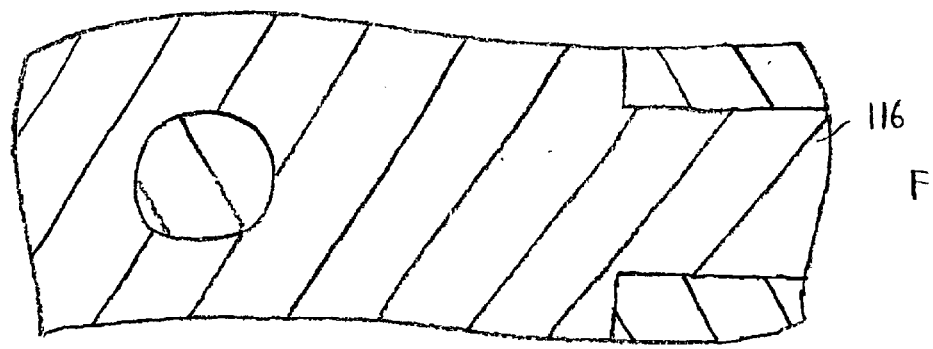
Figure 3B:
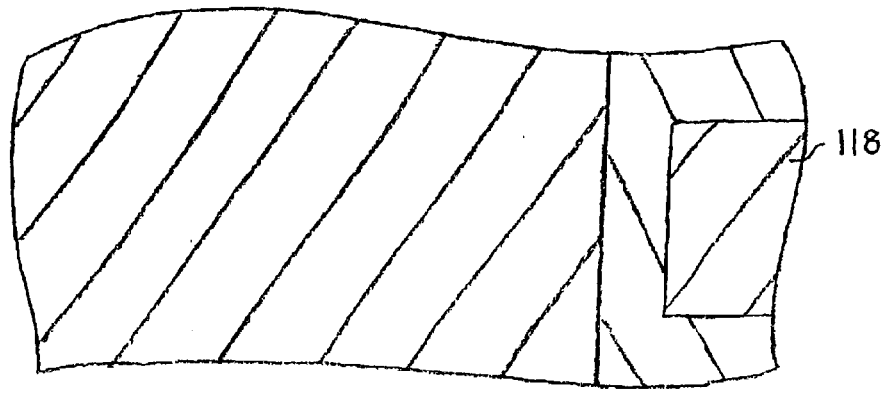

FIGS. 1B, 2B and 3B are cross-sectional, top and bottom views, respectively, of photoresist layers 116 and 118 formed on surfaces 112 and 114, respectively, of base 110. Photoresist layers 116 and 118 are simultaneously deposited as continuous dry films and then patterned by selectively applying light through respective reticles (not shown), applying a developer solution to remove the photoresist portions rendered soluble by the light, and then hard baking, as is conventional. As a result, photoresist layer 116 contains openings that selectively expose portions of surface 112, and photoresist layer 118 contains openings that selectively expose portions of surface 114. Photoresist layers 116 and 118 have a thickness of 50 microns.

Figure 1C:
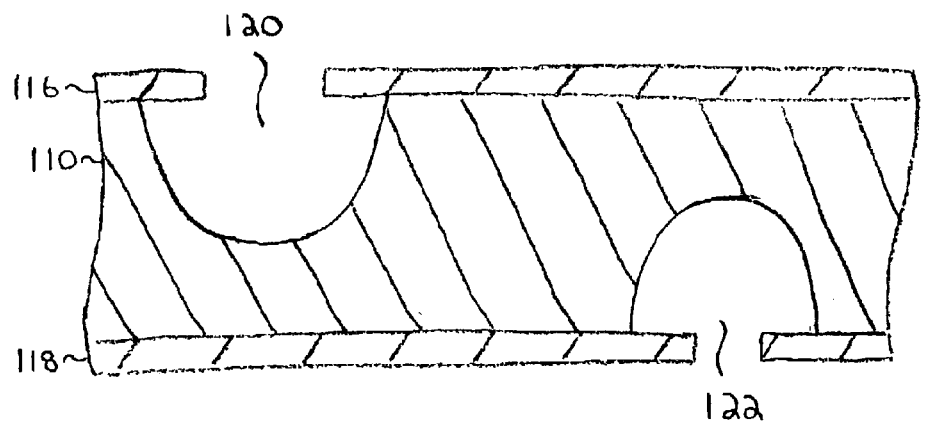
Figure 2C:
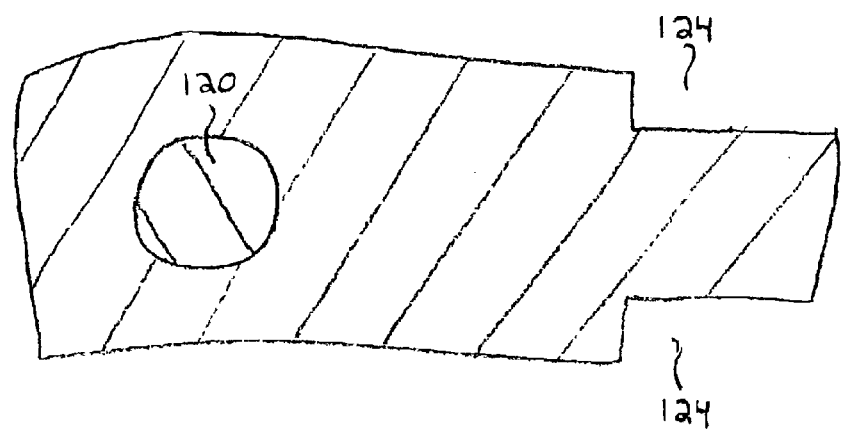
Figure 3C:
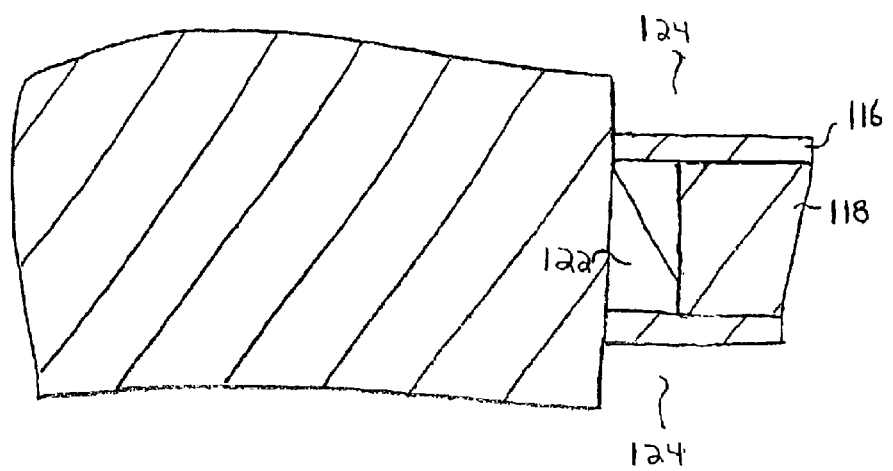

FIGS. 1C, 2C and 3C are cross-sectional, top and bottom views, respectively, of recesses 120 and 122 and slots 124 formed in base 110 using photoresist layers 116 and 118 as etch masks. In particular, the structure is dipped in a wet chemical etch that provides a front-side etch through the openings in photoresist layer 116 to the exposed portions of surface 112 and a back-side etch through the openings in photoresist layer 118 to the exposed portions of surface 114. The structure is submerged in the wet chemical etch long enough for the etchant to etch about 200 microns into base 110. That is, the wet chemical etch provides a "half-etch" that removes slightly over one-half (200/300) the thickness of base 110 at the exposed portions. Thus, the front-side etch completely forms recess 120 and partially forms slots 124, the back-side etch completely forms recess 122 and partially forms slots 124, and the combination of the front-side and back-side etches completely forms slots 124. Likewise, the front-side and back-side etches are applied simultaneously, and recesses 120 and 122 and slots 124 are formed simultaneously.

Recesses 120 and 122 are shaped as hemispheres with a diameter of 200 microns. Thus, recess 120 has a depth of 200 microns relative to surface 112 and is spaced 100 microns from surface 114, and recess 122 has a depth of 200 microns relative to surface 114 and is spaced 100 microns from surface 112. Recess 120 and slots 124 extend laterally under photoresist layer 116, and recess 122 and slots 124 extend laterally under photoresist layer 118 due to the isotropic nature of the wet chemical etch. In addition, recess 120 is spaced from slots 124, and recess 122 is between and adjacent to slots 124.

A suitable wet chemical etch can be provided by a solution containing alkaline ammonia, sulfuric acid with hydrogen peroxide, chromic-sulfuric acid, phosphoric acid with ammonium persulfate, copper sulfate, copper chloride or ferric chloride. The optimal etch time for exposing base 110 to the wet chemical etch in order to form recesses 120 and 122 and slots 124 with the desired dimensions can be established through trial and error.

Figure 1D:
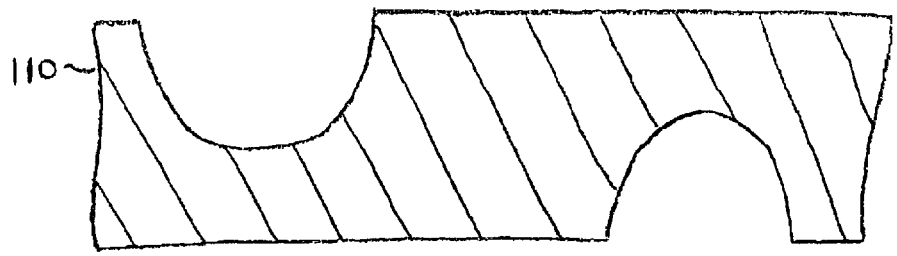
Figure 2D:
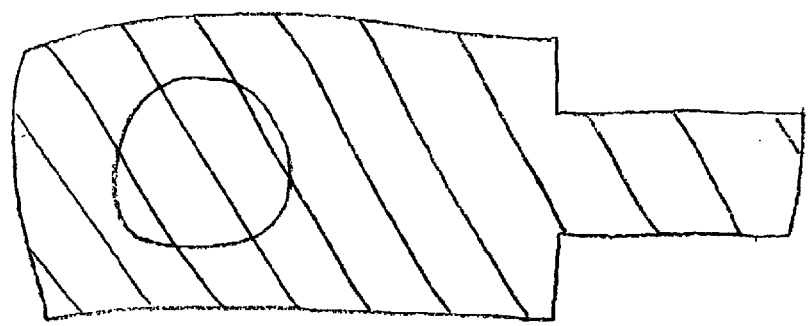
Figure 3D:
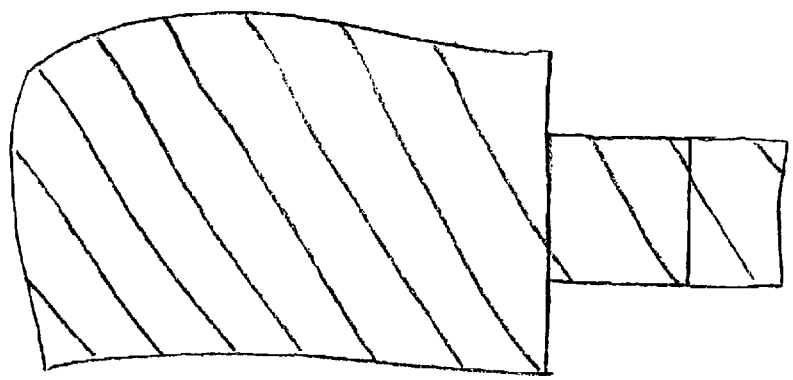

FIGS. 1D, 2D and 3D are cross-sectional, top and bottom views, respectively, of base 110 after photoresist layers 116 and 118 are stripped. Photoresist layers 116 and 118 are removed using a solvent, such as a mild alkaline solution with a pH of 9, that is highly selective of photoresist with respect to copper. Therefore, no appreciable amount of base 110 is removed.

Figure 1E:
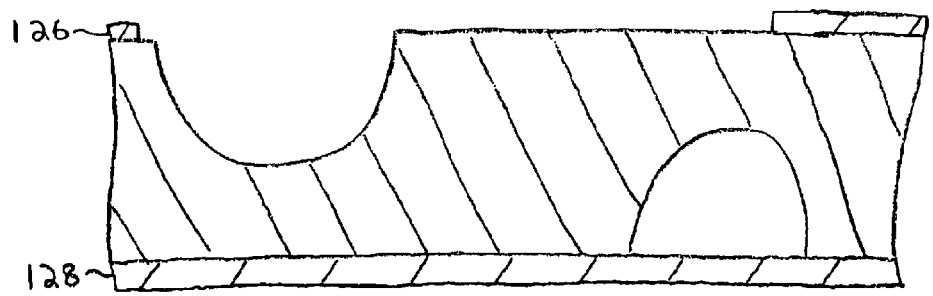
Figure 2E:
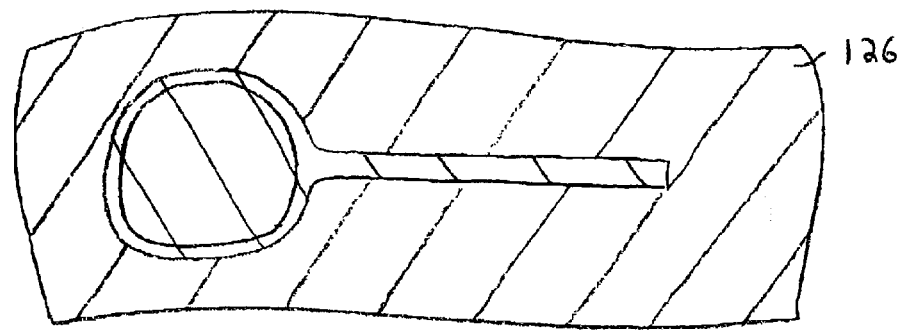
Figure 3E:
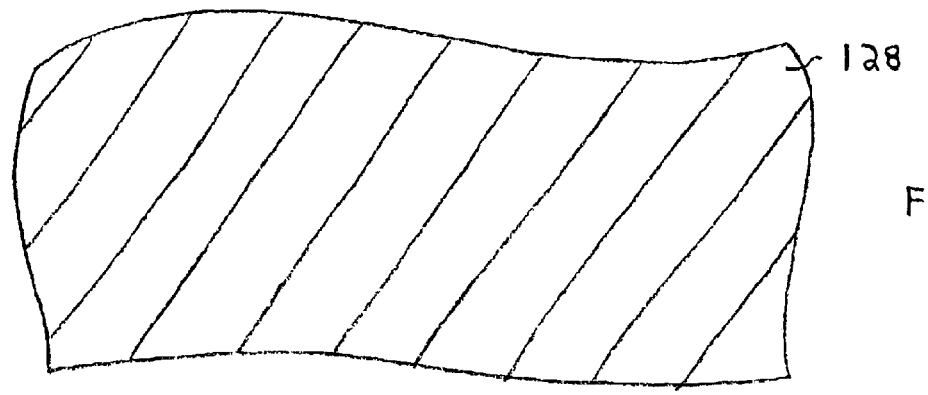

FIGS. 1E, 2E and 3E are cross-sectional, top and bottom views, respectively, of photoresist layers 126 and 128 formed on surfaces 112 and 114, respectively. Photoresist layers 126 and 128 are simultaneously is deposited as continuous dry films and then photoresist layer 126 is patterned by selectively applying light through a reticle (not shown), applying a developer solution to remove the photoresist portions rendered soluble by the light, and then hard baking, as is conventional. However, no reticle or selective light exposure is provided for photoresist layer 128. As a result, photoresist layer 126 contains an opening that selectively exposes portions of surface 112, photoresist layer 126 exposes recess 120 and covers slots 124, and photoresist layer 128 remains unpatterned and covers surface 114, recess 122 and slots 124. Photoresist layers 126 and 128 have a thickness of 50 microns.

Figure 1F:
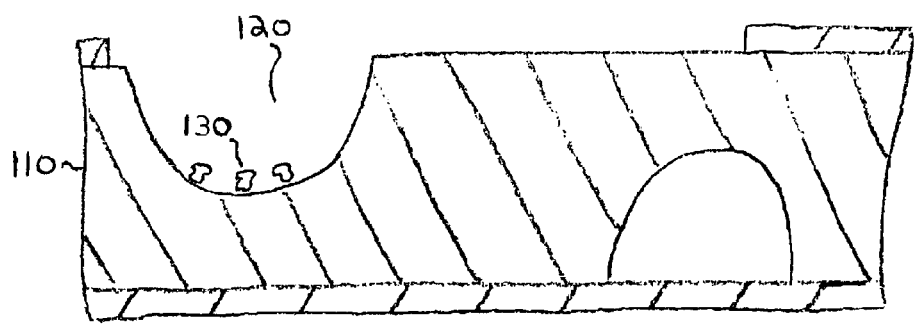
Figure 2F:
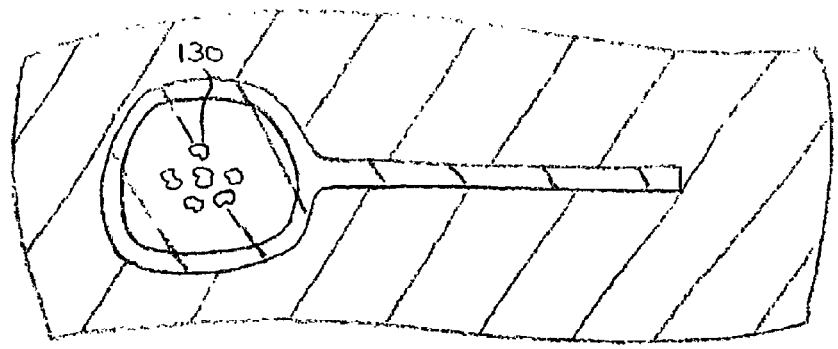
Figure 3F:
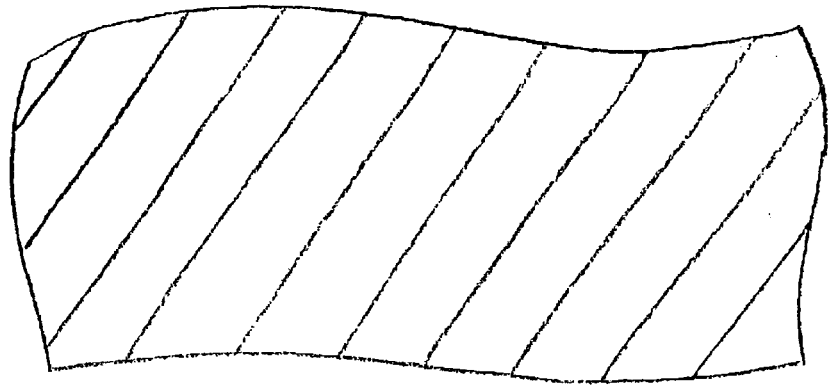

FIGS. 1F, 2F and 3F are cross-sectional, top and bottom views, respectively, of particles 130 deposited on base 110 in recess 120. Particles 130 are randomly dispersed as a single layer throughout the lower portion of recess 120. Particles 130 are composed of nickel, have random shapes and sizes, and have varying diameters in the range of 5 to 25 microns.

Figure 1G:
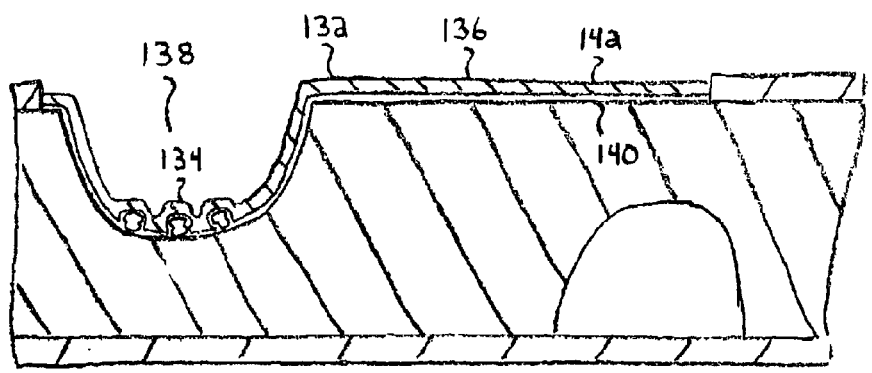
Figure 2G:
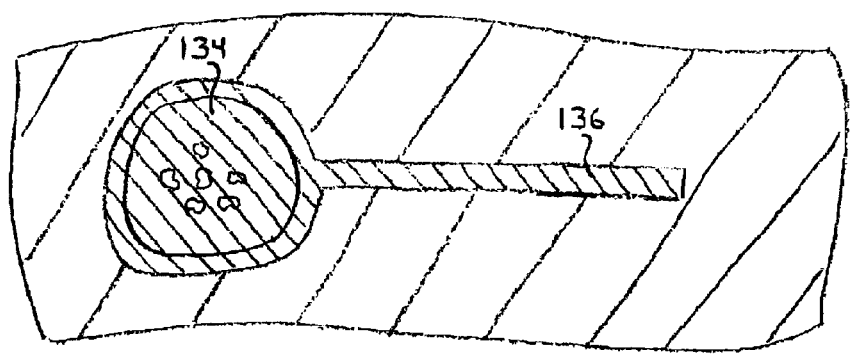
Figure 3G:
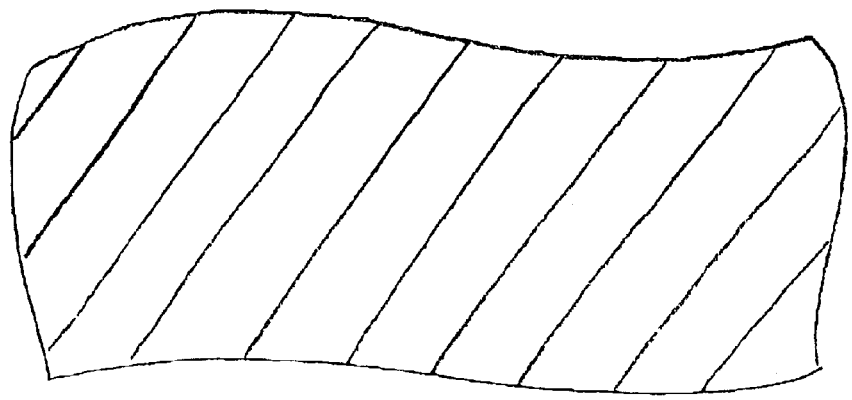

FIGS. 1G, 2G and 3G are cross-sectional, top and bottom views, respectively, of conductive trace 132 formed on base 110 and particles 130 using photoresist layers 126 and 128 as plating masks. Conductive trace 132 includes bumped terminal 134 and routing line 136. Bumped terminal 134 is formed in recess 120, and routing line 136 is formed outside recess 120. Bumped terminal 134 has a hemispherical shape that resembles recess 120, and routing line 136 is a flat planar lead. Bumped terminal 134 includes or defines cavity 138 that extends into recess 120 and faces away from base 110 and is exposed. Routing line 136 includes an enlarged annular portion that is contiguous with and surrounds bumped terminal 134 and an elongated portion that laterally extends from bumped terminal 134 and extends between slots 124.

Conductive trace 132 includes sacrificial plated metal 140 and undercoat plated metal 142. Sacrificial plated metal 140 is deposited on base 110 and particles 130, and undercoat plated metal 142 is deposited on sacrificial plated metal 140 and spaced from base 110 and particles 130. Sacrificial plated metal 140 is composed of copper and has a thickness of 3 microns, and undercoat plated metal 142 is composed of nickel and has a thickness of 15 microns.

Conductive trace 132 is formed by an electroplating operation. Thus, conductive is trace 132 is formed additively. Initially, a plating bus (not shown) is connected to base 110, current is applied to the plating bus from an external power source, and base 110 is submerged in an electrolytic copper plating solution such as Sel-Rex CUBATH M™ at room temperature. As a result, sacrificial plated metal 140 electroplates (or grows) on the exposed portions of base 110 and particles 130. Sacrificial plated metal 140 provides a conformal coating that locks particles 130 into recess 120, and particles 130 are embedded in sacrificial plated metal 140 and sealed by base 110 and sacrificial plated metal 140. The copper electroplating operation continues until sacrificial plated metal 140 has the desired thickness. Thereafter, the structure is removed from the electrolytic copper plating solution and submerged in an electrolytic nickel plating solution such as Technic Techni Nickel "S" at room temperature while current is applied to the plating bus to electroplate undercoat plated metal 142 on sacrificial plated metal 140. Undercoat plated metal 142 has an uneven topography in recess 120 due to particles 130 and includes tips or wedges that extend between and are spaced from particles 130. The nickel electroplating operation continues until undercoat plated metal 142 has the desired thickness. Thereafter, the structure is removed from the nickel electrolytic bath and rinsed in distilled water to remove contaminants.

Figure 1H:
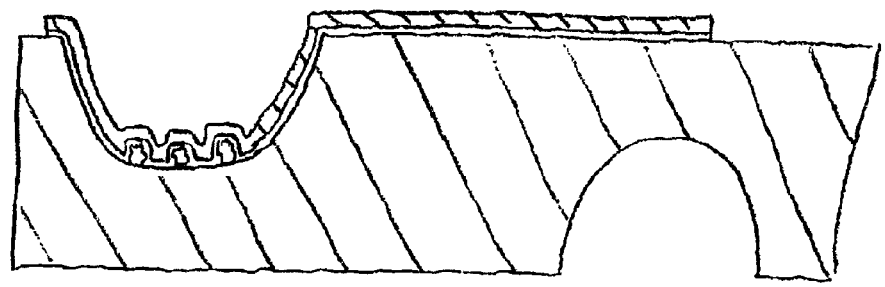
Figure 2H:
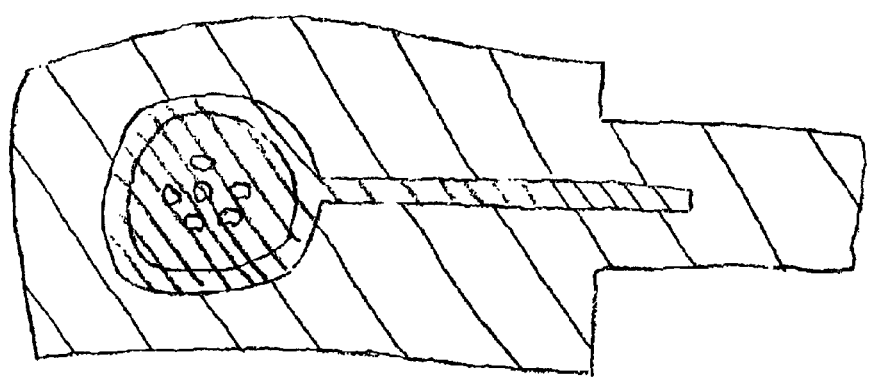
Figure 3H:
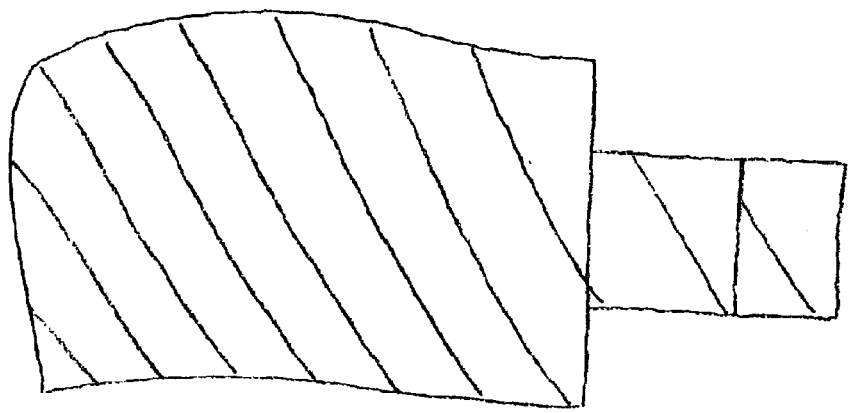

FIGS. 1H, 2H and 3H are cross-sectional, top and bottom views, respectively, of base 110, particles 130 and conductive trace 132 after photoresist layers 126 and 128 are stripped. Photoresist layers 126 and 128 are removed using a solvent, such as a mild alkaline solution with a pH of 9, that is highly selective of photoresist with respect to copper and nickel. Therefore, no appreciable amount of base 110 or conductive trace 132 is removed.

Figure 1I:
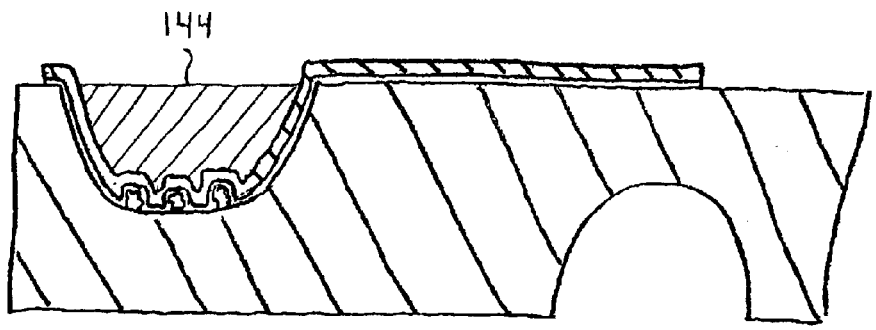
Figure 2I:
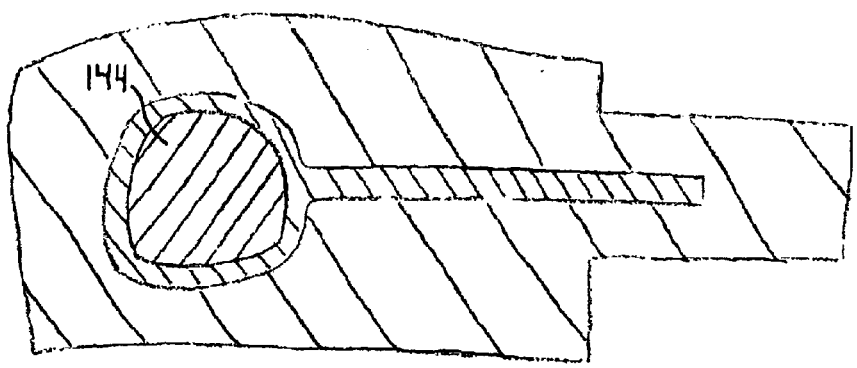
Figure 3I:
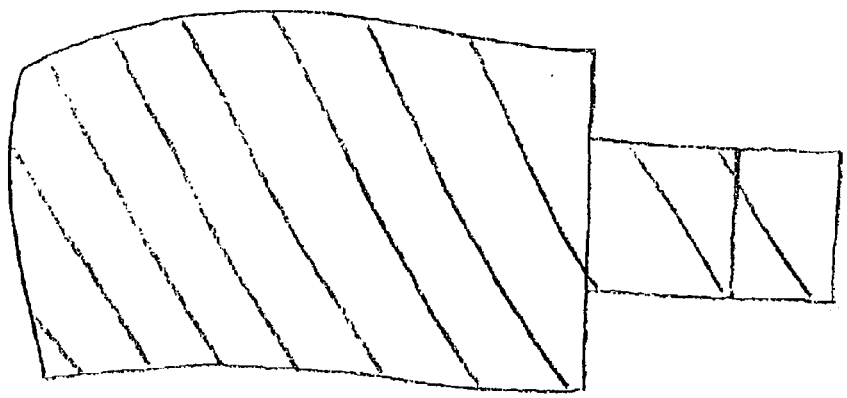

FIGS. 1I, 2I and 3I are cross-sectional, top and bottom views, respectively, of elastomer 144 filled into cavity 138. Elastomer 144 is a high compliance, high thermal stability, flexible elastomeric material such as polydimethylsiloxane based rubber that is confined to and occupies substantially all of cavity 138.

Elastomer 144 is deposited into cavity 138 as a resin and then cured. Initially, a liquid resin is deposited into cavity 138 using stencil printing. During stencil printing, a stencil (not shown) is placed over base 110, a stencil opening is aligned with cavity 138, and then a squeegee (not shown) pushes the liquid resin along the surface of the stencil opposite base 110, through the stencil opening and into cavity 138. The liquid resin is compliant enough at room temperature to conform to virtually any shape. Thereafter, the liquid resin is cured at a relatively low temperature in the range of 60 to 80° C.

Figure 1J:
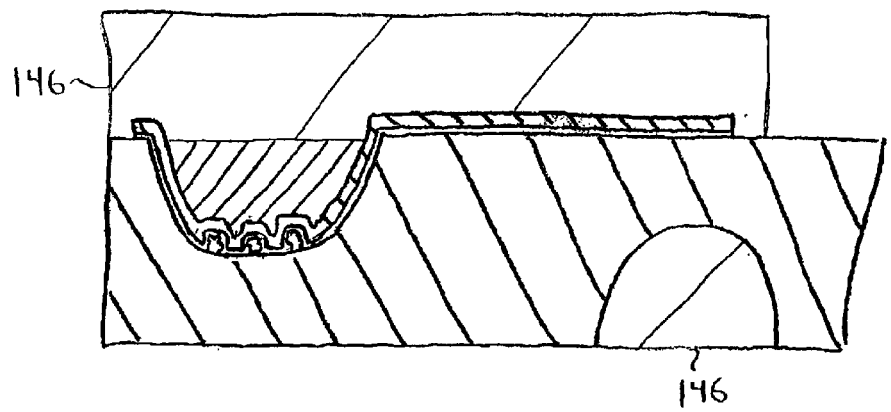
Figure 2J:
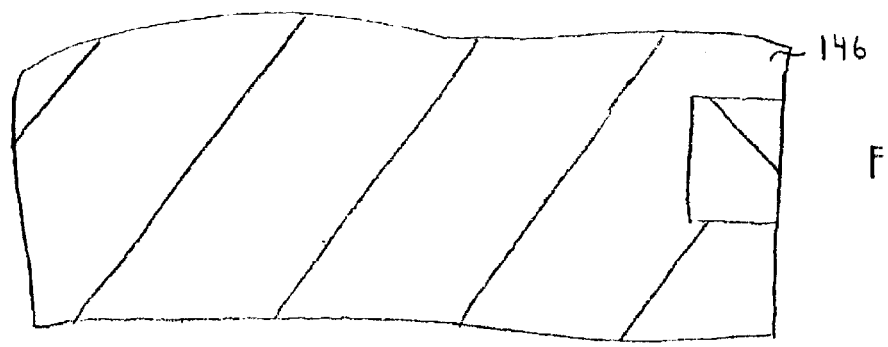
Figure 3J:
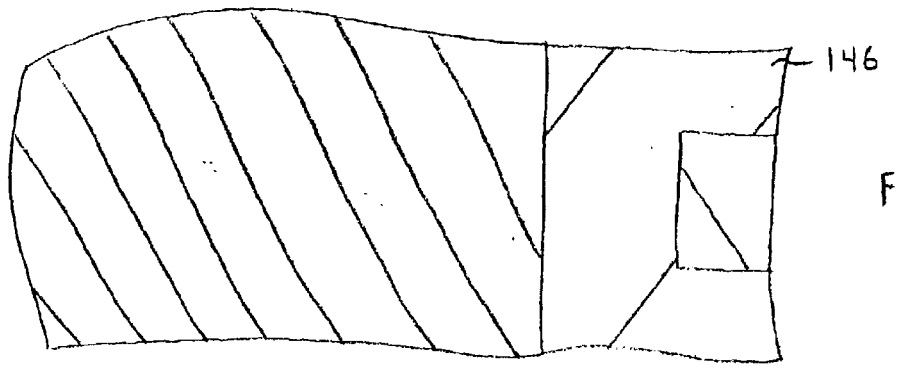

FIGS. 1J, 2J and 3J are cross-sectional, top and bottom views, respectively, of insulative support 146 formed on the structure by transfer molding. Transfer molding is the most popular chip encapsulation method for essentially all plastic packages. Generally speaking, transfer molding involves forming components in a closed mold from a molding compound that is conveyed under pressure in a hot, plastic state from a central reservoir called the transfer pot through a tree-like array of runners and gates into closed cavities. Molding compounds are well-known in the art.

Initially the structure is accurately positioned within a mold (not shown). The mold contacts surfaces 112 and 114 but does not extend into slots 124. The mold defines a box-shaped mold cavity that extends above surface 112, surrounds conductive trace 132 and overlaps recess 122 and slots 124. The mold lays flush against surface 114. Next, insulative support 146 is introduced into the mold cavity as a liquid resin under pressure and then hardened to form a solid single-piece molded plastic base during the transfer molding operation. Insulative support 146 fills the mold cavity and contacts all exposed surfaces within the mold cavity. As a result, insulative support 146 forms a box-shaped portion, shaped like the mold cavity, that contacts and extends above surface 112 and the outer edges of conductive trace 132. Furthermore, insulative support 146 fills recess 122 and slots 124. That is, since recess 122 and slots 124 form a continuous channel, and the liquid resin enters recess 122 and slots 124 under pressure, the liquid resin fills and assumes the shape of recess 122 and slots 124. Thus, insulative support 146 includes canal-like portions in slots 124 that extend laterally beyond the box-shaped portion and recess 122. However, surface 114 outside recess 122 and slots 124 remains exposed, and insulative support 146 contacts little or none of surface 114 outside recess 122 and slots 124.

Insulative support 146 contacts base 110, conductive trace 132 and elastomer 144, and interlocks base 110 and conductive trace 132 at recess 122 and slots 124, thereby enhancing the mechanical attachment between base 110 and conductive trace 132. Insulative support 146 is a solid adherent compressible protective layer that provides back-side environmental protection such as moisture resistance and particle protection as well as mechanical support for the structure.

Figure 1K:
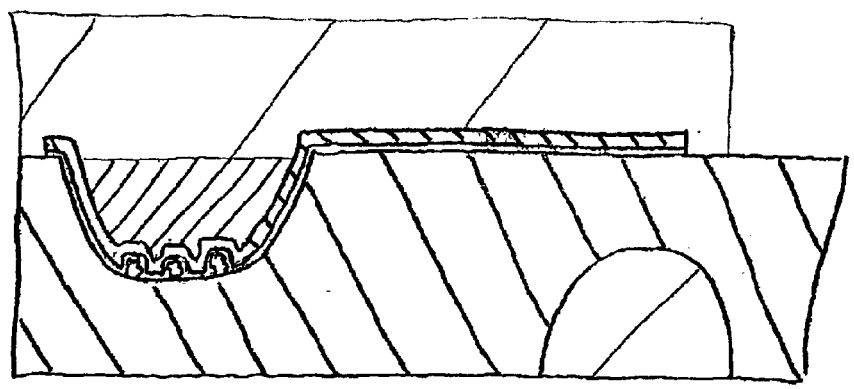
Figure 2K:
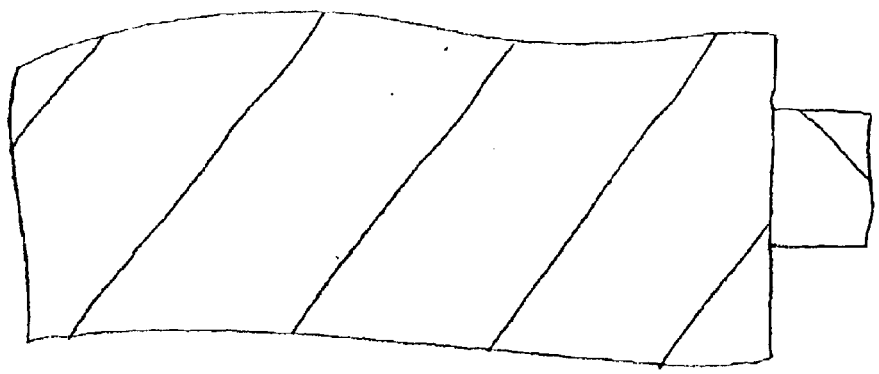
Figure 3K:
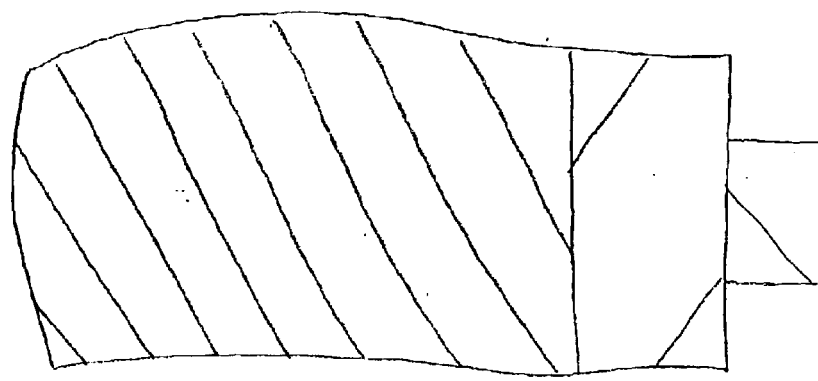

FIGS. 1K, 2K and 3K are cross-sectional, top and bottom views, respectively, of the structure after selected portions of insulative support 146 in slots 124 that extend laterally beyond recess 122 are removed. This can be accomplished using a mechanical trimming operation. For instance, a mold die (not shown) with an excise blade and a table can be used. The excise blade contains comb-like blade portions that are aligned with and disposed above slots 124, and the table contains openings that are aligned with and disposed below slots 124 as the structure is spaced from the excise blade and rests on the table. The excise blade is then actuated towards the table such that the blade portion enters slots 124 and cuts off the portions of insulative support 146 that reside in slots 124 and extend laterally beyond recess 122.

Figure 1L:
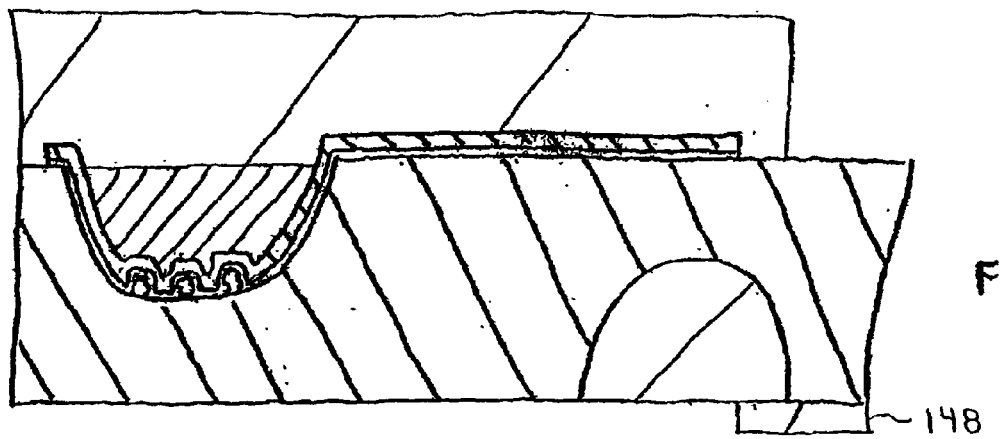
Figure 2L:
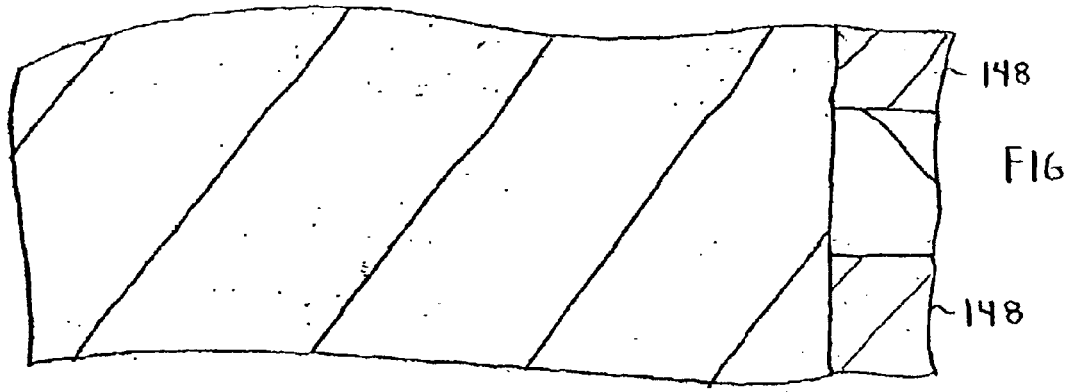
Figure 3L:
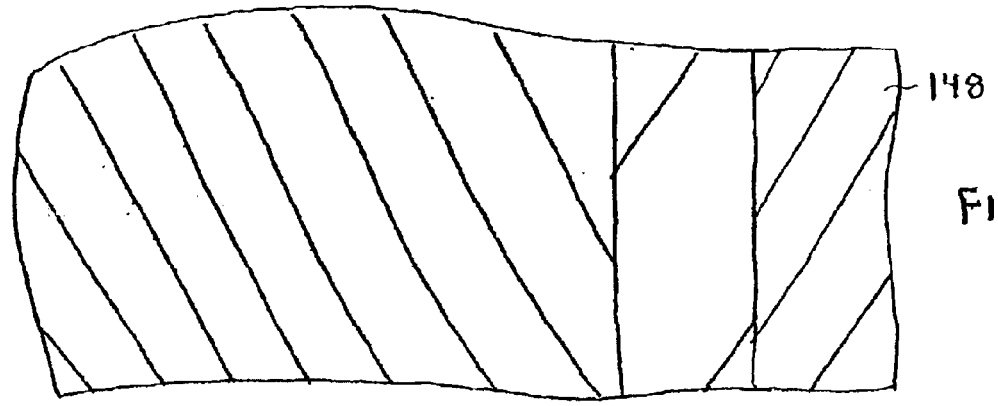

FIGS. 1L, 2L and 3L are cross-sectional, top and bottom views, respectively, of photoresist layer 148 formed on surface 114. Photoresist layer 148 is deposited as a continuous dry film and then patterned by selectively applying light through a reticle (not shown), applying a developer solution to remove the photoresist portions rendered soluble by the light, and then hard baking, as is conventional. As a result, photoresist layer 148 contains openings that selectively expose portions of surface 114. Photoresist layer 148 has a thickness of 50 microns.

Figure 1M:
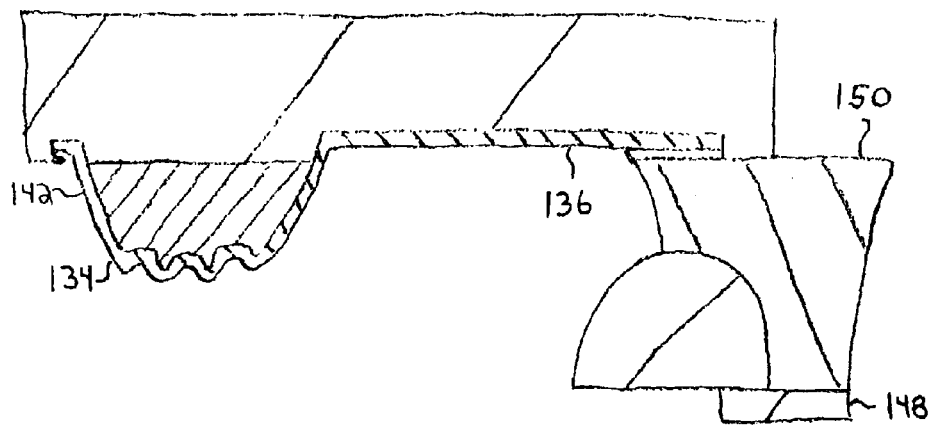
Figure 2M:
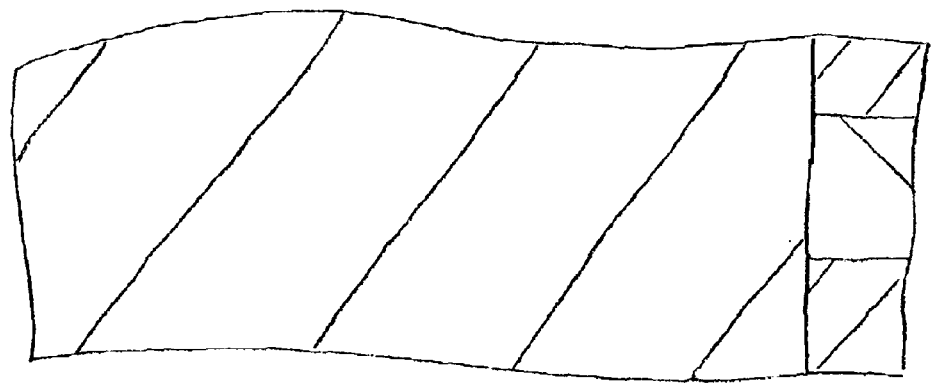
Figure 3M:
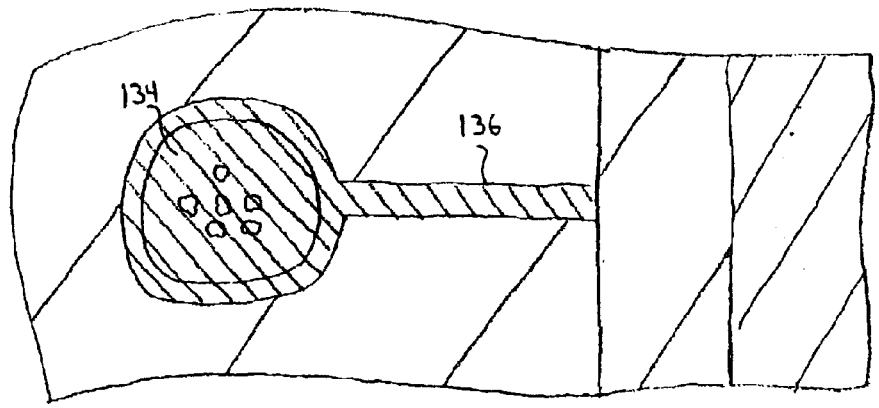

FIGS. 1M, 2M and 3M are cross-sectional, top and bottom views, respectively, of the structure after selected portions of base 110 and sacrificial plated metal 140 are removed and particles 130 are dislodged using photoresist layer 148 as an etch mask. A remaining portion of base 110 forms lead 150 that overlaps and extends laterally from and is electrically connected to routing line 136.

A back-side wet chemical etch is applied to surface 114 of base 110 without being applied to the opposite or front-side at surface 112 of base 110. For instance, the wet chemical etch can be sprayed on surface 114, or surface 112 can be covered by a mask and then the structure can be dipped in the wet chemical etch.

The wet chemical etch is highly selective of copper with respect to nickel and the molding compound. Therefore, no appreciable amount of undercoat plated metal 142 or insulative support 146 is removed. In addition, since base 110 and sacrificial plated metal 140 are composed of copper, the wet chemical etch is achieved in a single step using a copper etching solution. A suitable wet chemical etch can be provided by the same solution used to form recesses 120 and 122 and slots 124. The optimal etch time for exposing base 110 and sacrificial plated metal 140 to the wet chemical etch in order to remove the selected portions of base 110 and sacrificial plated metal 140 and dislodge particles 130 without excessively exposing the remaining portions of base 110 and sacrificial plated metal 140 to the wet chemical etch can be established through trial and error.

The wet chemical etch etches completely through base 110 and sacrificial plated metal 140, thereby effecting a pattern transfer of photoresist layer 148 onto base 110 and sacrificial plated metal 140. In this manner, the wet chemical etch completely removes portions of base 110 that overlap bumped terminal 134 and the portions of sacrificial plated metal 140 at bumped terminal 134 and contacts particles 130 and undercoat plated metal 142. The wet chemical etch does not appreciably etch particles 130. However, since particles 130 were in locked in place by the etched portions of base 110 and sacrificial plated metal 140, particles 130 become dislodged, that is, loose and no longer attached to the structure, and are easily removed from the structure. For instance, the loose particles 130 can be removed by gravitational force and/or the physical force of the wet chemical etch or its related cleaning steps (such as rinsing in distilled water and air blowing). As a result, particles 130 are dislodged and removed from bumped terminal 134, and undercoat plated metal 142 is exposed at bumped terminal 134 and routing line 136 and forms a jagged contact surface at bumped terminal 134 due to the tips that extended between particles 130.

Figure 1N:
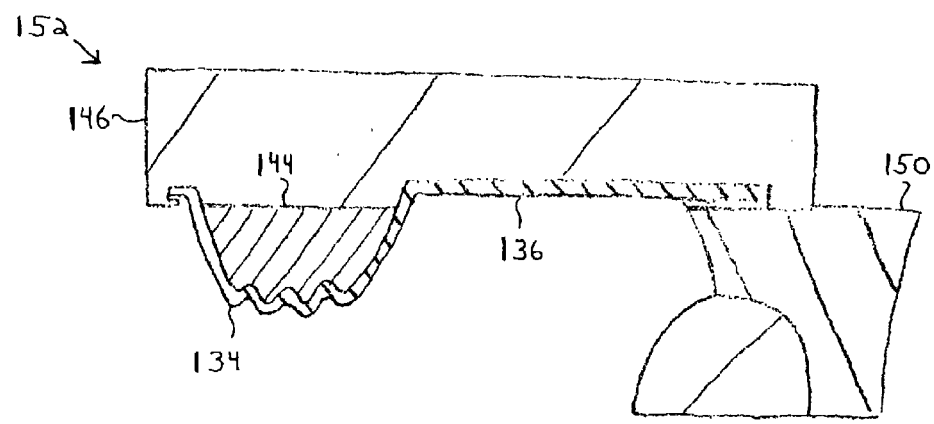
Figure 2N:
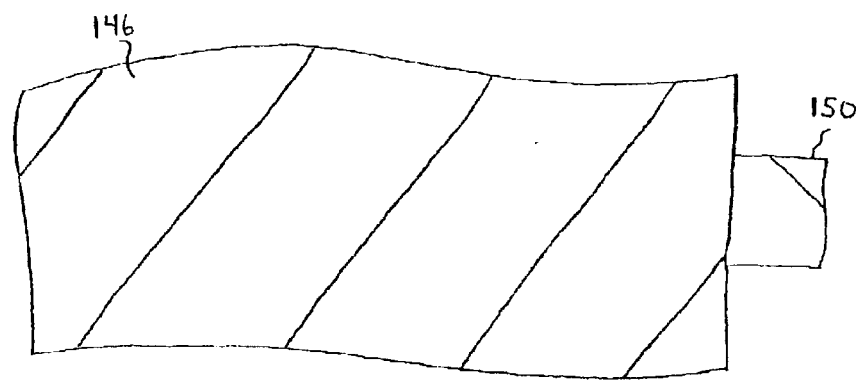
Figure 3N:
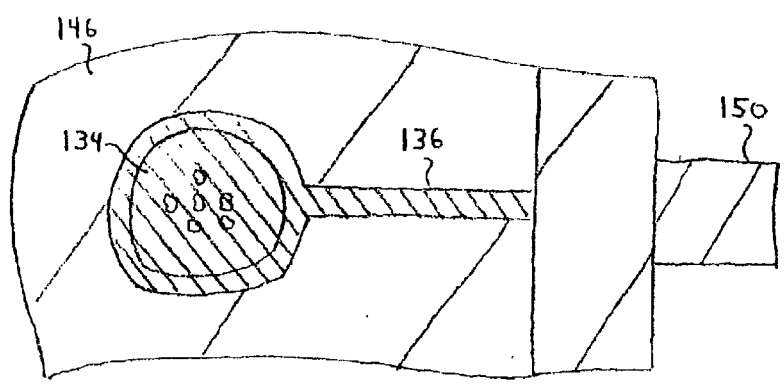

FIGS. 1N, 2N and 3N are cross-sectional, top and bottom views, respectively, of the structure after photoresist layer 148 is stripped. Photoresist layer 148 is removed using a solvent, such as a mild alkaline solution with a pH of 9, that is highly selective of photoresist with respect to copper, nickel and the molding compound. Therefore, no appreciable amount of conductive trace 132, insulative support 146 or lead 150 is removed.

At this stage, the manufacture of test probe 152 that includes bumped terminal 134, routing line 136, elastomer 144, insulative support 146 and lead 150 can be considered complete. Bumped terminal 134 provides a contact probe. Undercoat plated metal 142 provides bumped terminal 134 with a jagged contact surface. The jagged contact surface includes tips with random sizes, shapes and locations due to the random sizes, shapes and locations of particles 130. Elastomer 144 is flexible and compressible and permits bumped terminal 134 to provide a compressible, compliant contact probe. That is, bumped terminal 134 exhibits elastic deformation in response to vertically oriented external pressure and provides excellent vertical compliance and uniform pressure for contact testing. Routing line 136 and lead 150 provide horizontal fan-out routing between bumped terminal 134 and external circuitry on a test socket. Furthermore, insulative support 146 provides critical mechanical support for the structure and interlocks routing line 136 and lead 150.

Test probe 152 includes other bumped terminals, routing lines and leads supported by insulative support 146, and only a single bumped terminal 134, routing line 136 and lead 150 are shown for convenience of illustration.

FIGS. 4A–4O, 5A–5O and 6A–6O are cross-sectional, top and bottom views, respectively, of a method of making a test probe in accordance with a second embodiment of the present invention. In the second embodiment, the particles and the sacrificial plated metal are deposited through the photoresist layer that defines the recess for the bumped terminal. For purposes of brevity, any description in the first embodiment is incorporated herein insofar as the same is applicable, and the same description need not be repeated. Likewise, elements of the second embodiment similar to those in the first embodiment have corresponding reference numerals indexed at two-hundred rather than one-hundred. For instance, base 210 corresponds to base 110, conductive trace 232 corresponds to conductive trace 132, etc.

Figure 4A:
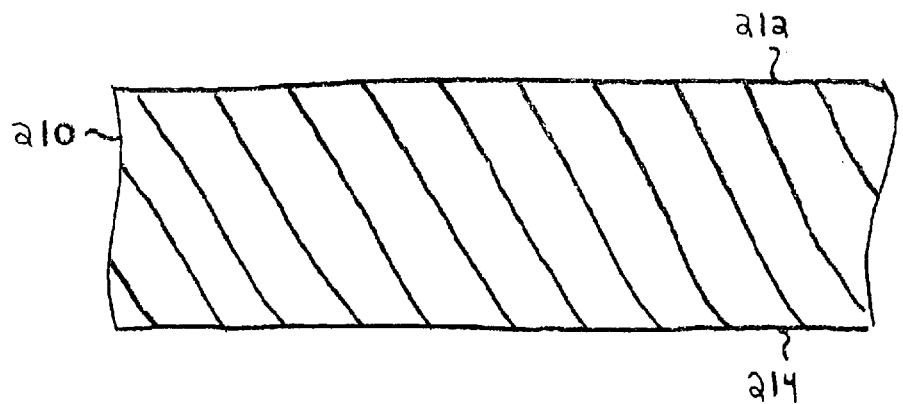
FIGS. 4A–4O are cross-sectional views showing a method of making a test probe in accordance with a second embodiment of the present invention.
Figure 5A:
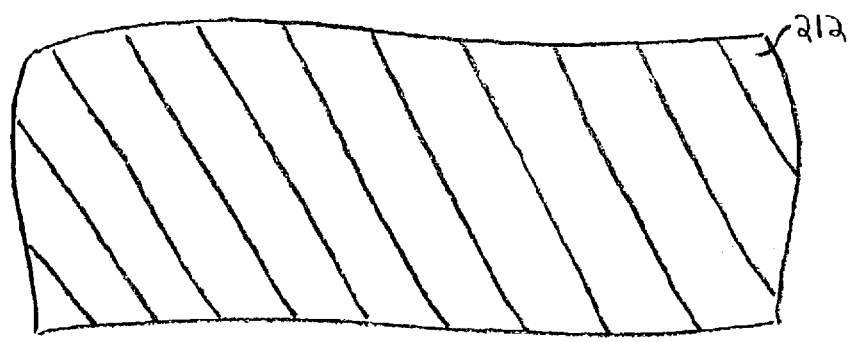
FIGS. 5A–5O are top plan views corresponding to FIGS. 4A–4O, respectively.
Figure 6A:
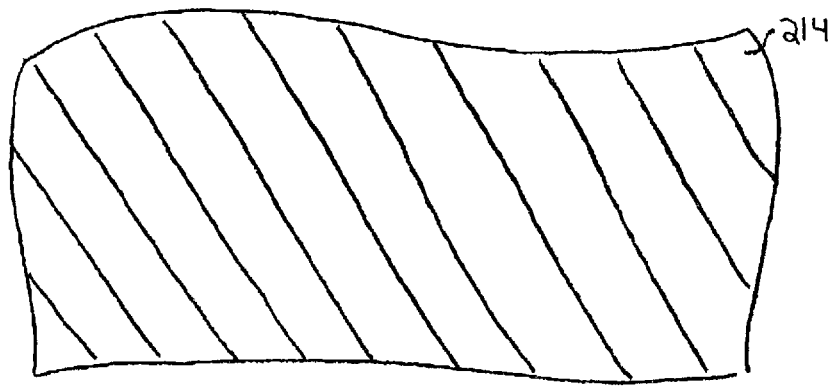
FIGS. 6A–6O are bottom plan views corresponding to FIGS. 4A–4O, respectively.

FIGS. 4A, 5A and 6A are cross-sectional, top and bottom views, respectively, of base 210 which includes surfaces 212 and 214.

Figure 4B:
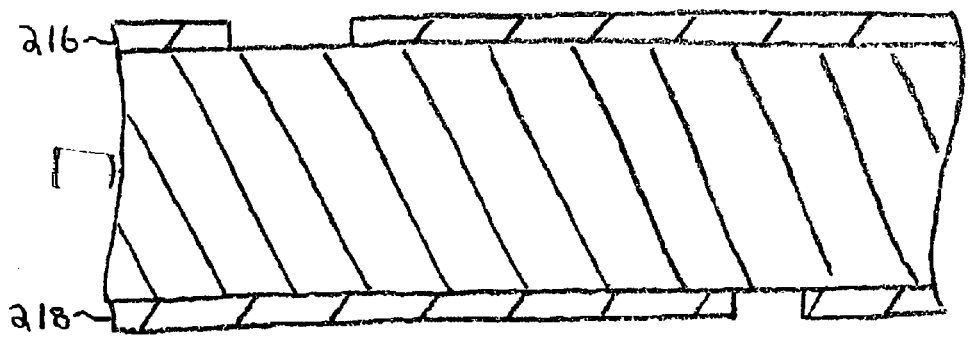
Figure 5B:
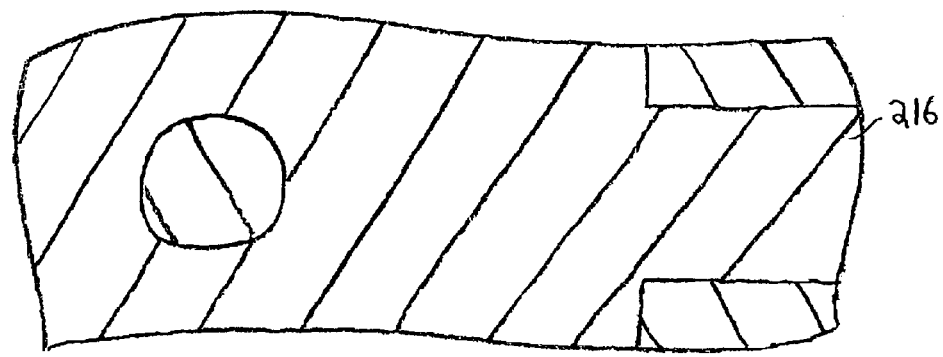
Figure 6B:
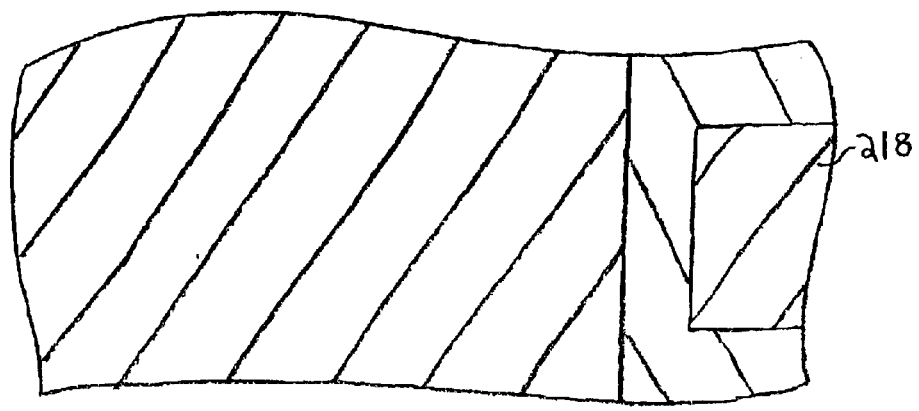

FIGS. 4B, 5B and 6B are cross-sectional, top and bottom views, respectively, of photoresist layers 216 and 218 formed on surfaces 212 and 214, respectively.

Figure 4C:
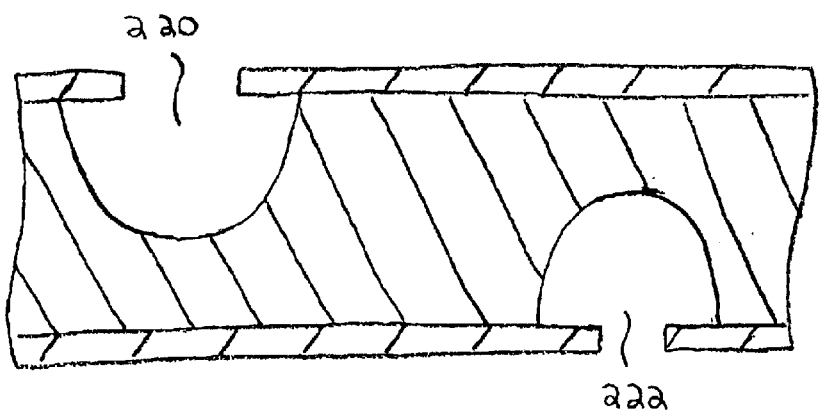
Figure 5C:
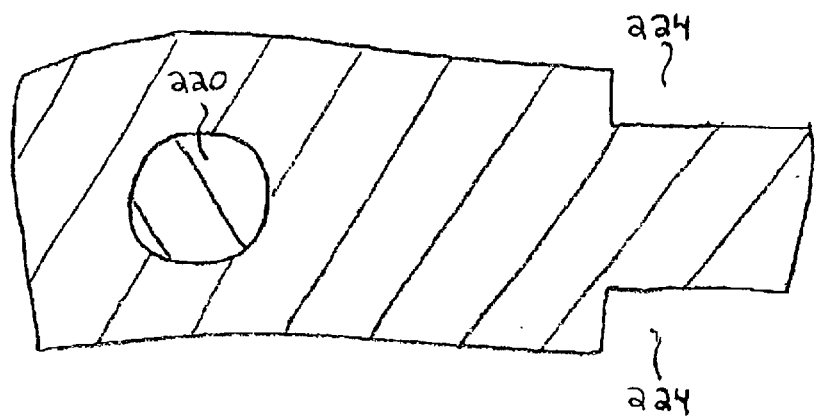
Figure 6C:
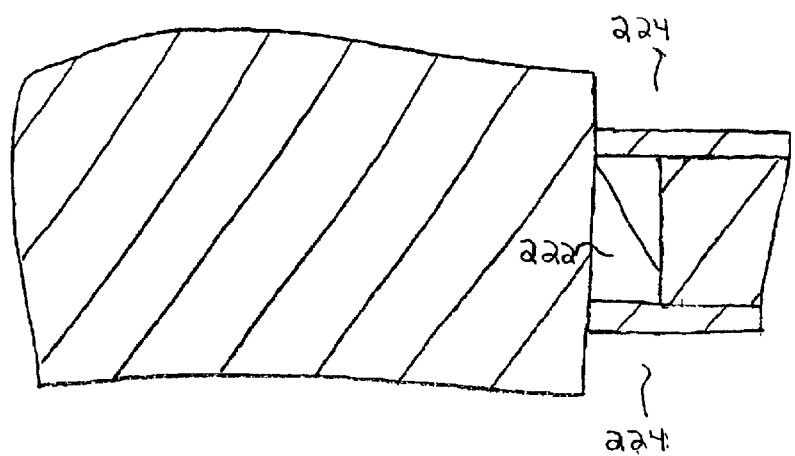

FIGS. 4C, 5C and 6C are cross-sectional, top and bottom views, respectively, of recesses 220 and 222 and slots 224 formed in base 210 by wet chemical etching.

Figure 4D:
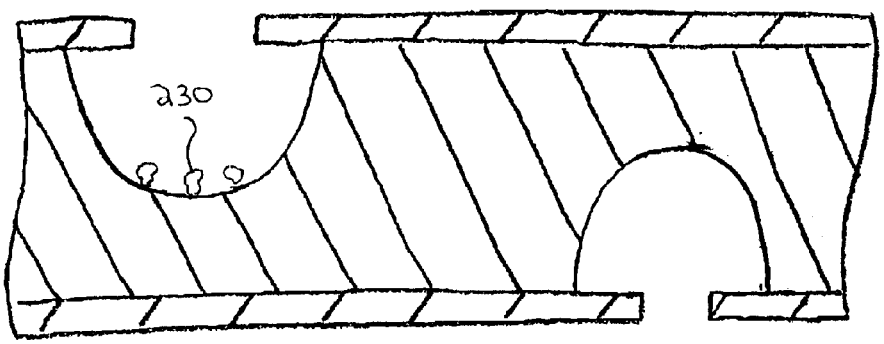
Figure 5D:
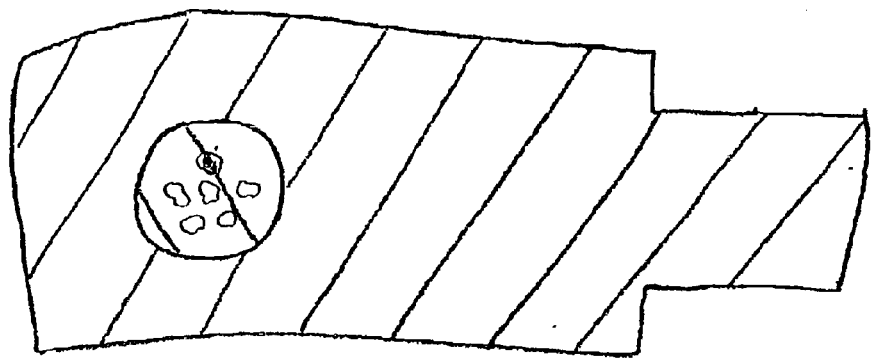
Figure 6D:
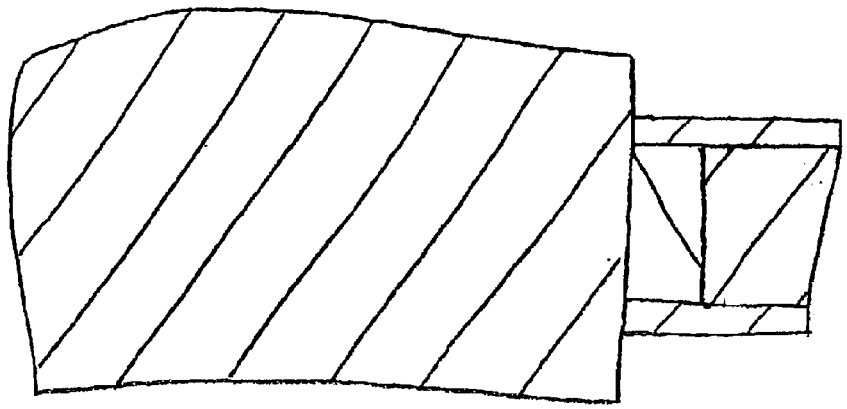

FIGS. 4D, 5D and 6D are cross-sectional, top and bottom views, respectively, of particles 230 deposited in recess 220.

Figure 4E:
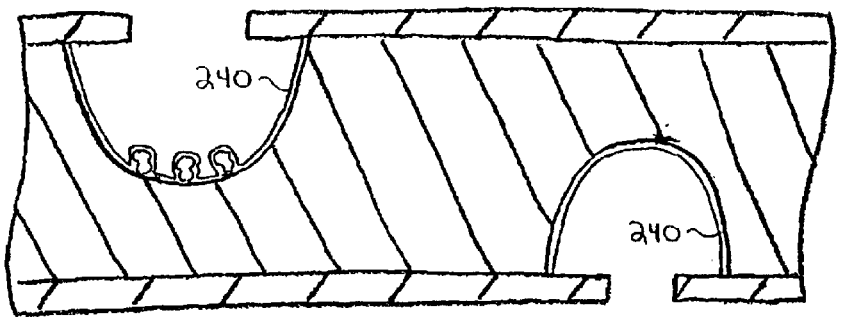
Figure 5E:
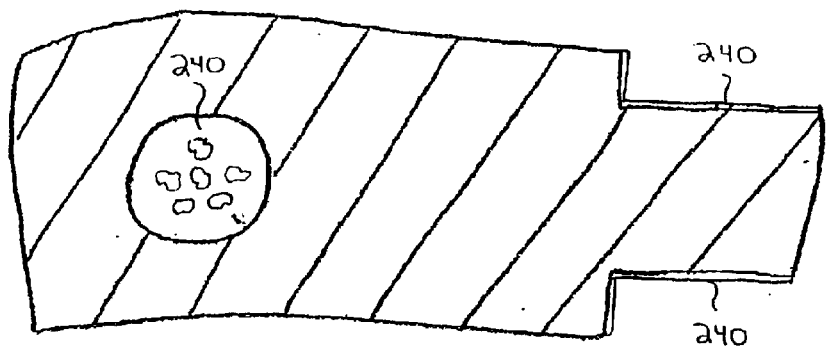
Figure 6E:
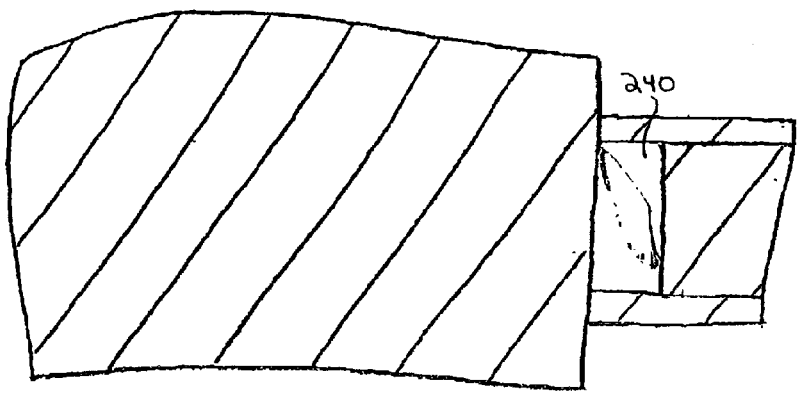

FIGS. 4E, 5E and 6E are cross-sectional, top and bottom views, respectively, of sacrificial plated metal 240 formed in recess 220 by electroplating, thereby partially forming conductive trace 232. Sacrificial plated metal 240 contacts particles 230 and locks particles 230 into recess 220, and particles 230 are embedded in sacrificial plated metal 240. Thus, sacrificial plated metal 240 partially forms bumped terminal 234. However, sacrificial plated metal 240 does not form any portion of routing line 236. Sacrificial plated metal 240 also forms in recess 222 and slots 224, although these portions of sacrificial plated metal 240 are relatively unimportant byproducts of the copper electroplating operation. Thus, sacrificial plated metal 240 has a different shape than sacrificial plated metal 140.

Figure 4F:
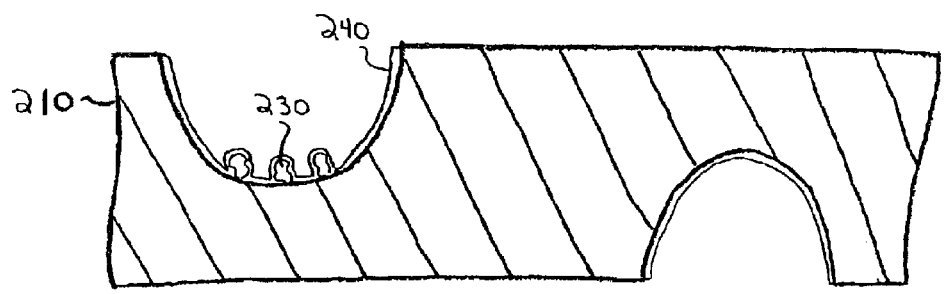
Figure 5F:
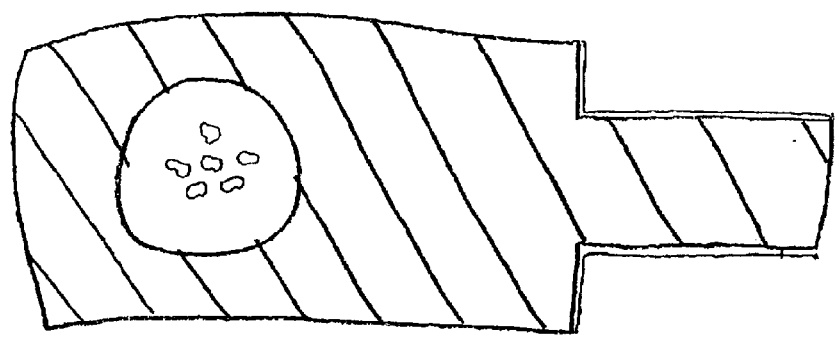
Figure 6F:
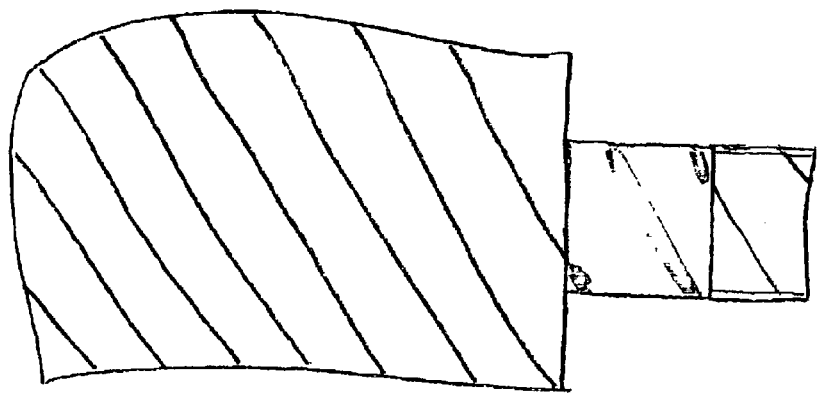

FIGS. 4F, 5F and 6F are cross-sectional, top and bottom views, respectively, of base 210, particles 230 and sacrificial plated metal 240 after photoresist layers 216 and 218 are stripped.

Figure 4G:
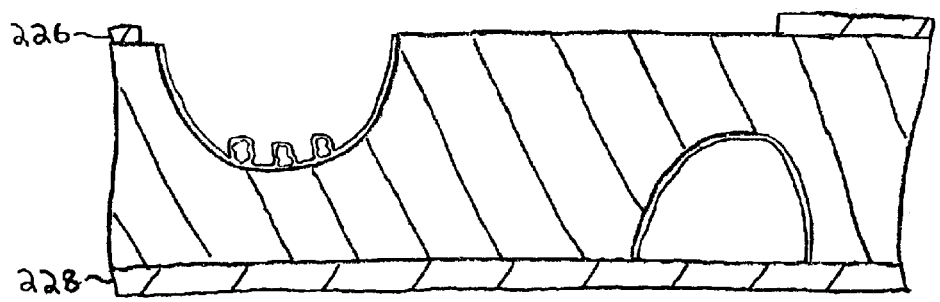
Figure 5G:
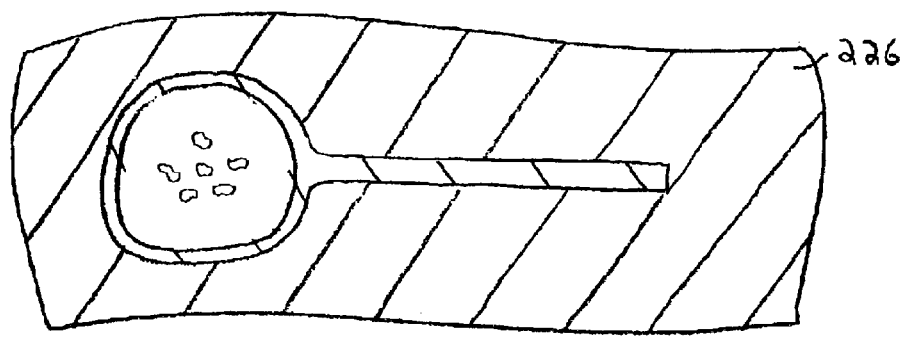
Figure 6G:
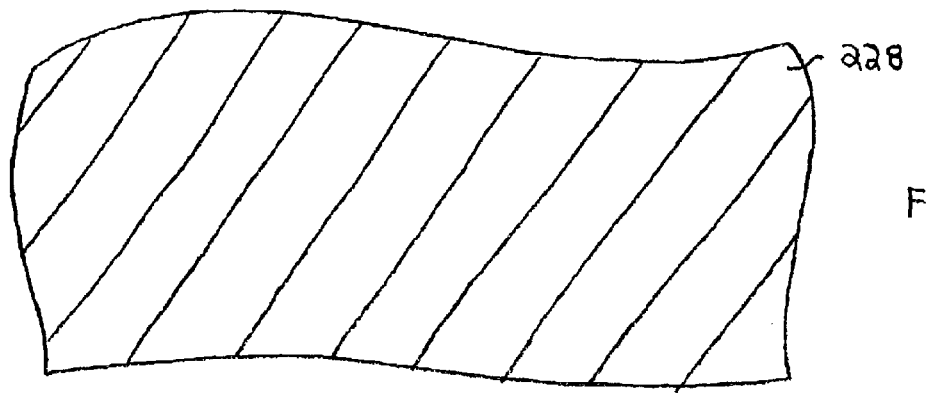

FIGS. 4G, 5G and 6G are cross-sectional, top and bottom views, respectively, of photoresist layers 226 and 228 formed on surfaces 212 and 214, respectively.

Figure 4H:
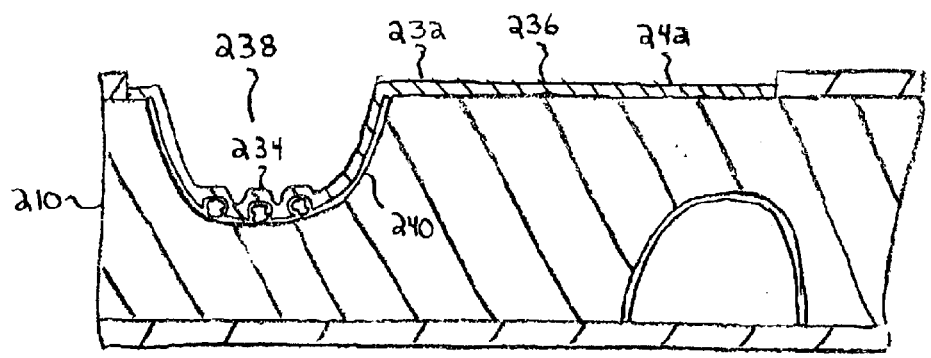
Figure 5H:
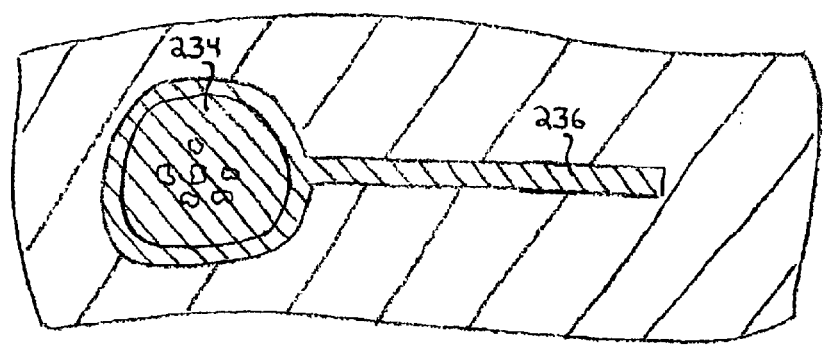
Figure 6H:
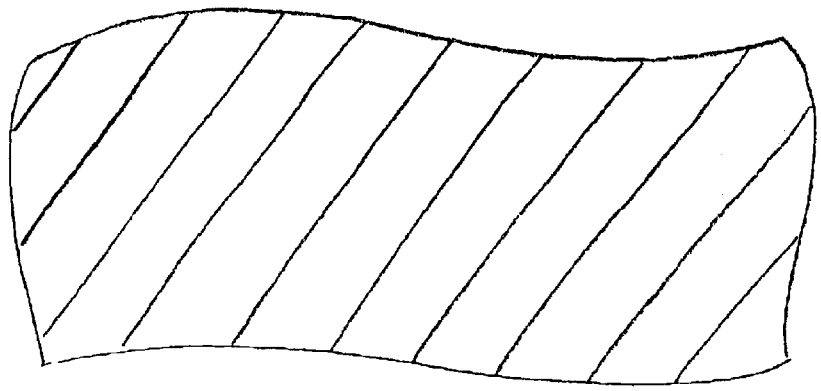

FIGS. 4H, 5H and 6H are cross-sectional, top and bottom views, respectively, of undercoat plated metal 242 formed on base 210 and sacrificial plated metal 240 by electroplating, thereby completing the formation of conductive trace 232. Undercoat plated metal 242 contacts sacrificial plated metal 240 in recess 220 and base 210 outside recess 220. Thus, undercoat plated metal 242 has a different shape than undercoat plated metal 142. Conductive trace 232 includes bumped terminal 234 and routing line 236, and bumped terminal 234 includes cavity 238. Bumped terminal 234 includes sacrificial plated metal 240 and undercoat plated metal 242, and routing line 236 includes undercoat plated metal 242 but excludes sacrificial plated metal 240.

Figure 4I:
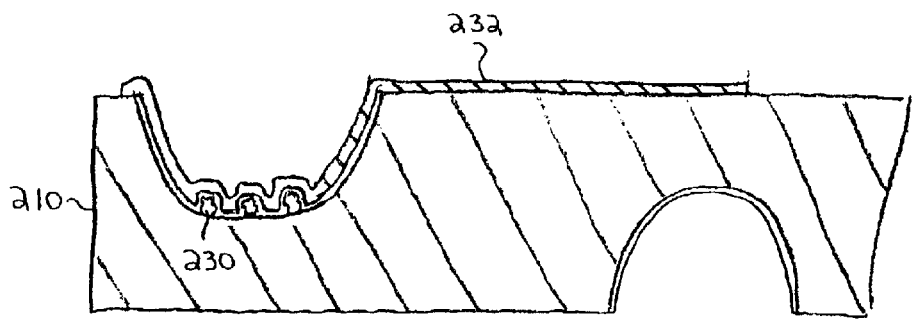
Figure 5I:
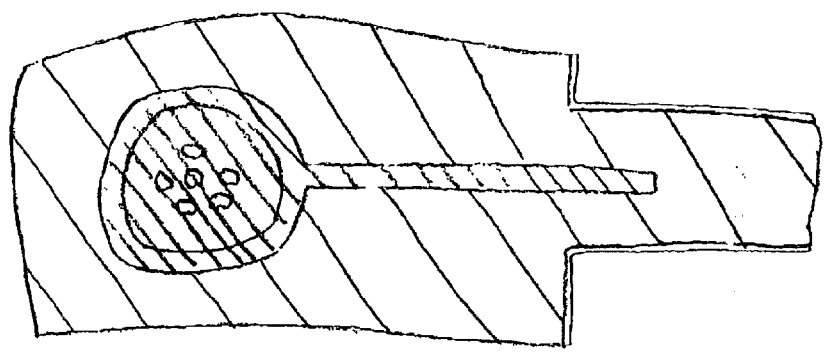
Figure 6I:
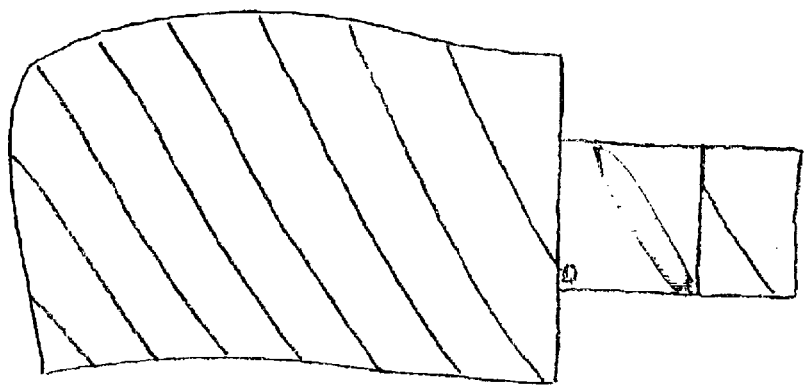

FIGS. 4I, 5I and 6I are cross-sectional, top and bottom views, respectively, of base 210, particles 230 and conductive trace 232 after photoresist layers 226 and 228 are stripped.

Figure 4J:
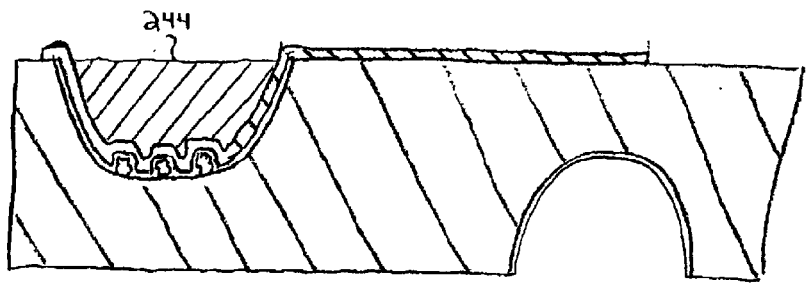
Figure 5J:
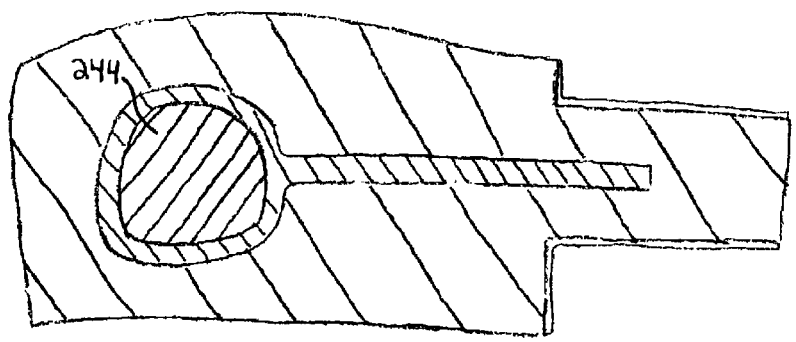
Figure 6J:
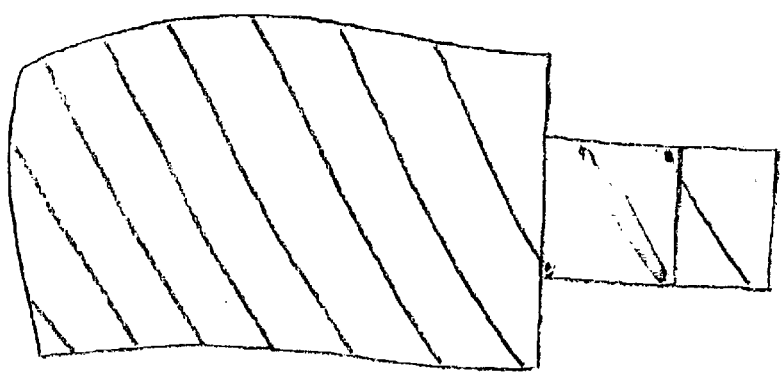

FIGS. 4J, 5J and 6J are cross-sectional, top and bottom views, respectively, of elastomer 244 formed in cavity 238 of bumped terminal 234.

Figure 4K:
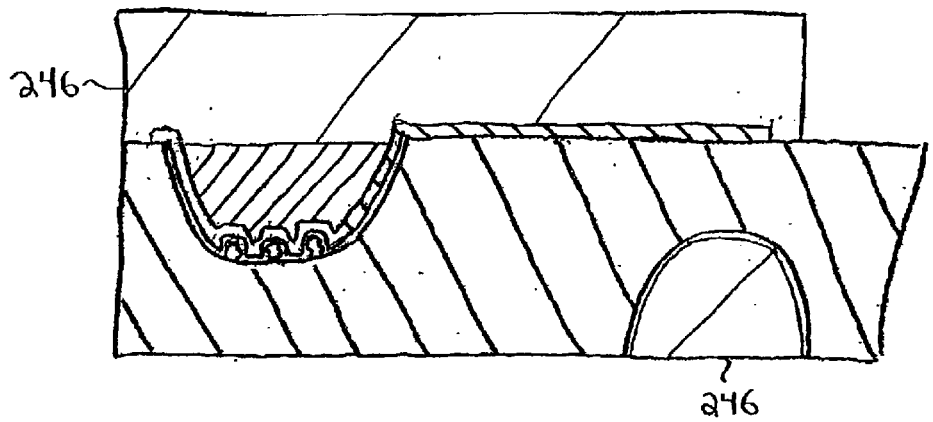
Figure 5K:
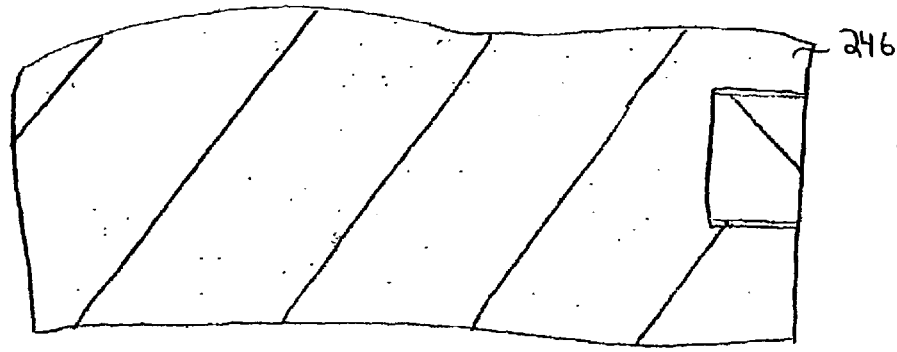
Figure 6K:
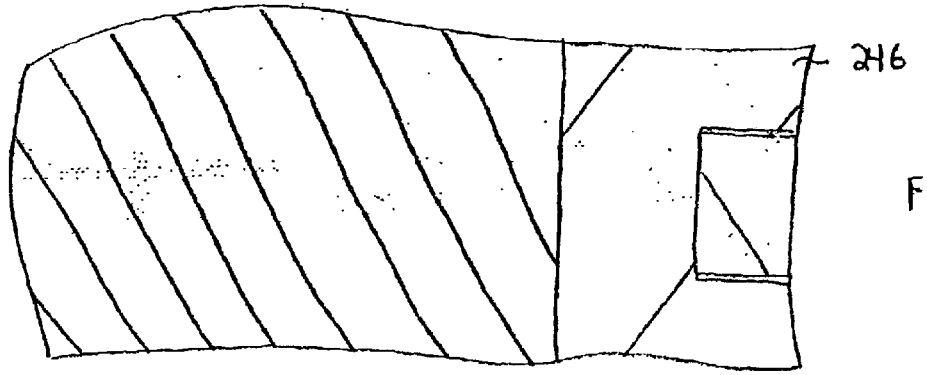

FIGS. 4K, 5K and 6K are cross-sectional, top and bottom views, respectively, of insulative support 246 formed on the structure by transfer molding.

Figure 4L:
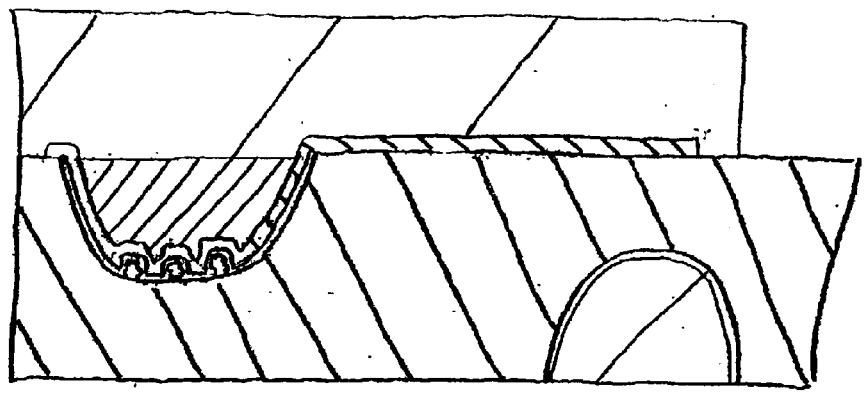
Figure 5L:
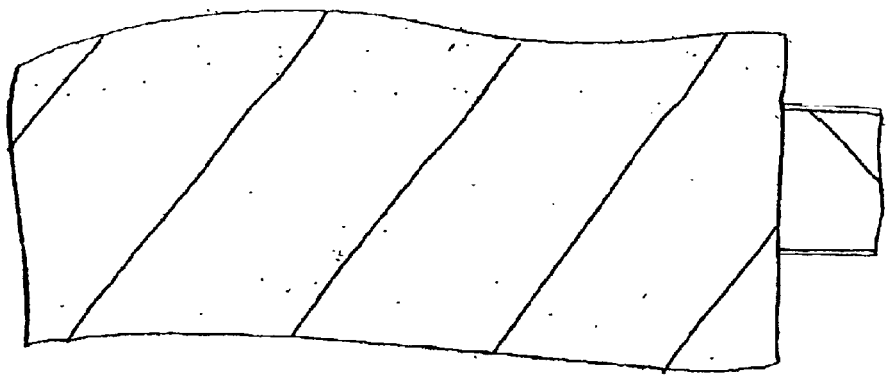
Figure 6L:
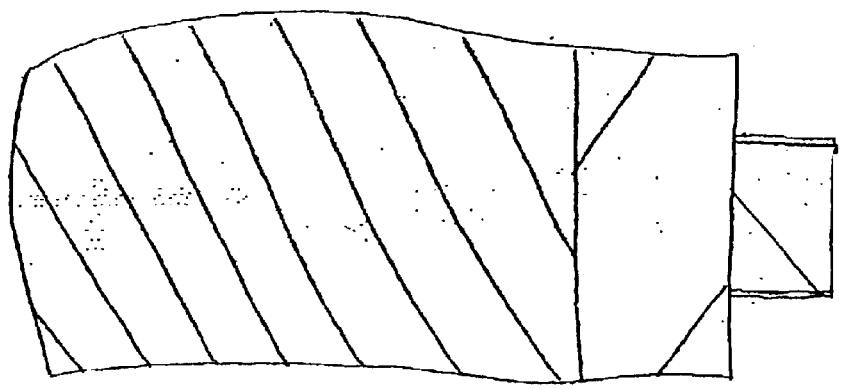

FIGS. 4L, 5L and 6L are cross-sectional, top and bottom views, respectively, of the structure after selected portions of insulative support 246 in slots 224 that extend laterally beyond recess 222 are removed.

Figure 4M:
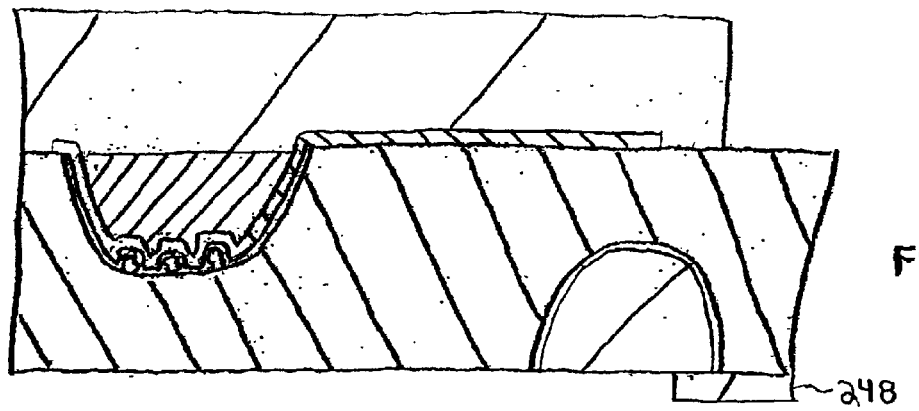
Figure 5M:
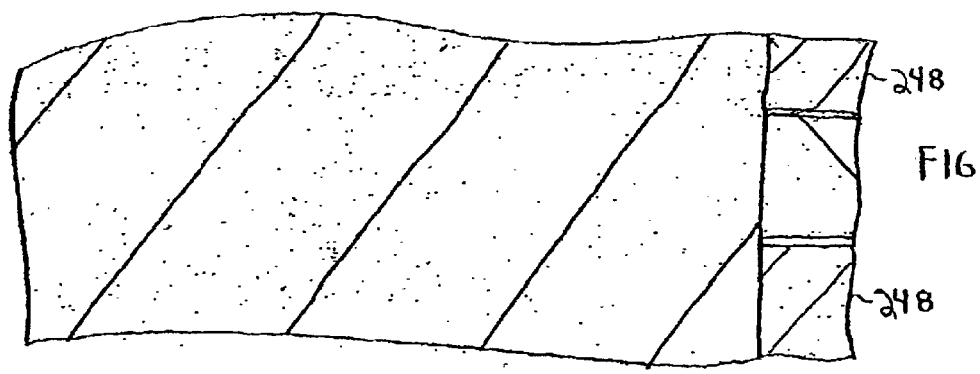
Figure 6M:
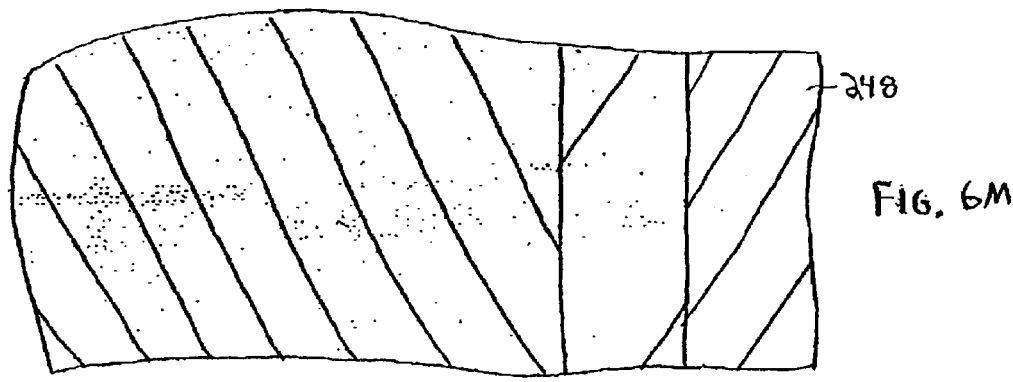

FIGS. 4M, 5M and 6M are cross-sectional, top and bottom views, respectively, of photoresist layer 248 formed on surface 214.

Figure 4N:
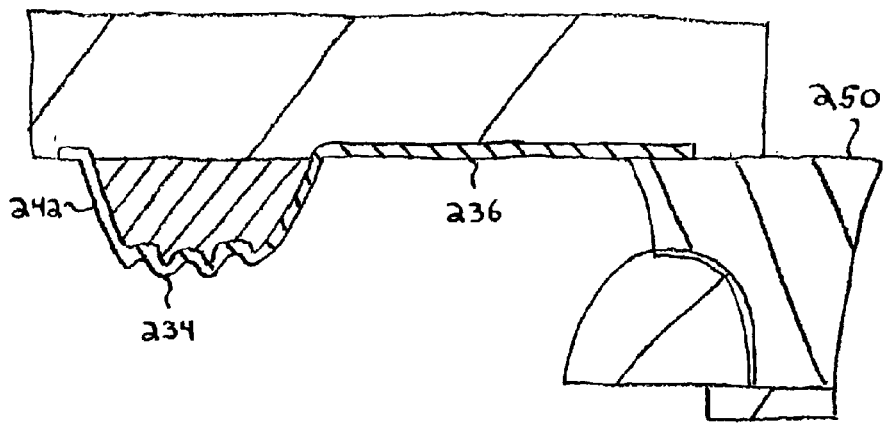
Figure 5N:
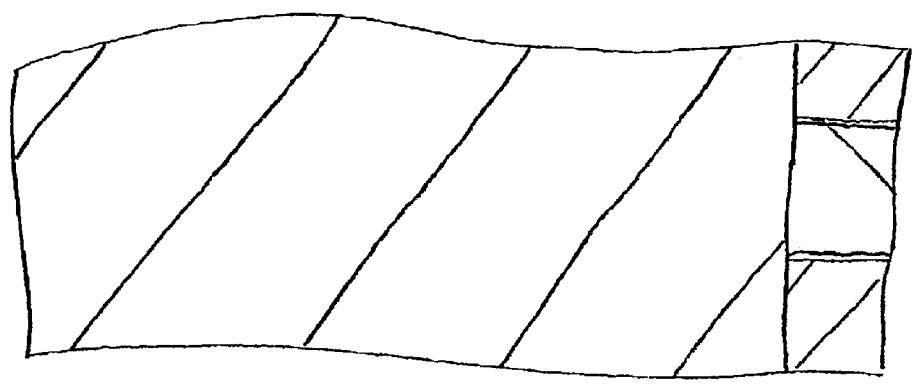
Figure 6N:
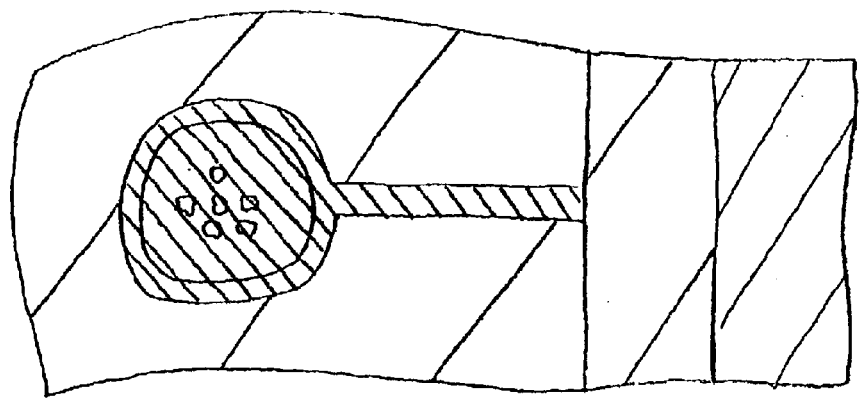
Figure 40:
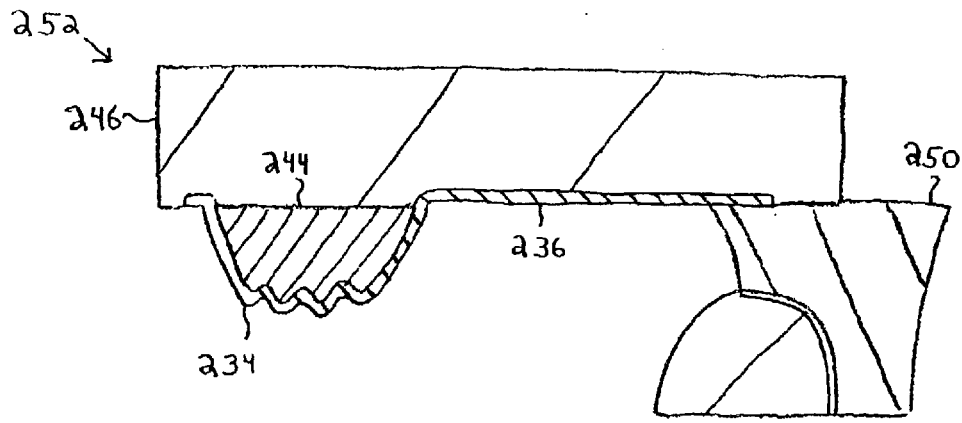
Figure 50:
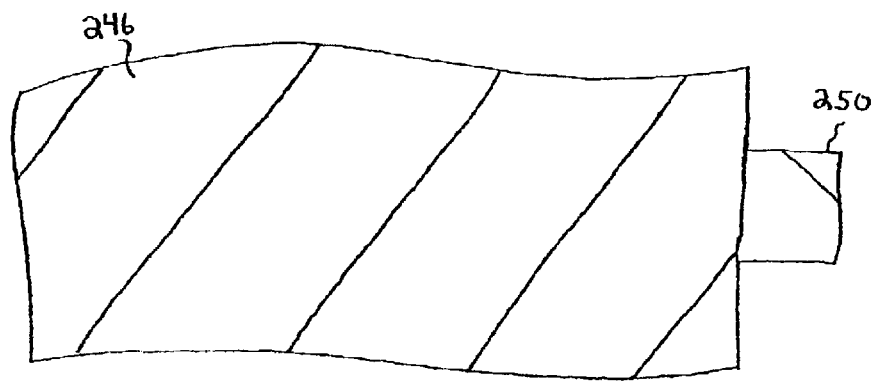
Figure 60:
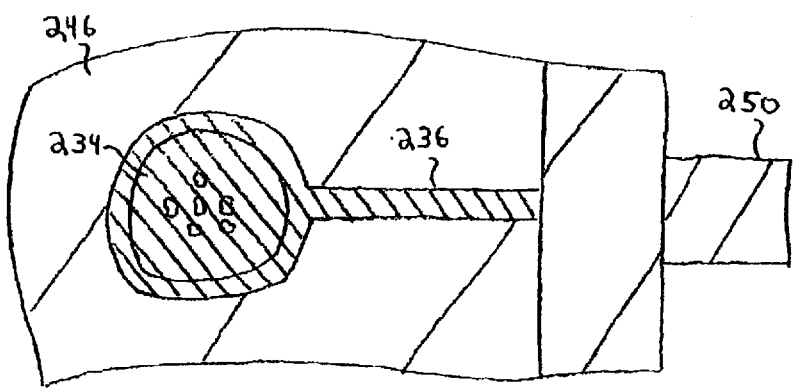

FIGS. 4N, 5N and 6N are cross-sectional, top and bottom views, respectively, of the structure after selected portions of base 210 and sacrificial plated metal 240 are removed by wet chemical etching, particles 230 are dislodged and a remaining portion of base 210 forms lead 250. As a result, undercoat plated metal 242 is exposed at bumped terminal 234 and routing line 236 includes a jagged contact surface at bumped terminal 234.

Figure 4A:
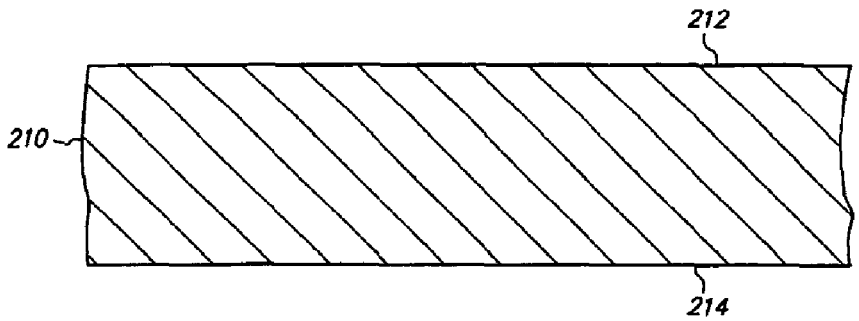
Figure 4B:
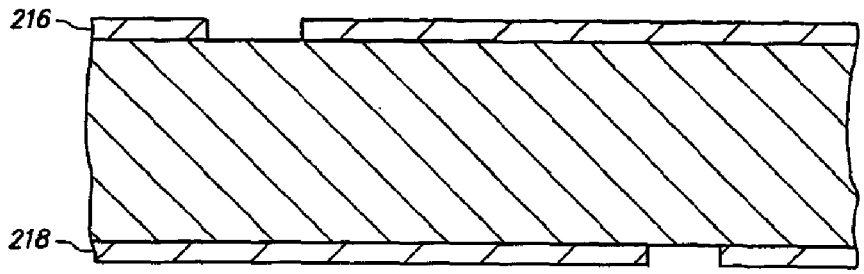
Figure 4C:
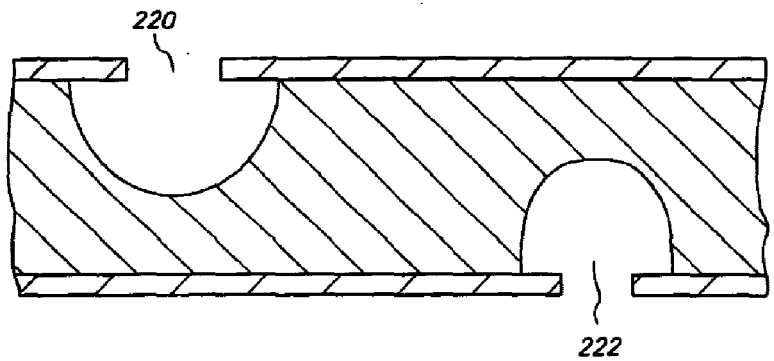
Figure 4D:
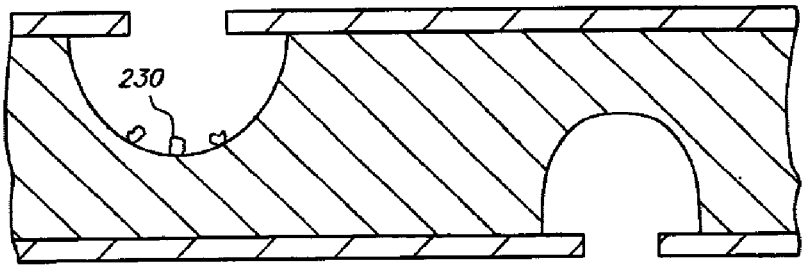
Figure 4E:
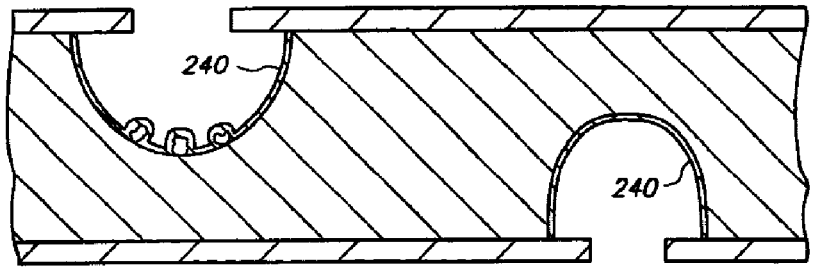
Figure 4F:
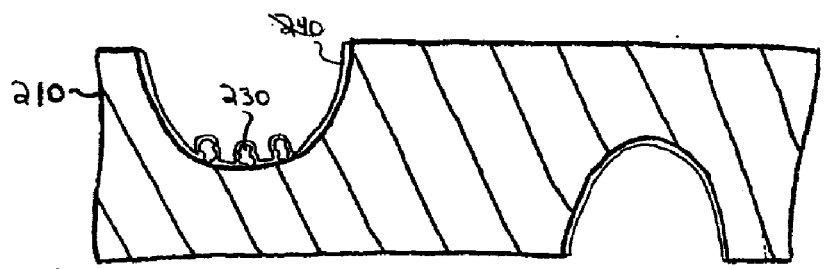
Figure 4G:
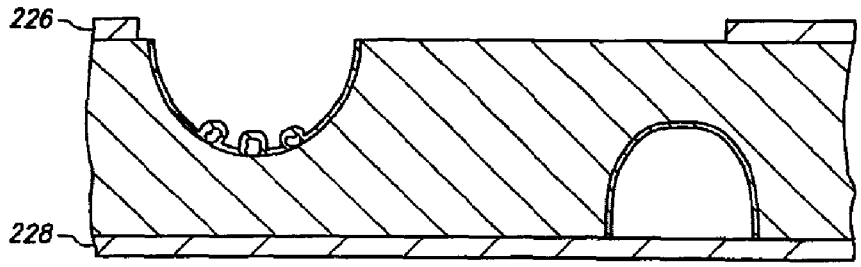
Figure 4H:
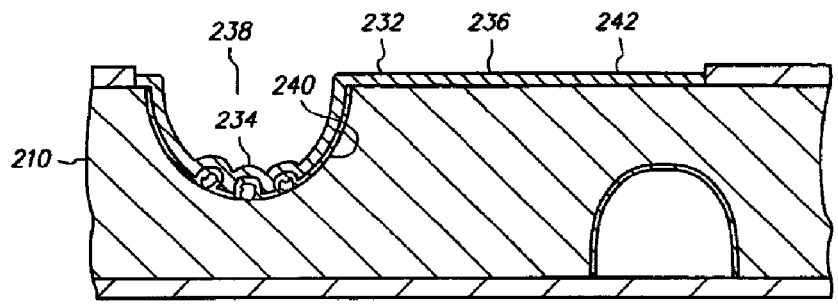
Figure 4I:
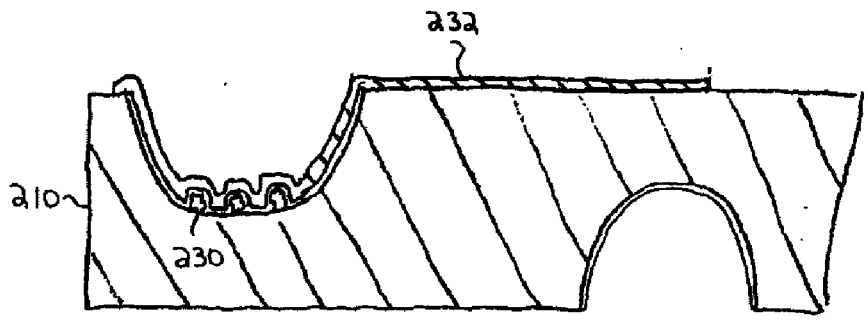
Figure 4J:
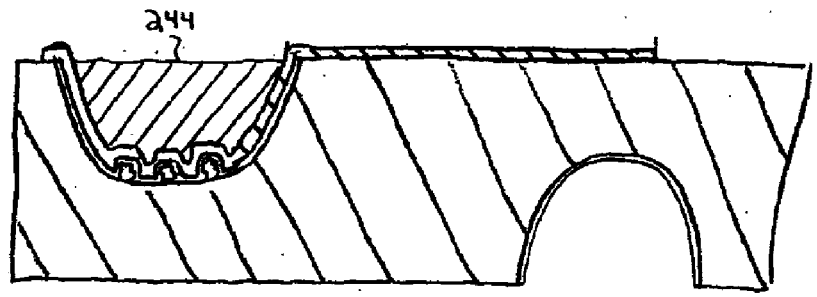
Figure 4K:
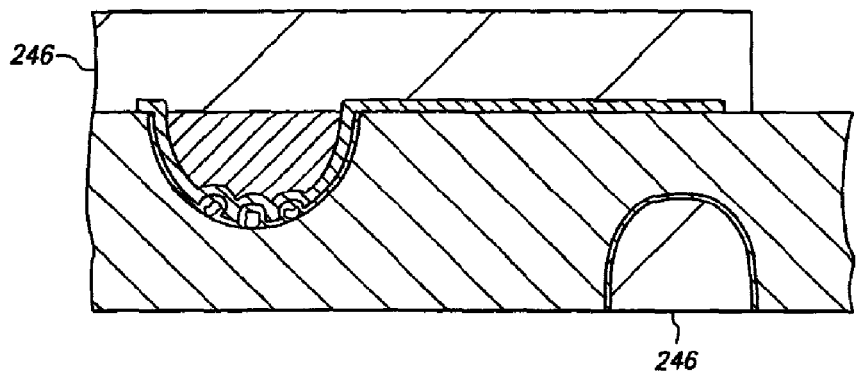
Figure 4L:
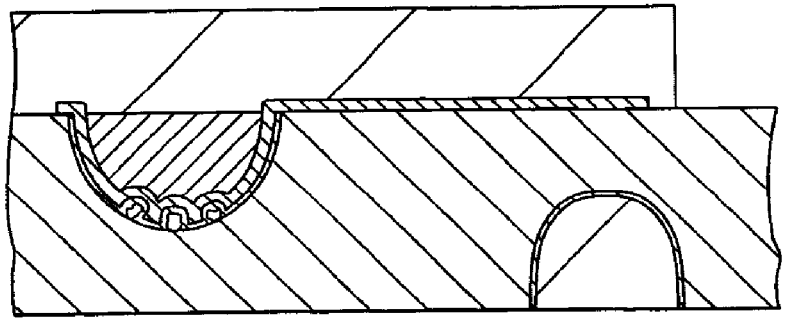
Figure 4M:
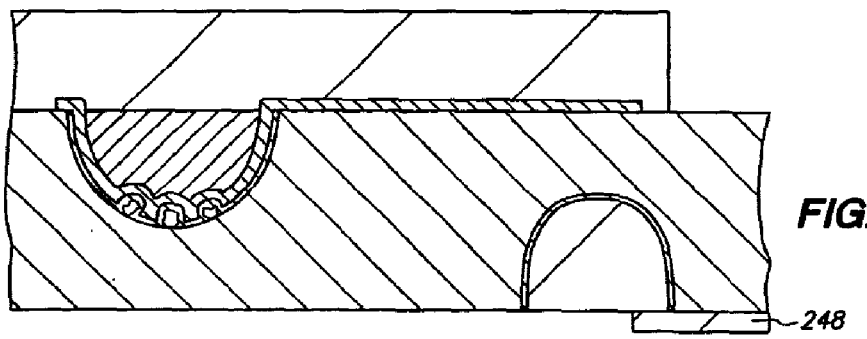
Figure 4N:
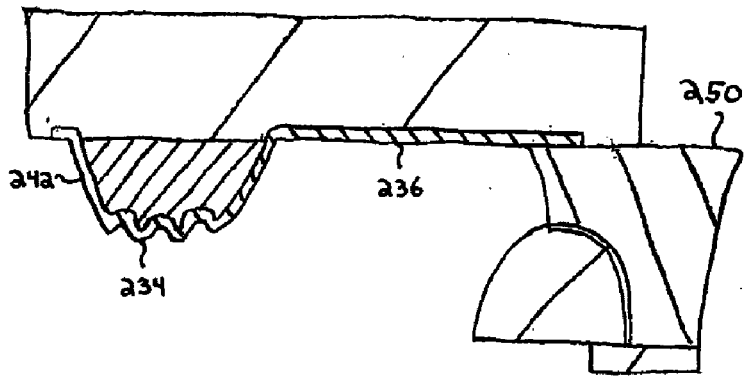
Figure 4O:
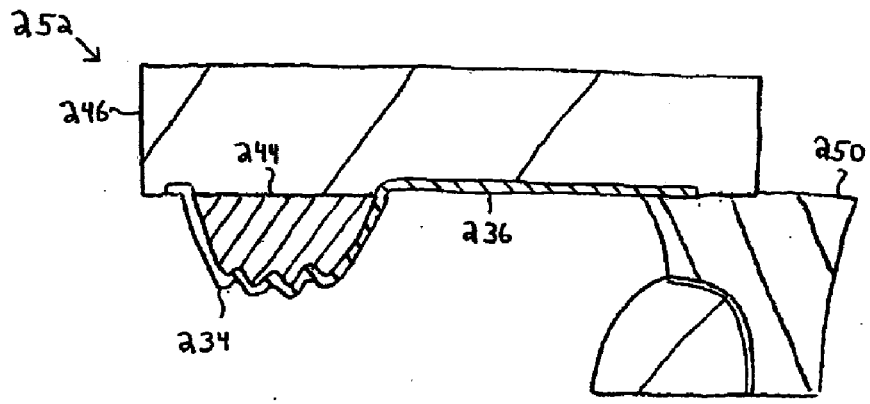
Figure 5O:
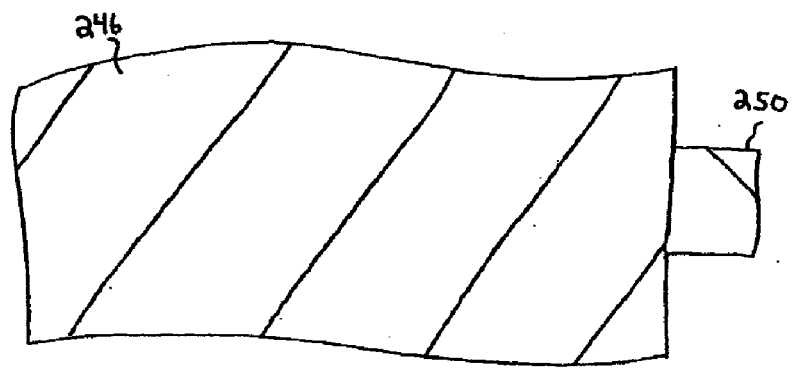
Figure 6O:
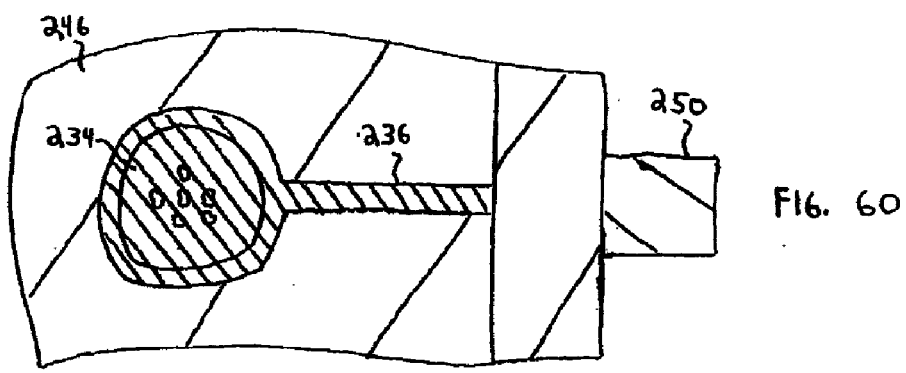
Figure 7A:
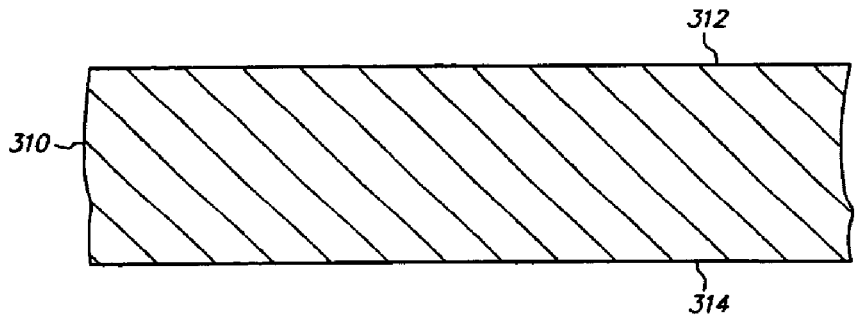
Figure 8A:
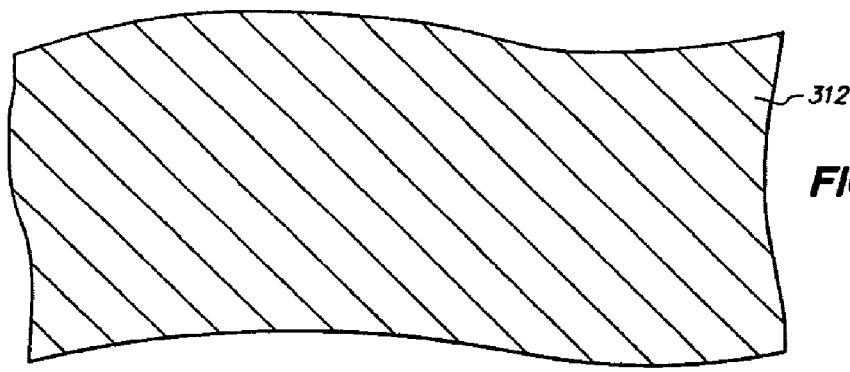
Figure 9A:
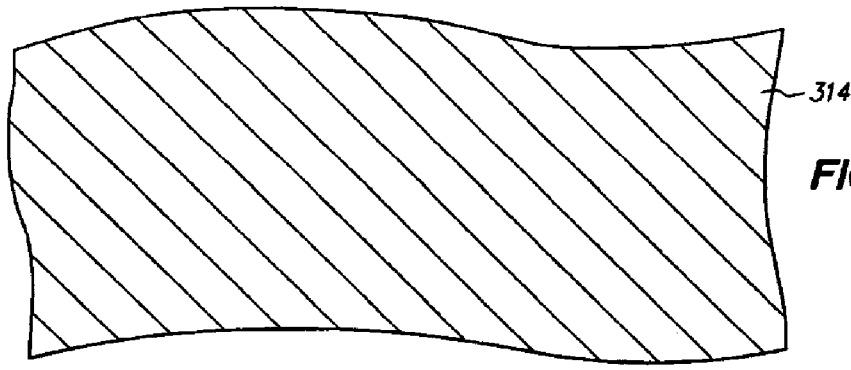
Figure 7B:
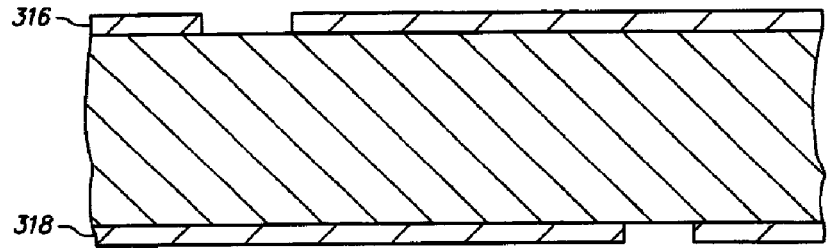
Figure 8B:
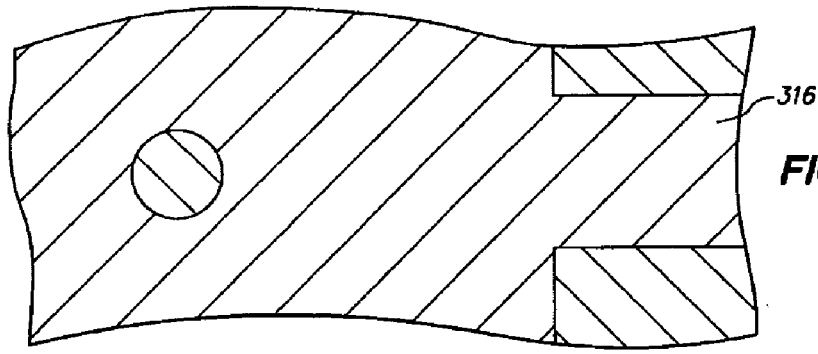
Figure 9B:
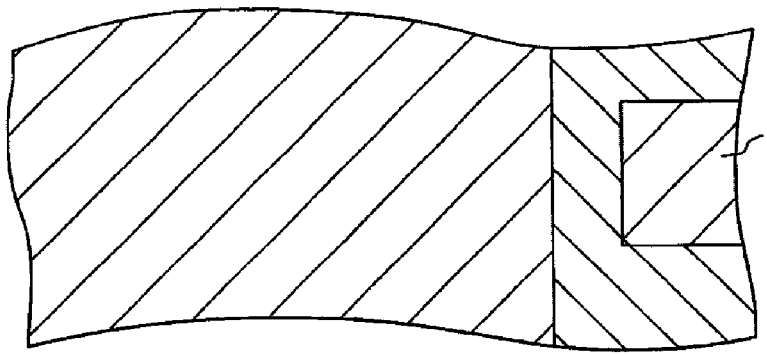
Figure 7C:
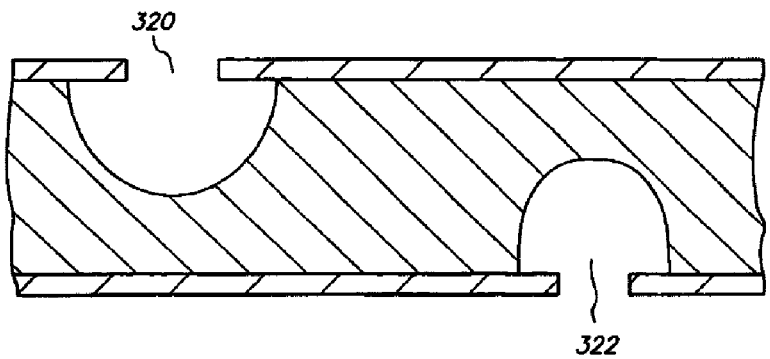
Figure 8C:
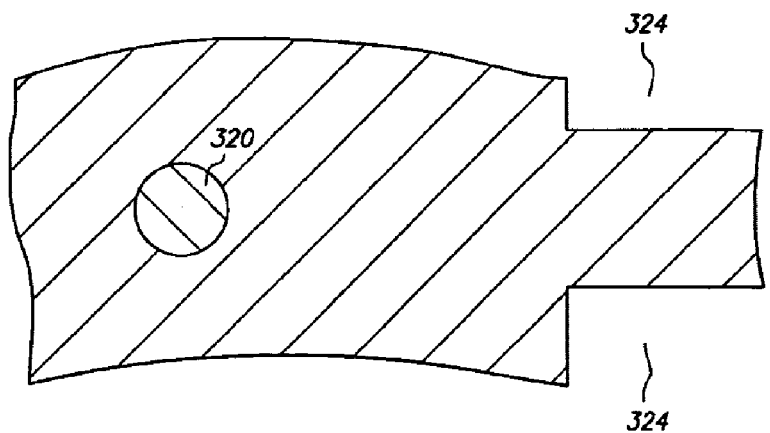
Figure 9C:
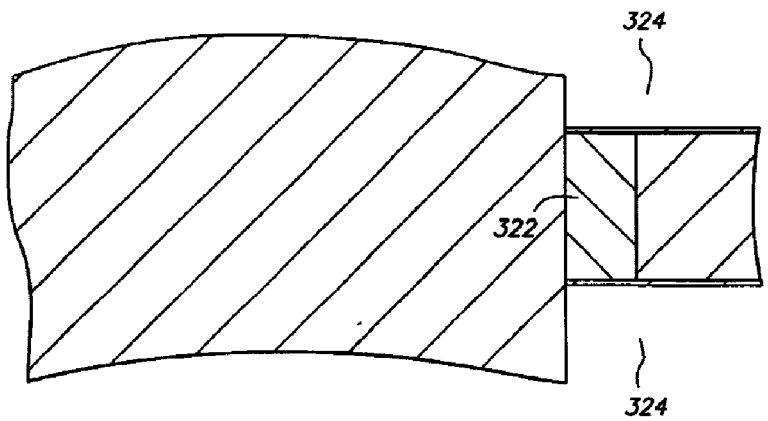
Figure 7D:
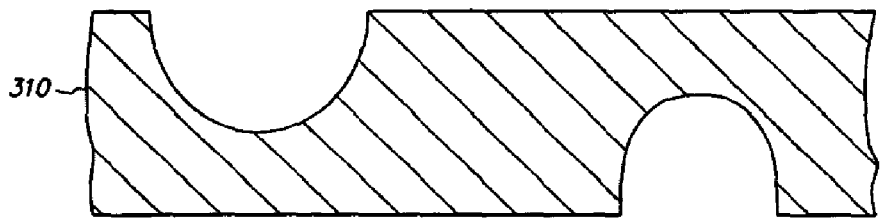
Figure 8D:
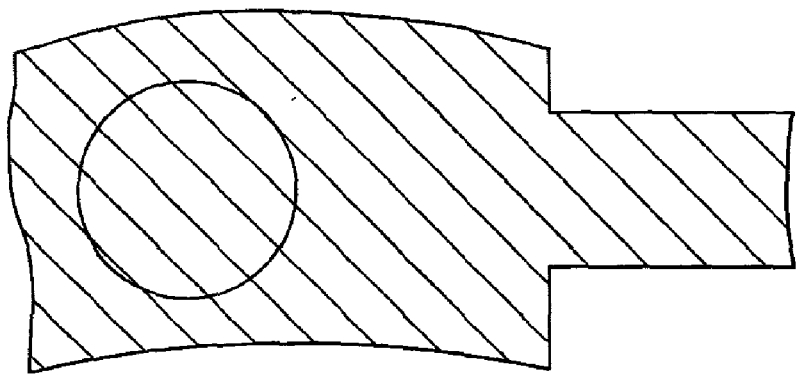
Figure 9D:
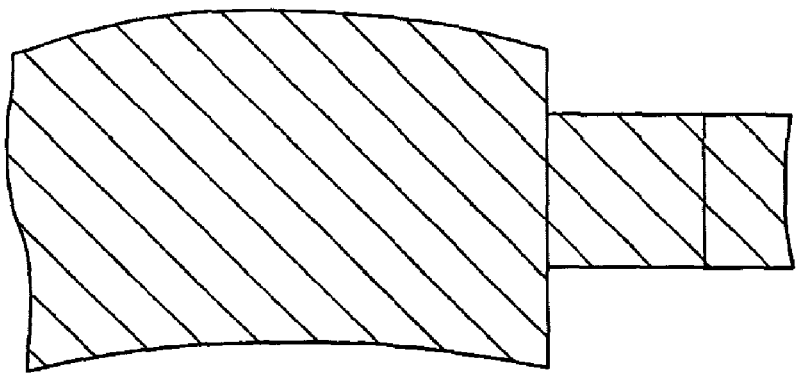
Figure 7E:
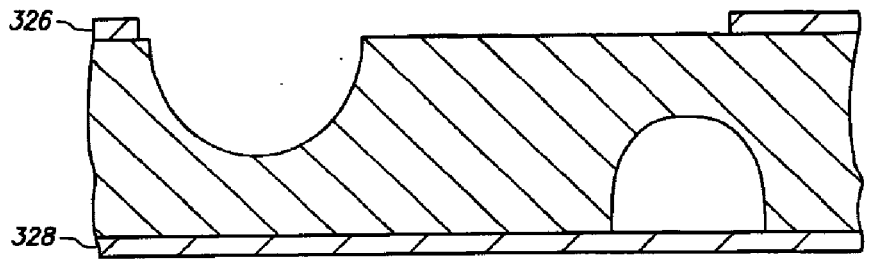
Figure 8E:
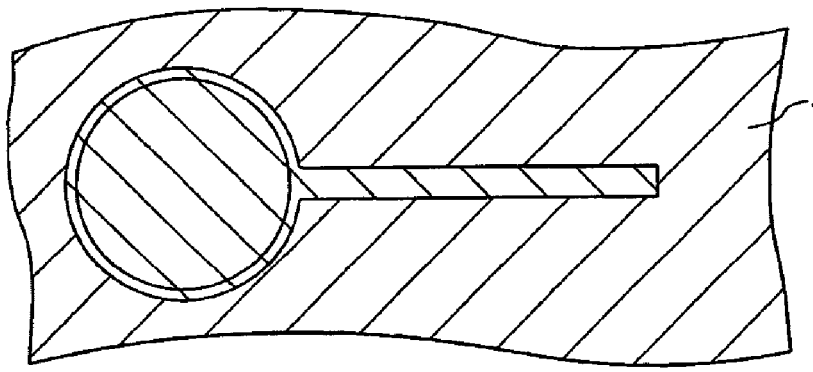
Figure 9E:
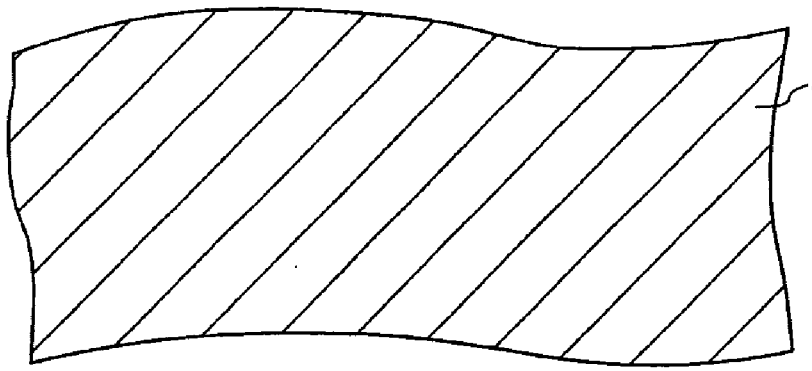
Figure 7F:
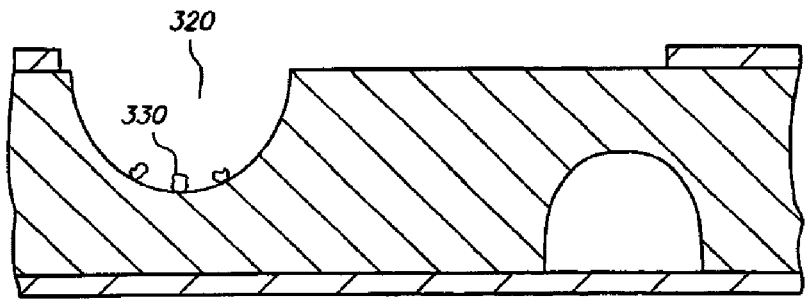
Figure 8F:
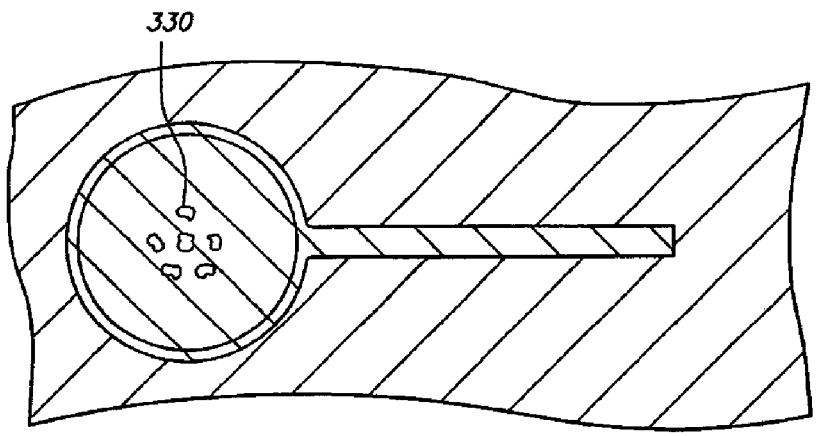
Figure 9F:
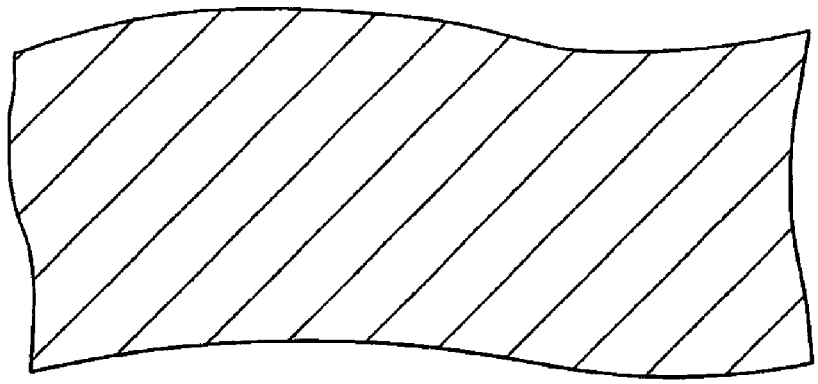
Figure 7G:
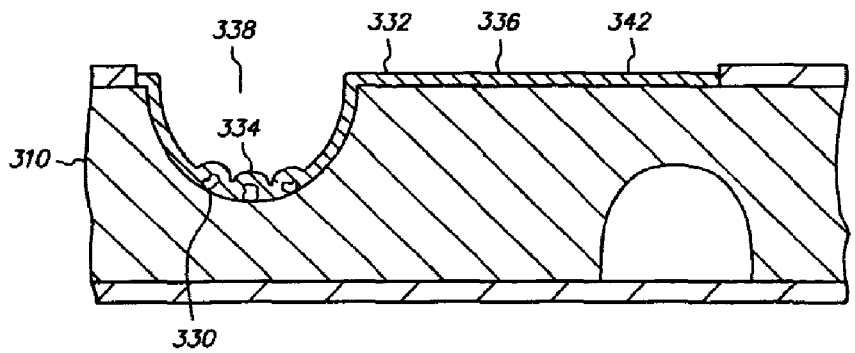
Figure 8G:
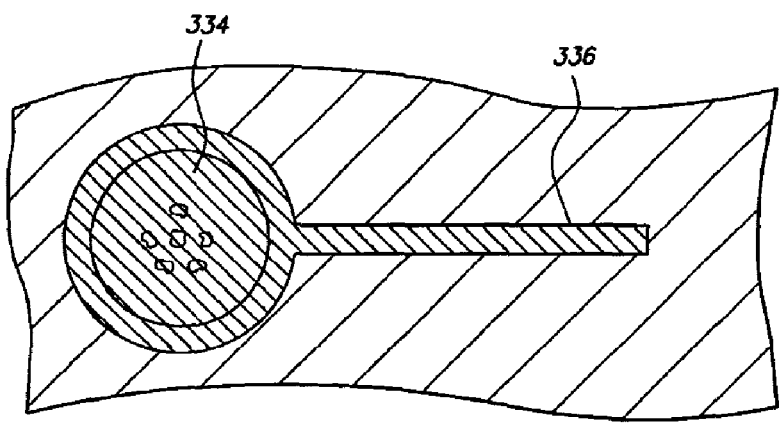
Figure 9G:
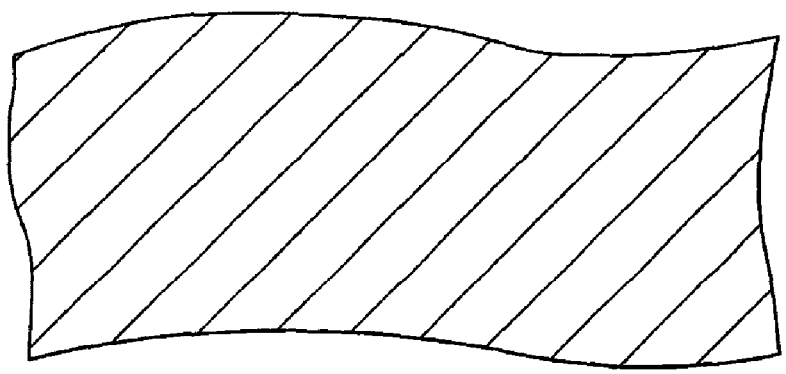
Figure 7H:
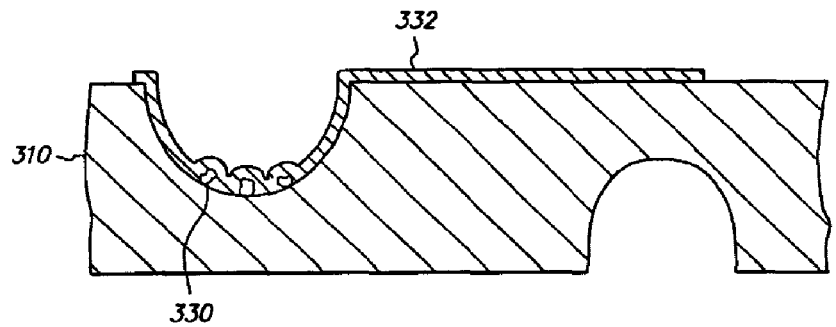
Figure 8H:
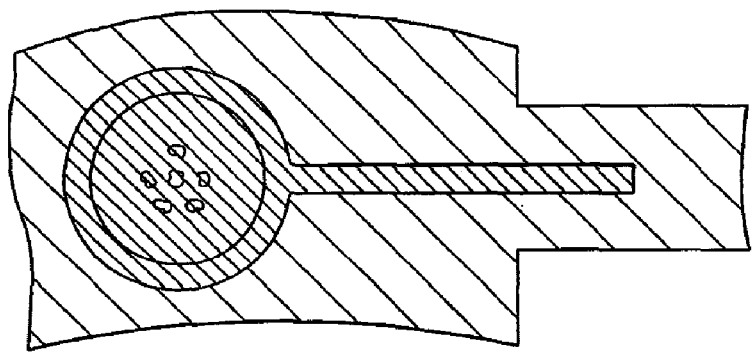
Figure 9H:
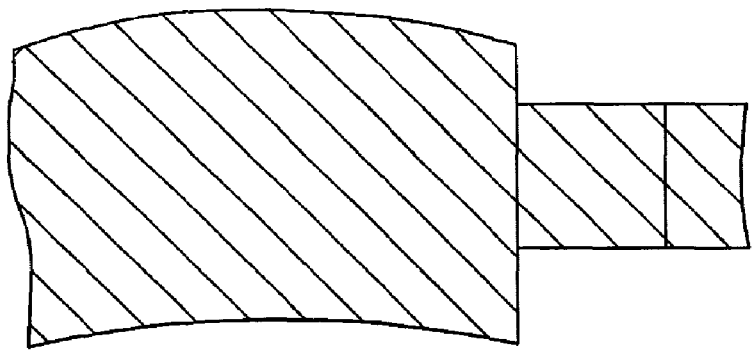
Figure 7I:
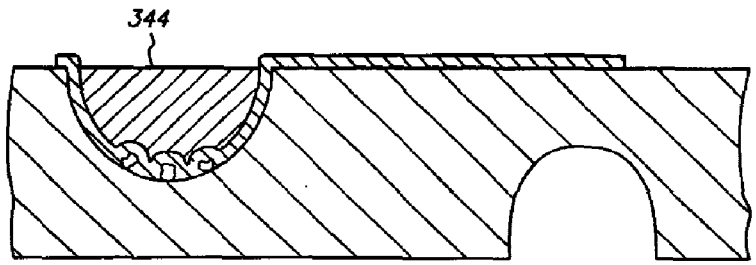
Figure 8I:
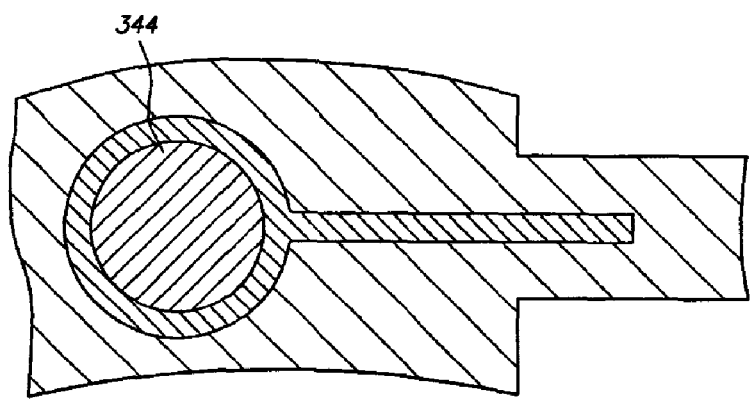
Figure 9I:
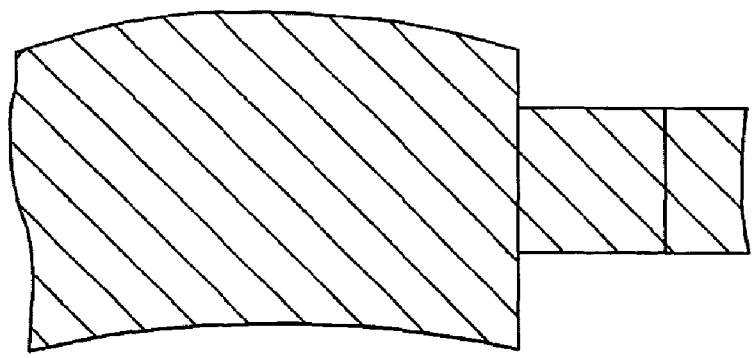
Figure 7J:
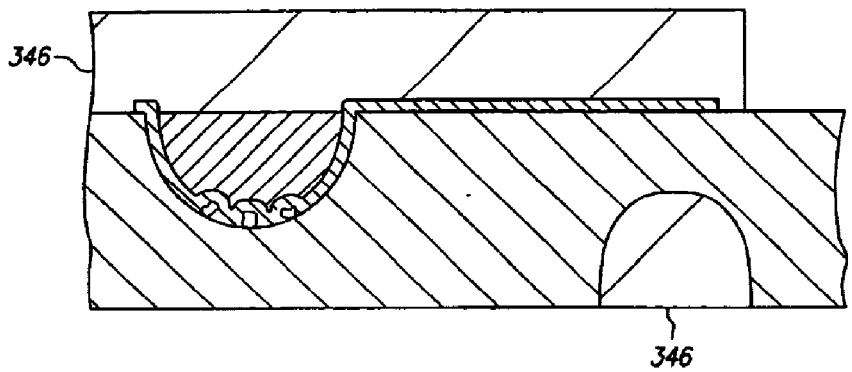
Figure 8J:
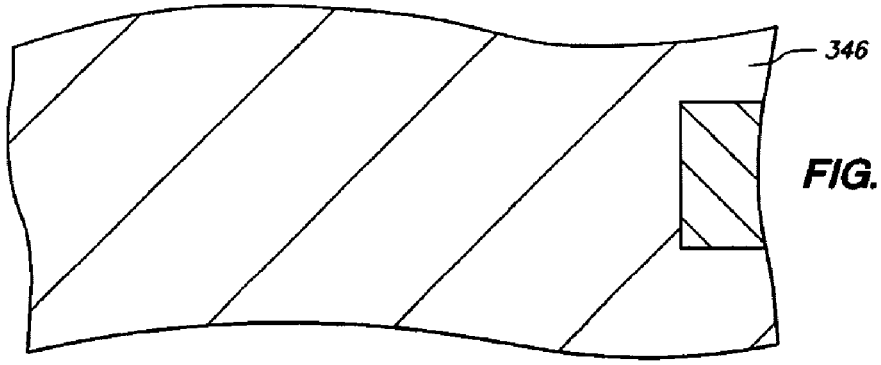
Figure 9J:
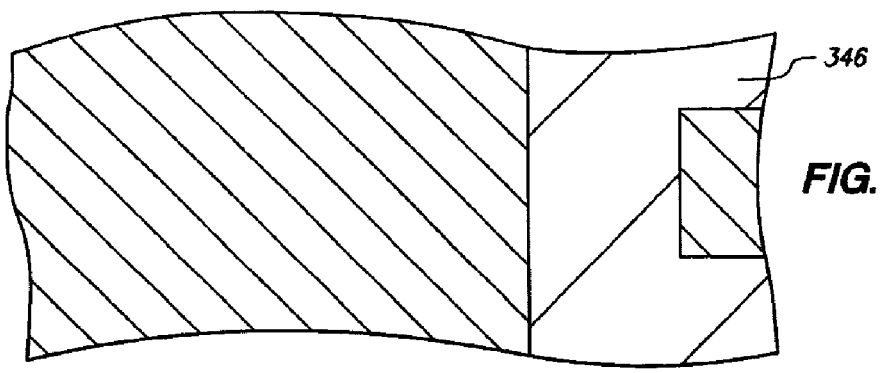
Figure 7K:
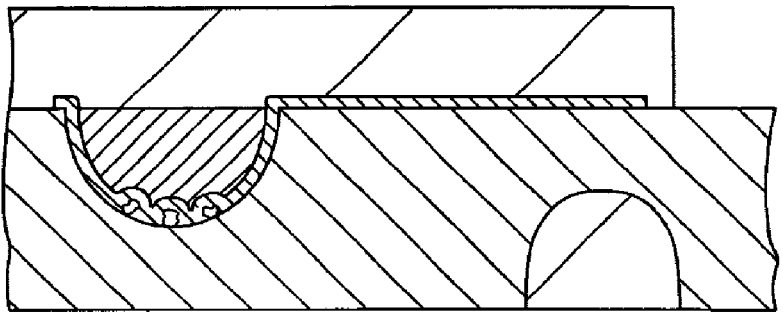
Figure 8K:
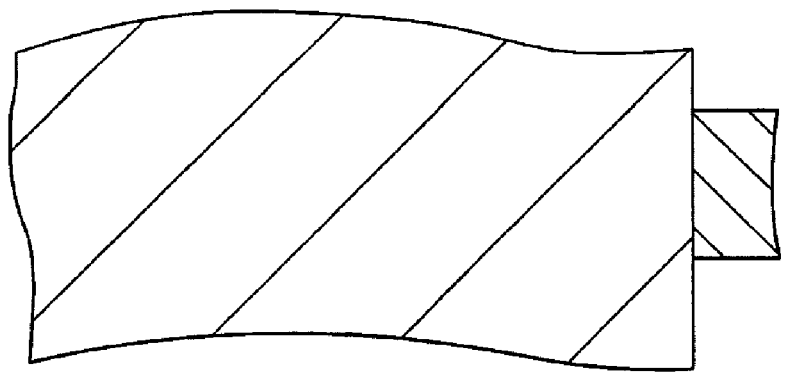
Figure 9K:
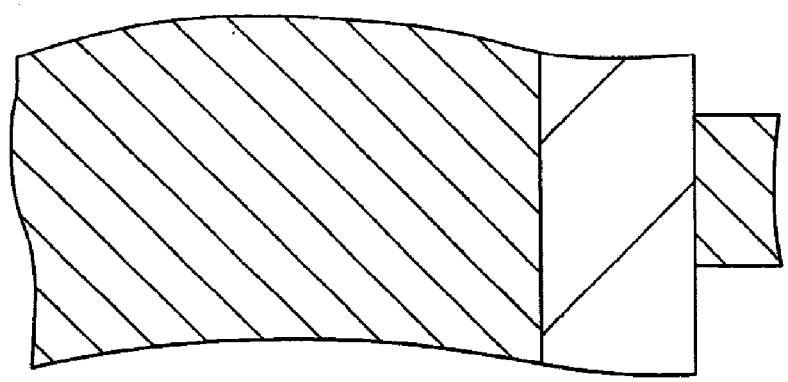
Figure 7L:
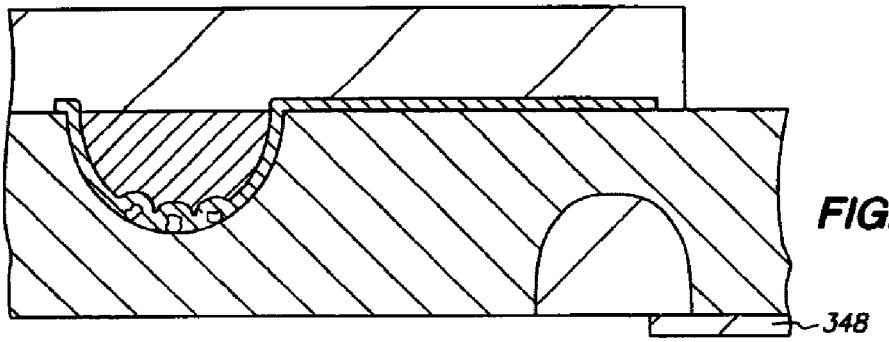
Figure 8L:
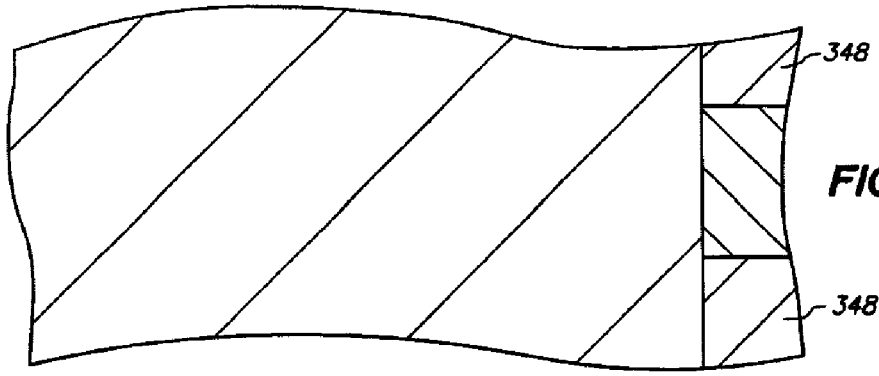
Figure 9L:
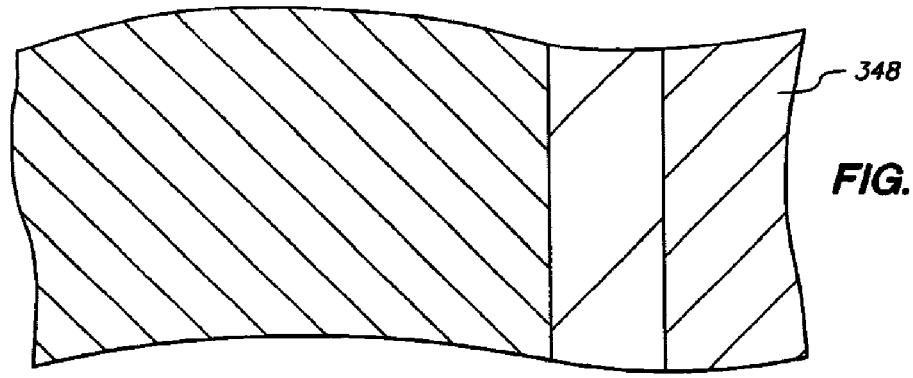
Figure 7M:
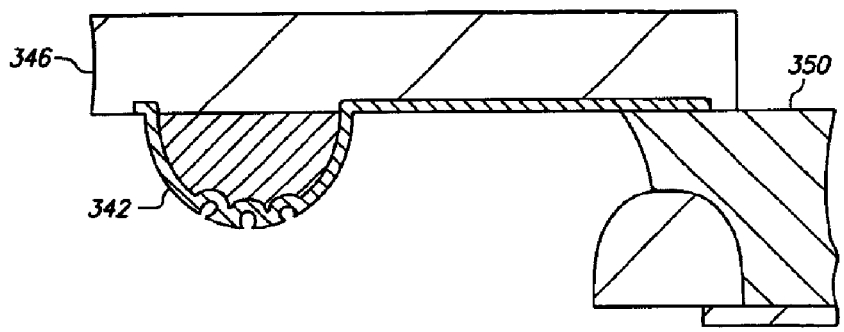
Figure 8M:
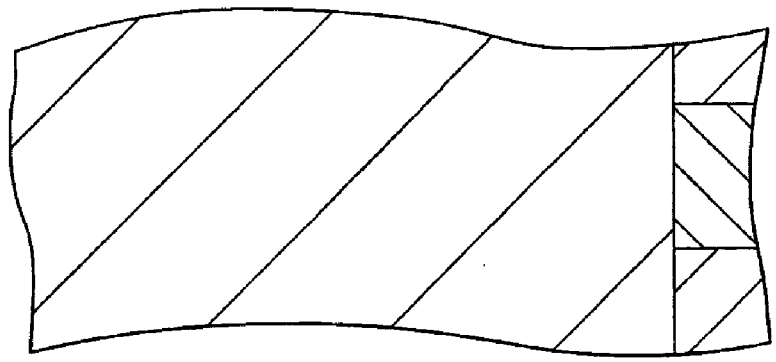
Figure 9M:
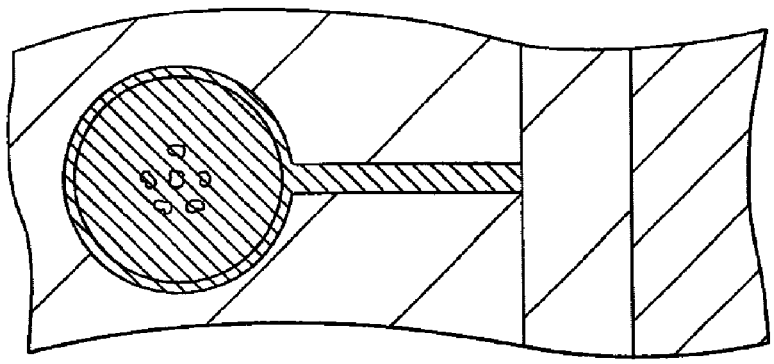
Figure 7N:
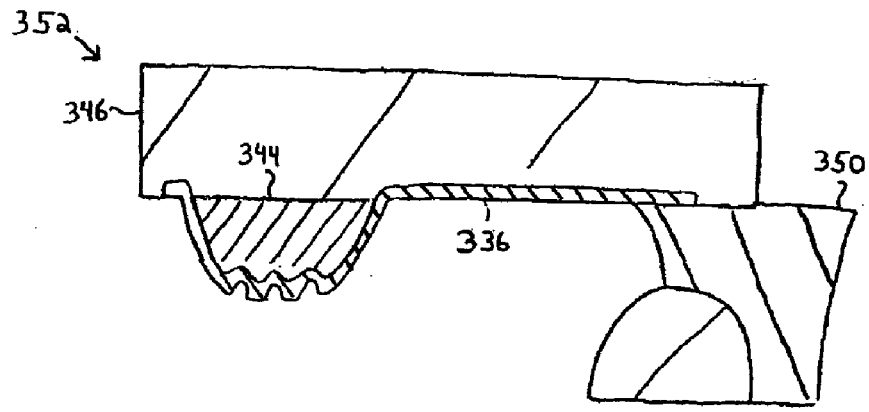
Figure 8N:
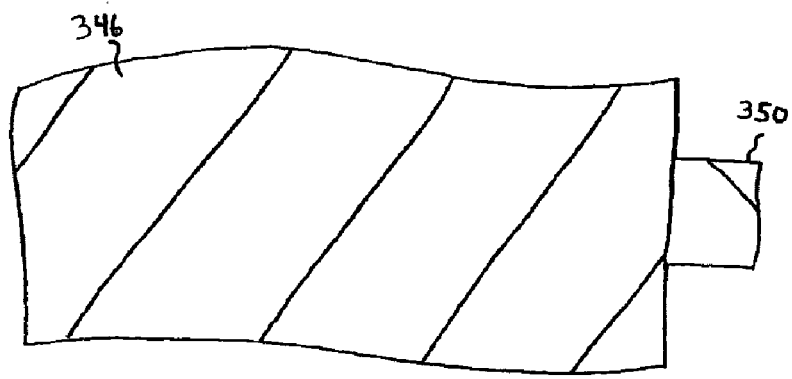
Figure 9N:
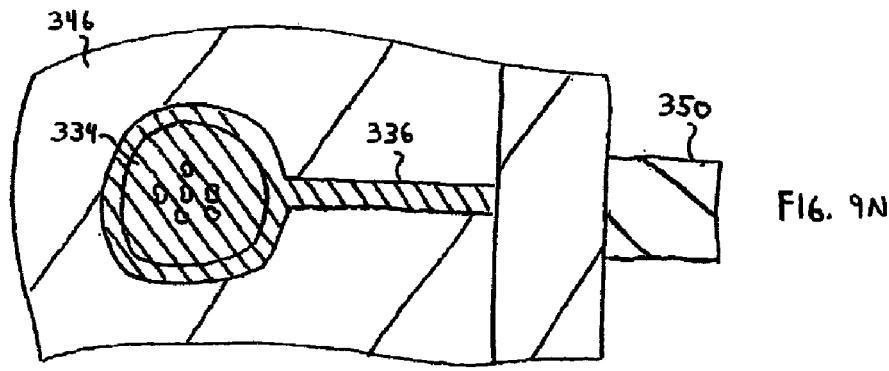
Figure 10A:
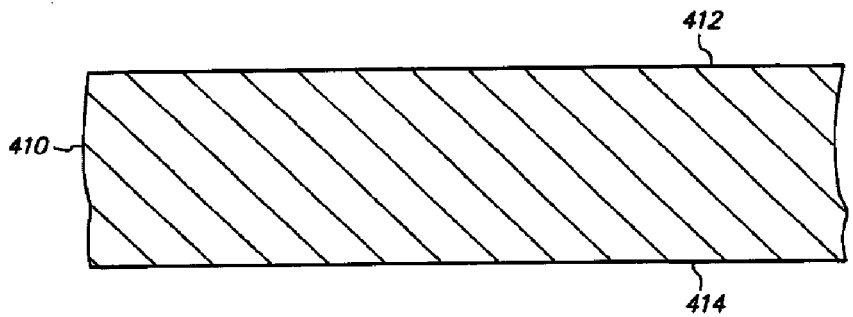
Figure 11A:
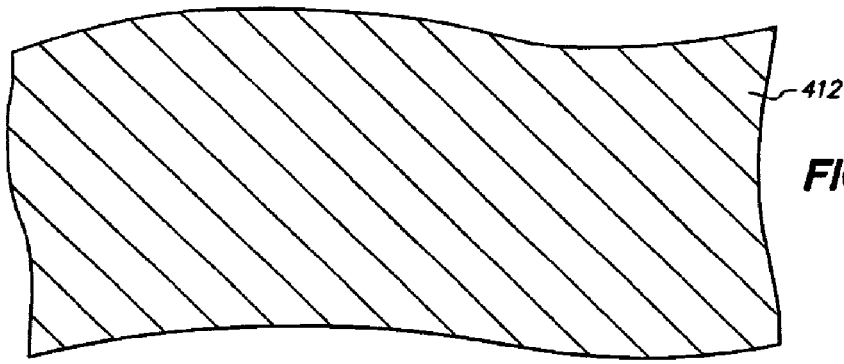
Figure 12A:
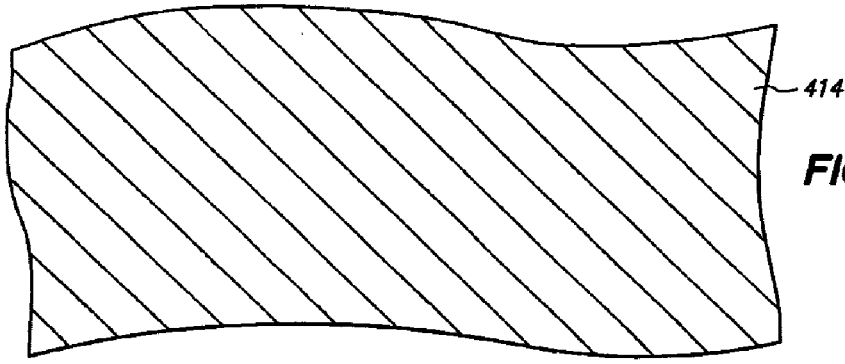
Figure 10B:
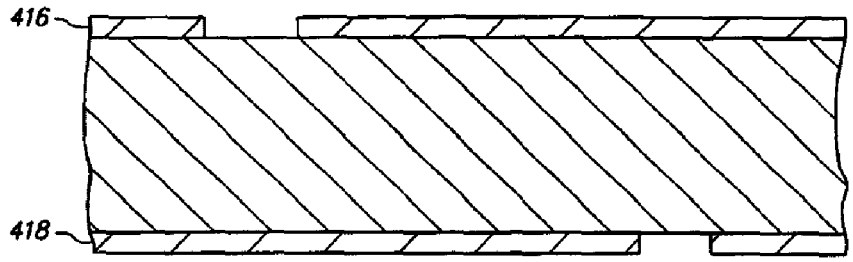
Figure 11B:
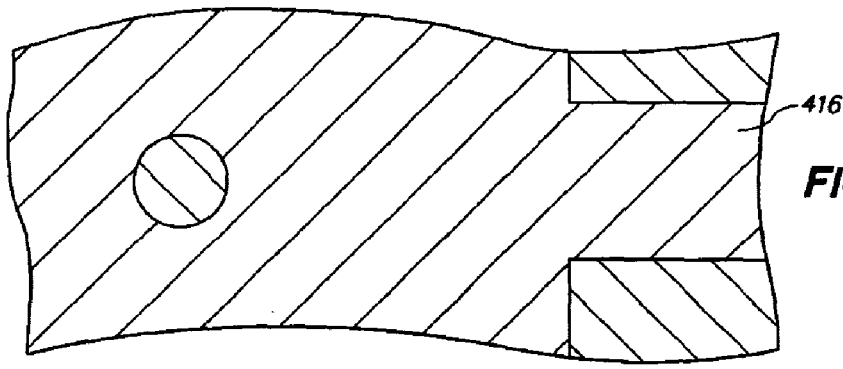
Figure 12B:
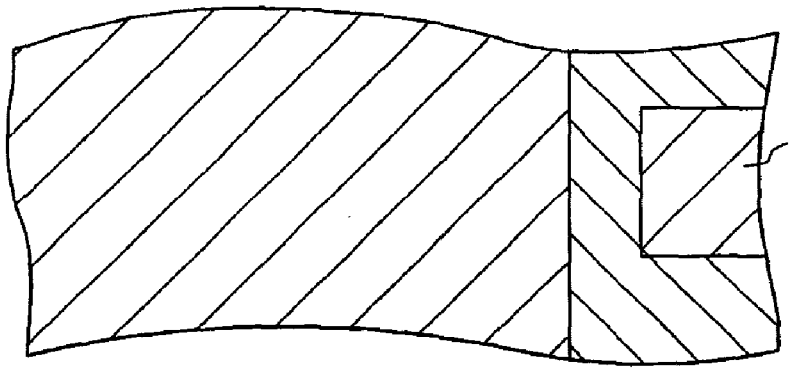
Figure 10C:
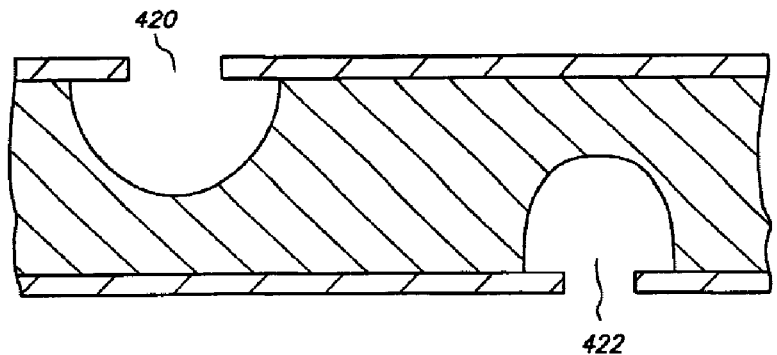
Figure 11C:
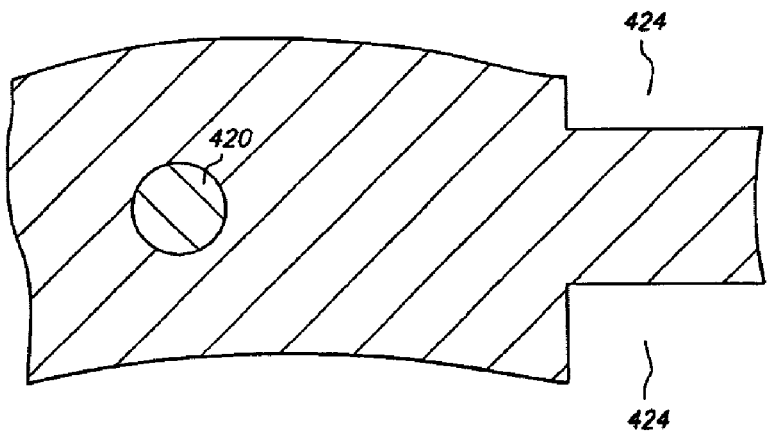
Figure 12C:
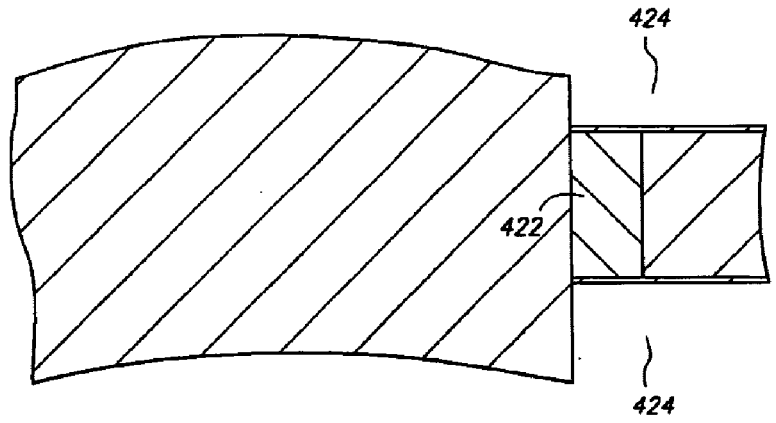
Figure 10D:
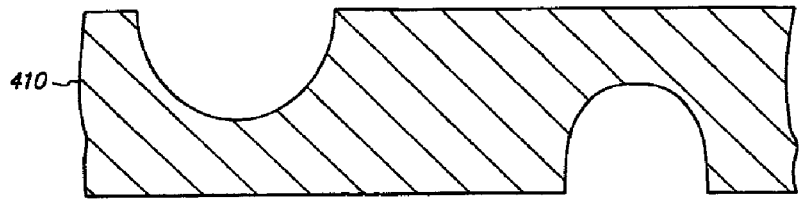
Figure 11D:
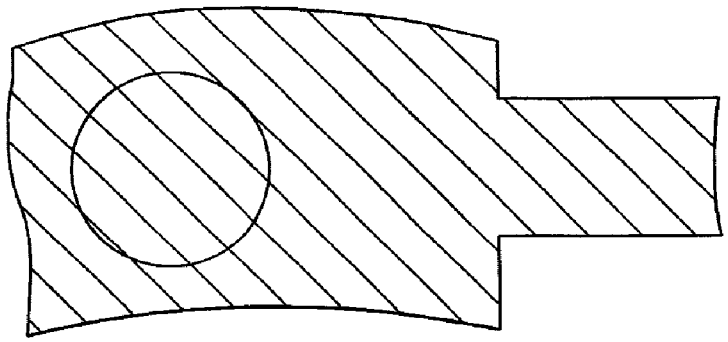
Figure 12D:
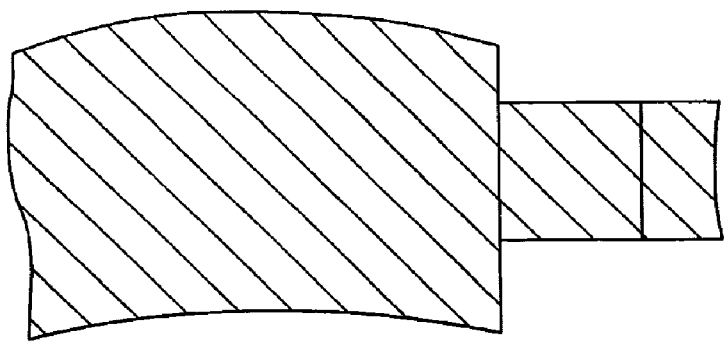
Figure 10E:
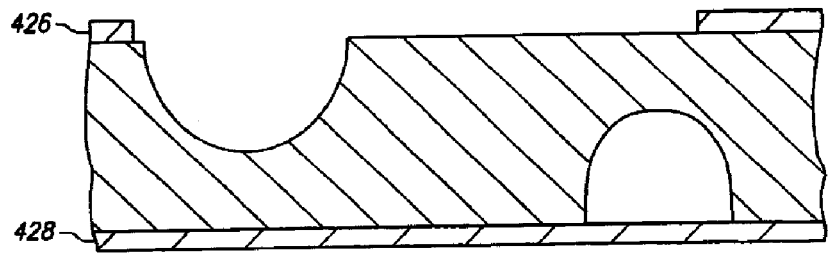
Figure 11E:
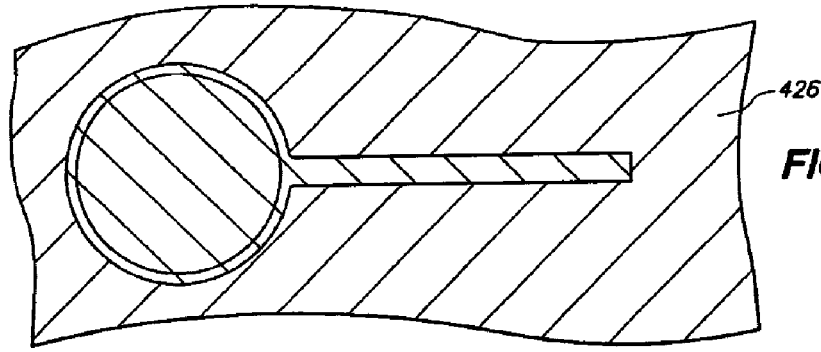
Figure 12E:
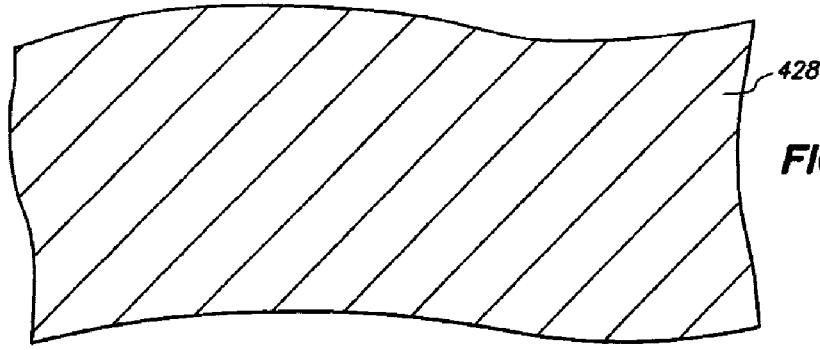
Figure 10F:
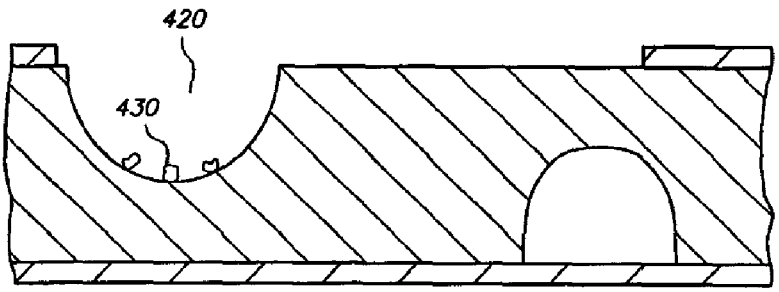
Figure 11F:
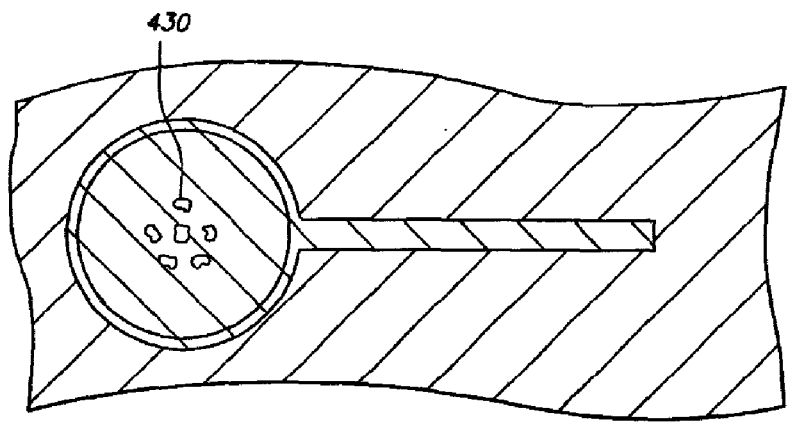
Figure 12F:
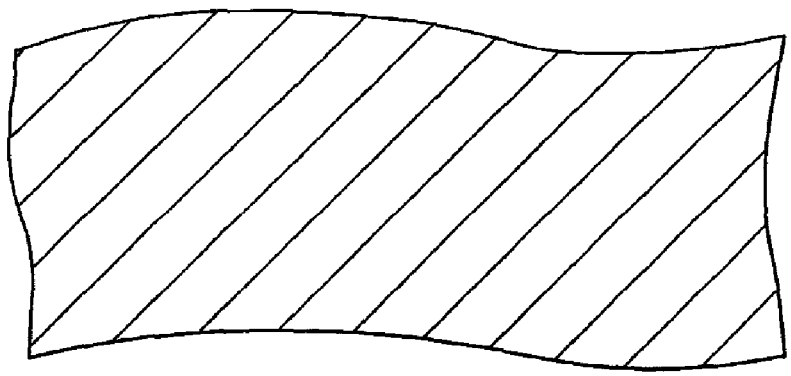
Figure 10G:
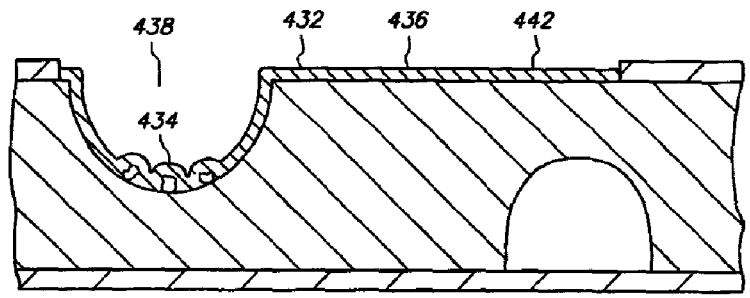
Figure 11G:
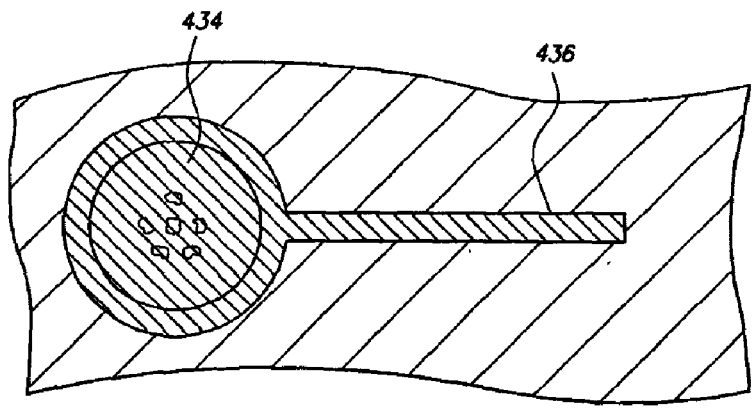
Figure 12G:
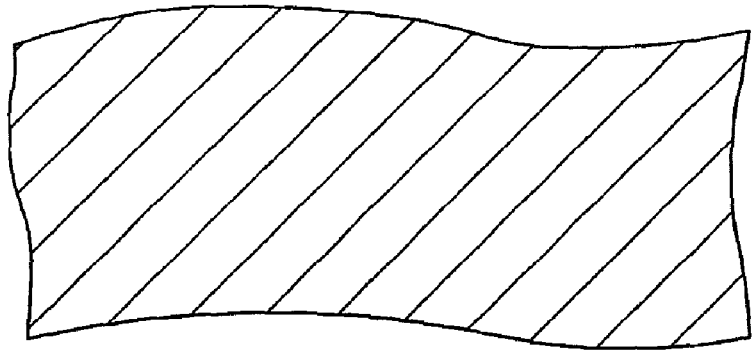
Figure 10H:
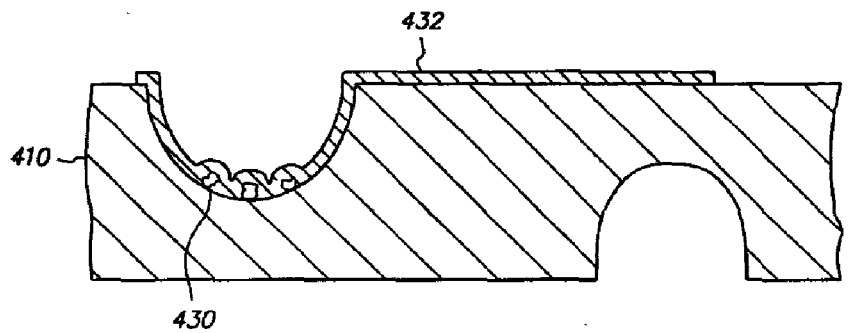
Figure 11H:
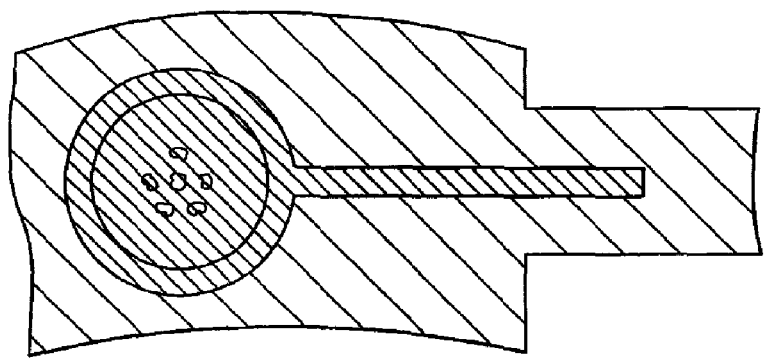
Figure 12H:
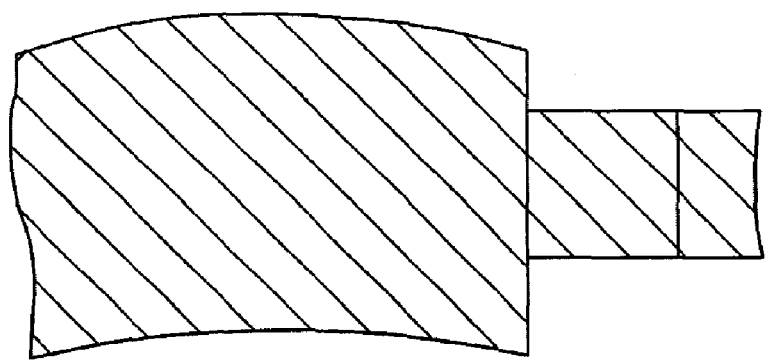
Figure 10I:
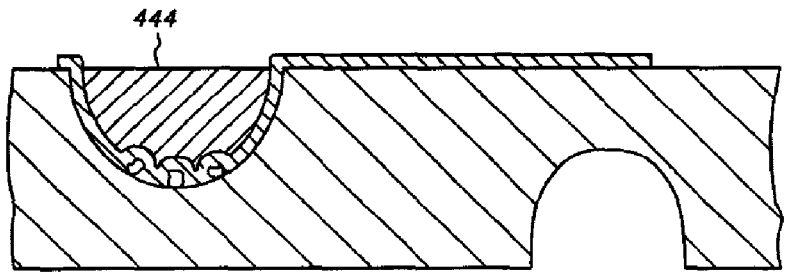
Figure 11I:
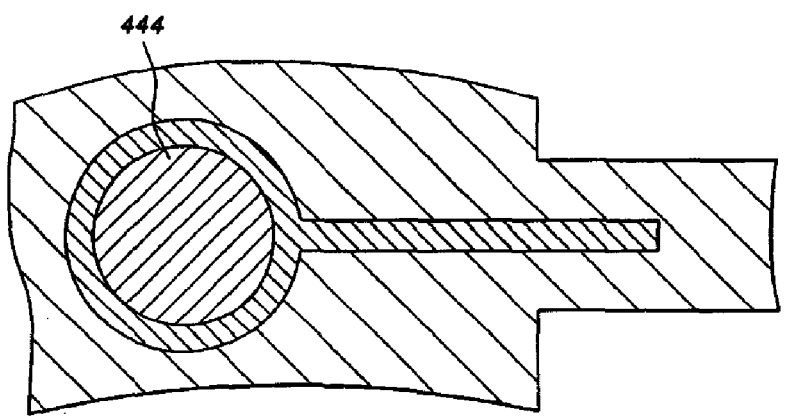
Figure 12I:
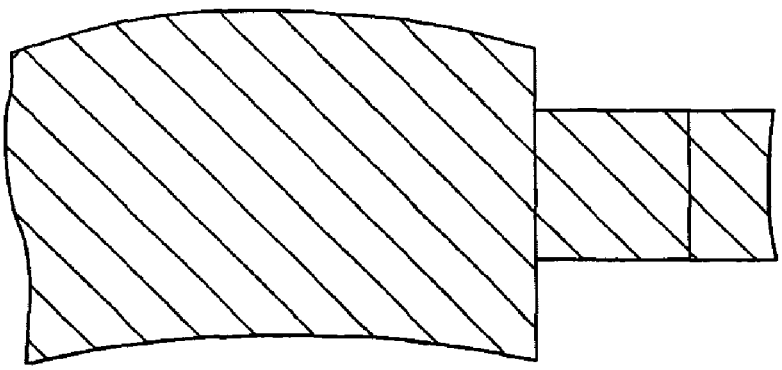
Figure 10J:
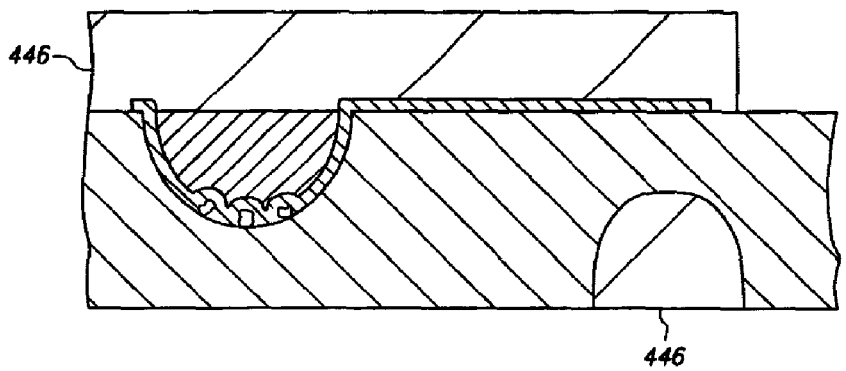
Figure 11J:
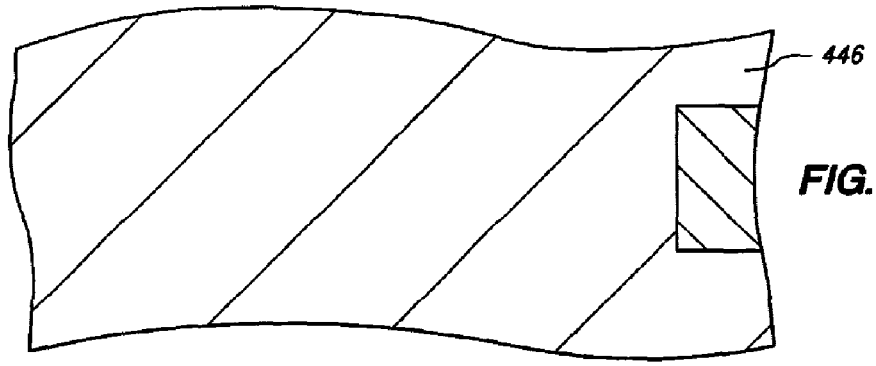
Figure 12J:
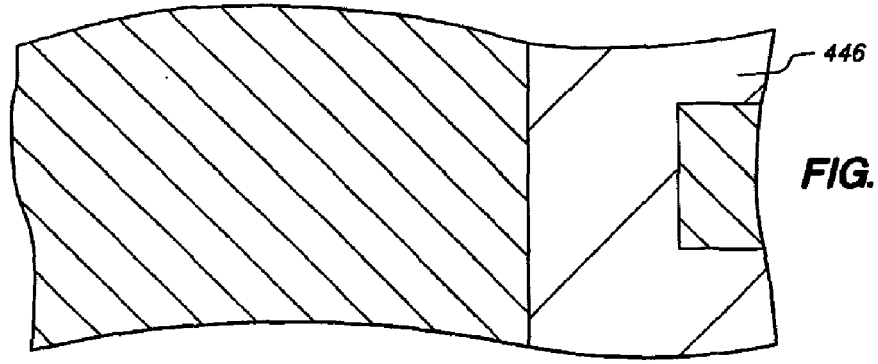
Figure 10K:
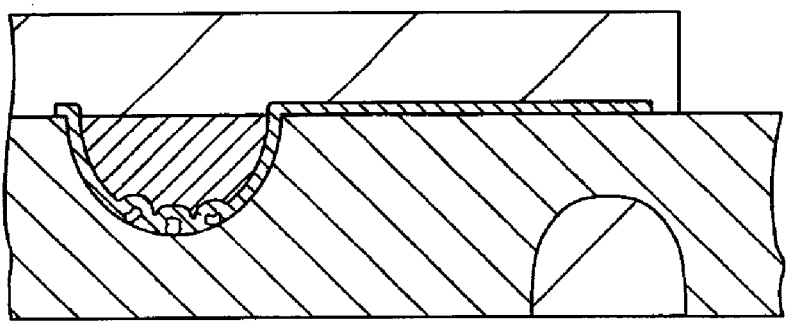
Figure 11K:
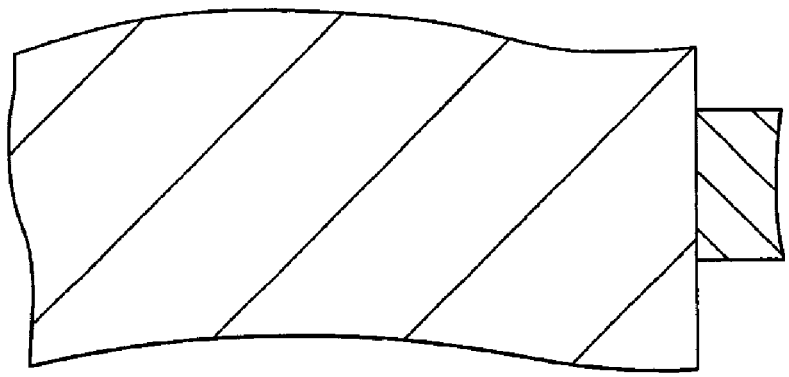
Figure 12K:
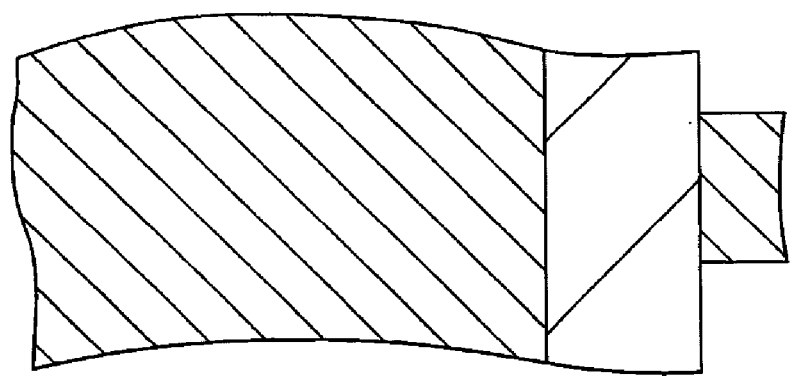
Figure 10L:
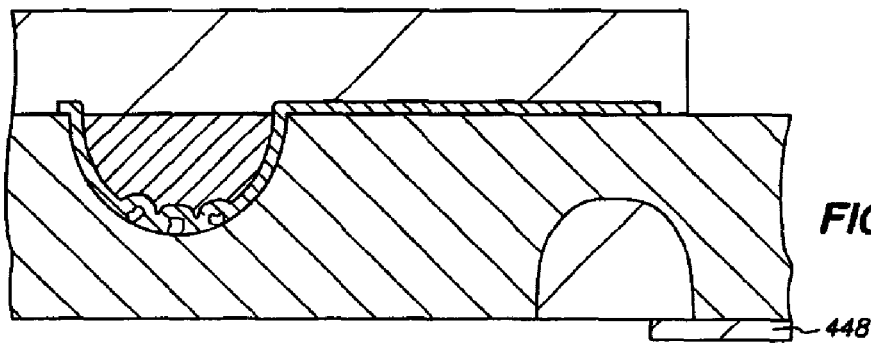
Figure 11L:
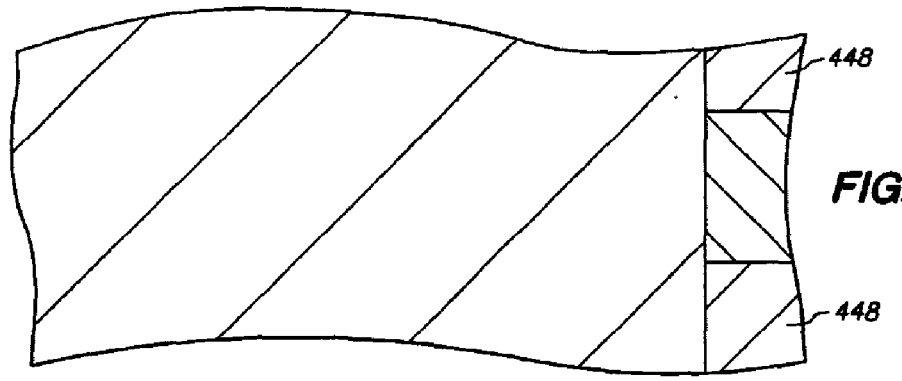
Figure 12L:
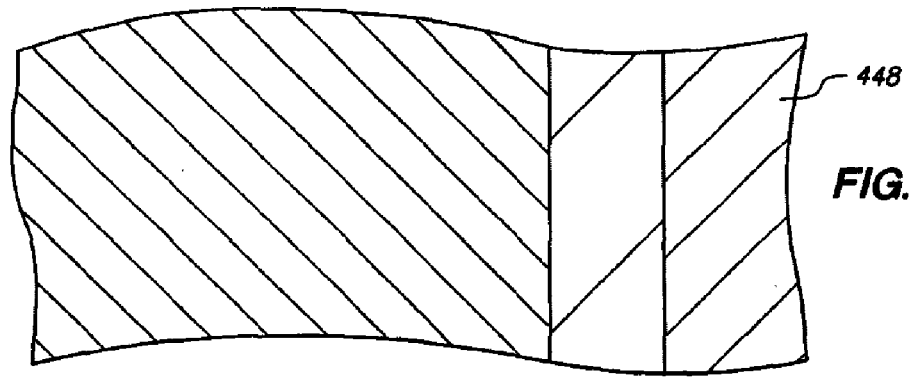
Figure 10M:
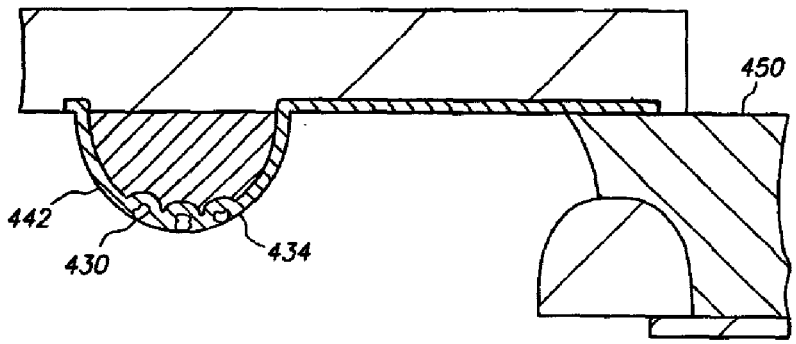
Figure 11M:
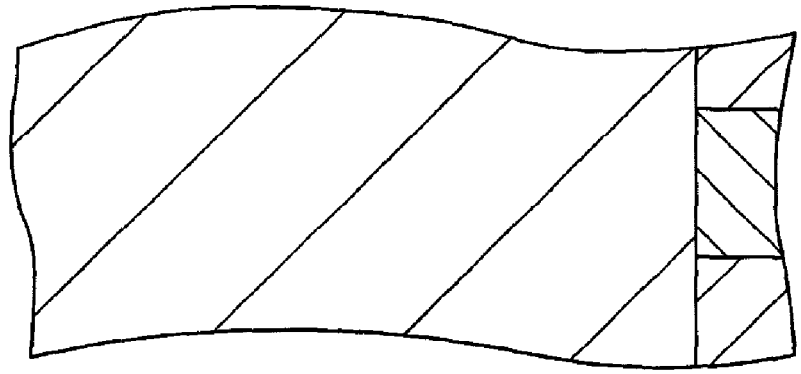
Figure 12M:
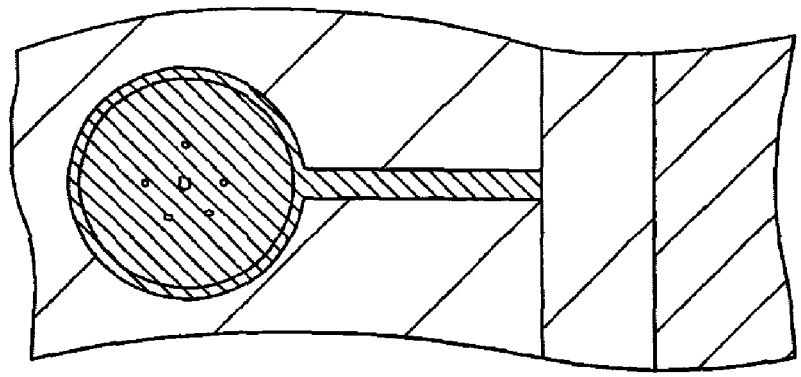
Figure 10N:
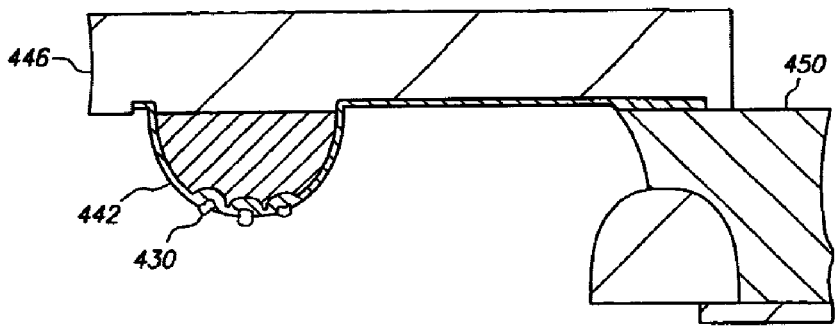
Figure 11N:
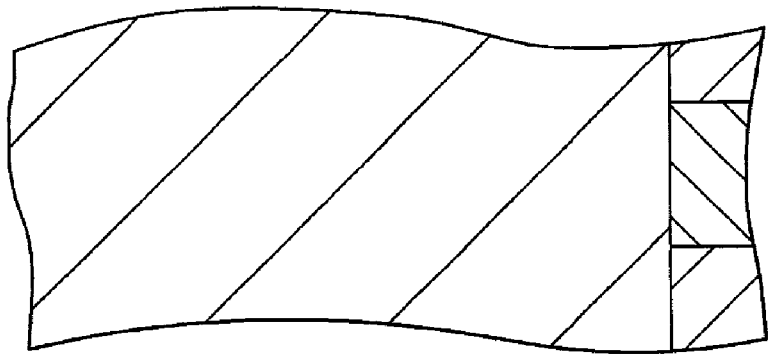
Figure 12N:
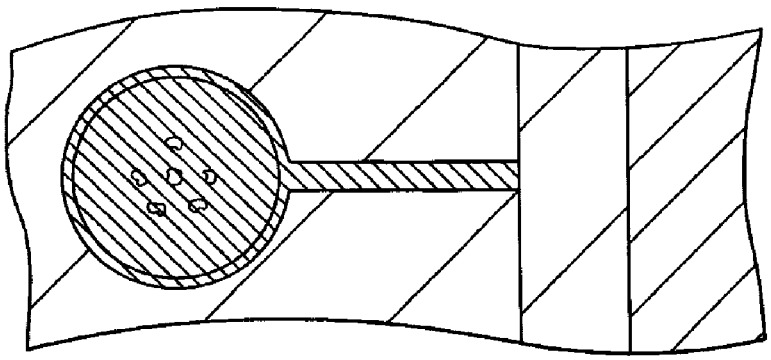
Figure 10O:
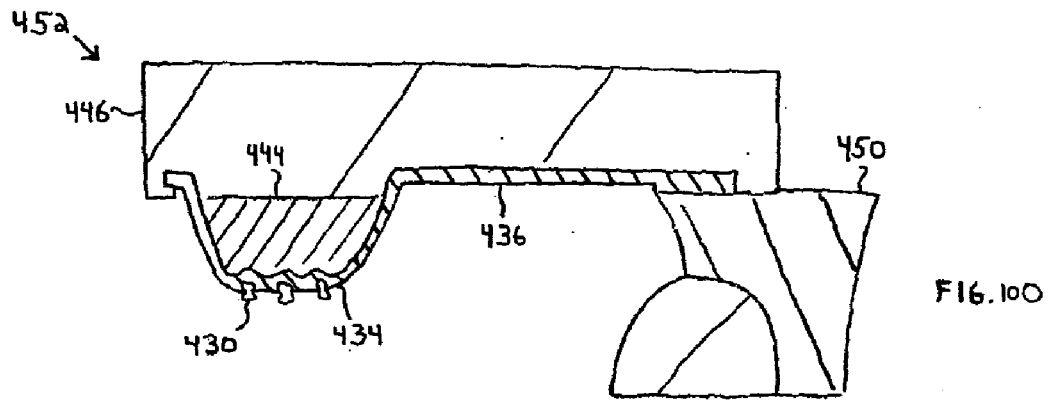
Figure 11O:
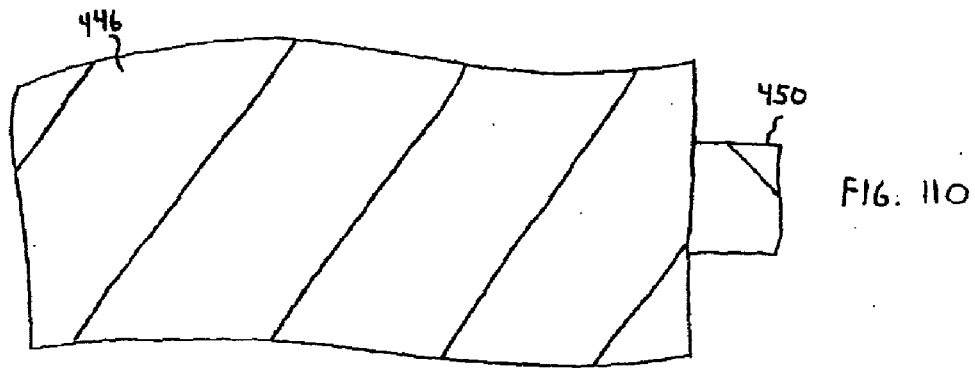
Figure 12O:
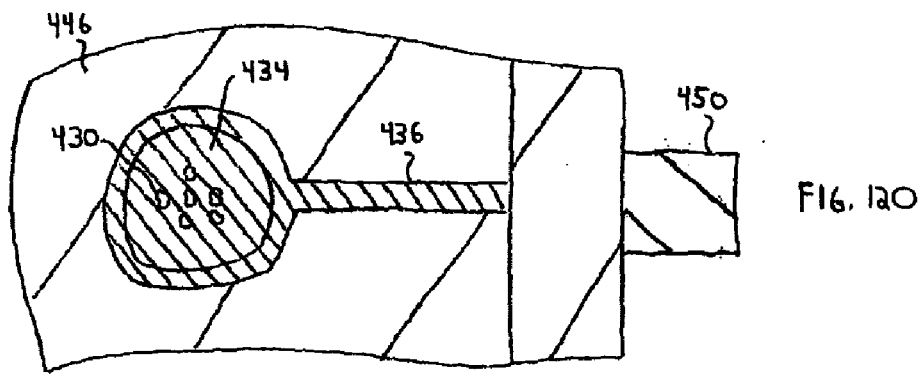
Figure 13A:
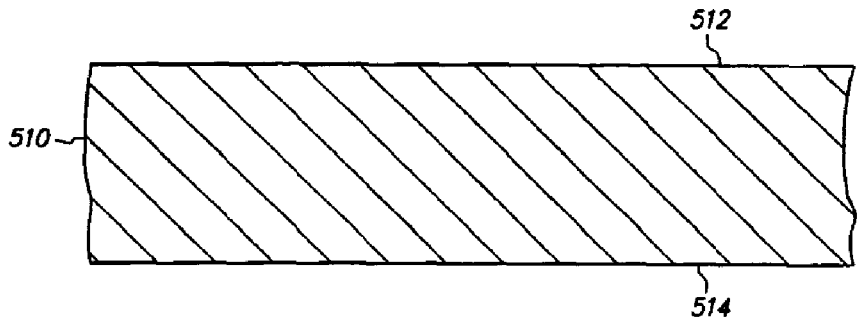
Figure 14A:
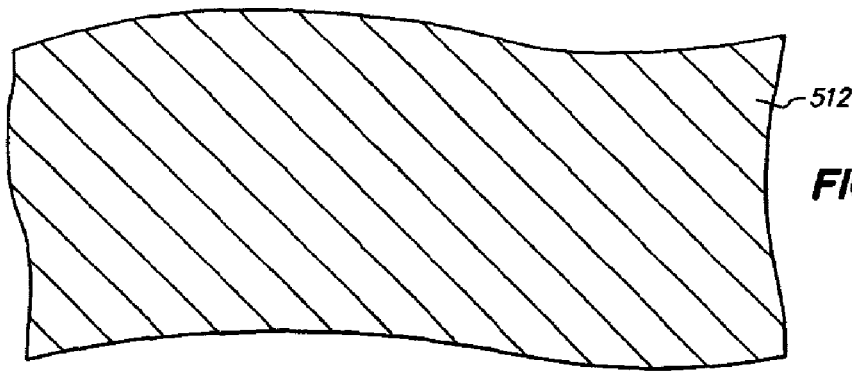
Figure 15A:
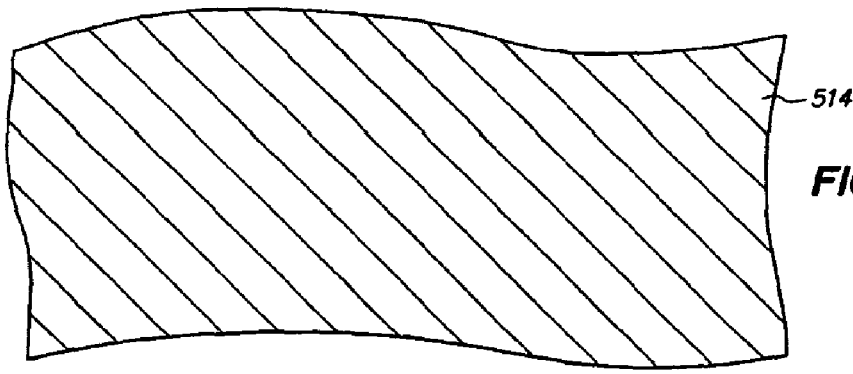
Figure 13B:
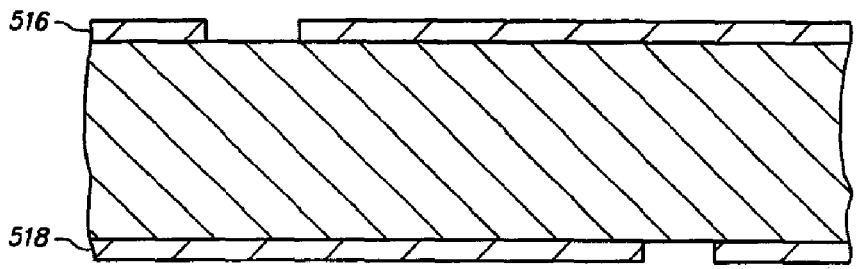
Figure 14B:
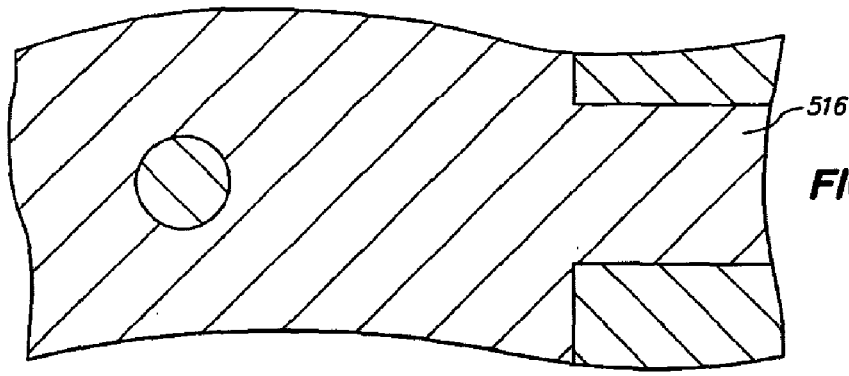
Figure 15B:
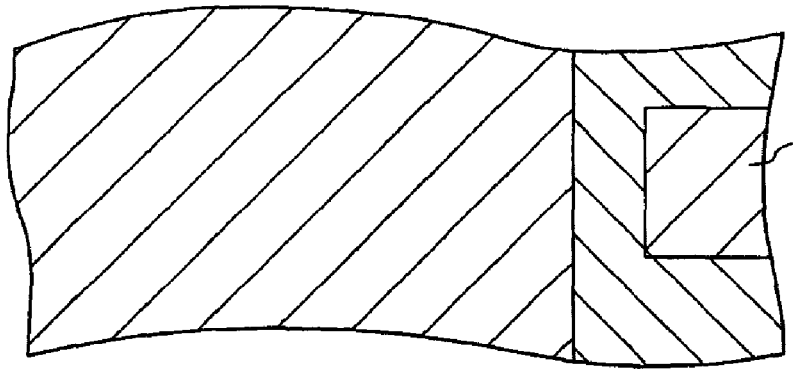
Figure 13C:
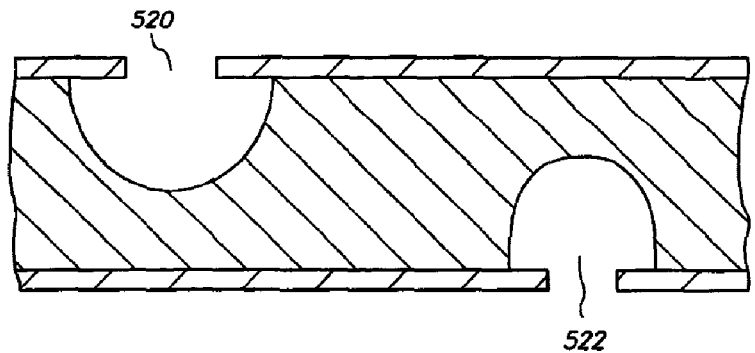
Figure 14C:
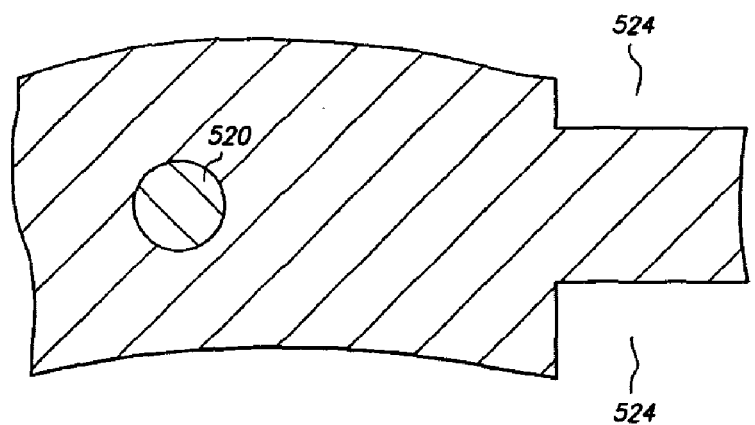
Figure 15C:
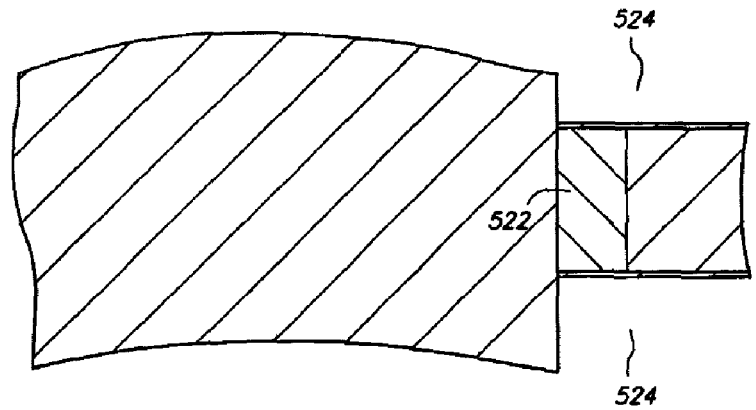
Figure 13D:
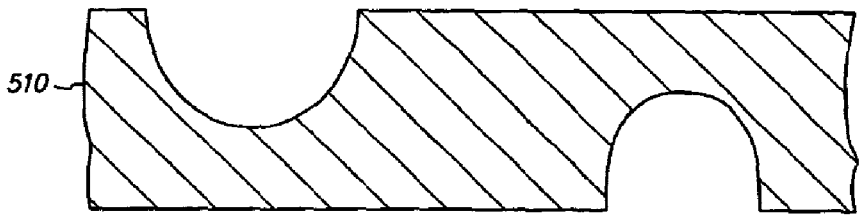
Figure 14D:
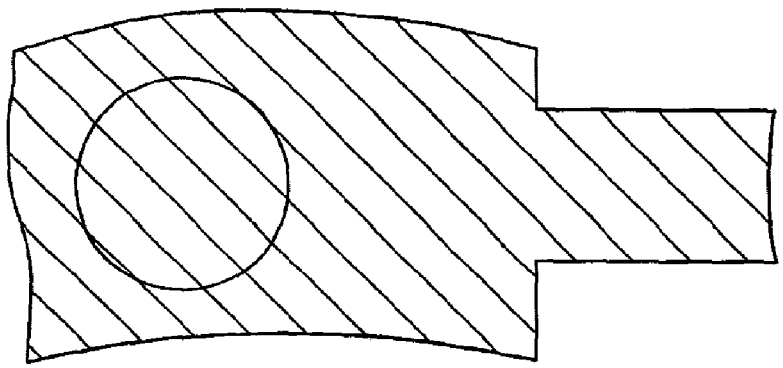
Figure 15D:
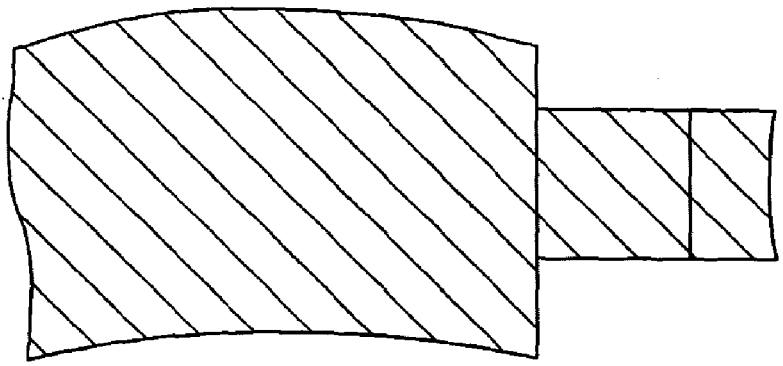
Figure 13E:
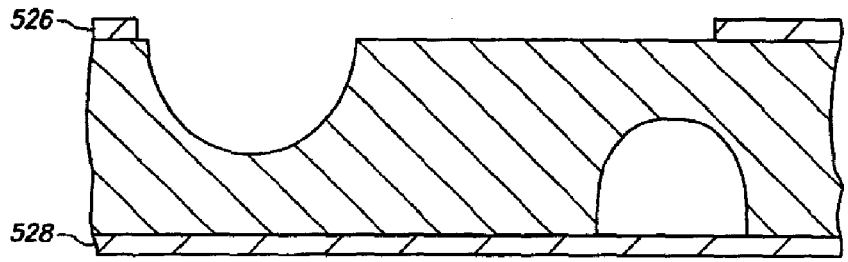
Figure 14E:
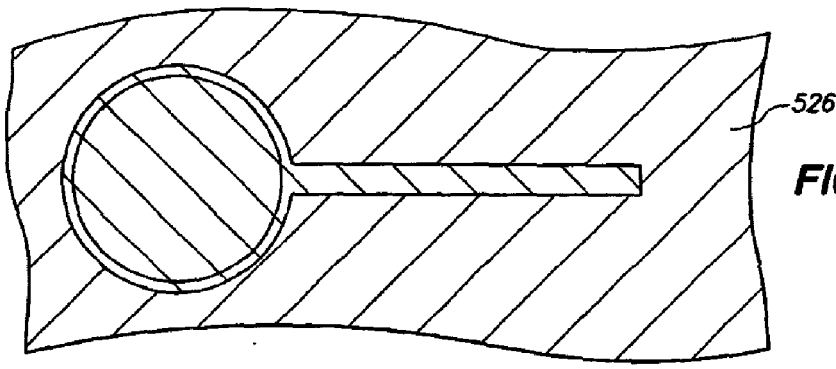
Figure 15E:
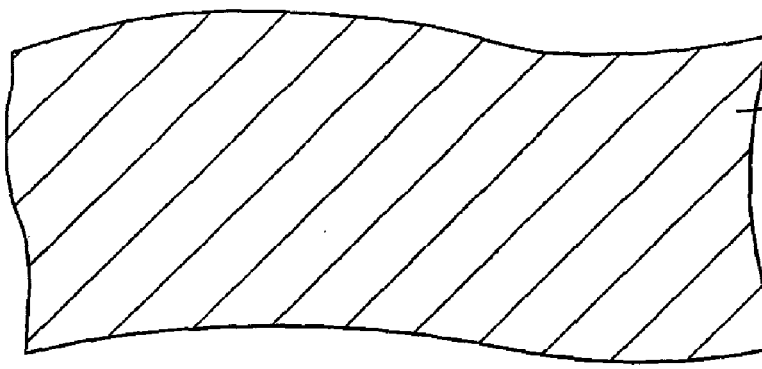
Figure 13F:
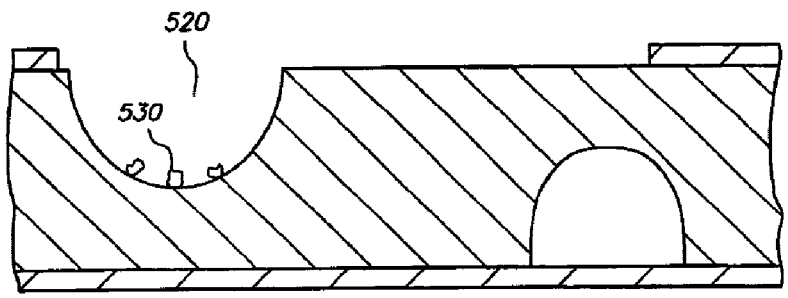
Figure 14F:
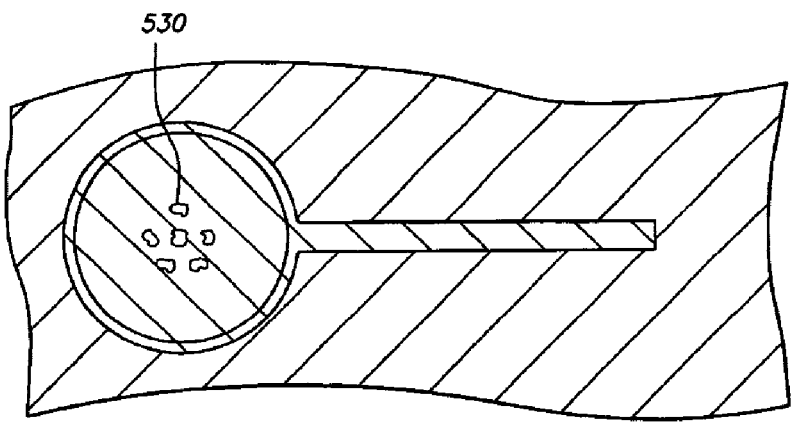
Figure 15F:
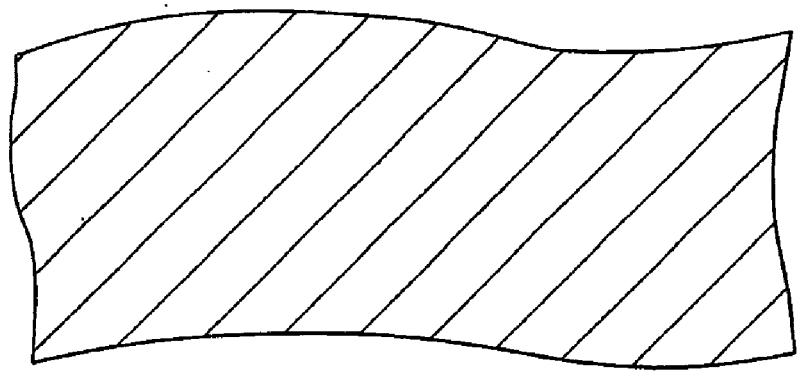
Figure 13G:
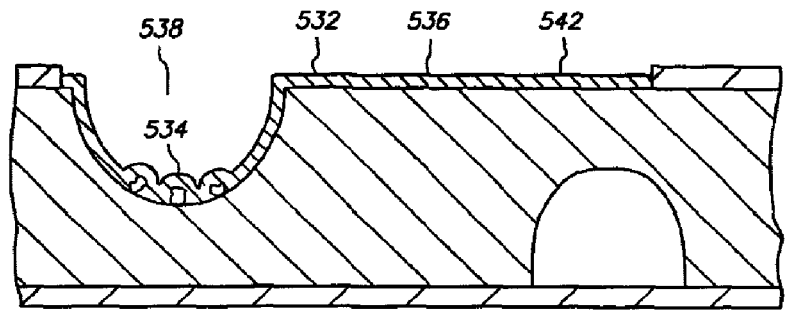
Figure 14G:
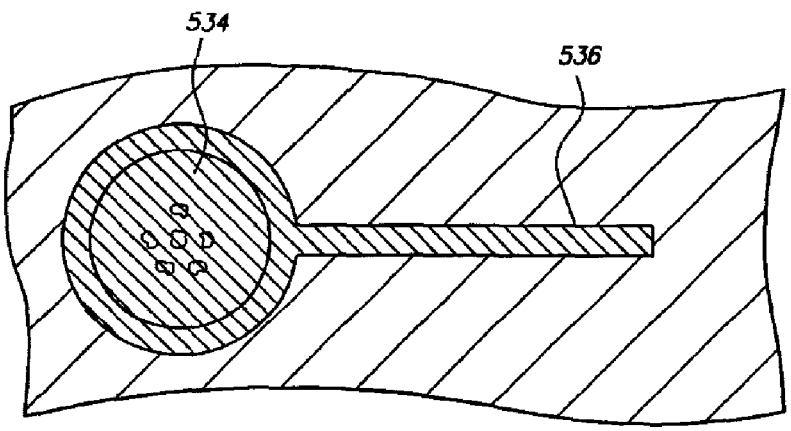
Figure 15G:
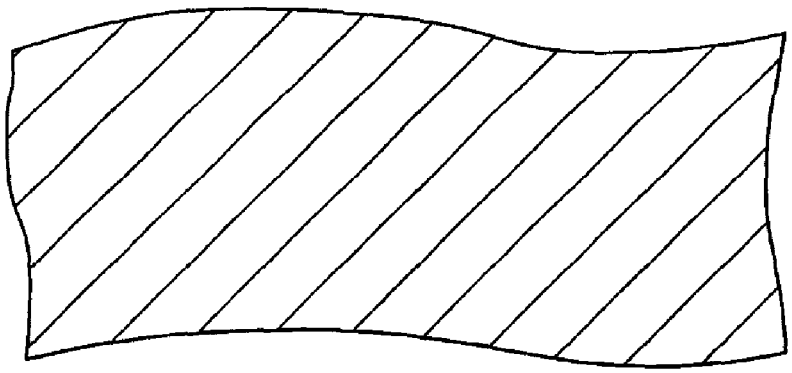
Figure 13H:
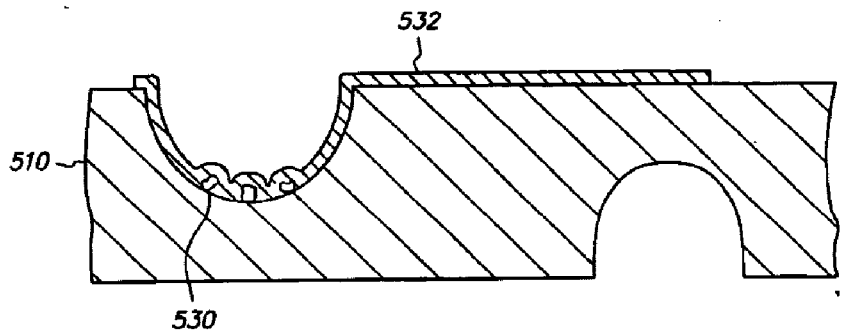
Figure 14H:
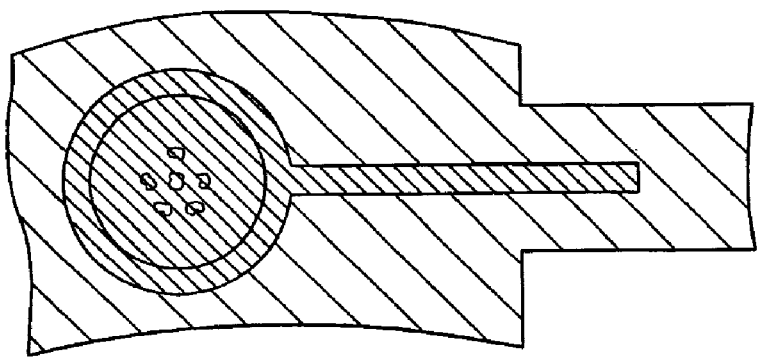
Figure 15H:
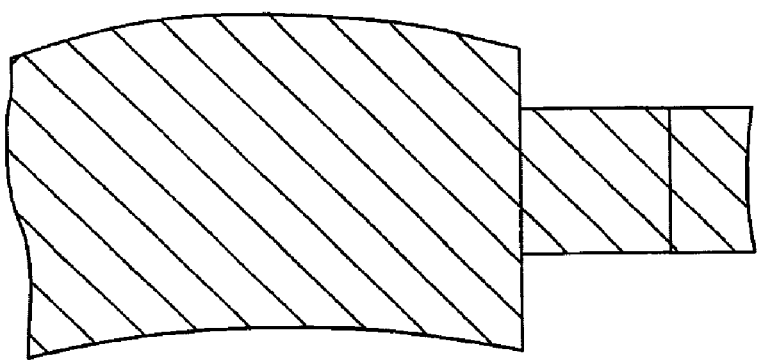
Figure 13I:
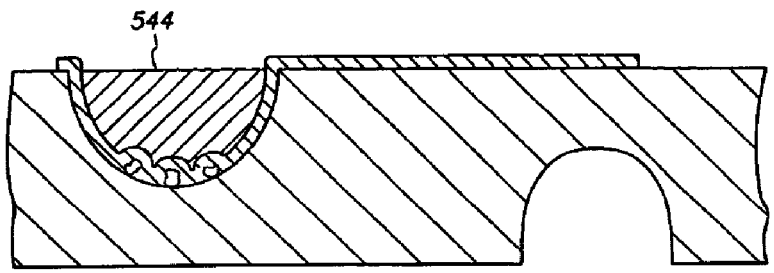
Figure 14I:
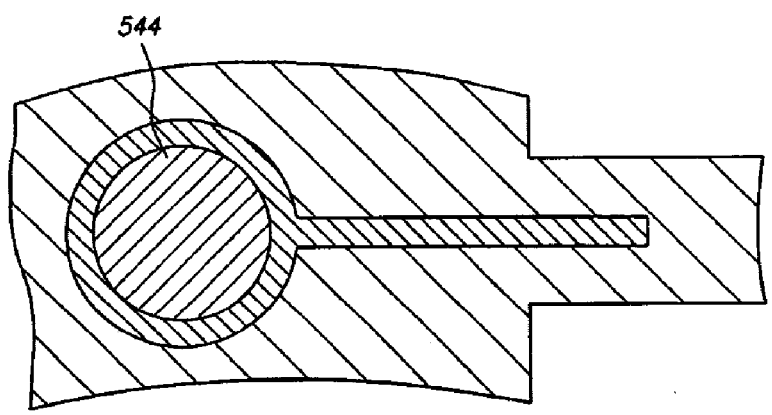
Figure 15I:
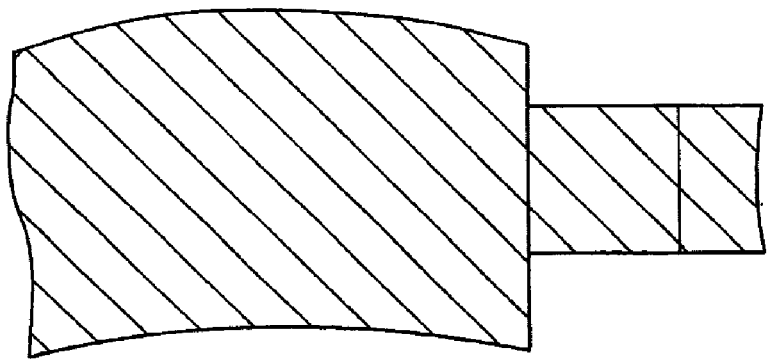
Figure 13J:
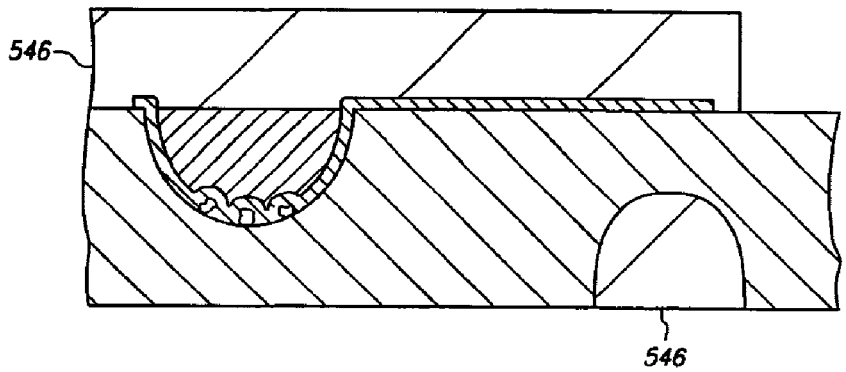
Figure 14J:
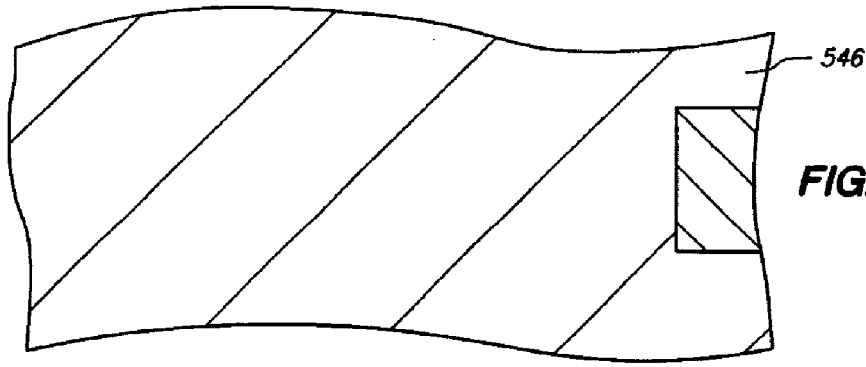
Figure 15J:
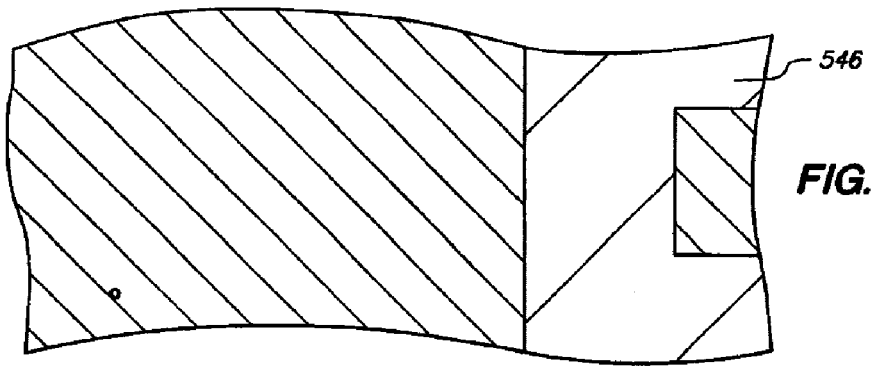
Figure 13K:
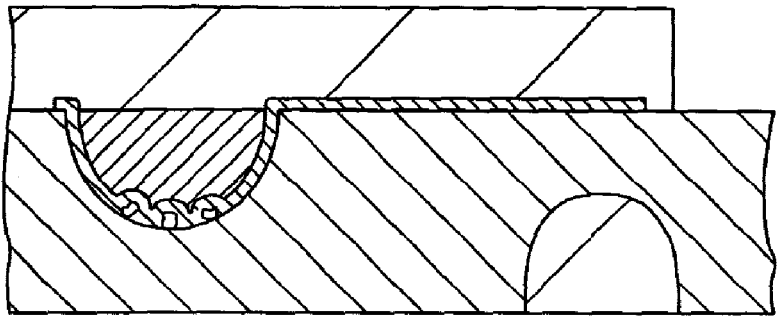
Figure 14K:
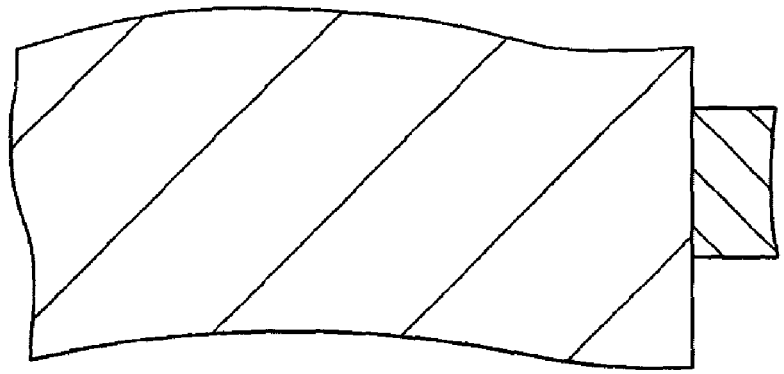
Figure 15K:
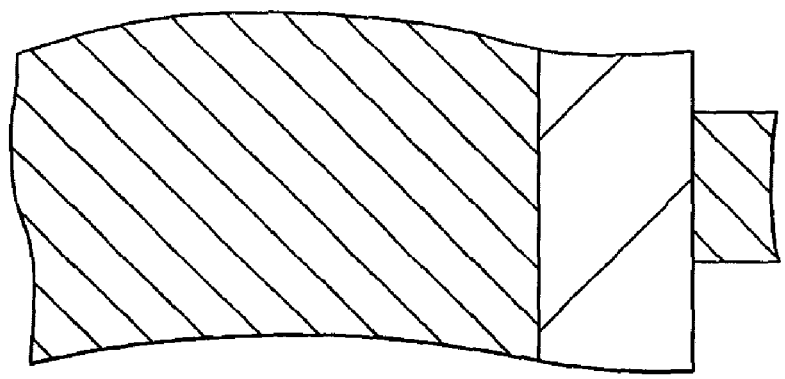
Figure 13L:
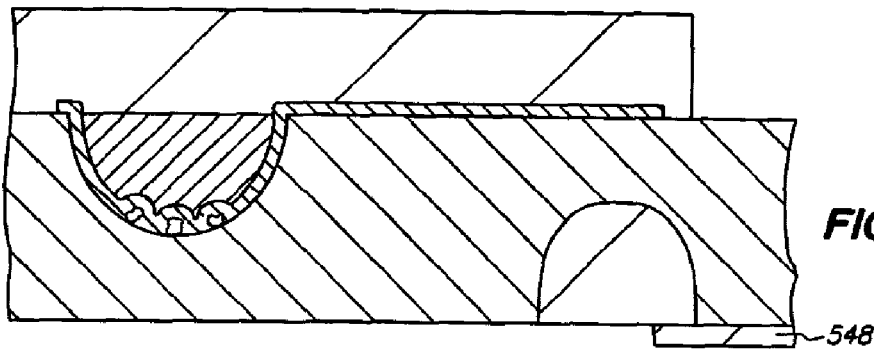
Figure 14L:
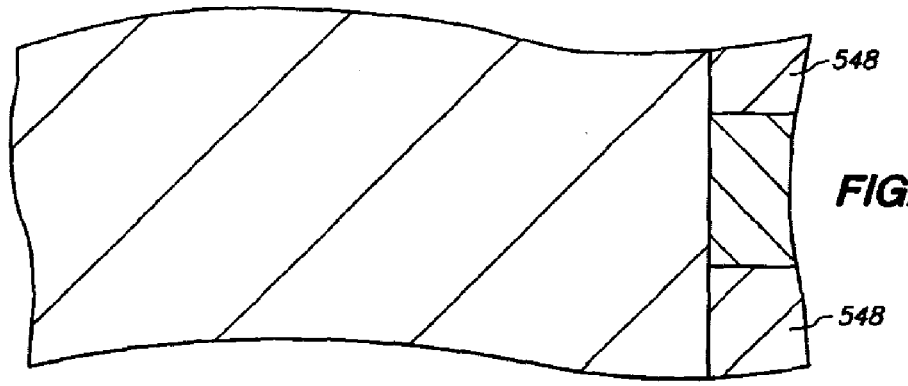
Figure 15L:
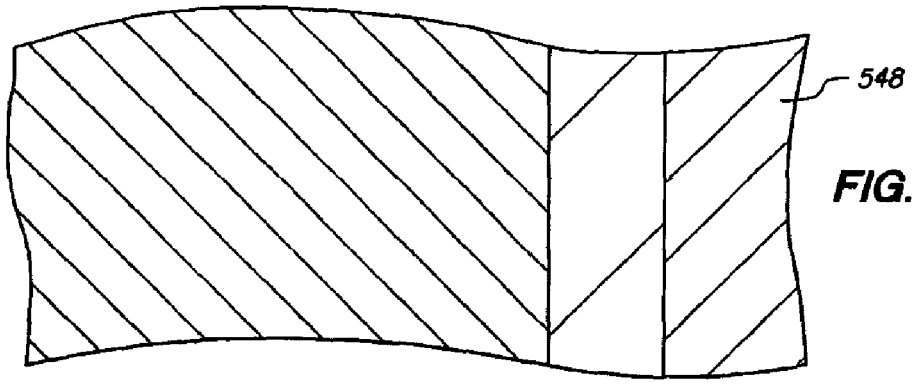
Figure 13M:
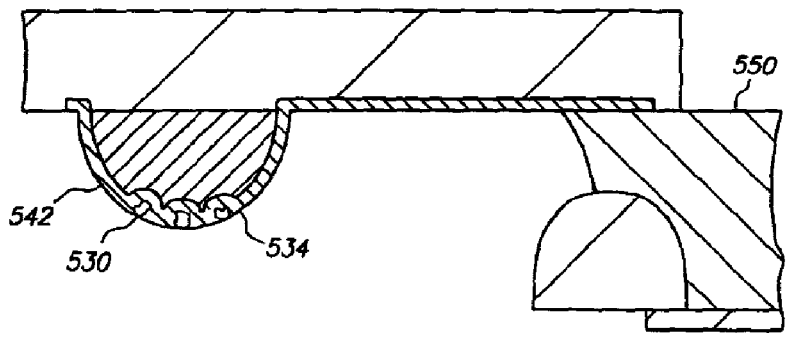
Figure 14M:
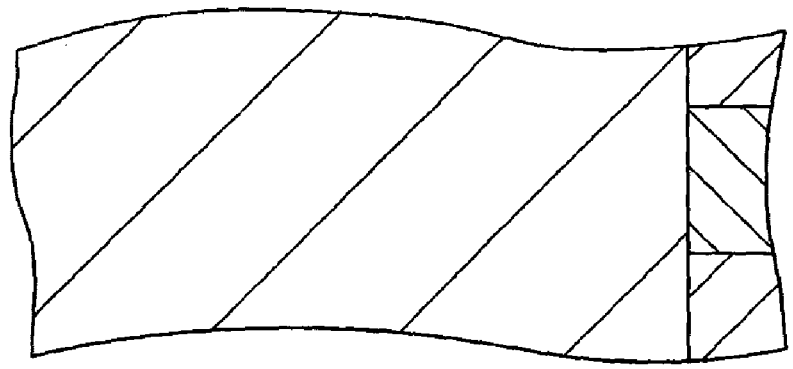
Figure 15M:
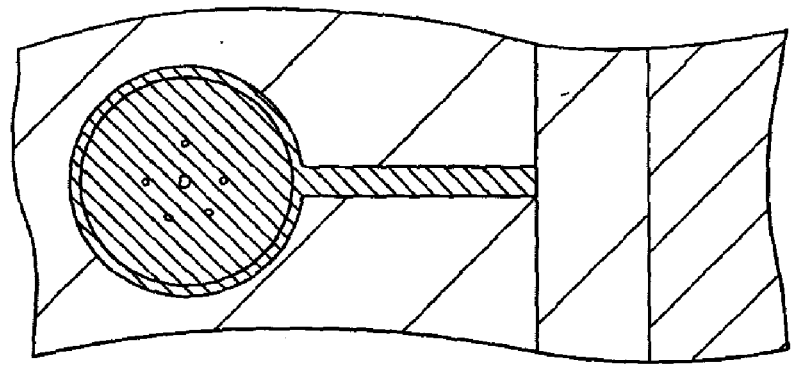
Figure 13N:
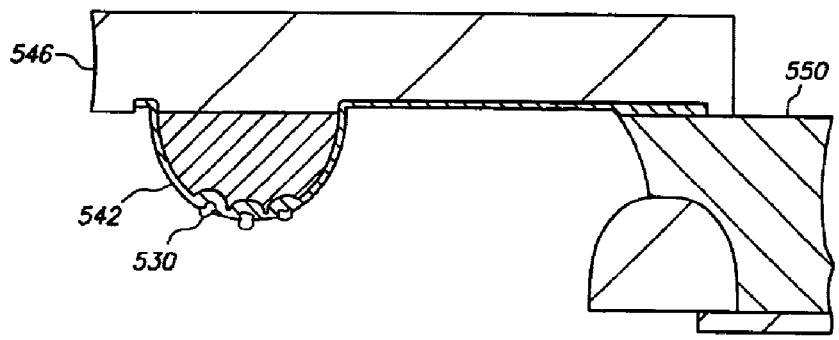
Figure 14N:
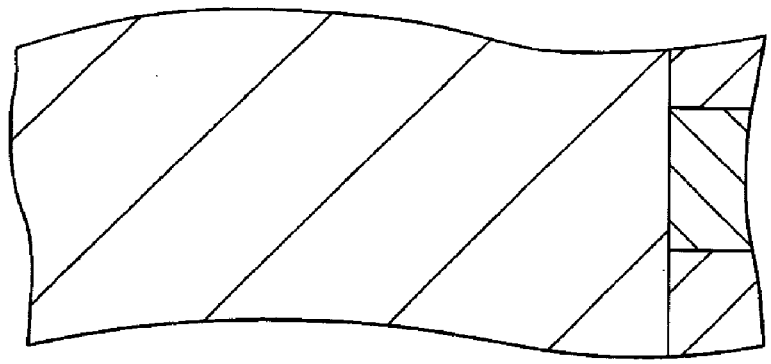
Figure 15N:
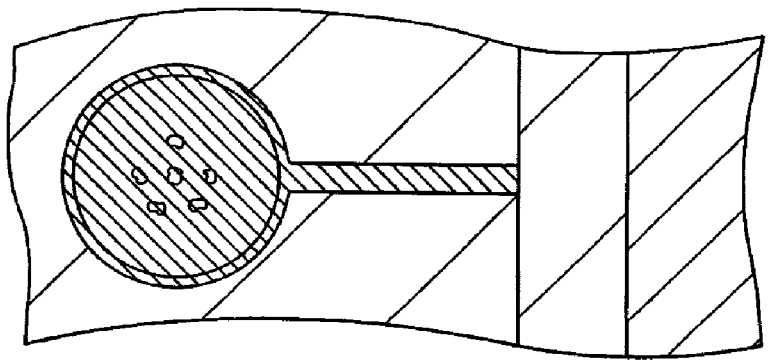
Figure 130:
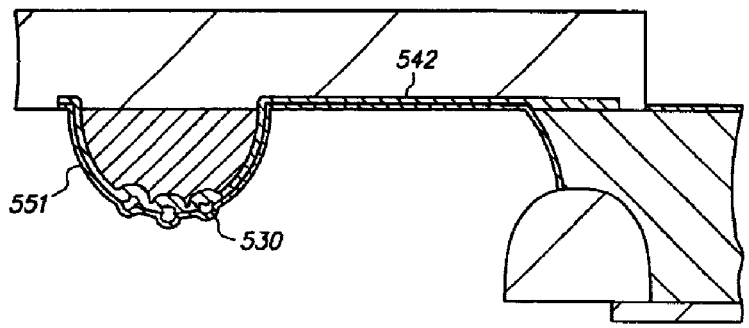
Figure 140:
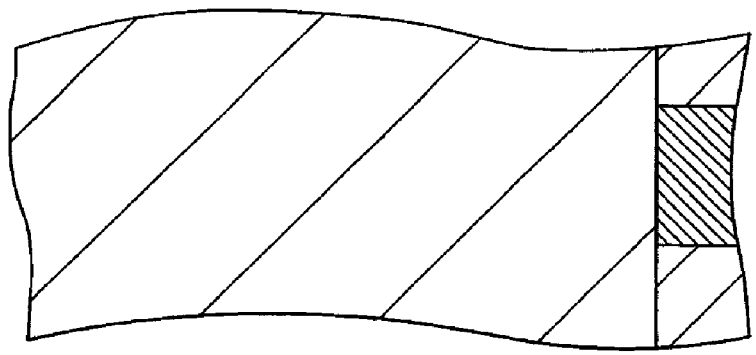
Figure 150:
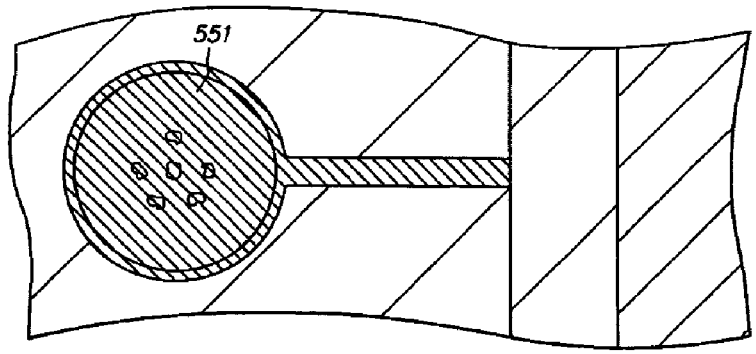
Figure 13P:
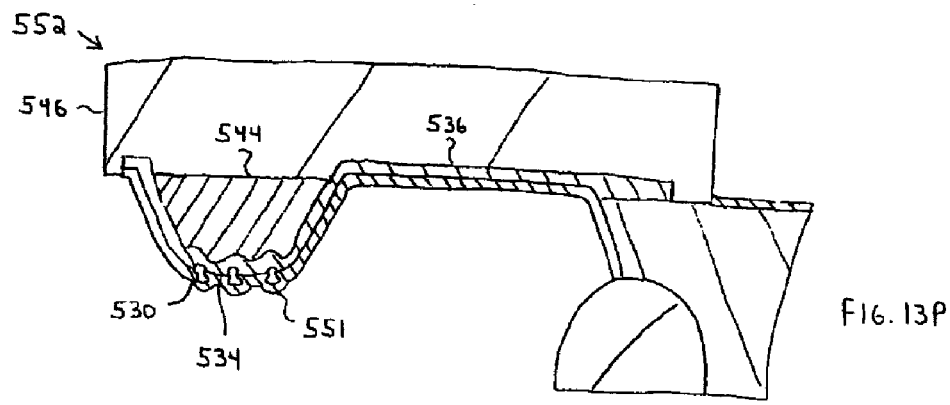
Figure 14P:
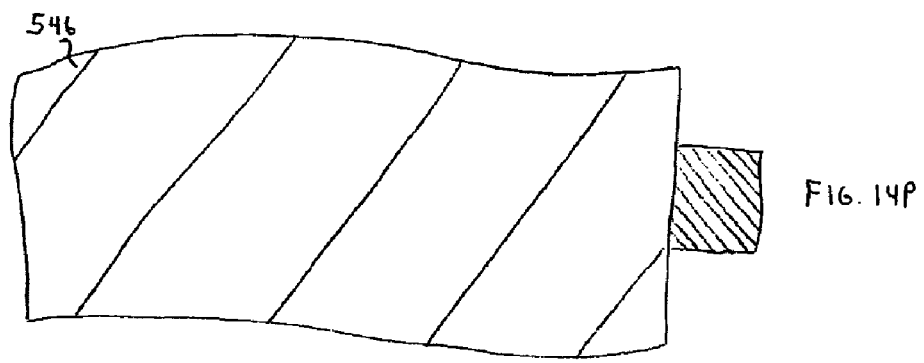
Figure 15P:
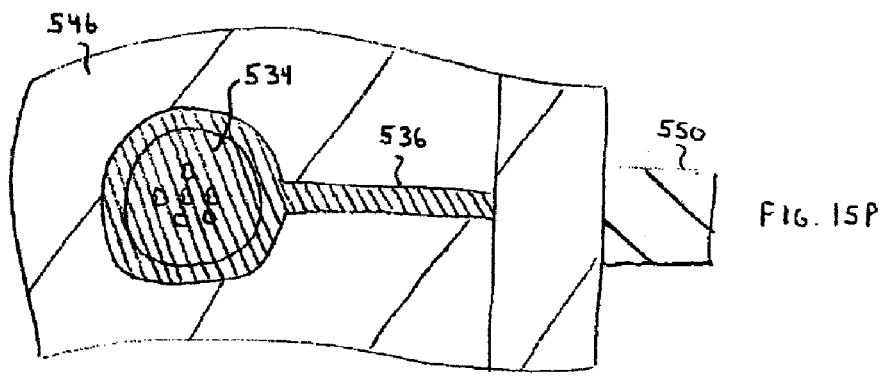
Figure 16:
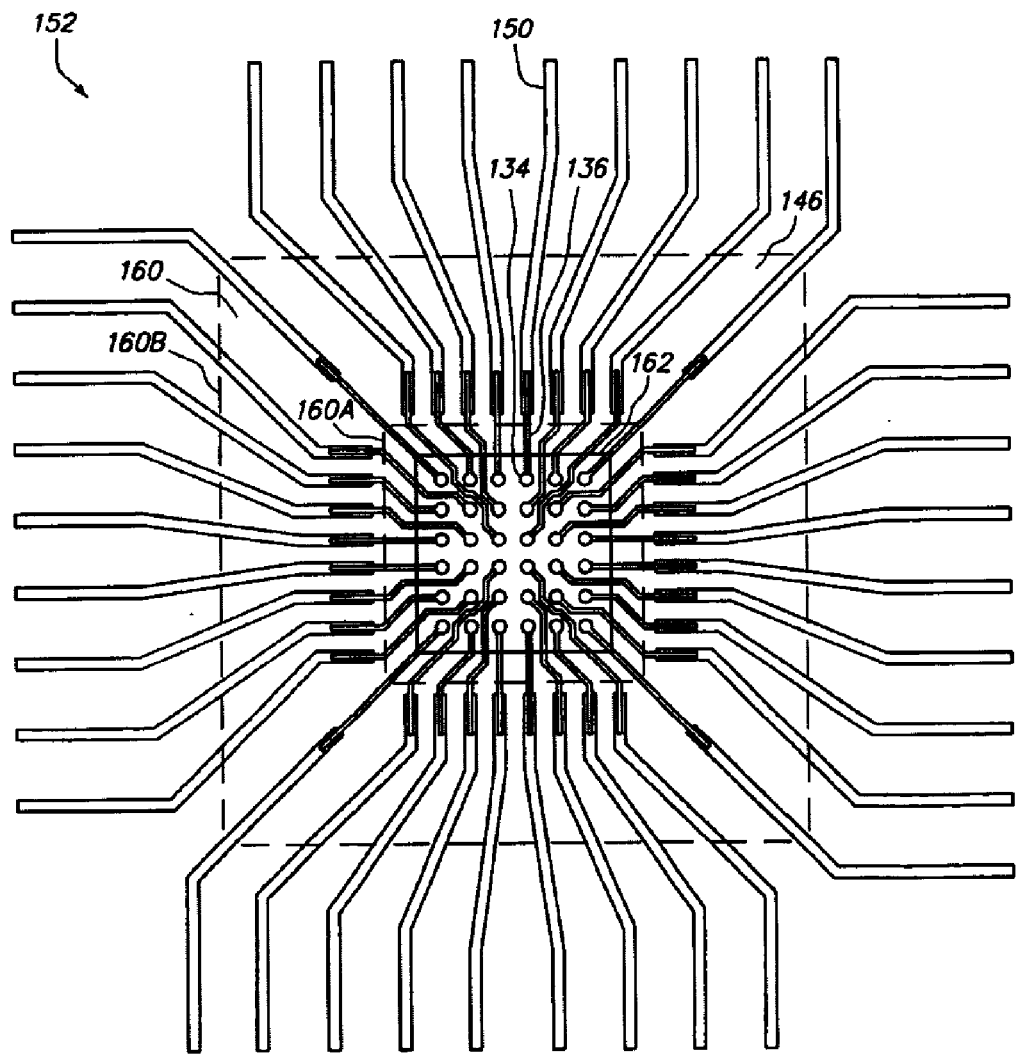

FIGS. 4O, 5O and 6O are cross-sectional, top and bottom views, respectively, of the structure after photoresist layer 248 is stripped. At this stage, the manufacture of test probe 252 that includes bumped terminal 234, routing line 236, elastomer 244, insulative support 246 and lead 250 can be considered complete.

FIGS. 7A–7N, 8A–8N and 9A–9N are cross-sectional, top and bottom views, respectively, of a method of making a test probe in accordance with a third embodiment of the present invention. In the third embodiment, the sacrificial plated metal is omitted, the undercoat plated metal is plated on the base and the particles, and the particles are etched and removed. For purposes of brevity, any description in the first embodiment is incorporated herein insofar as the same is applicable, and the same description need not be repeated. Likewise, elements of the third embodiment similar to those in the first embodiment have corresponding reference numerals indexed at three-hundred rather than one-hundred. For instance, base 310 corresponds to base 110, conductive trace 332 corresponds to conductive trace 132, etc.

Figure 7A:
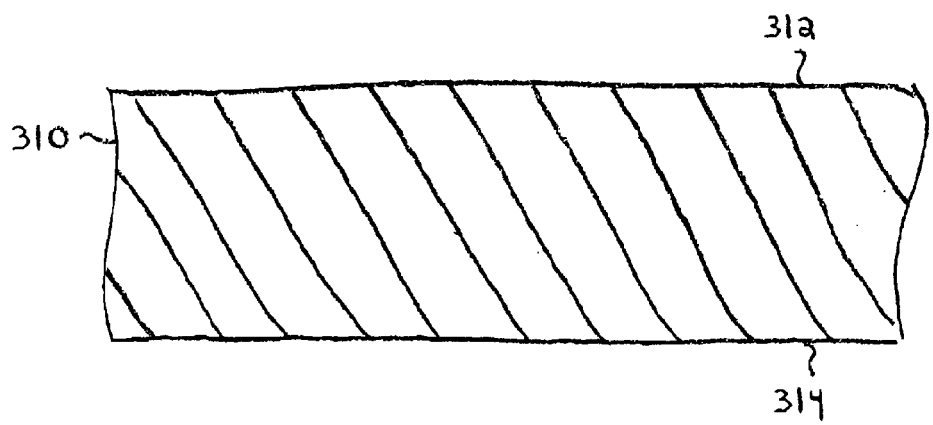
FIGS. 7A–7N are cross-sectional views showing a method of making a test probe in accordance with a third embodiment of the present invention.
Figure 8A:
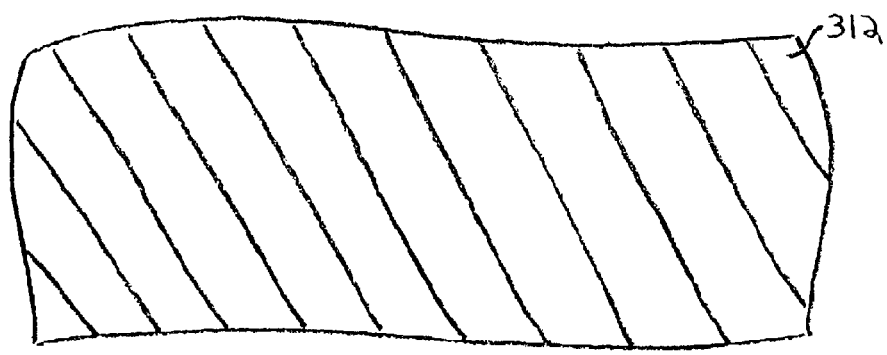
FIGS. 8A–8N are top plan views corresponding to FIGS. 7A–7N, respectively.
Figure 9A:
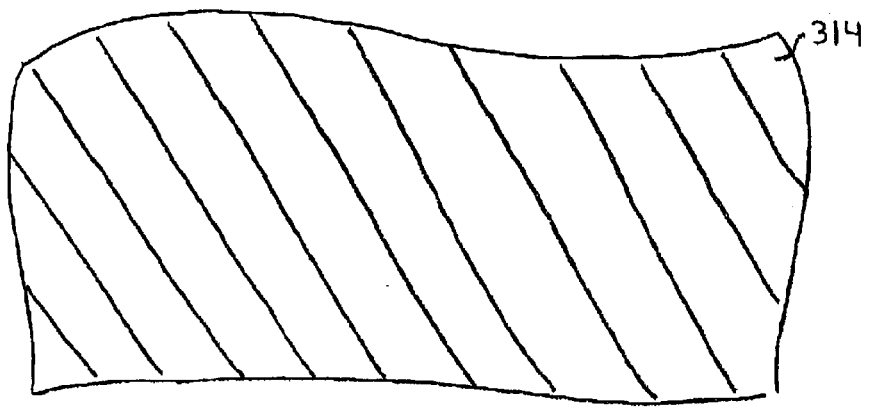
FIGS. 9A–9N are bottom plan views corresponding to FIGS. 7A–7N, respectively.

FIGS. 7A, 8A and 9A are cross-sectional, top and bottom views, respectively, of base 310 which includes surfaces 312 and 314.

Figure 7B:
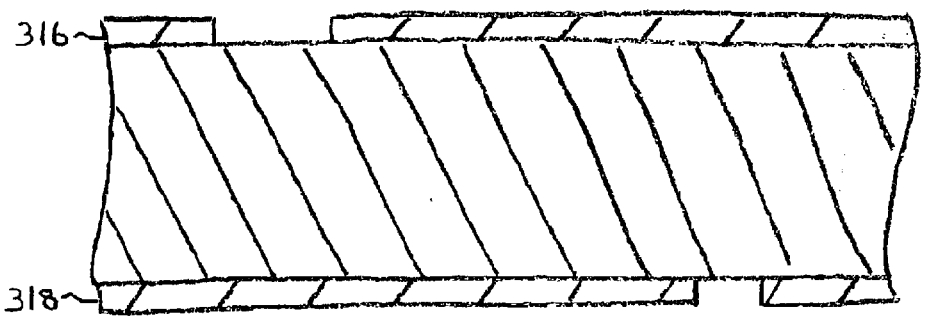
Figure 8B:
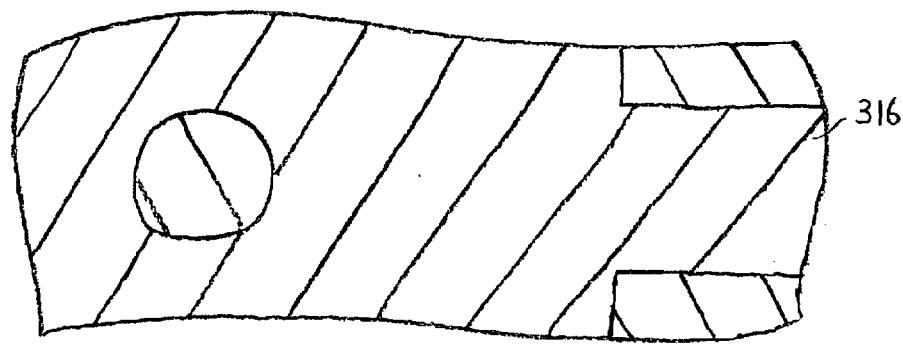
Figure 9B:
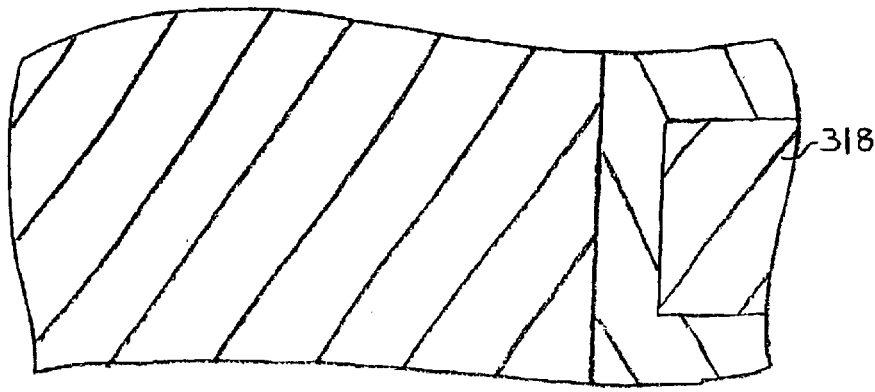

FIGS. 7B, 8B and 9B are cross-sectional, top and bottom views, respectively, of photoresist layers 316 and 318 formed on surfaces 312 and 314, respectively.

Figure 7C:
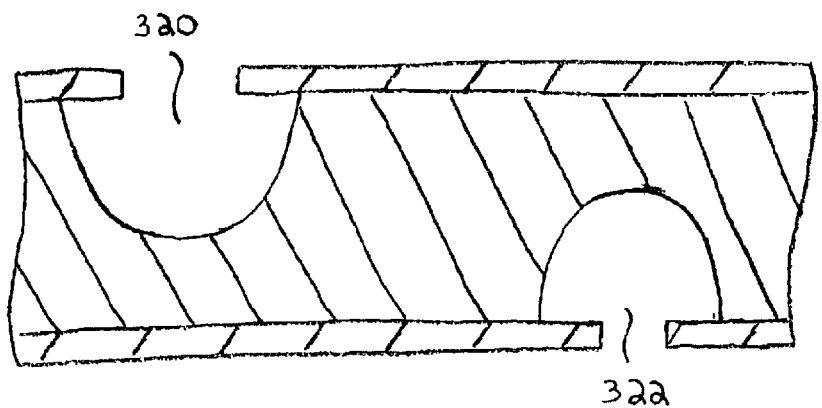
Figure 8C:
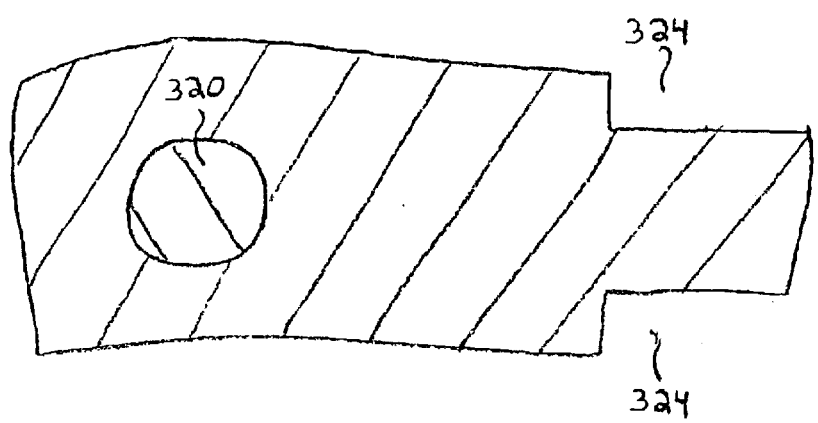
Figure 9C:
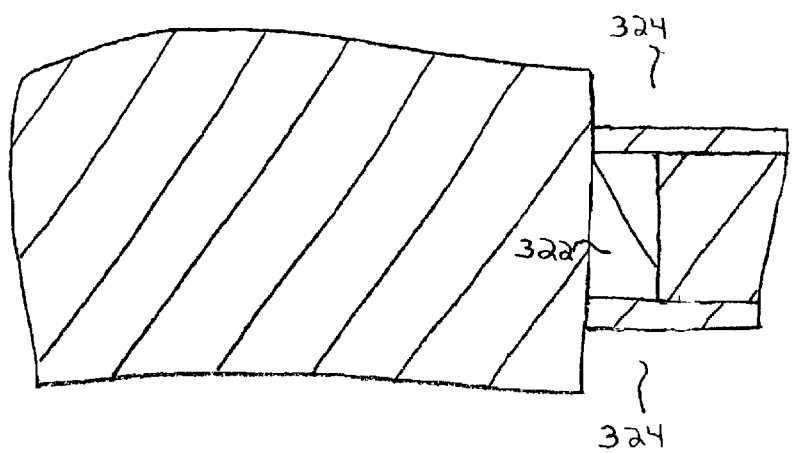

FIGS. 7C, 8C and 9C are cross-sectional, top and bottom views, respectively, of recesses 320 and 322 and slots 324 formed in base 310 by wet chemical etching.

Figure 7D:
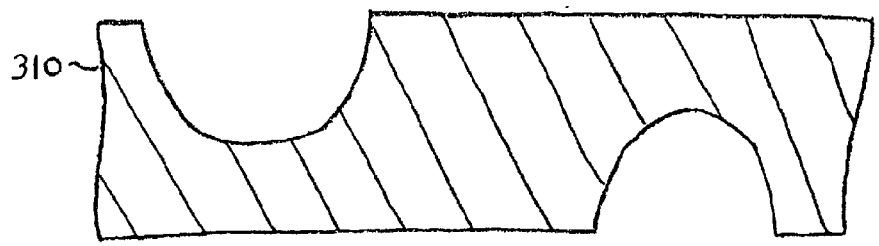
Figure 8D:
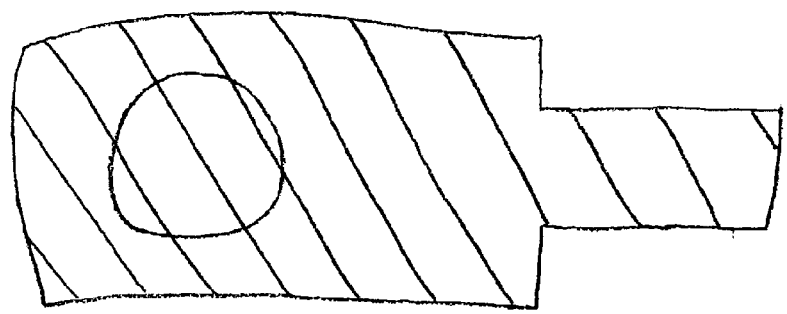
Figure 9D:
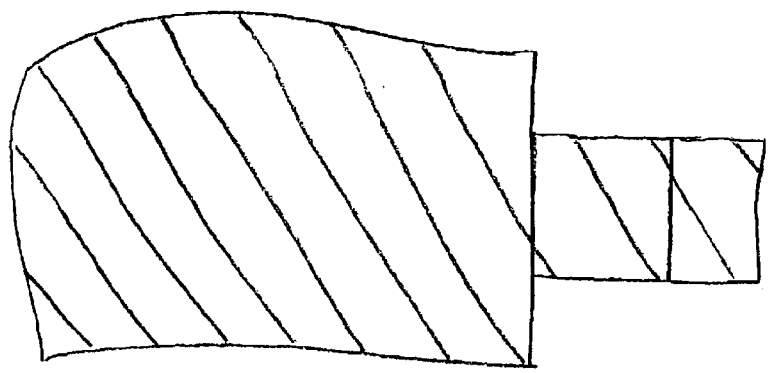

FIGS. 7D, 8D and 9D are cross-sectional, top and bottom views, respectively, of base 310 after photoresist layers 316 and 318 are stripped.

Figure 7E:
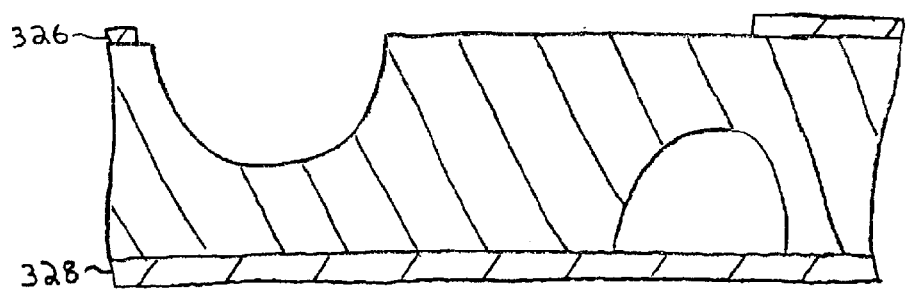
Figure 8E:
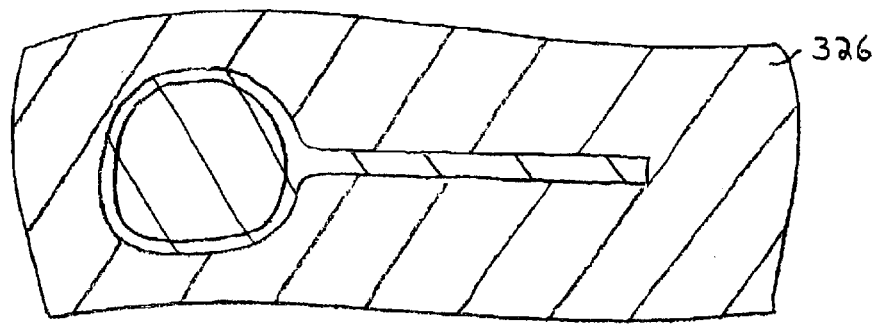
Figure 9E:
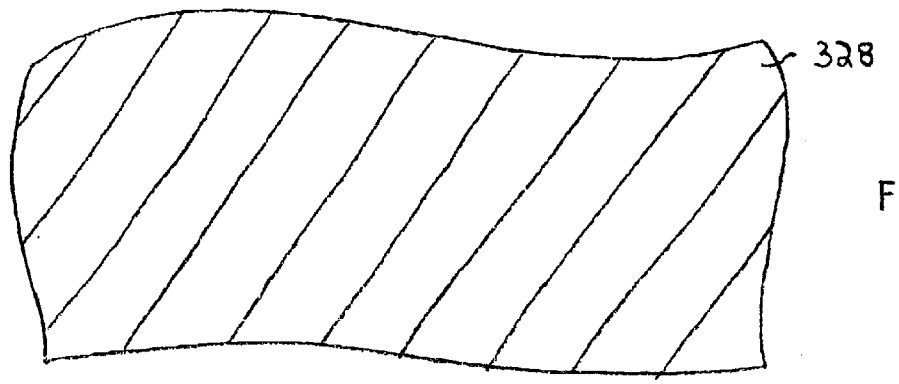

FIGS. 7E, 8E and 9E are cross-sectional, top and bottom views, respectively, of photoresist layers 326 and 328 formed on surfaces 312 and 314, respectively.

Figure 7F:
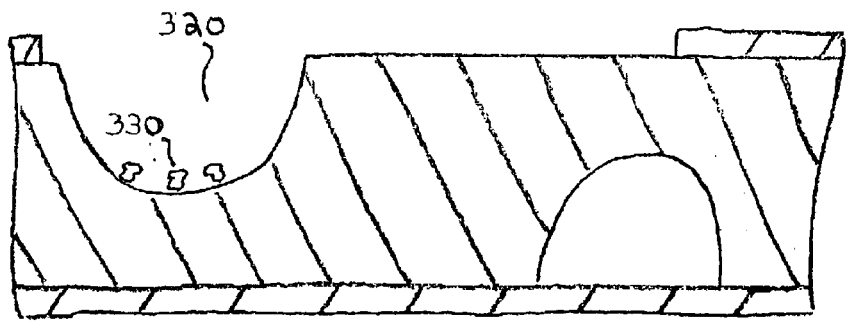
Figure 8F:
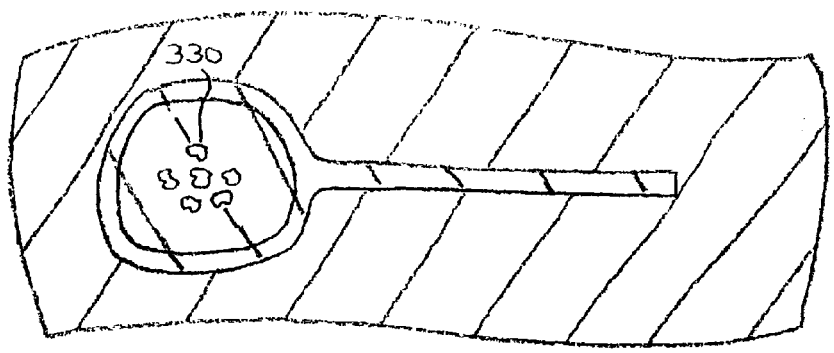
Figure 9F:
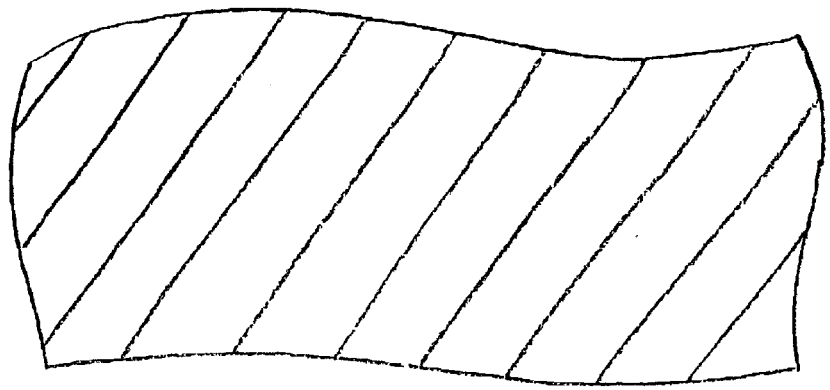

FIGS. 7F, 8F and 9F are cross-sectional, top and bottom views, respectively, of particles 330 deposited in recess 320. Particles 330 are composed of copper. Thus, particles 330 have a different composition than particles 130.

Figure 7G:
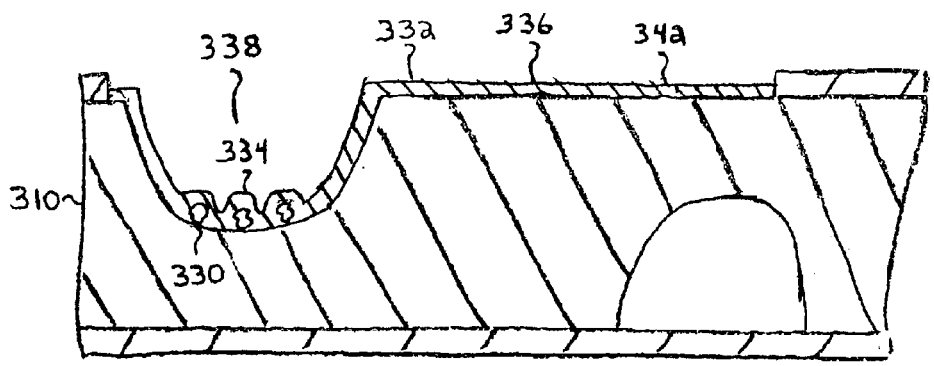
Figure 8G:
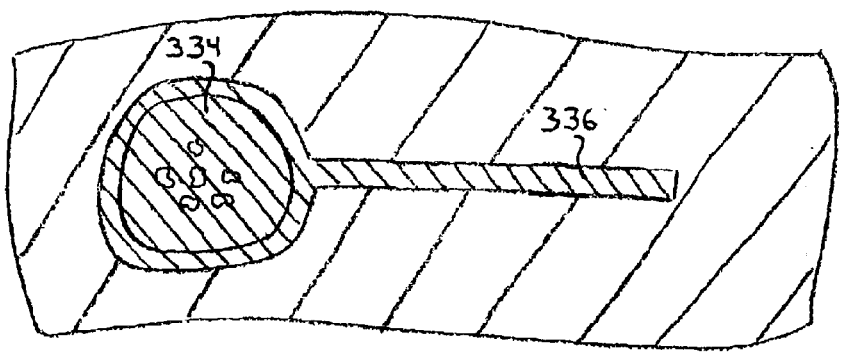
Figure 9G:
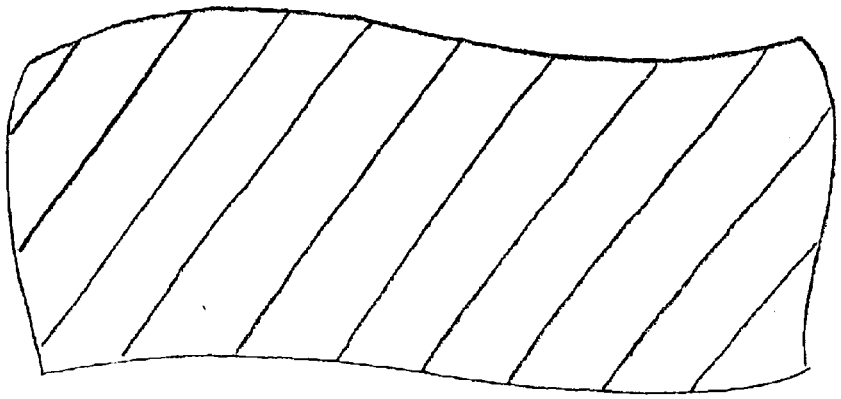

FIGS. 7G, 8G and 9G are cross-sectional, top and bottom views, respectively, of conductive trace 332 formed on base 310 and particles 330 by electroplating. Conductive trace 332 includes bumped terminal 334 and routing line 336, and bumped terminal 334 includes cavity 338.

Conductive trace 332 includes undercoat plated metal 342 deposited on base 310 and particles 330. Undercoat plated metal 342 is composed of nickel and has a thickness of 25 microns. Thus, conductive trace 332 does not include a sacrificial plated metal, and undercoat plated metal 342 is thicker than undercoat plated metal 142.

Conductive trace 332 is formed by an electroplating operation. Initially, a plating bus (not shown) is connected to base 310, current is applied to the plating bus from an external power source, and base 310 is submerged in an electrolytic nickel plating solution such as Technic Techni Nickel "S" at room temperature. As a result, undercoat plated metal 342 electroplates on the exposed portions of base 310 and particles 330. Undercoat plated metal 342 contacts particles 330 and locks particles 330 into recess 320. Thus, particles 330 are embedded in undercoat plated metal 342 and sealed by base 310 and undercoat plated metal 342. The nickel electroplating operation continues until undercoat plated metal 342 has the desired thickness. Thereafter, the structure is removed from the nickel electrolytic bath and rinsed in distilled water to remove contaminants.

Figure 7H:
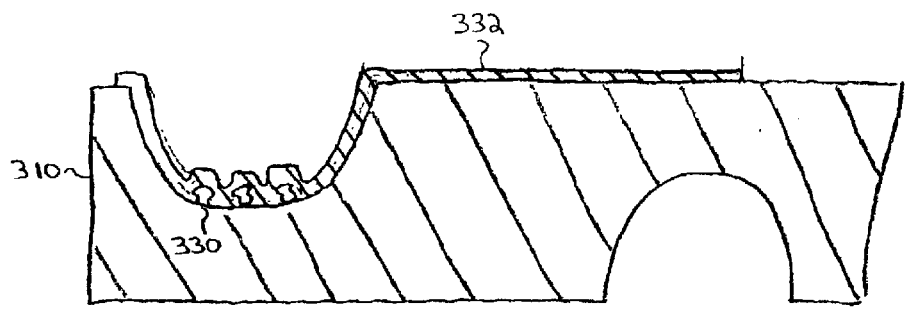
Figure 8H:
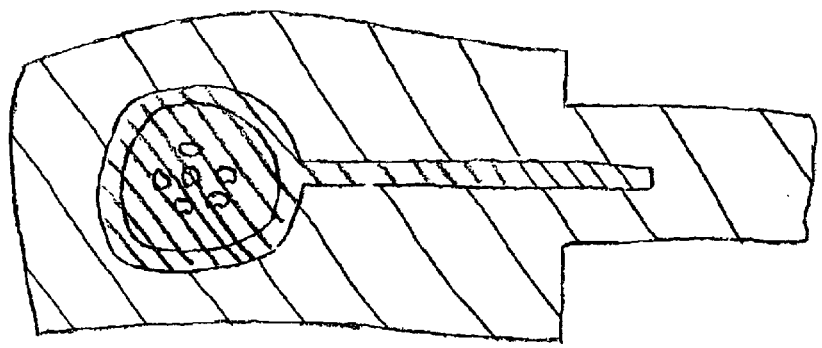
Figure 9H:
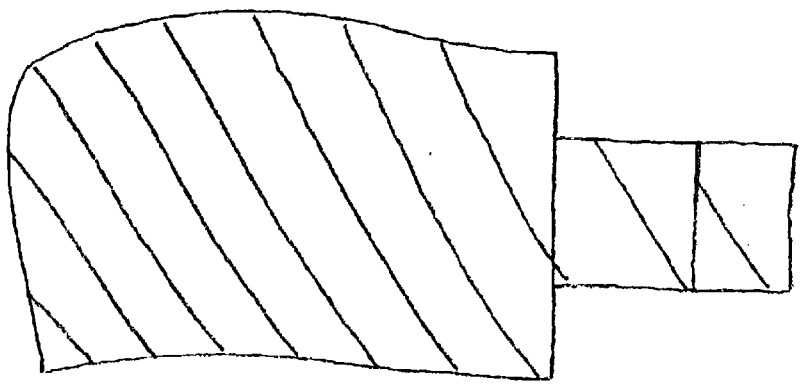

FIGS. 7H, 8H and 9H are cross-sectional, top and bottom views, respectively, of base 310, particles 330 and conductive trace 332 after photoresist layers 326 and 328 are stripped.

Figure 7I:
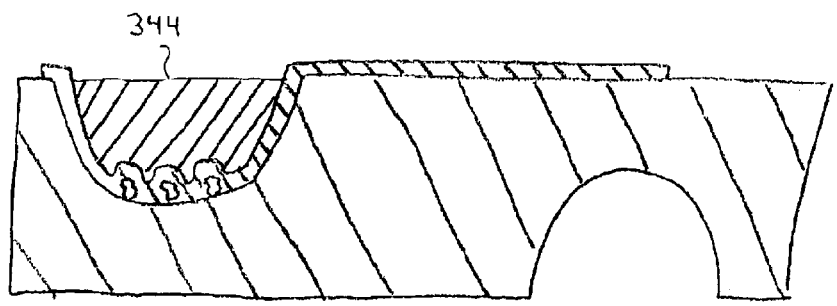
Figure 8I:
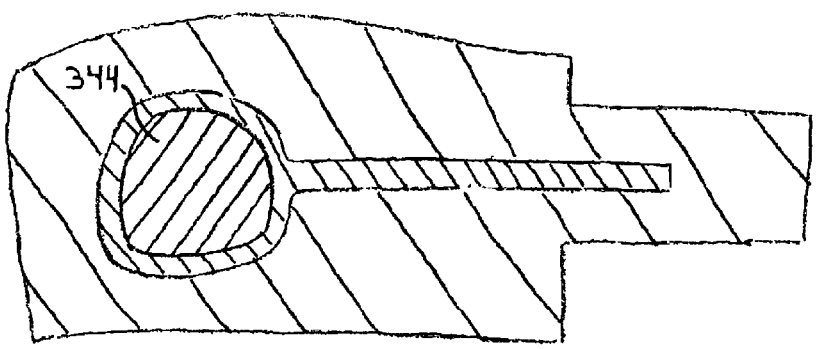
Figure 9I:
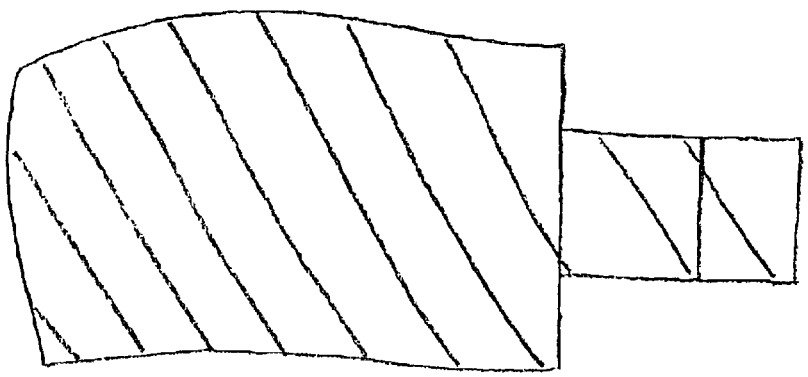

FIGS. 7I, 8I and 9I are cross-sectional, top and bottom views, respectively, of elastomer 344 formed in cavity 338 of bumped terminal 334.

Figure 7J:
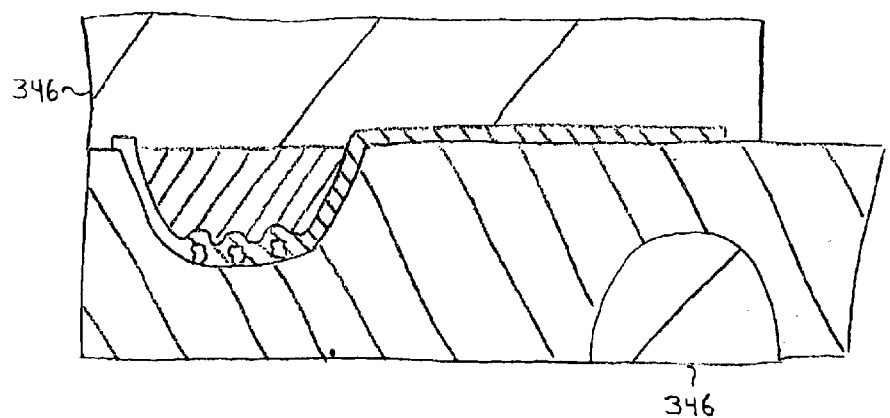
Figure 8J:
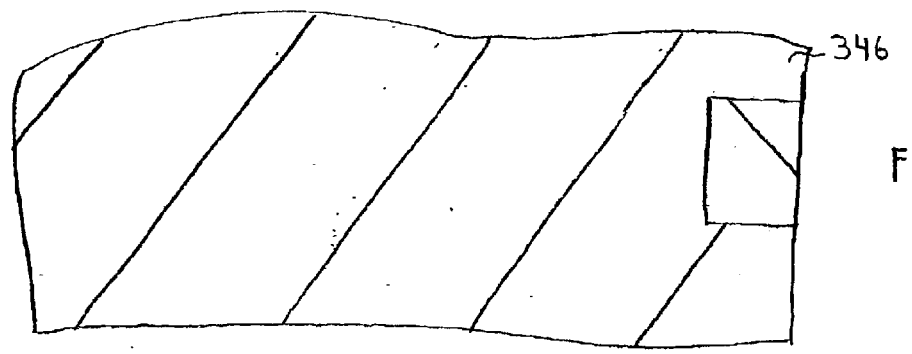
Figure 9J:
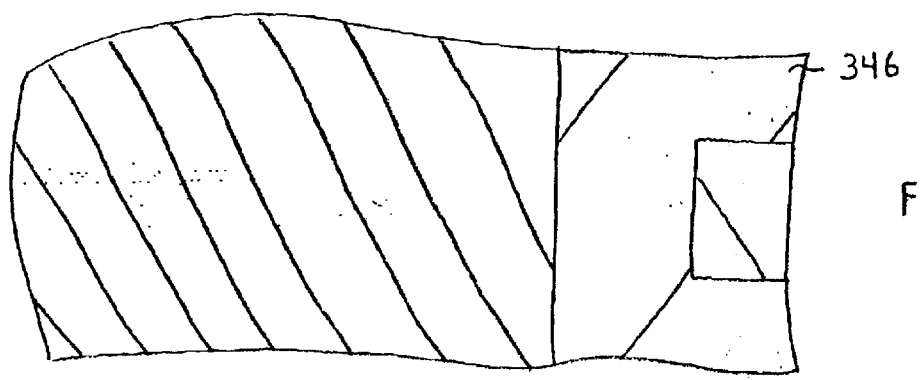

FIGS. 7J, 8J and 9J are cross-sectional, top and bottom views, respectively, of insulative support 346 formed on the structure by transfer molding.

Figure 7K:
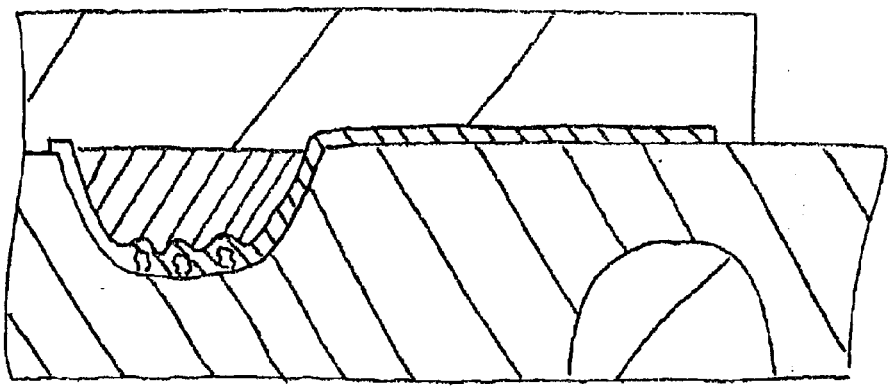
Figure 8K:
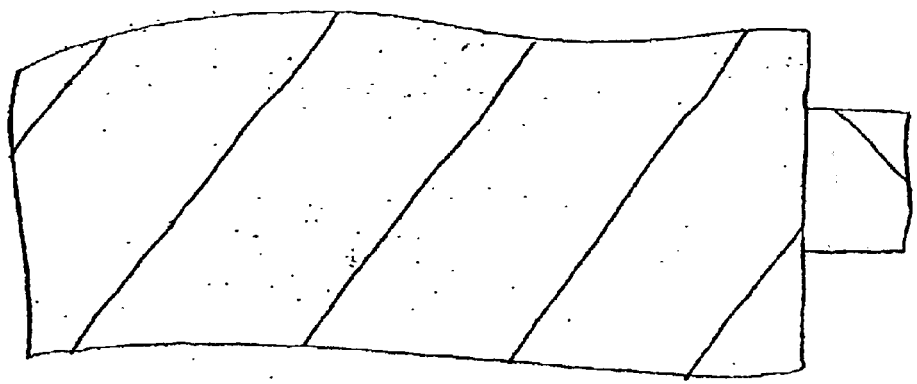
Figure 9K:
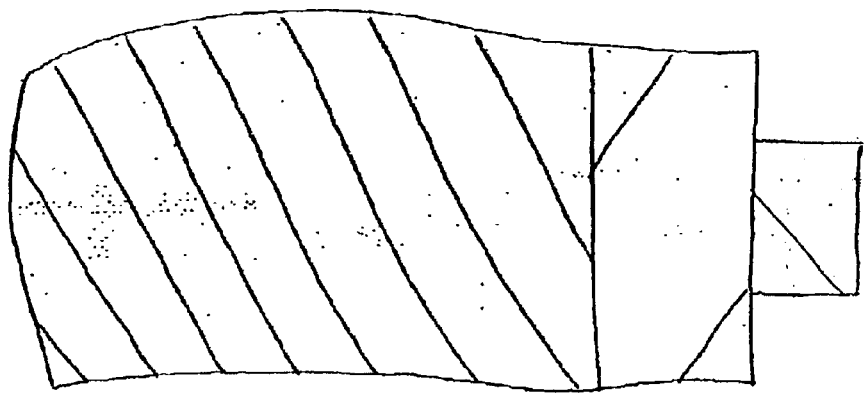

FIGS. 7K, 8K and 9K are cross-sectional, top and bottom views, respectively, of the structure after selected portions of insulative support 346 in slots 324 that extend laterally beyond recess 322 are removed.

Figure 7L:
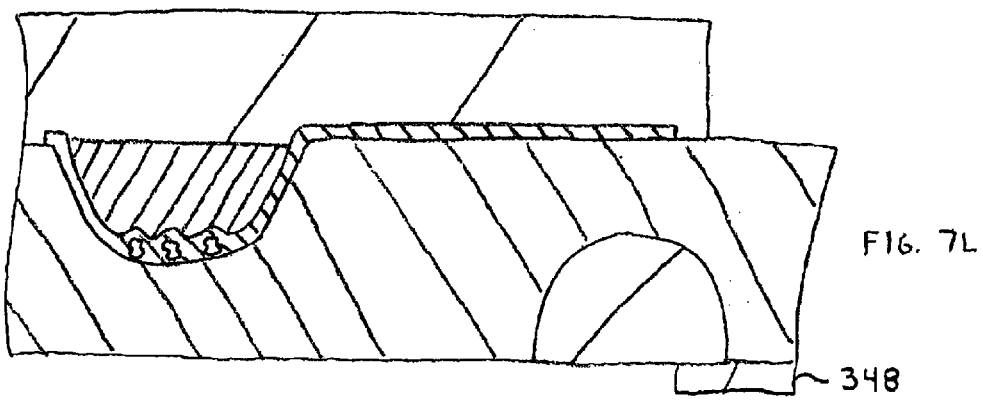
Figure 8L:
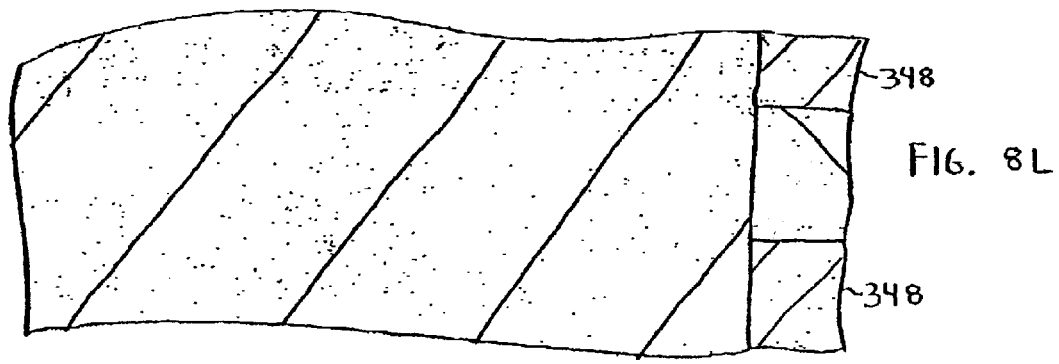
Figure 9L:
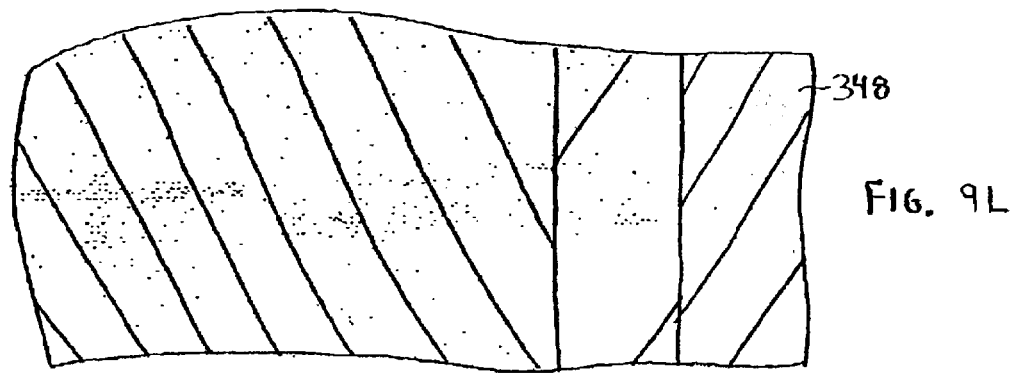

FIGS. 7L, 8L and 9L are cross-sectional, top and bottom views, respectively, of photoresist layer 348 formed on surface 314.

Figure 7M:
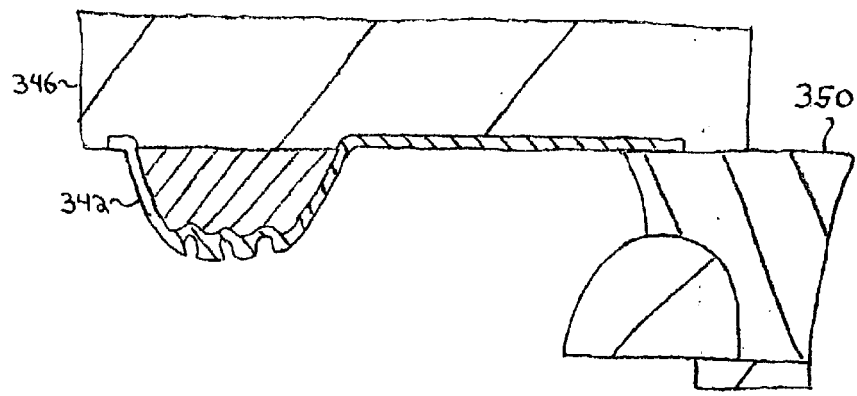
Figure 8M:
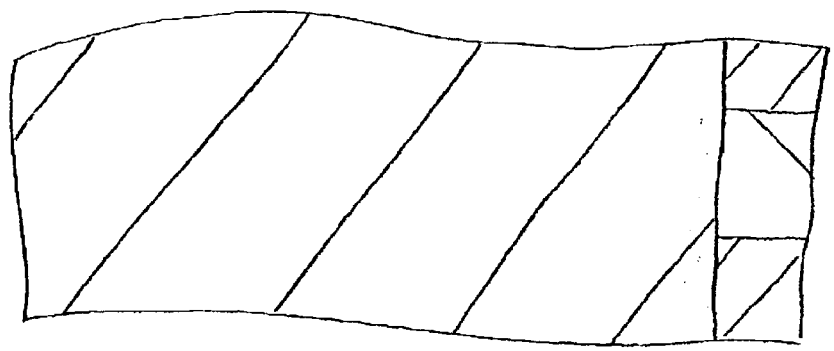
Figure 9M:
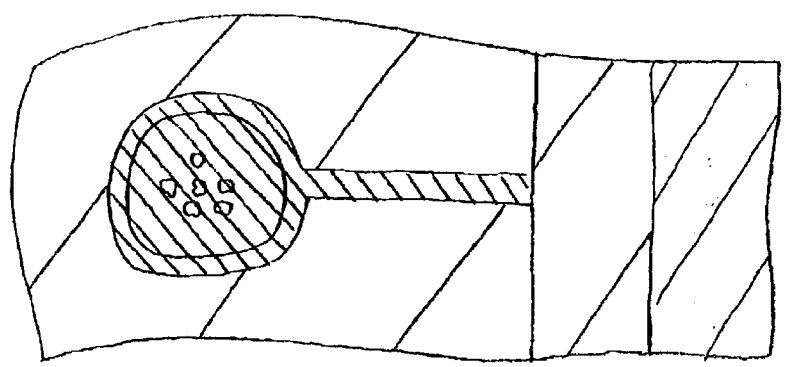

FIGS. 7M, 8M and 9M are cross-sectional, top and bottom views, respectively, of the structure after selected portions of base 310 are removed and particles 330 are removed by wet chemical etching, and a remaining portion of base 310 forms lead 350. The wet chemical etch is highly selective of copper with respect to nickel and the molding compound. Therefore, no appreciable amount of undercoat plated metal 342 or insulative support 346 is removed. Since base 310 and particles 330 are composed of copper, the wet chemical etch is achieved in a single step using a copper etching solution. Moreover, particles 330 are removed by being dissolved in the wet chemical etch rather than dislodged.

Figure 7N:
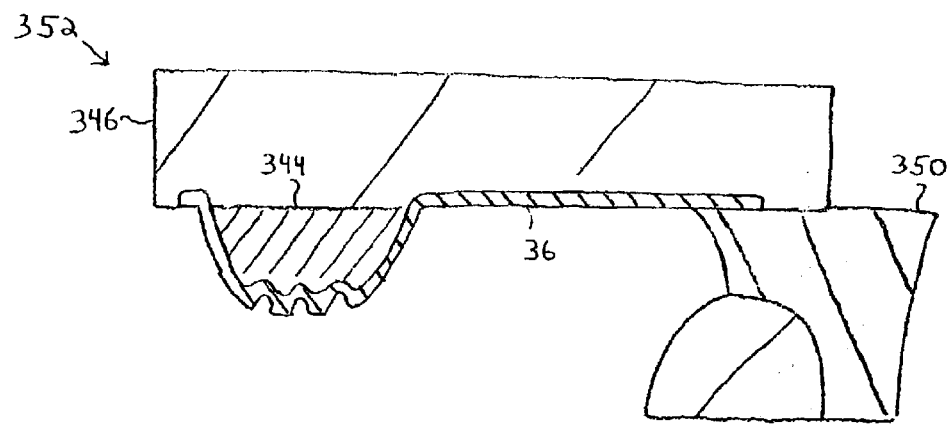
Figure 8N:
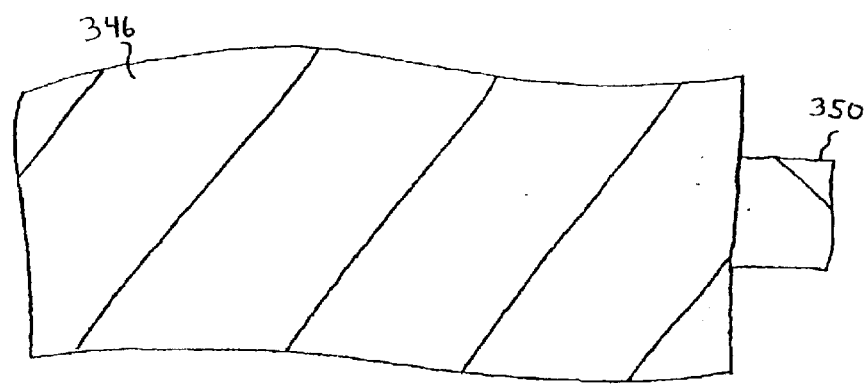
Figure 9N:
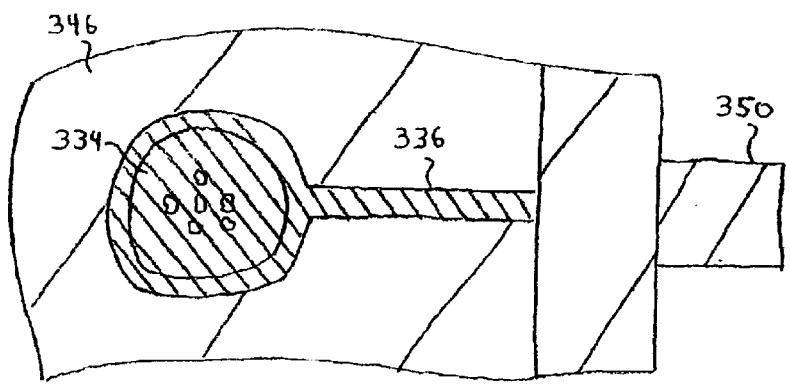

FIGS. 7N, 8N and 9N are cross-sectional, top and bottom views, respectively, of the structure after photoresist layer 348 is stripped. At this stage, the manufacture of test probe 352 that includes bumped terminal 334, routing line 336, elastomer 344, insulative support 346 and lead 350 can be considered complete.

FIGS. 10A–10O, 11A–11O and 12A–12O are cross-sectional, top and bottom views, respectively, of a method of making a test probe in accordance with a fourth embodiment of the present invention. In the fourth embodiment, the sacrificial plated metal is omitted, the undercoat plated metal is plated on the base and the particles, and the undercoat plated metal is etched back so that the particles protrude therefrom. For purposes of brevity, any description in the first embodiment is incorporated herein insofar as the same is applicable, and the same description need not be repeated. Likewise, elements of the fourth embodiment similar to those in the first embodiment have corresponding reference numerals indexed at four-hundred rather than one-hundred. For instance, base 410 corresponds to base 110, conductive trace 432 corresponds to conductive trace 132, etc.

Figure 10A:
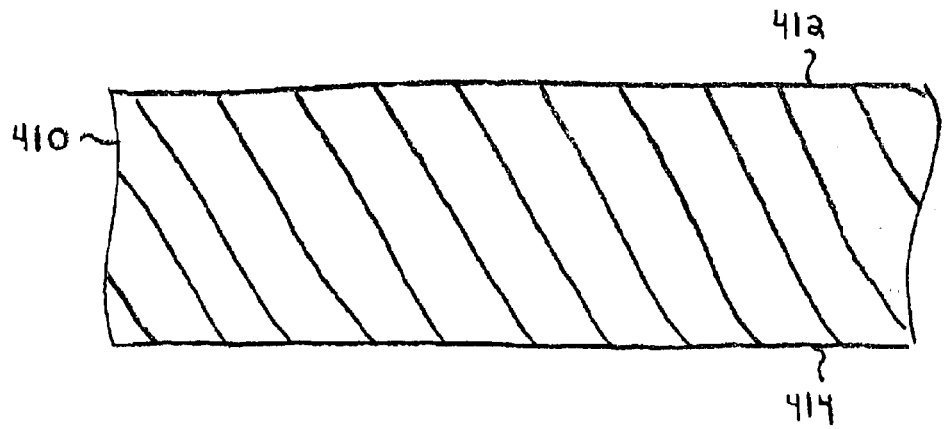
FIGS. 10A–10O are cross-sectional views showing a method of making a test probe in accordance with a fourth embodiment of the present invention.
Figure 11A:
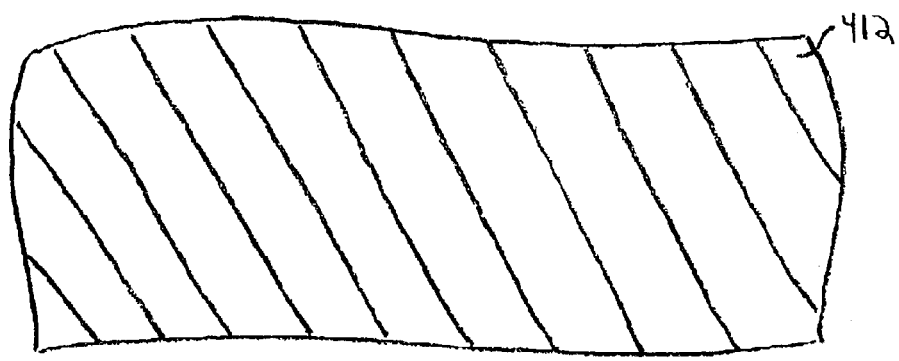
FIGS. 11A–11O are top plan views corresponding to FIGS. 10A–10O, respectively.
Figure 12A:
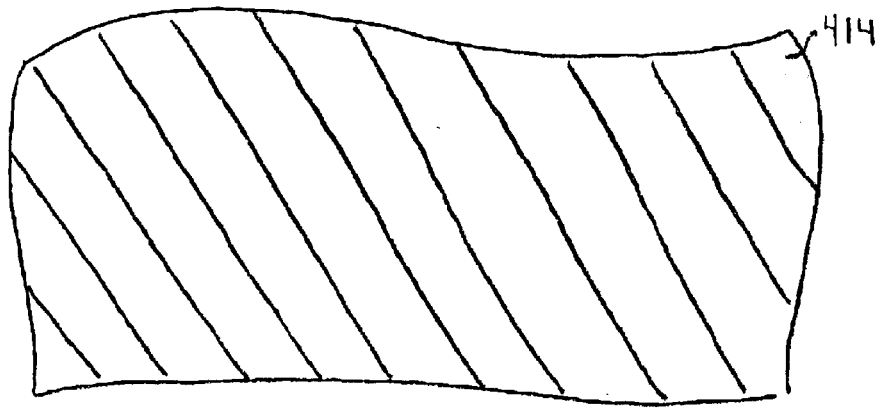
FIGS. 12A–12O are bottom plan views corresponding to FIGS. 10A–10O, respectively.

FIGS. 10A, 11A and 12A are cross-sectional, top and bottom views, respectively, of base 410 which includes surfaces 412 and 414.

Figure 10B:
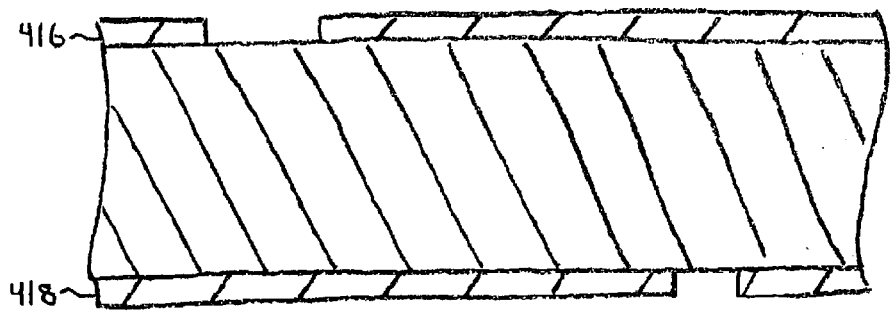
Figure 11B:
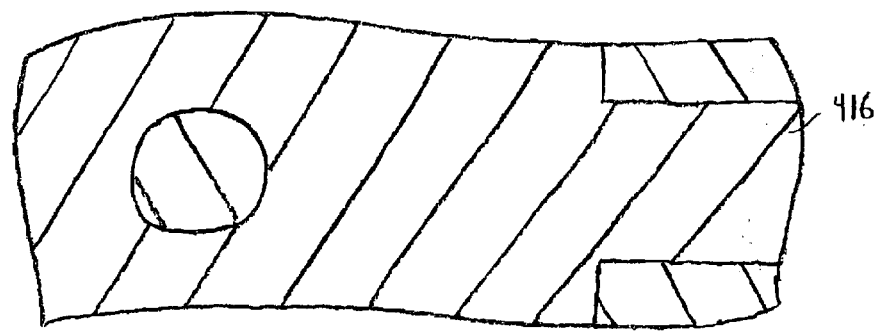
Figure 12B:
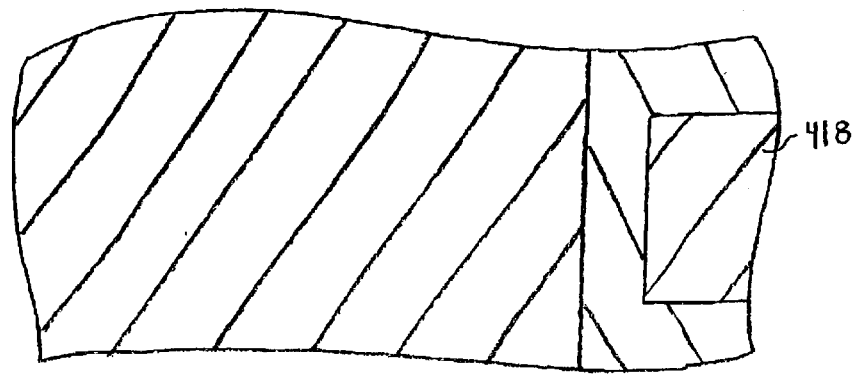

FIGS. 10B, 11B and 12B are cross-sectional, top and bottom views, respectively, of photoresist layers 416 and 418 formed on surfaces 412 and 414, respectively.

Figure 10C:
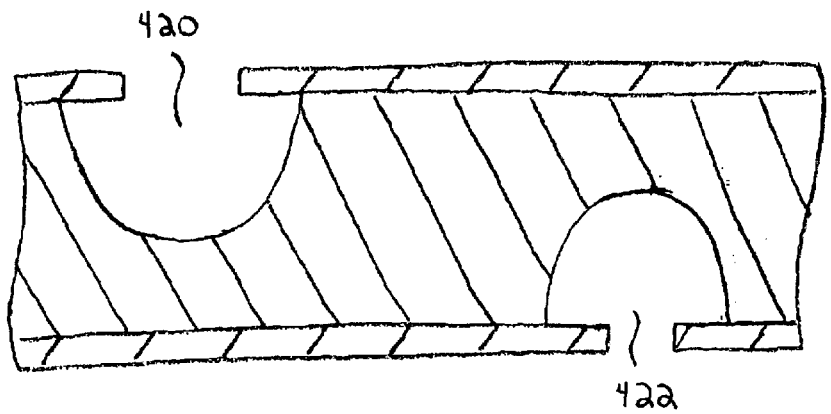
Figure 11C:
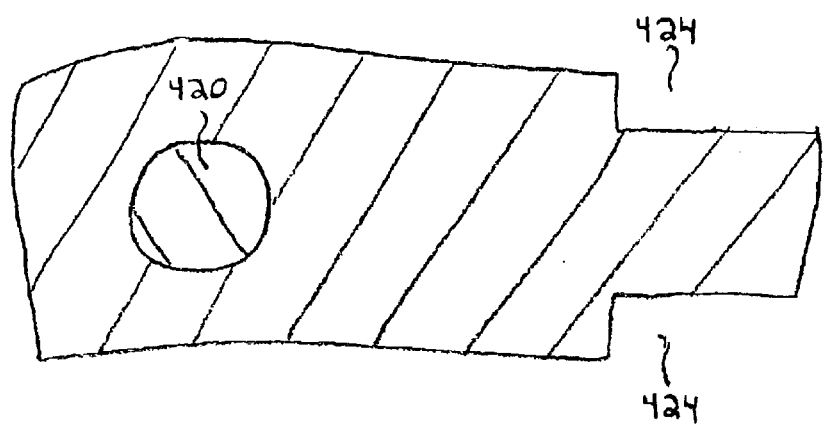
Figure 12C:
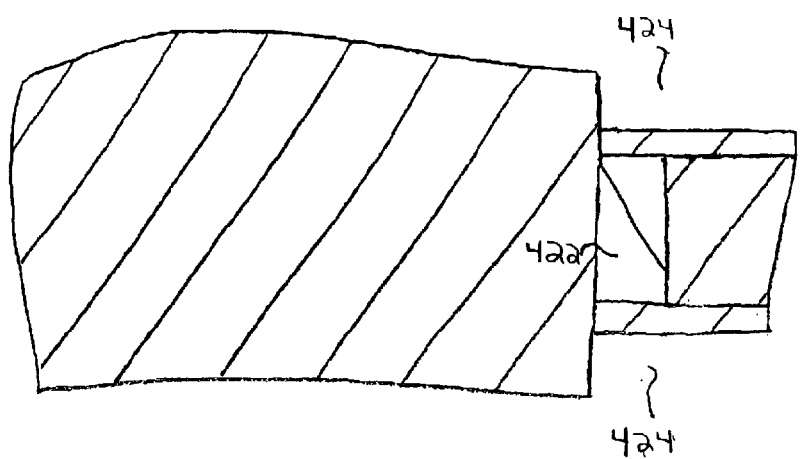

FIGS. 10C, 11C and 12C are cross-sectional, top and bottom views, respectively, of recesses 420 and 422 and slots 424 formed in base 410 by wet chemical etching.

Figure 10D:
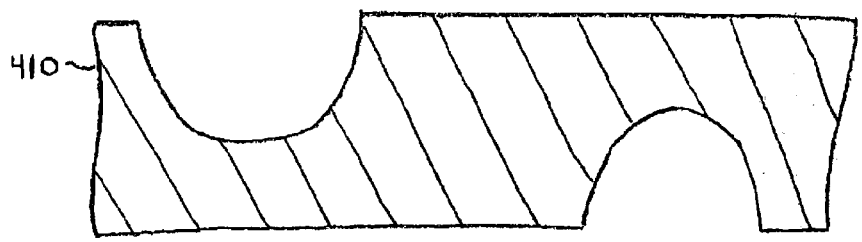
Figure 11D:
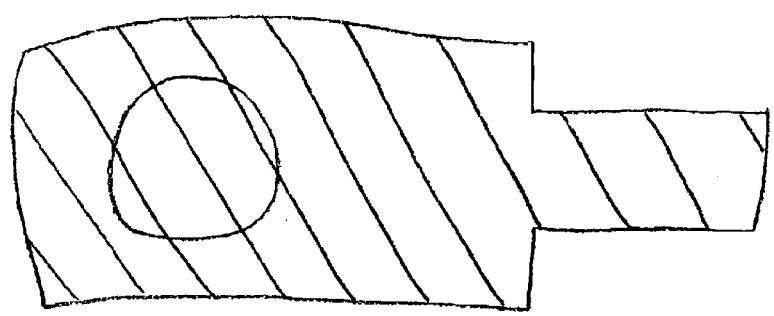
Figure 12D:
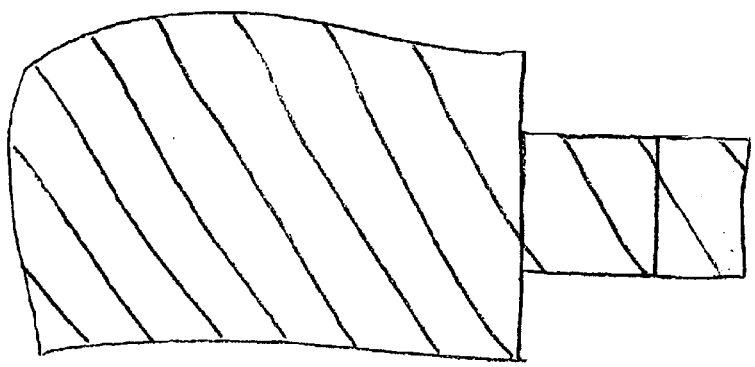

FIGS. 10D, 11D and 12D are cross-sectional, top and bottom views, respectively, of base 410 after photoresist layers 416 and 418 are stripped.

Figure 10E:
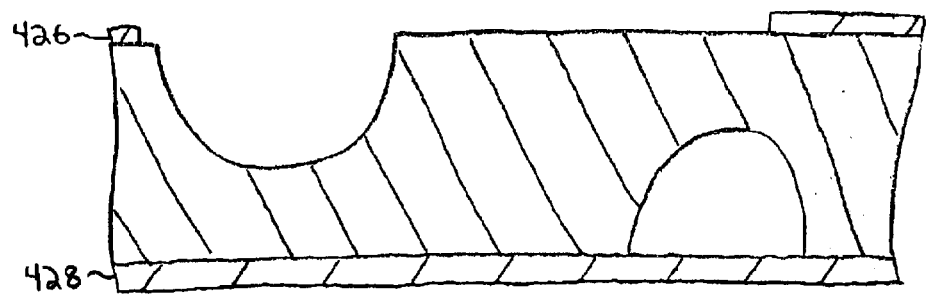
Figure 11E:
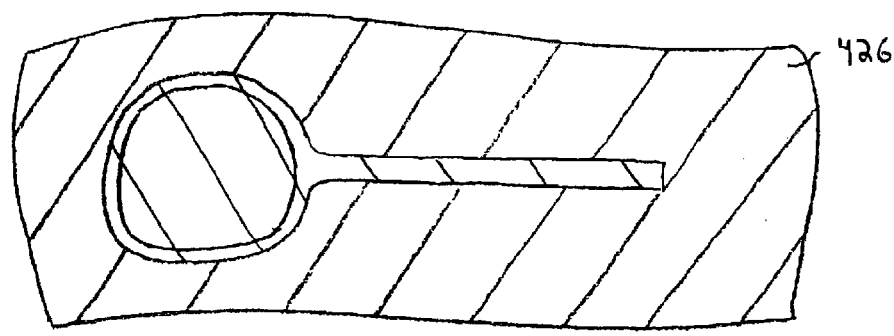
Figure 12E:
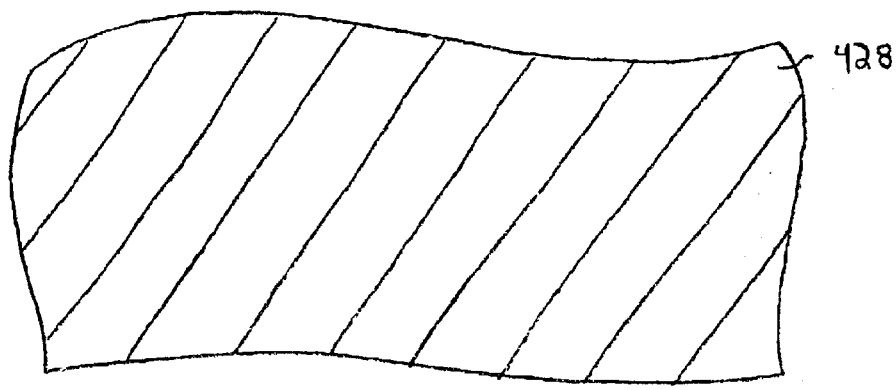

FIGS. 10E, 11E and 12E are cross-sectional, top and bottom views, respectively, of photoresist layers 426 and 428 formed on surfaces 412 and 414, respectively.

Figure 10F:
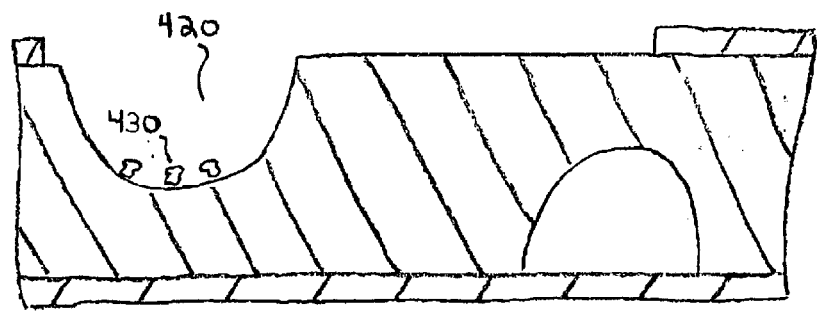
Figure 11F:
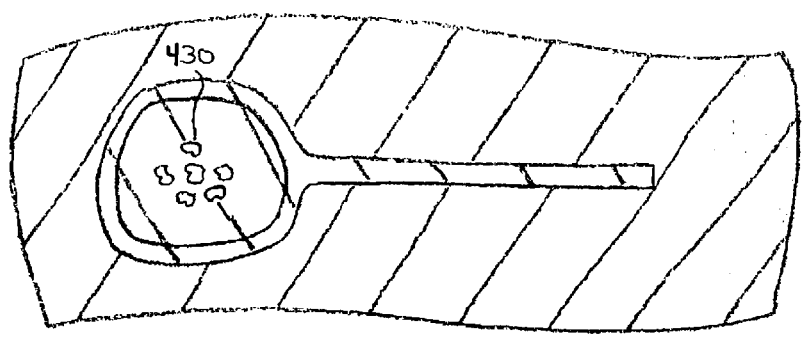
Figure 12F:
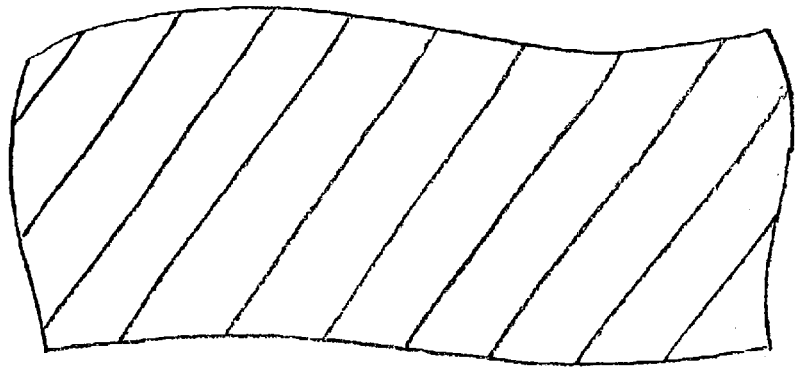

FIGS. 10F, 11F and 12F are cross-sectional, top and bottom views, respectively, of particles 430 deposited in recess 420. Particles 430 are composed of iron and have an average diameter of 25 microns. Thus, particles 430 have a different composition than particles 130.

Figure 10G:
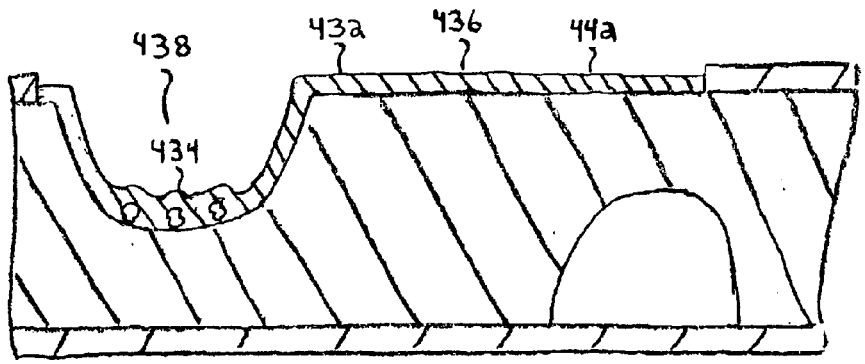
Figure 11G:
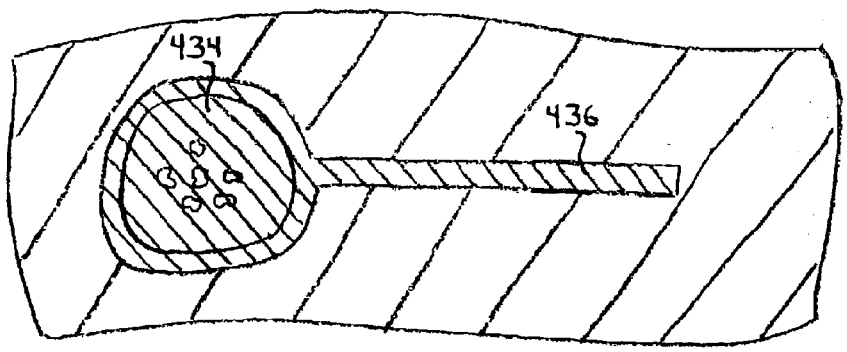
Figure 12G:
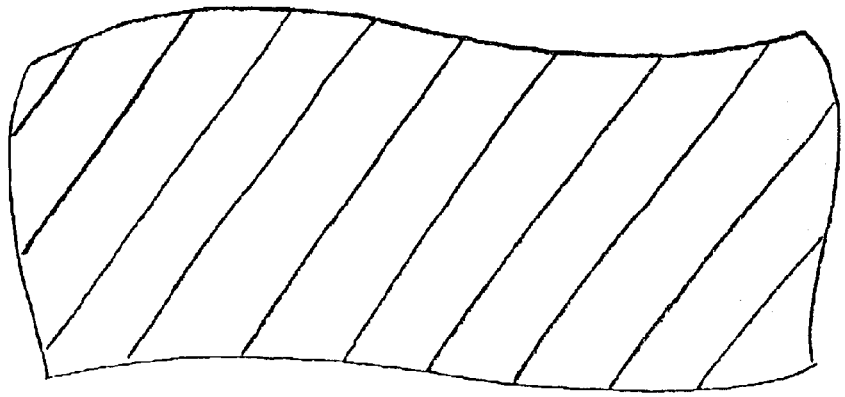

FIGS. 10G, 11G and 12G are cross-sectional, top and bottom views, respectively, of conductive trace 432 formed on base 410 and particles 430 by electroplating. Conductive trace 432 includes bumped terminal 434 and routing line 436, and bumped terminal 434 includes cavity 438.

Conductive trace 432 includes undercoat plated metal 442 deposited on base 410 and particles 430. Undercoat plated metal 442 is composed of nickel and has a thickness of 25 microns. Thus, conductive trace 432 does not include a sacrificial plated metal, and undercoat plated metal 442 is thicker than undercoat plated metal 142.

Conductive trace 432 is formed by an electroplating operation. Initially, a plating bus (not shown) is connected to base 410, current is applied to the plating bus from an external power source, and base 410 is submerged in an electrolytic nickel plating solution such as Technic Techni Nickel "S" at room temperature. As a result, undercoat plated metal 442 electroplates on the exposed portions of base 410 and particles 430. Undercoat plated metal 442 contacts particles 430 and locks particles 430 into recess 420. Thus, particles 430 are embedded in undercoat plated metal 442 and sealed by base 410 and undercoat plated metal 442. The nickel electroplating operation continues until undercoat plated metal 442 has the desired thickness. Thereafter, the structure is removed from the nickel electrolytic bath and rinsed in distilled water to remove contaminants.

Figure 10H:
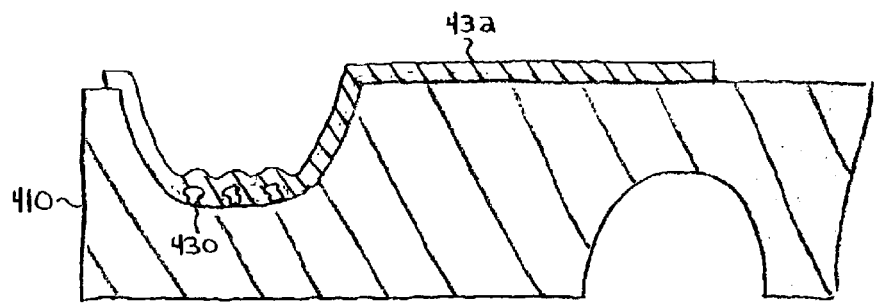
Figure 11H:
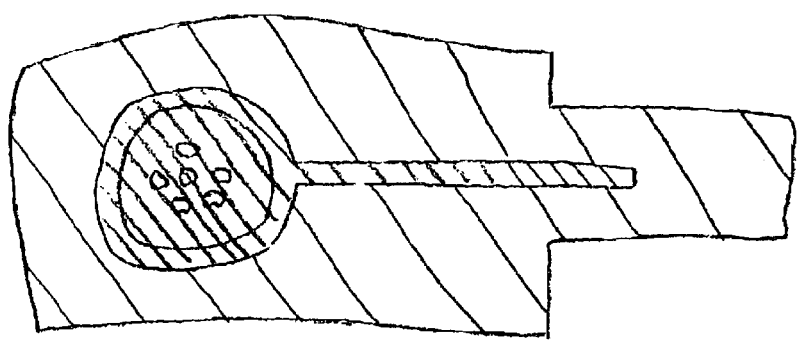
Figure 12H:
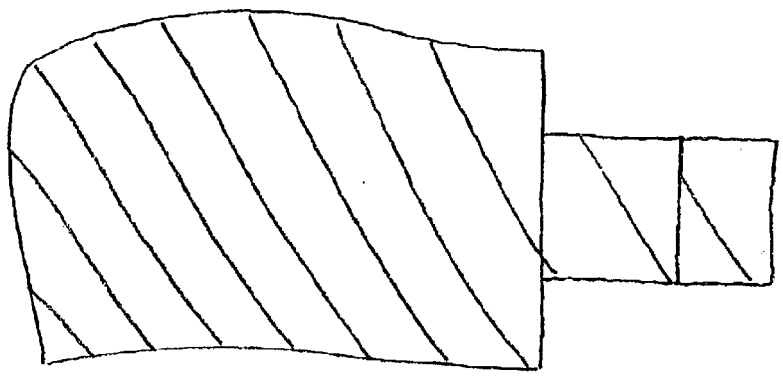

FIGS. 10H, 11H and 12H are cross-sectional, top and bottom views, respectively, of base 410, particles 430 and conductive trace 432 after photoresist layers 426 and 428 are stripped.

Figure 10I:
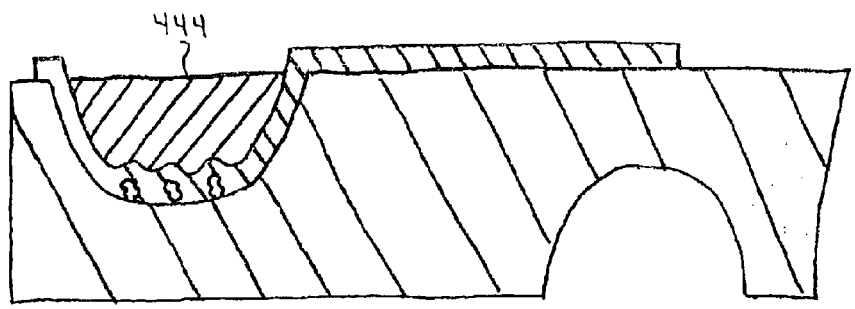
Figure 11I:
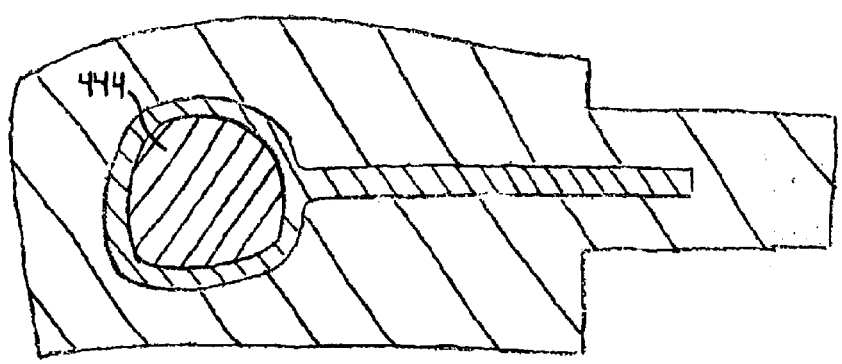
Figure 12I:
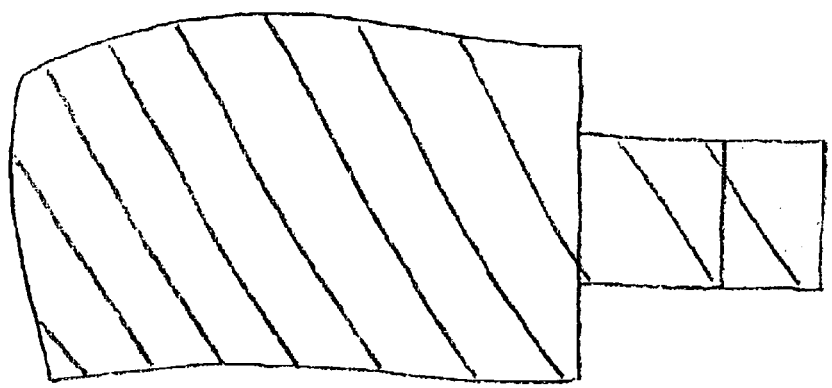

FIGS. 10I, 11I and 12I are cross-sectional, top and bottom views, respectively, of elastomer 444 formed in cavity 438 of bumped terminal 434.

Figure 10J:
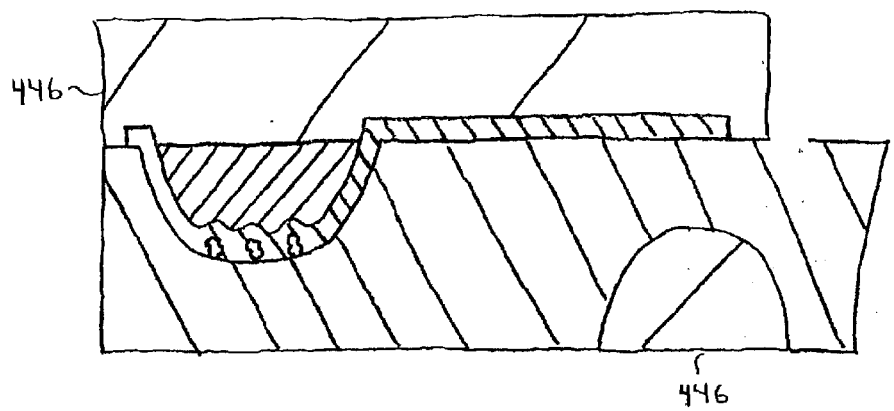
Figure 11J:
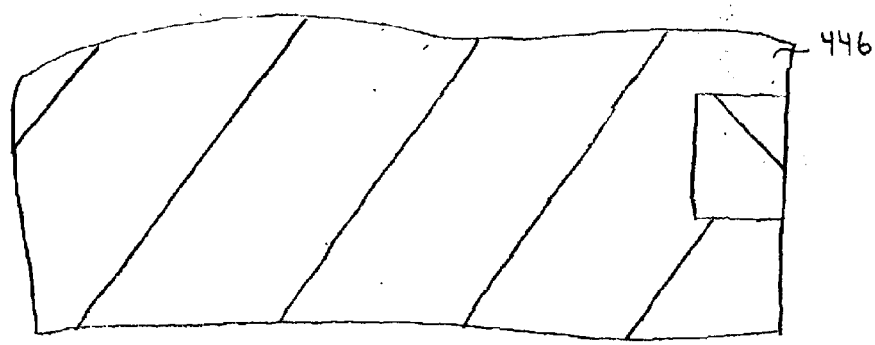
Figure 12J:
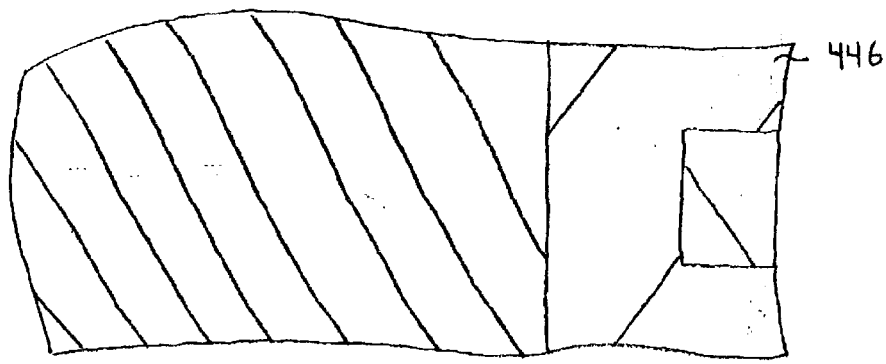

FIGS. 10J, 11J and 12J are cross-sectional, top and bottom views, respectively, of insulative support 446 formed on the structure by transfer molding.

Figure 10K:
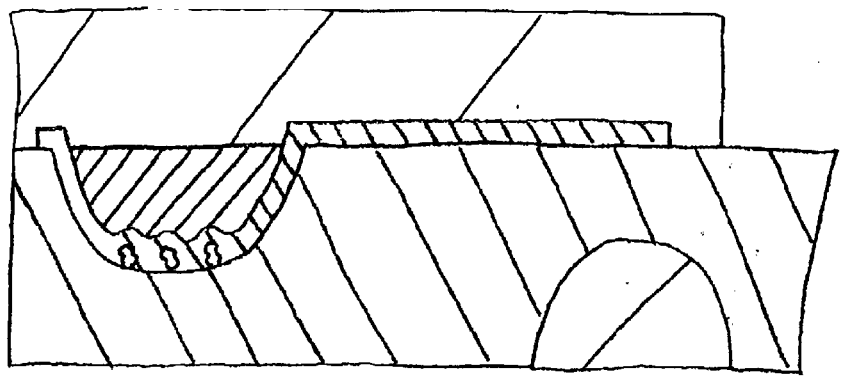
Figure 11K:
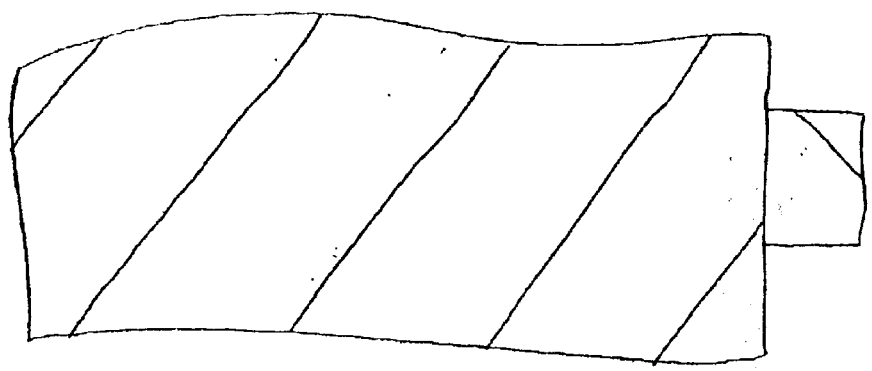
Figure 12K:
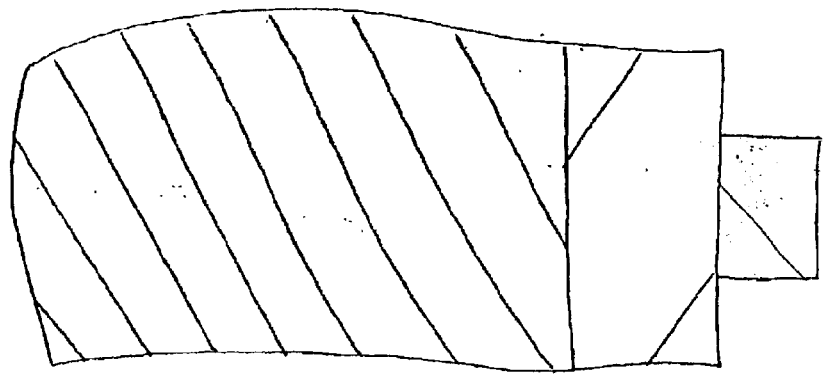

FIGS. 10K, 11K and 12K are cross-sectional, top and bottom views, respectively, of the structure after selected portions of insulative support 446 in slots 424 that extend laterally beyond recess 422 are removed.

Figure 10L:
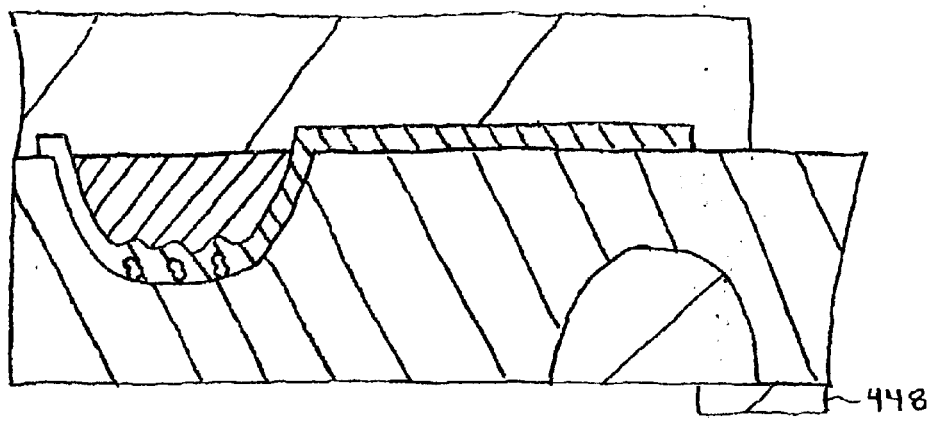
Figure 11L:
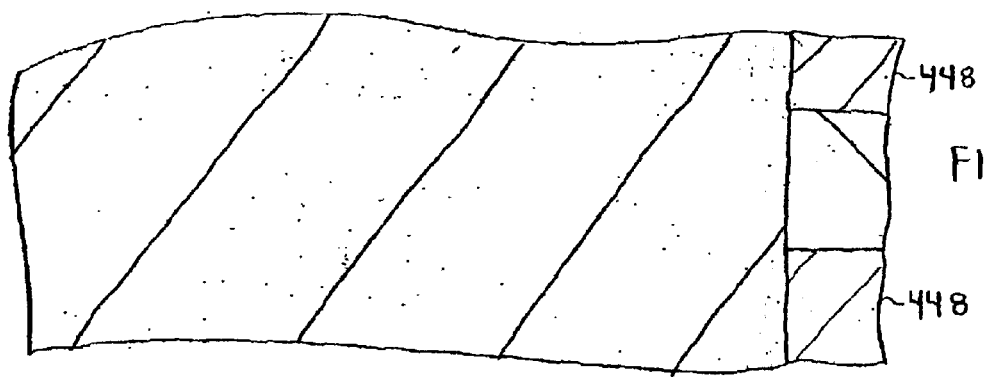
Figure 12L:
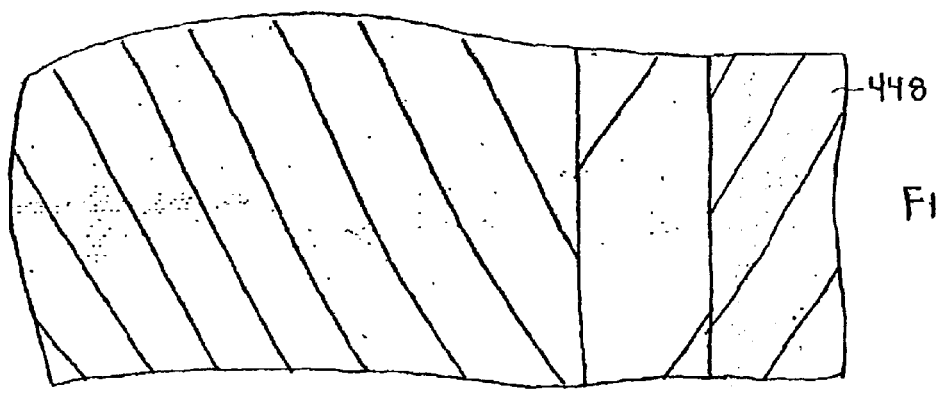

FIGS. 10L, 11L and 12L are cross-sectional, top and bottom views, respectively, of photoresist layer 448 formed on surface 414.

Figure 10M:
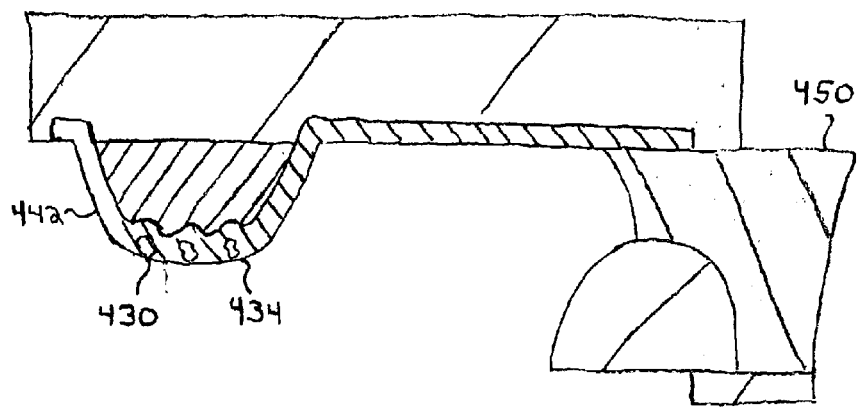
Figure 11M:
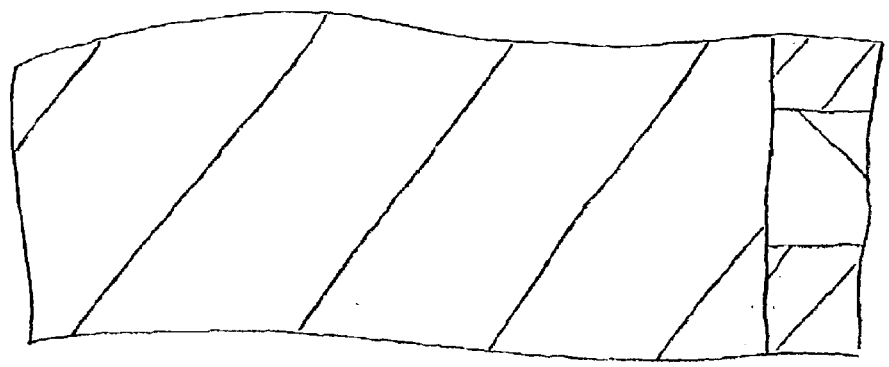
Figure 12M:
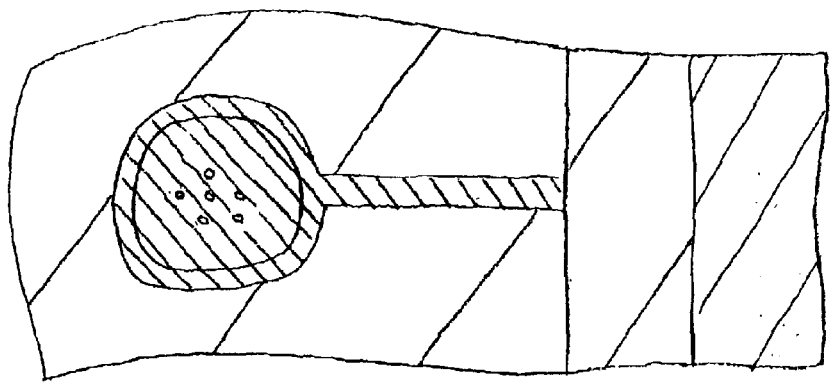

FIGS. 10M, 11M and 12M are cross-sectional, top and bottom views, respectively, of the structure after selected portions of base 410 are removed by wet chemical etching, and a remaining portion of base 410 forms lead 450. The wet chemical etch is highly selective of copper with respect to nickel, iron and the molding compound. As a result, particles 430 and undercoat plated metal 442 are exposed and form a relatively smooth surface at bumped terminal 434. Moreover, since particles 430 are embedded in undercoat plated metal 442, particles 430 remain affixed to undercoat plated metal 442 and are not dislodged.

Figure 10N:
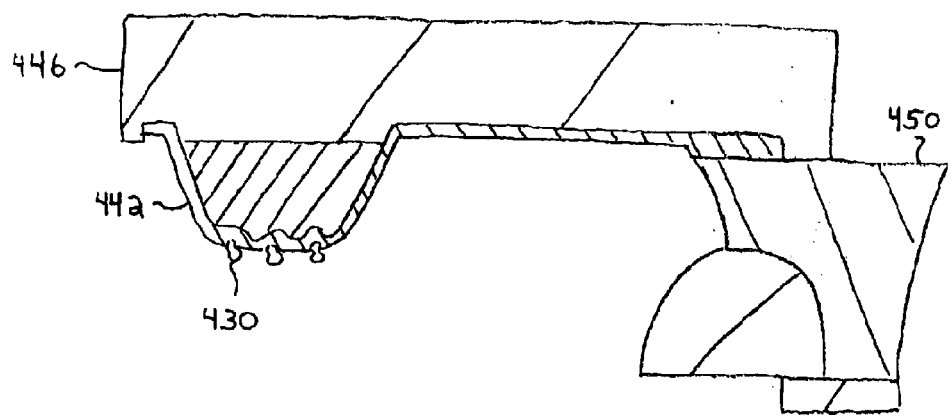
Figure 11N:
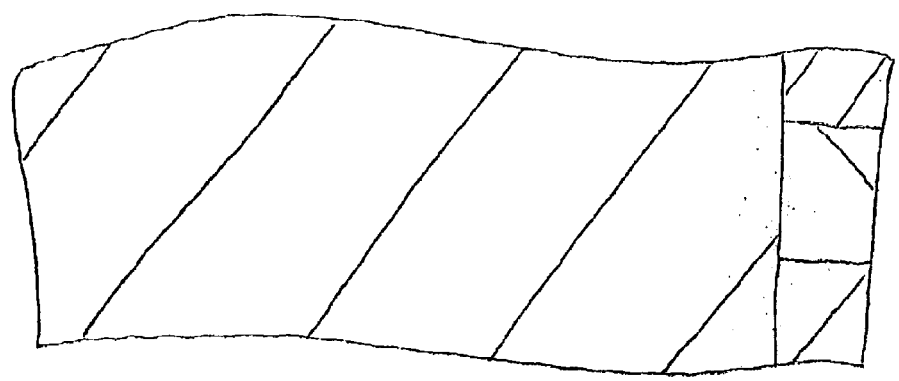
Figure 12N:
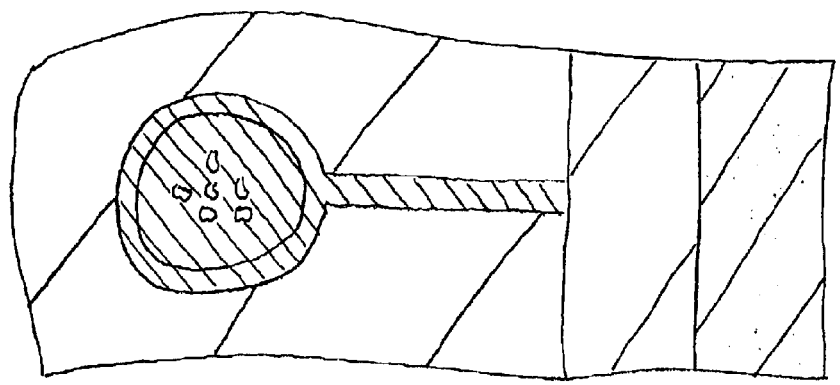

FIGS. 10N, 11N and 12N are cross-sectional, top and bottom views, respectively, of the structure after undercoat plated metal 442 is etched back so that particles 430 protrude therefrom. Undercoat plated metal 442 is etched back by applying a wet chemical etch (or "micro-etch") using a nickel etching solution that is highly selective of nickel with respect to iron and the molding compound. Therefore, no appreciable amount of particles 430 or insulative support 446 is removed. The micro-etch is relatively brief and etches partially but not completely through the exposed portions undercoat plated metal 442, removing a 10 micron upper portion and leaving a 15 micron lower portion intact. Particles 430 are embedded in and protrude from undercoat plated metal 442 and form small tips relative to undercoat plated metal 442. As a result, particles 430 and undercoat plated metal 442 form a jagged contact surface. Since the 10 micron etch depth is extremely thin relative to lead 450, it is not critical that the nickel etching solution be highly selective of nickel with respect to copper. A suitable nickel etching solution is a dilute mixture of nitric and hydrochloric acid.

Figure 10O:
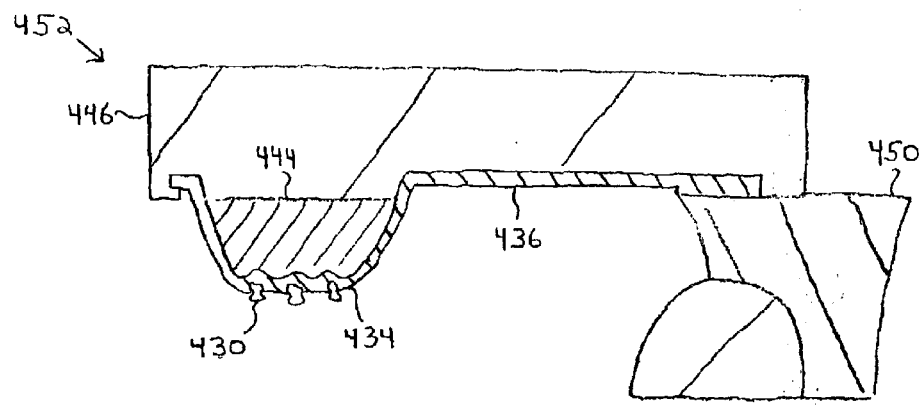
Figure 11O:
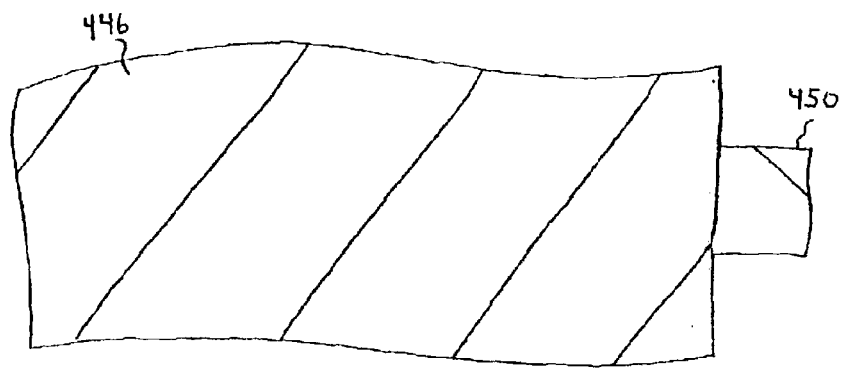
Figure 12O:
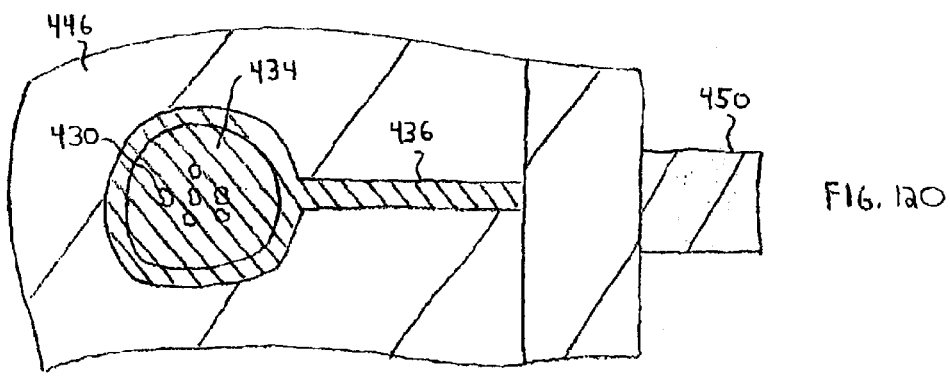

FIGS. 10O, 11O and 12O are cross-sectional, top and bottom views, respectively, of the structure after photoresist layer 448 is stripped. At this stage, the manufacture of test probe 452 that includes particles 430, bumped terminal 434, routing line 436, elastomer 444, insulative support 446 and lead 450 can be considered complete.

FIGS. 13A–13P, 14A–14P and 15A–15P are cross-sectional, top and bottom views, respectively, of a method of making a test probe in accordance with a fifth embodiment of the present invention. In the fifth embodiment, the particles include an insulative core coated with a catalytic material, the sacrificial plated metal is omitted, the undercoat plated metal is plated on the base and the particles, the undercoat plated metal is etched back so that the particles protrude therefrom, and an overcoat plated metal is deposited over the particles and the undercoat plated metal to provide the contact surface. For purposes of brevity, any description in the first embodiment is incorporated herein insofar as the same is applicable, and the same description need not be repeated. Likewise, elements of the fifth embodiment similar to those in the first embodiment have corresponding reference numerals indexed at five-hundred rather than one-hundred. For instance, base 510 corresponds to base 110, conductive trace 532 corresponds to conductive trace 132, etc.

Figure 13A:
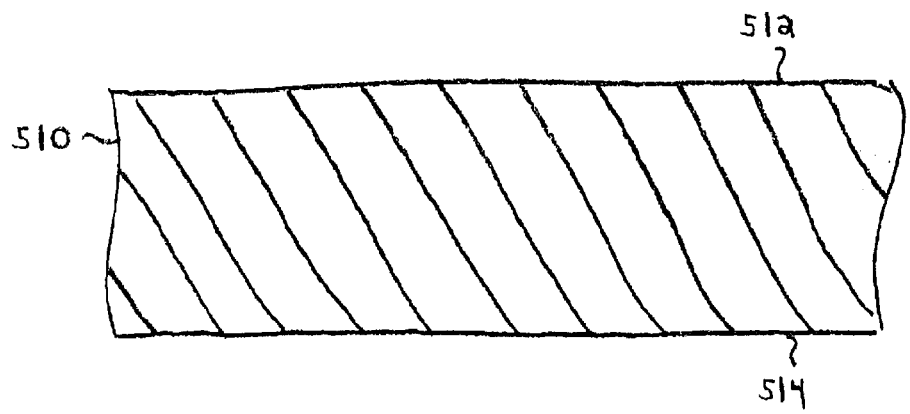
FIGS. 13A–13P are cross-sectional views showing a method of making a test probe in accordance with a fifth embodiment of the present invention.
Figure 14A:
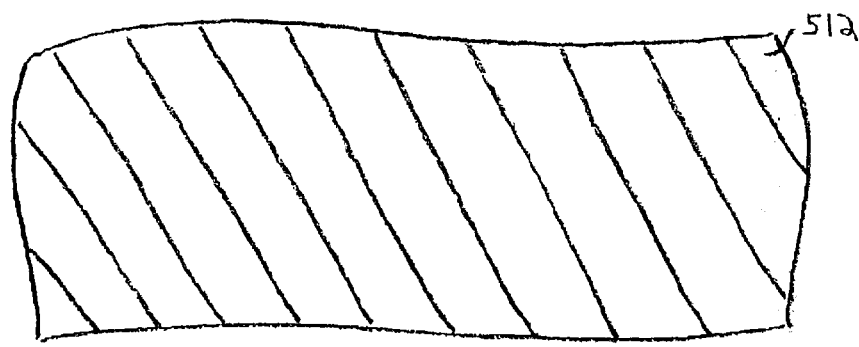
FIGS. 14A–14P are top plan views corresponding to FIGS. 13A–13P, respectively.
Figure 15A:
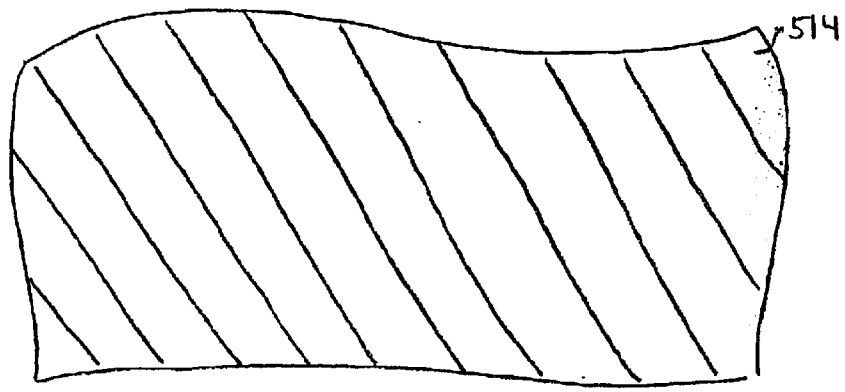
FIGS. 15A–15P are bottom plan views corresponding to FIGS. 13A–13P, respectively.

FIGS. 13A, 14A and 15A are cross-sectional, top and bottom views, respectively, of base 510 which includes surfaces 512 and 514.

Figure 13B:
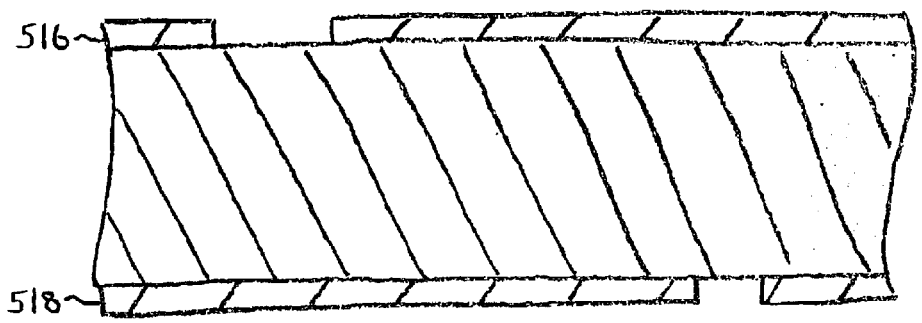
Figure 14B:
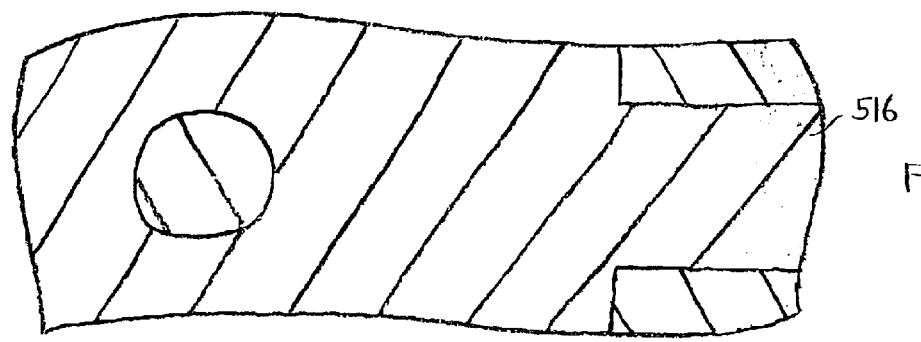
Figure 15B:
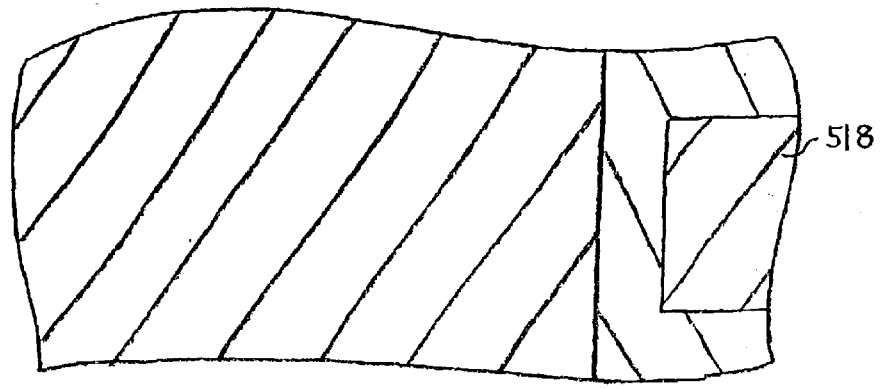

FIGS. 13B, 14B and 15B are cross-sectional, top and bottom views, respectively, of photoresist layers 516 and 518 formed on surfaces 512 and 514, respectively.

Figure 13C:
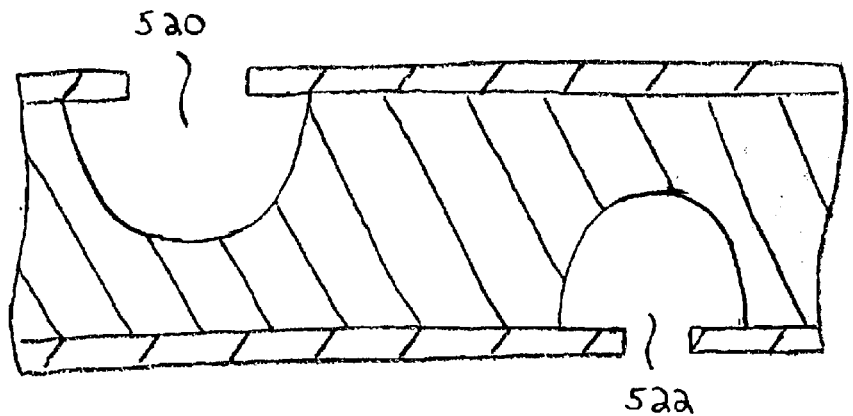
Figure 14C:
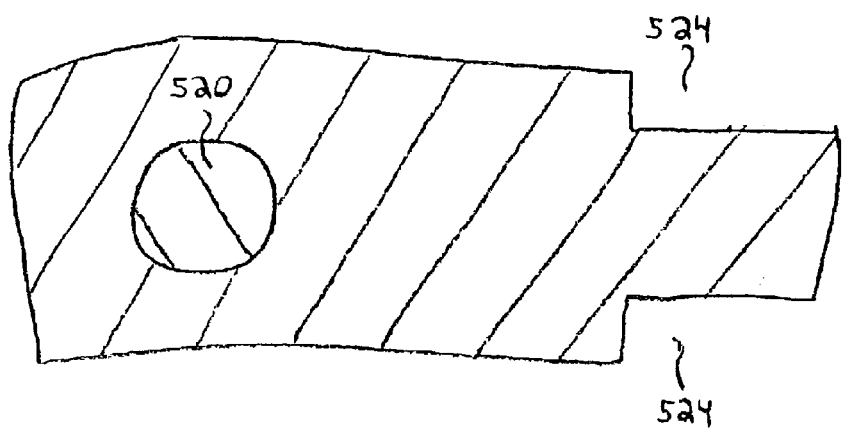
Figure 15C:
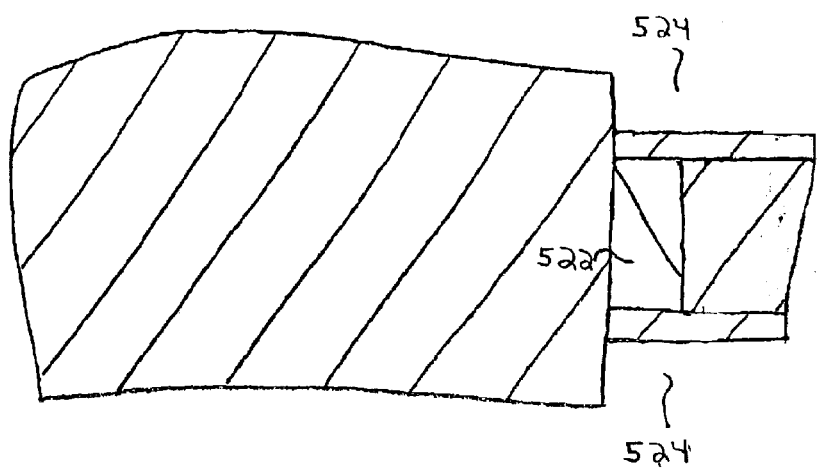

FIGS. 13C, 14C and 15C are cross-sectional, top and bottom views, respectively, of recesses 520 and 522 and slots 524 formed in base 510 by wet chemical etching.

Figure 13D:
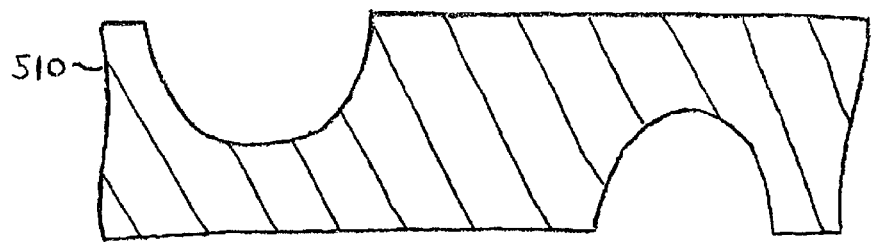
Figure 14D:
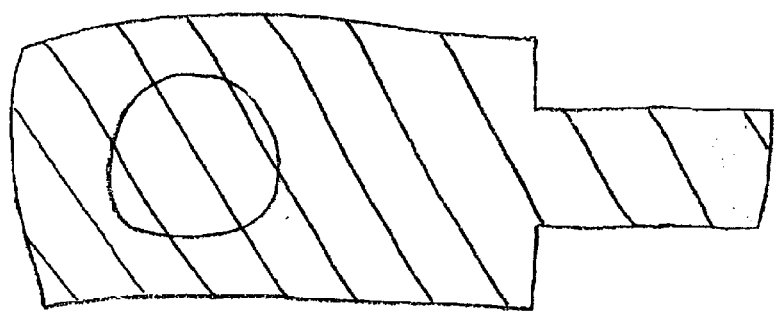
Figure 15D:
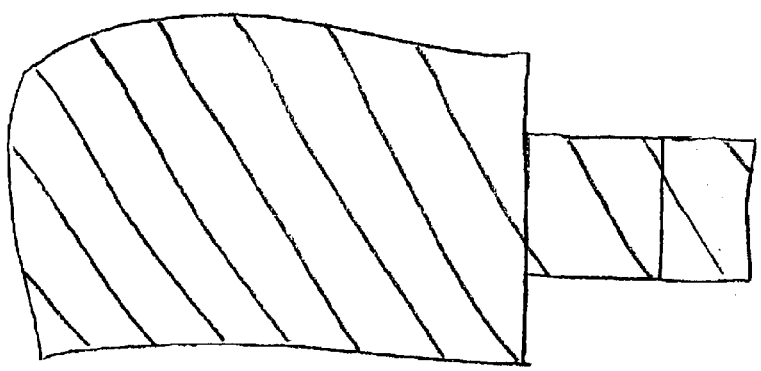

FIGS. 13D, 14D and 15D are cross-sectional, top and bottom views, respectively, of base 510 after photoresist layers 516 and 518 are stripped.

Figure 13E:
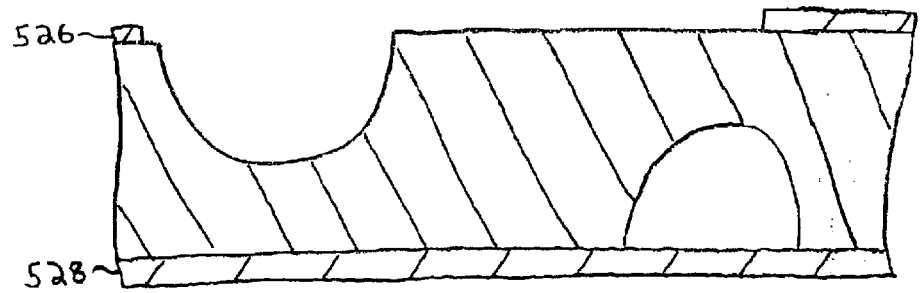
Figure 14E:
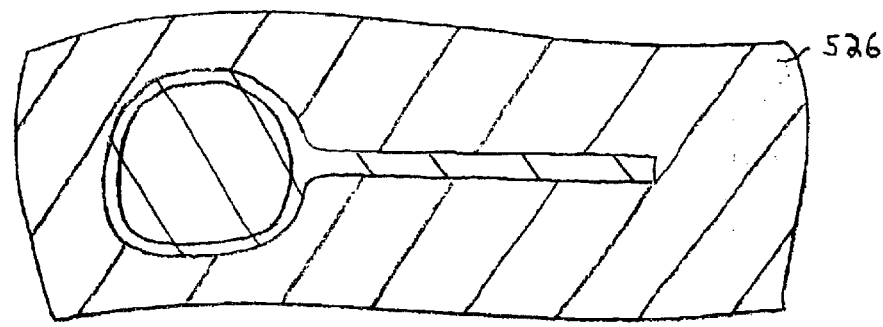
Figure 15E:
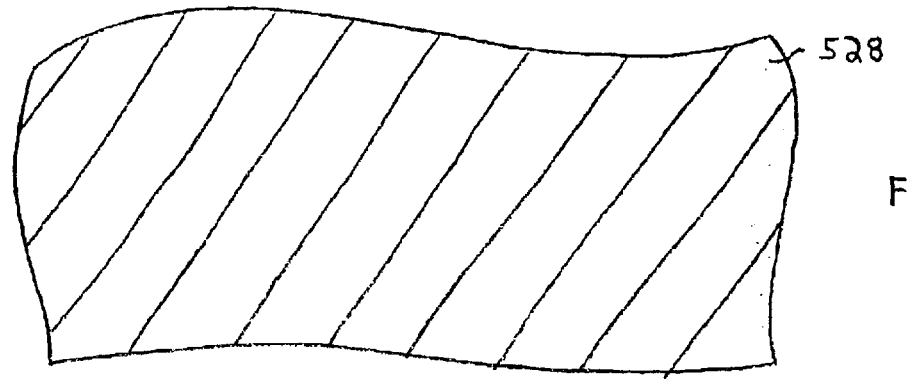

FIGS. 13E, 14E and 15E are cross-sectional, top and bottom views, respectively, of photoresist layers 526 and 528 formed on surfaces 512 and 514, respectively.

Figure 13F:
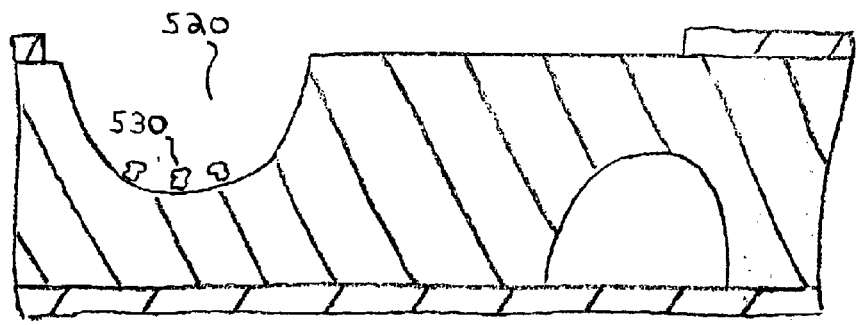
Figure 14F:
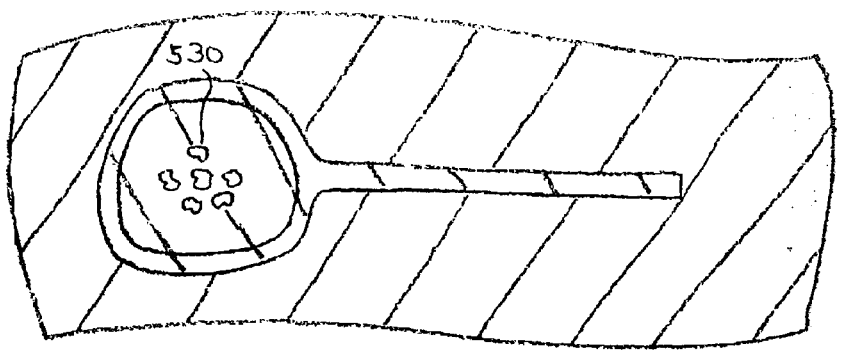
Figure 15F:
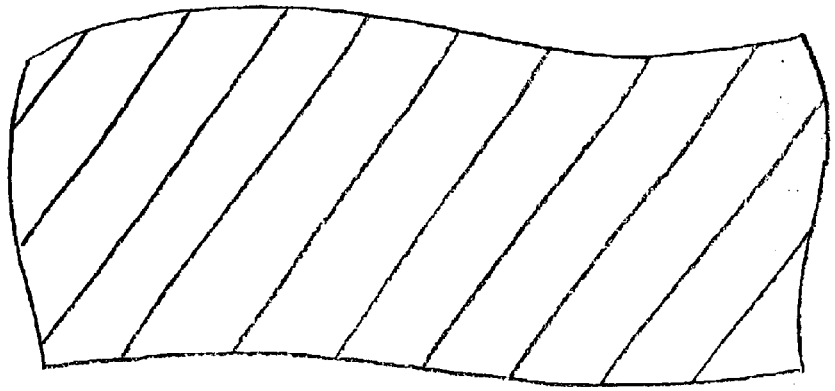

FIGS. 13F, 14F and 15F are cross-sectional, top and bottom views, respectively, of particles 530 deposited in recess 520. Particles 530 include a diamond core coated with a nucleation surface layer and have an average diameter of 25 microns. Thus, particles 530 have a different composition than particles 130.

Particles 530 are initially diamond particles. Although the diamond particles are insulators and thus not suitable for the contact surface, the diamond particles can be used to make an overlaying contact surface jagged. Therefore, the diamond particles are subsequently covered by an overcoat plated metal composed of electroless nickel so that the entire contact surface is conductive. The diamond particles need to be rendered catalytic to electroless nickel before a subsequent nickel electroless plating operation begins. To accomplish this, the diamond particles are dipped in a nickel activator solution such as is MacDermid M-SYSTEMS™. The nickel activator solution coats the diamond particles with a nucleation surface layer that renders the diamond particles catalytic to electroless nickel. Thus, particles 530 include a diamond core coated and surrounded by a nucleation surface layer that is catalytic to electroless nickel.

Figure 13G:
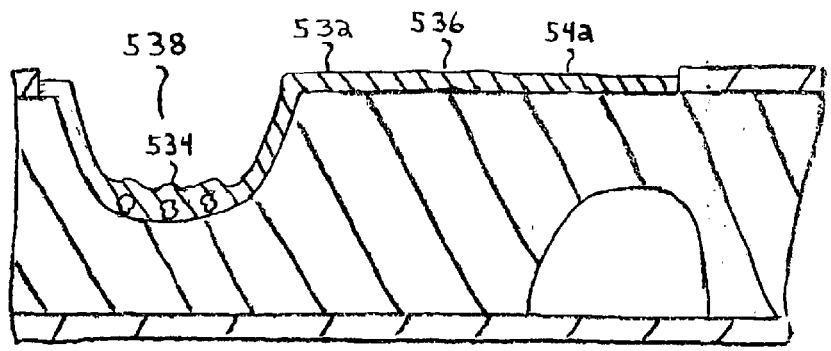
Figure 14G:
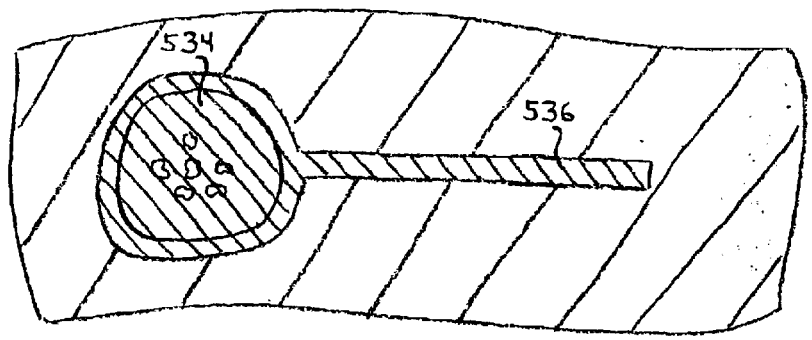
Figure 15G:
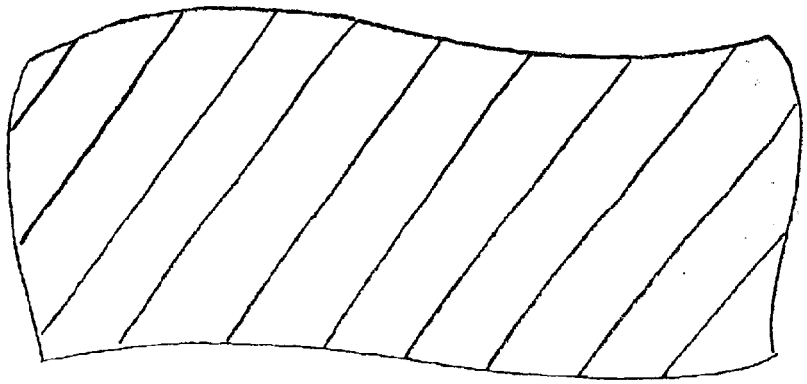

FIGS. 13G, 14G and 15G are cross-sectional, top and bottom views, respectively, of conductive trace 532 formed on base 510 and particles 530 by electroplating. Conductive trace 532 includes bumped terminal 534 and routing line 536, and bumped terminal 534 includes cavity 538.

Conductive trace 532 includes undercoat plated metal 542 deposited on base 510 and particles 530. Undercoat plated metal 542 is composed of nickel and has a thickness of 25 microns. Thus, conductive trace 532 does not include a sacrificial plated metal, and undercoat plated metal 542 thicker than undercoat plated metal 142.

Conductive trace 532 is formed by an electroplating operation. Initially, a plating bus (not shown) is connected to base 510, current is applied to the plating bus from an external power source, and base 510 is submerged in an electrolytic nickel plating solution such as Technic Techni Nickel "S" at room temperature. As a result, undercoat plated metal 542 electroplates on the exposed portions of base 510 and particles 530. Undercoat plated metal 542 contacts particles 530 and locks particles 530 into recess 520. Thus, particles 530 are embedded in undercoat plated metal 542 and sealed by base 510 and undercoat plated metal 542. The nickel electroplating operation continues until undercoat plated metal 542 has the desired thickness. Thereafter, the structure is removed from the nickel electrolytic bath and rinsed in distilled water to remove contaminants.

Figure 13H:
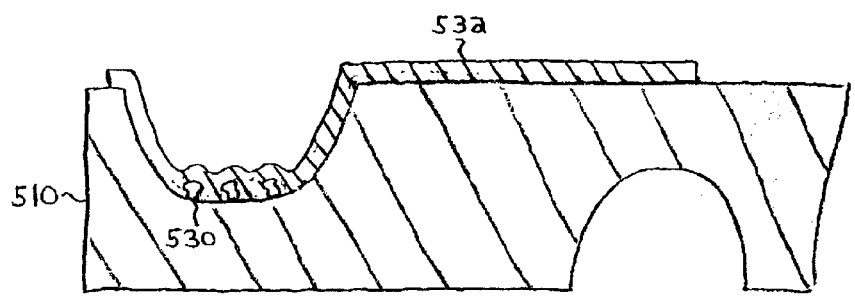
Figure 14H:
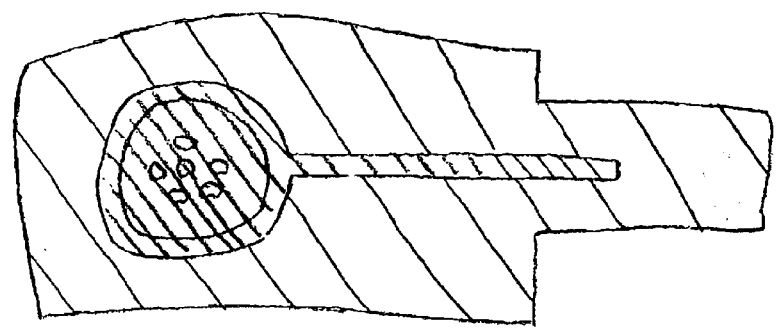
Figure 15H:
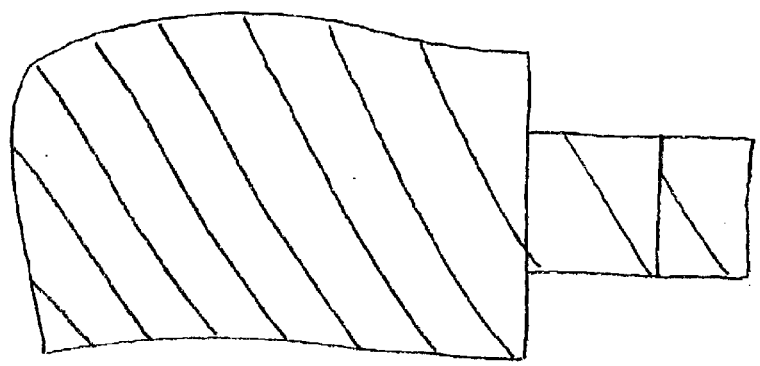

FIGS. 13H, 14H and 15H are cross-sectional, top and bottom views, respectively, of base 510, particles 530 and conductive trace 532 after photoresist layers 526 and 528 are stripped.

Figure 13I:
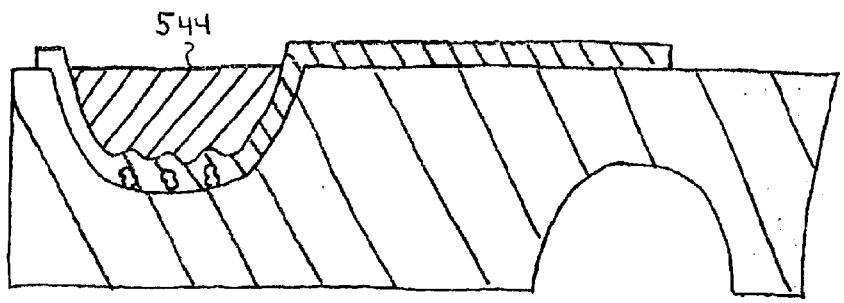
Figure 14I:
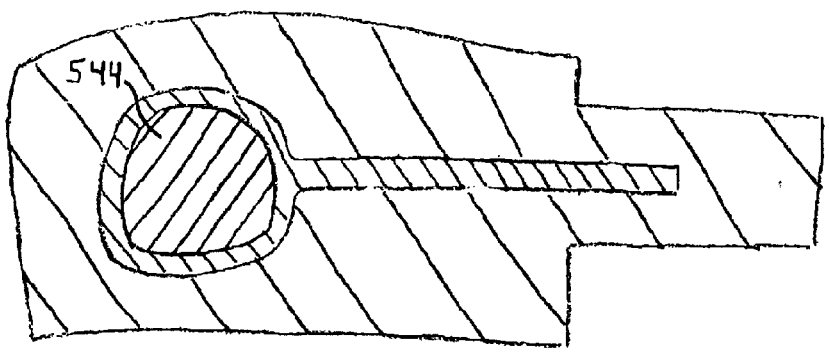
Figure 15I:
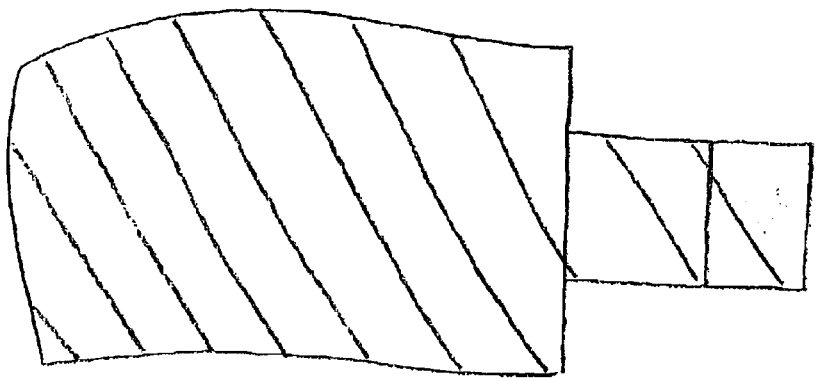

FIGS. 13I, 14I and 15I are cross-sectional, top and bottom views, respectively, of elastomer 544 formed in cavity 538 of bumped terminal 534.

Figure 13J:
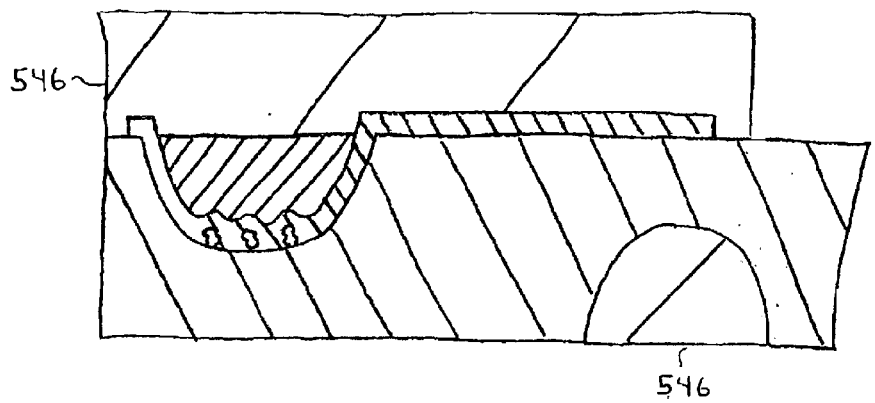
Figure 14J:
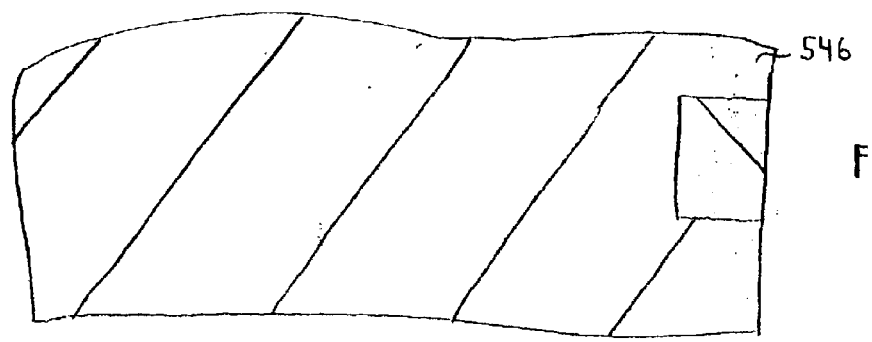
Figure 15J:
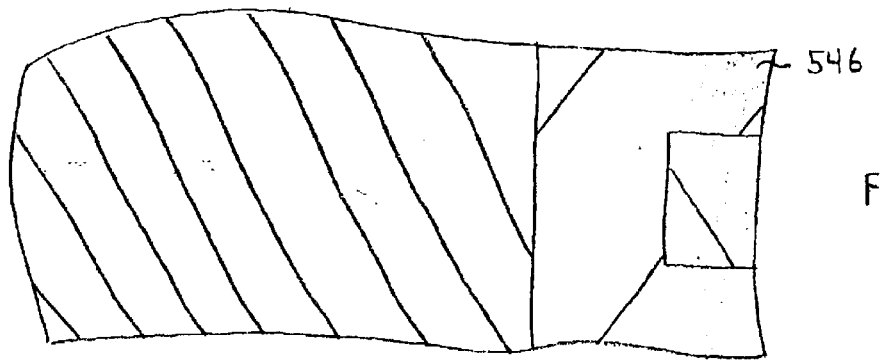

FIGS. 13J, 14J and 15J are cross-sectional, top and bottom views, respectively, of insulative support 546 formed on the structure by transfer molding.

Figure 13K:
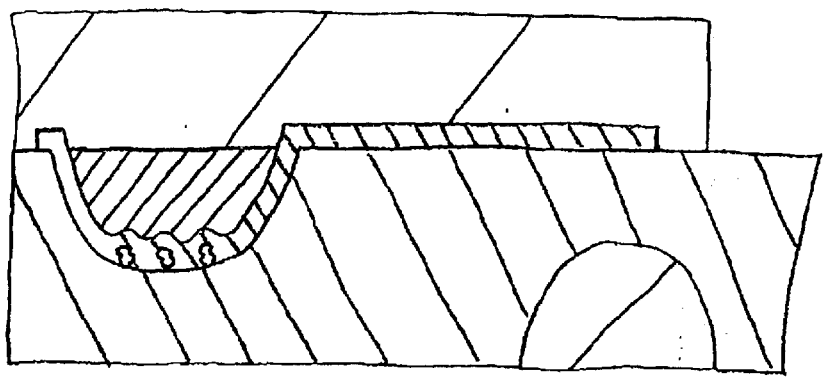
Figure 14K:
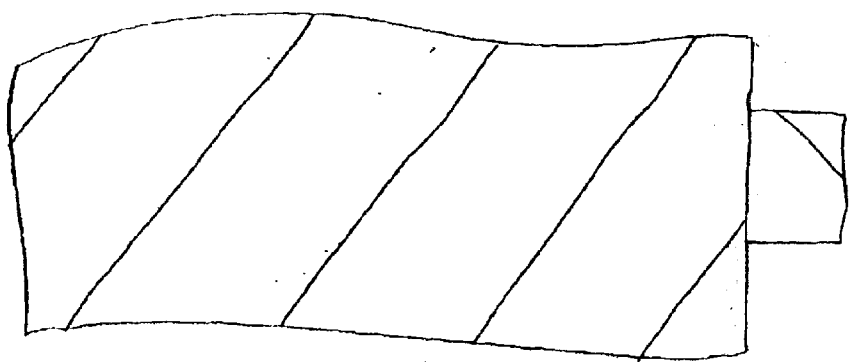
Figure 15K:
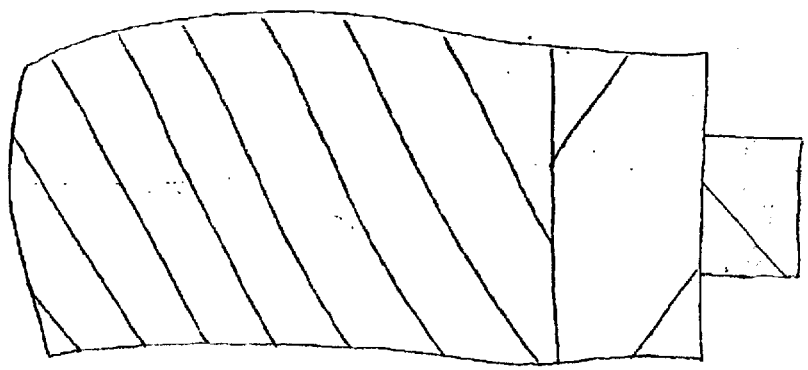

FIGS. 13K, 14K and 15K are cross-sectional, top and bottom views, respectively, of the structure after selected portions of insulative support 546 in slots 524 that extend laterally beyond recess 522 are removed.

Figure 13L:
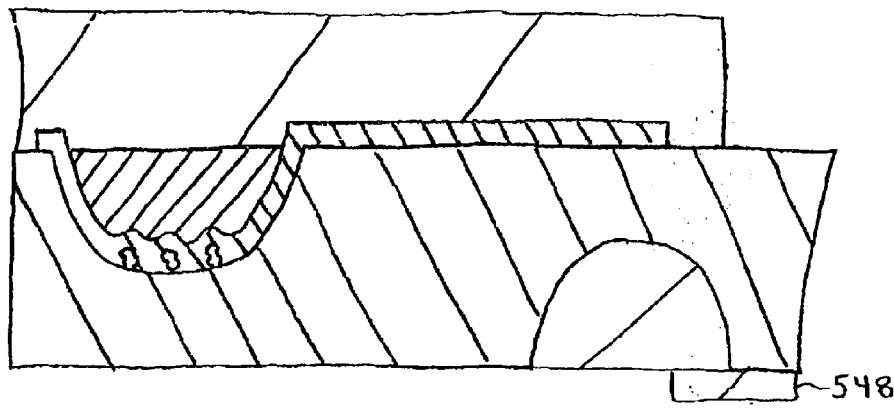
Figure 14L:
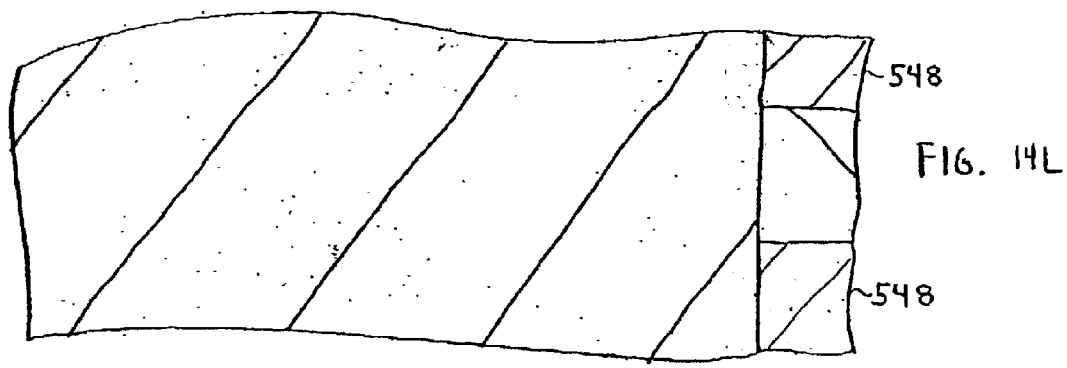
Figure 15L:
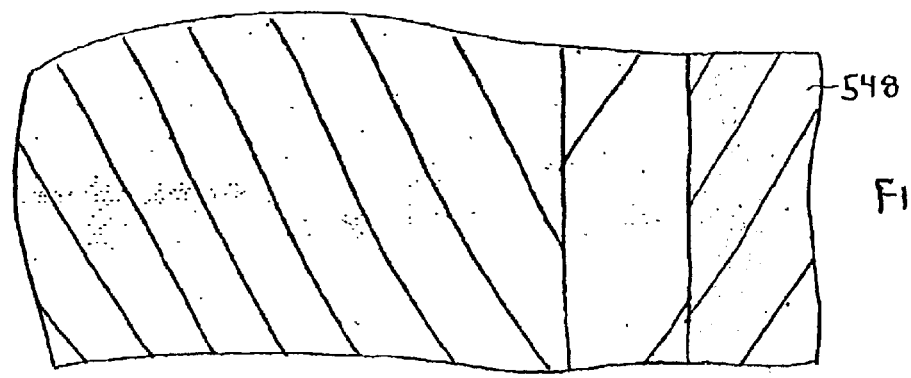

FIGS. 13L, 14L and 15L are cross-sectional, top and bottom views, respectively, of photoresist layer 548 formed on surface 514.

Figure 13M:
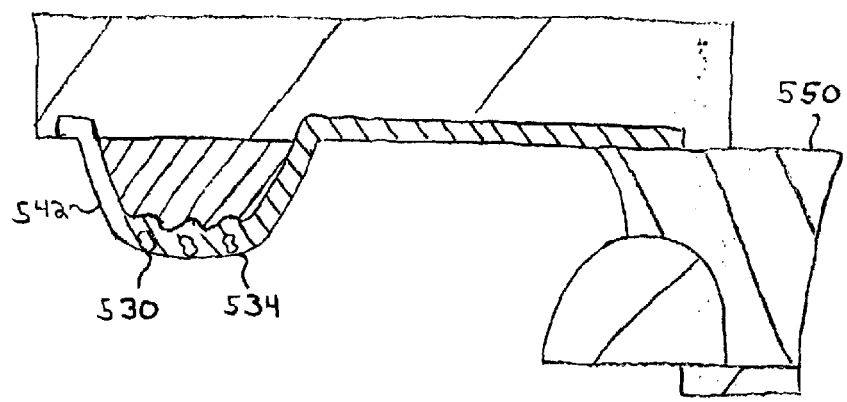
Figure 14M:
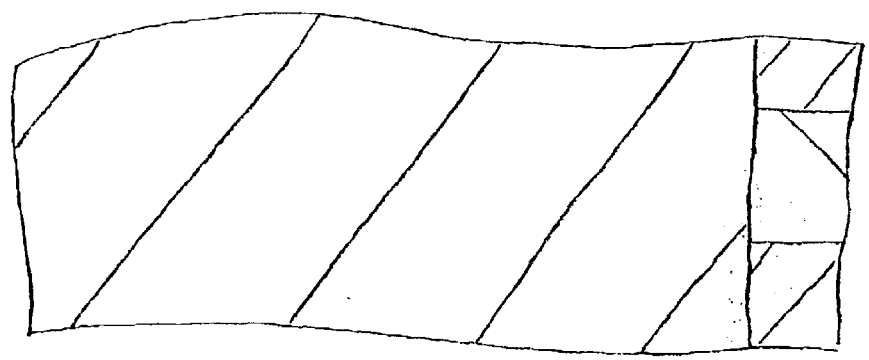
Figure 15M:
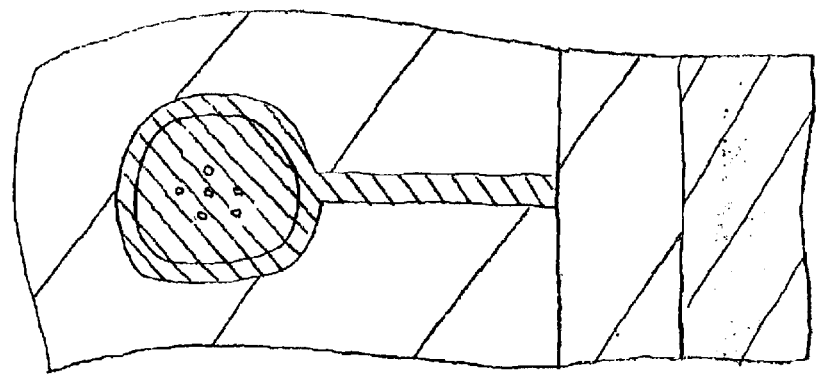

FIGS. 13M, 14M and 15M are cross-sectional, top and bottom views, respectively, of the structure after selected portions of base 510 are removed by wet chemical etching, and a remaining portion of base 510 forms lead 550. The wet chemical etch is highly selective of copper with respect to nickel, the nucleation layer and the molding compound. As a result, particles 530 and undercoat plated metal 542 are exposed and form a relatively smooth surface at bumped terminal 534. Moreover, since particles 530 are embedded in undercoat plated metal 542, particles 530 remain affixed to undercoat plated metal 542 and are not dislodged.

Figure 13N:
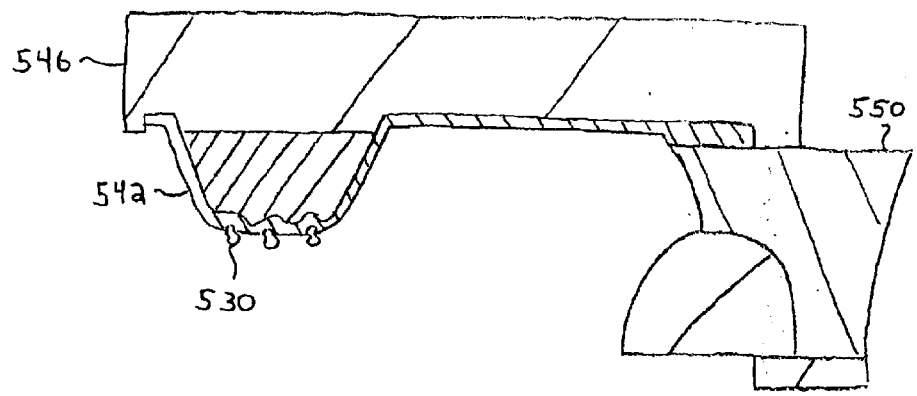
Figure 14N:
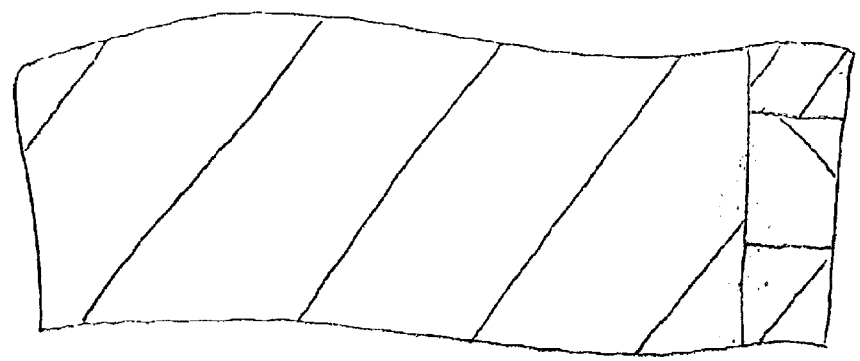
Figure 15N:
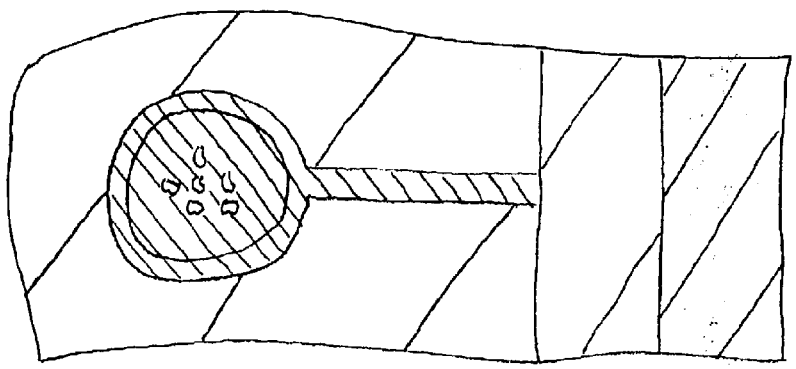
Figure 130:
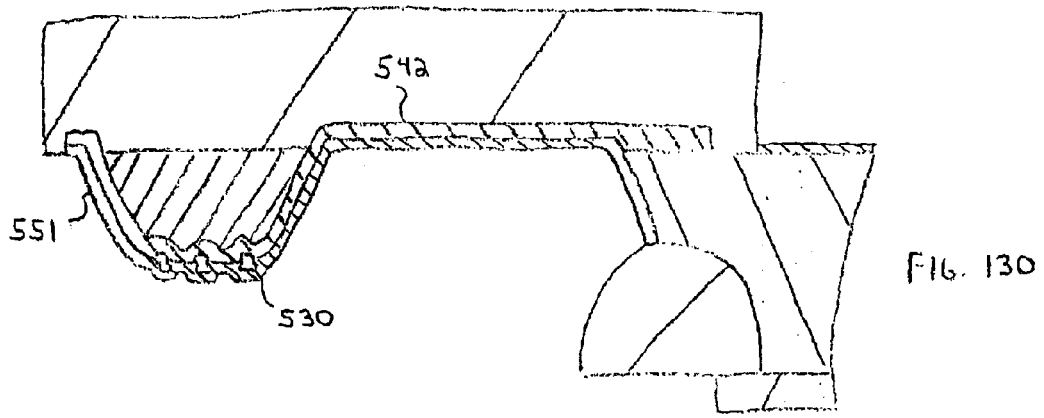
Figure 140:
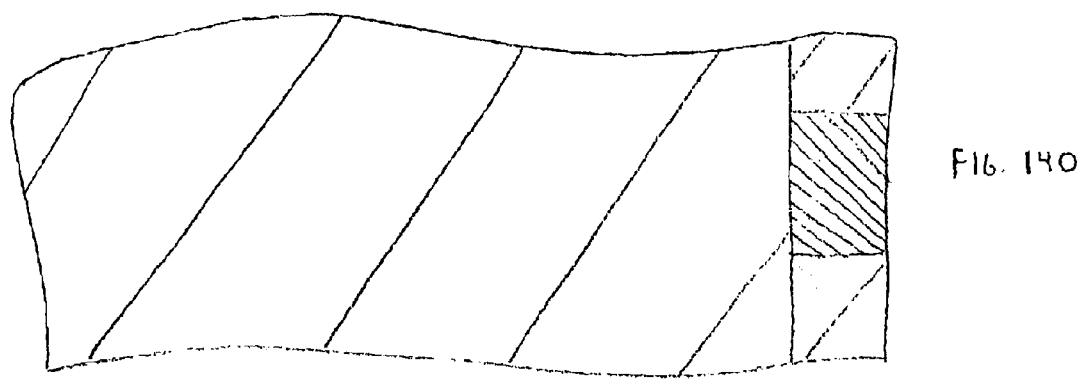
Figure 150:
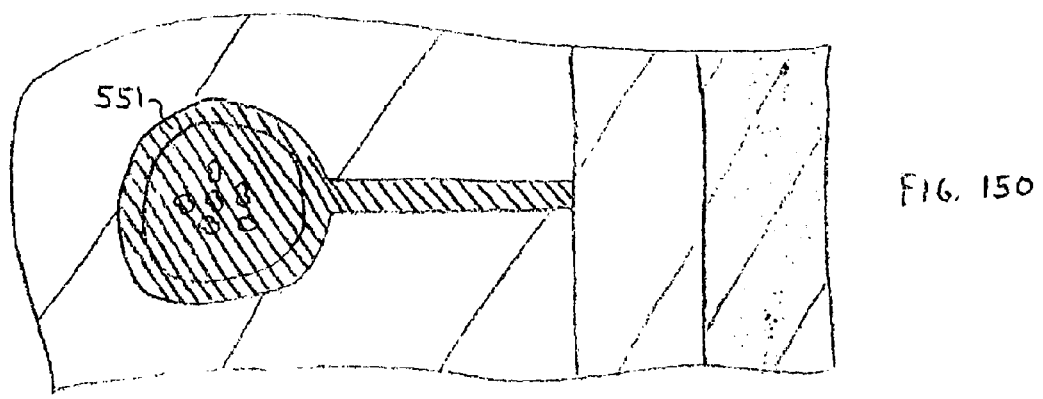

FIGS. 13N, 14N and 15N are cross-sectional, top and bottom views, respectively, of the structure after undercoat plated metal 542 is etched back so that particles 530 protrude therefrom. Undercoat plated metal 542 is etched back by applying a wet chemical etch (or "micro-etch") using a nickel etching solution that is highly selective of nickel with respect to the nucleation layer and the molding compound. Therefore, no appreciable amount of particles 530 or insulative support 546 is removed. The micro-etch is relatively brief and etches partially but not completely through the exposed portions undercoat plated metal 542, removing a 10 micron upper portion and leaving a 15 micron lower portion intact. Particles 530 are embedded in and protrude from undercoat plated metal 542 and form small tips relative to undercoat plated metal 542. As a result, particles 530 and undercoat plated metal 542 form a jagged surface. Since the 10 micron etch depth is extremely thin relative to lead 550, it is not critical that the nickel etching solution be highly selective of nickel with respect to copper. A suitable nickel etching solution is a dilute mixture of nitric and hydrochloric acid.

FIGS. 13O, 14O and 15O are cross-sectional, top and bottom views, respectively, of overcoat plated metal 551 formed on particles 530 and undercoat plated metal 542 by electroless plating.

Electroless plating provides metal deposition by an exchange reaction between metal complexes in a solution and a catalytic metal that activates or initiates the reaction. As a result, the electroless metal continually plates (i.e., deposits or grows) on the catalytic metal. Advantageously, the reaction does not require externally applied electric current. Therefore, electroless plating can proceed without a plating bus.

Particles 530 include a nucleation surface layer that is catalytic to electroless nickel, and undercoat plated metal 542 is composed of nickel and therefore catalytic to electroless nickel. However, insulative support 546 is not catalytic to electroless nickel.

In order to initiate electroless deposition of overcoat plated metal 551, the structure is dipped in an electroless nickel plating solution such as Enthone Enplate N_-424 at 85° C. Preferred nickel plating solutions include nickel-sulfate and nickel-chloride and have a pH of about 9.5 to 10.5. A higher nickel concentration provides a faster plating rate but reduces the stability of the solution. The amount of chelating agents or ligands in the solution depends on the nickel concentration and their chemical structure, functionality and equivalent weight. Most of the chelating agents used in electroless nickel plating solutions are hydroxy organic acids which form one or more water soluble nickel ring complexes. These complexes reduce the free nickel ion concentration, thereby increasing the stability of the solution while retaining a reasonably fast plating rate. Generally, the higher the complex agent concentration, the slower the plating rate. In addition, the pH of the solution and the plating rate continually decrease as the electroless plating continues due to hydrogen ions being introduced into the solution as a byproduct of the nickel reduction. Accordingly, the solution is buffered to offset the effects of the hydrogen ions. Suitable buffering agents include sodium or potassium salts of mono and dibasic organic acids. Finally, those skilled in the art will understand that electroless nickel plating solutions do not deposit pure elemental nickel since a reducing agent such as $H_2PO_2$ will naturally decompose into the electrolessly plated nickel. Therefore, those skilled in the art will understand that electrolessly plated nickel refers to a nickel compound that is mostly nickel but not pure elemental nickel.

The nickel electroless plating operation continues until overcoat plated metal 551 has the desired thickness. Thereafter, the structure is removed from the electroless nickel plating solution and rinsed in distilled water.

Overcoat plated metal 551 is primarily nickel and contains about 4 to 9 weight percentage phosphorus and is 10 microns thick. Since overcoat plated metal 551 electrolessly plates on and covers particles 530 and undercoat plated metal 542, overcoat plated metal 551 provides a conformal coating with a similar topology to particles 530 and undercoat plated metal 542. That is, overcoat plated metal 551 includes sharp tips that correspond to the protrusion of particles 530 from undercoat plated metal 542. As a result, overcoat plated metal 551 provides a jagged contact surface that is conductive and spaced from and proximate to particles 530 and undercoat plated metal 542.

Overcoat plated metal 551 also forms on routing line 536 and lead 550, although these portions of overcoat plated metal 551 are relatively unimportant byproducts of the nickel electroless plating operation.

Figure 13P:
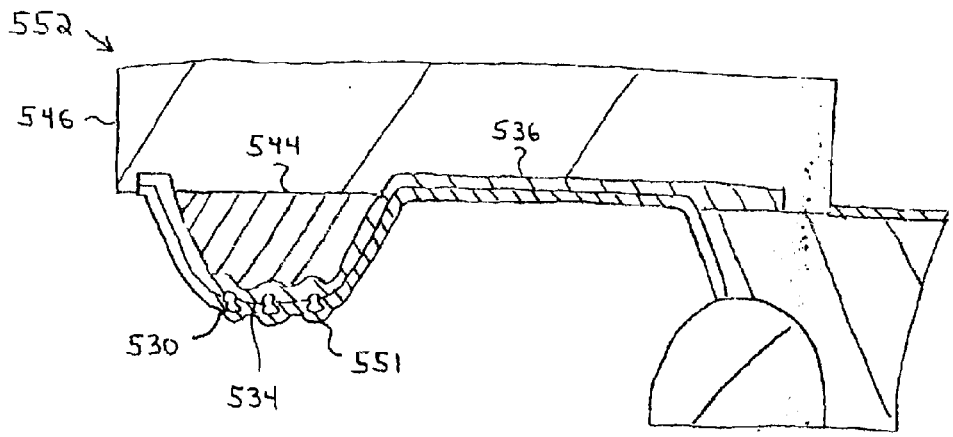
Figure 14P:
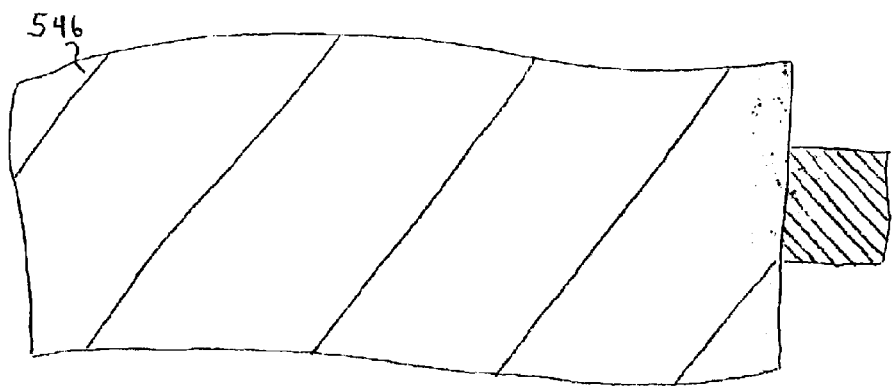
Figure 15P:
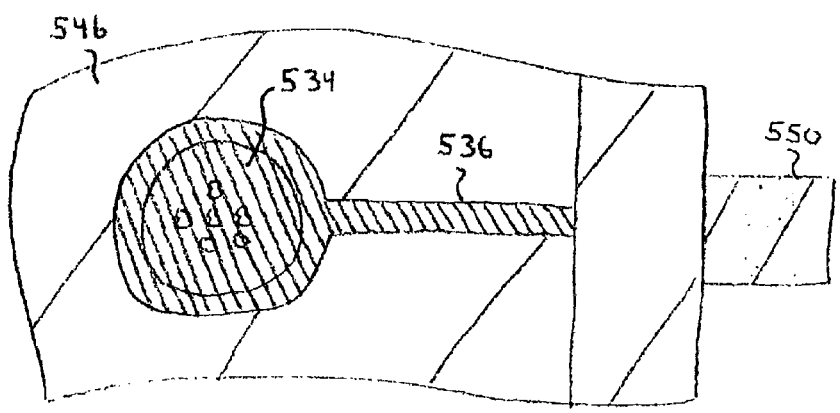

FIGS. 13P, 14P and 15P are cross-sectional, top and bottom views, respectively, of the structure after photoresist layer 548 is stripped. At this stage, the manufacture of test probe 552 that includes particles 530, bumped terminal 534, routing line 536, elastomer 544, insulative support 546, lead 550 and overcoat plated metal 551 can be considered complete.

Figure 16:
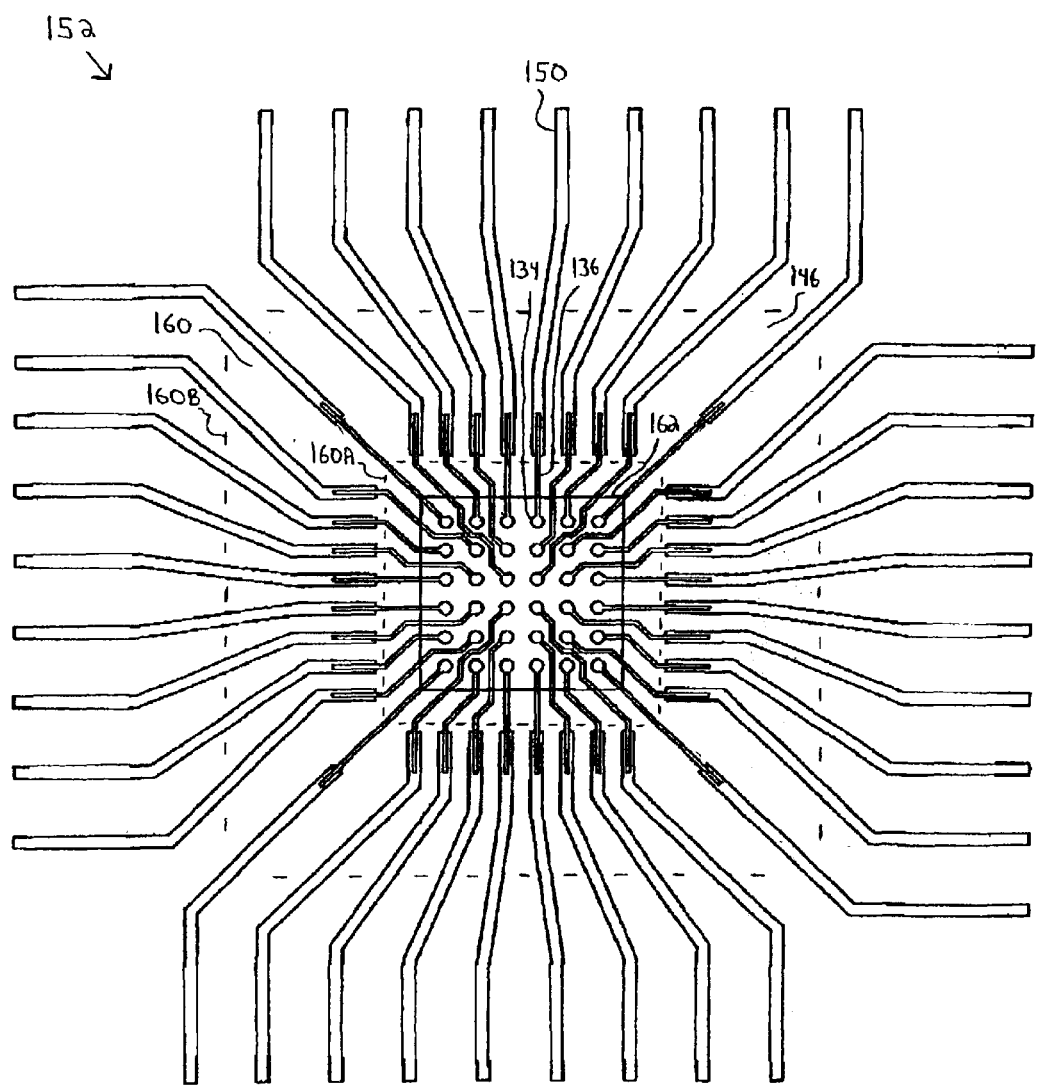
FIG. 16 is an expanded top plan view of a test probe in accordance with the first embodiment of the present invention.
Figure 1A:
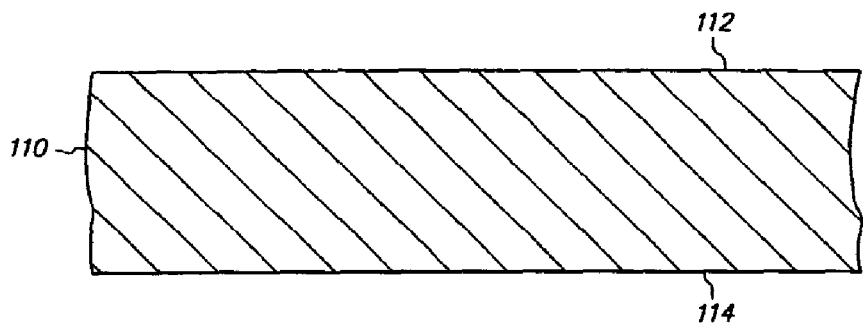
Figure 2A:
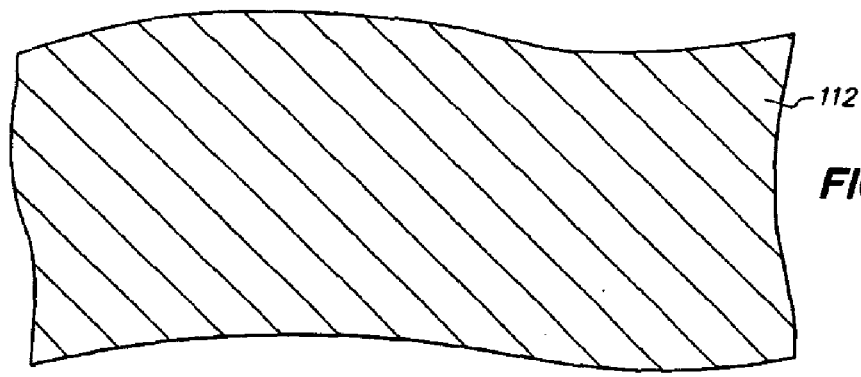
Figure 3A:
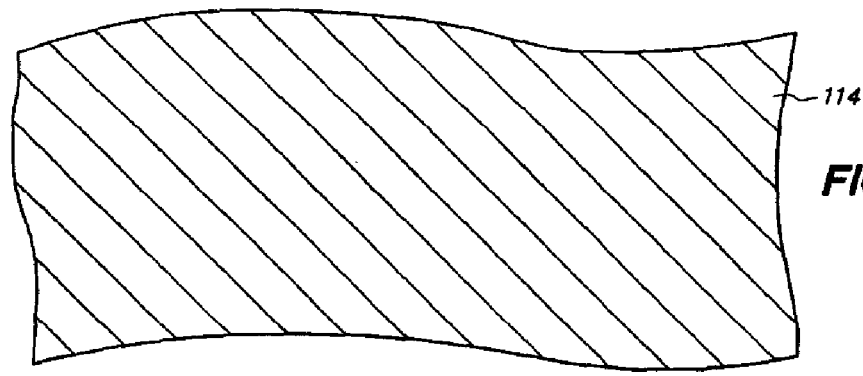
Figure 1B:
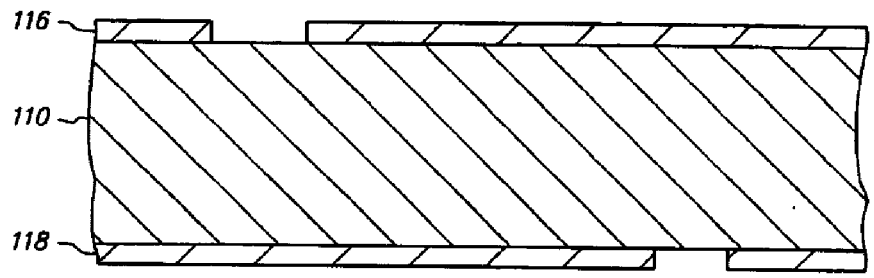
Figure 2B:
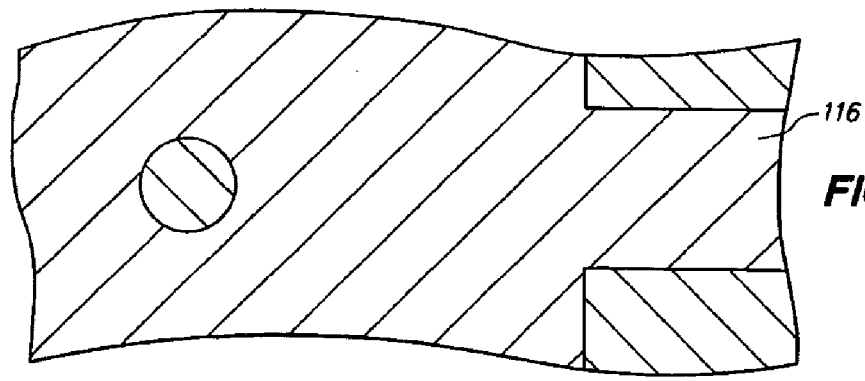
Figure 3B:
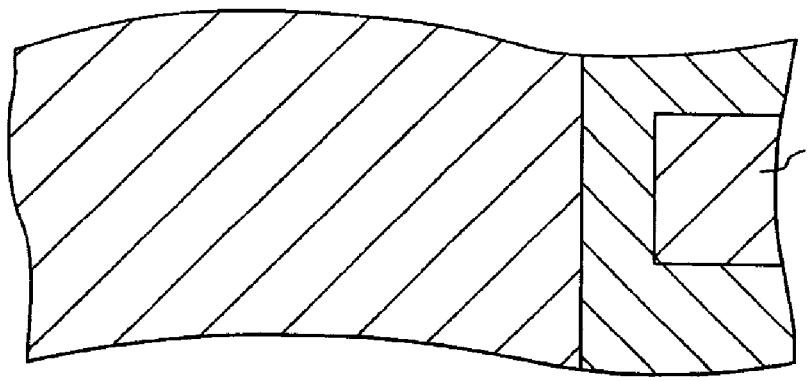
Figure 1C:
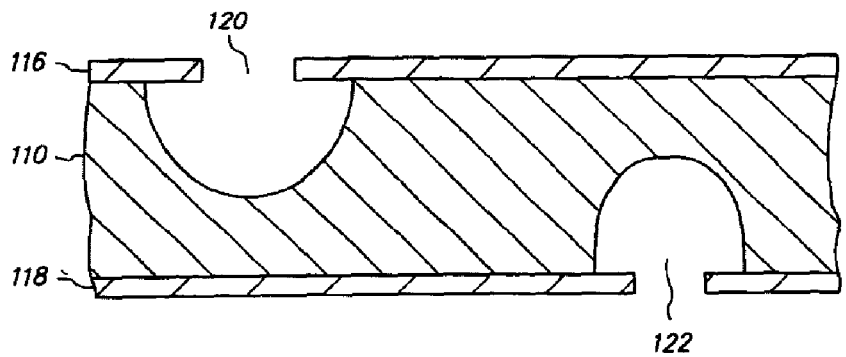
Figure 2C:
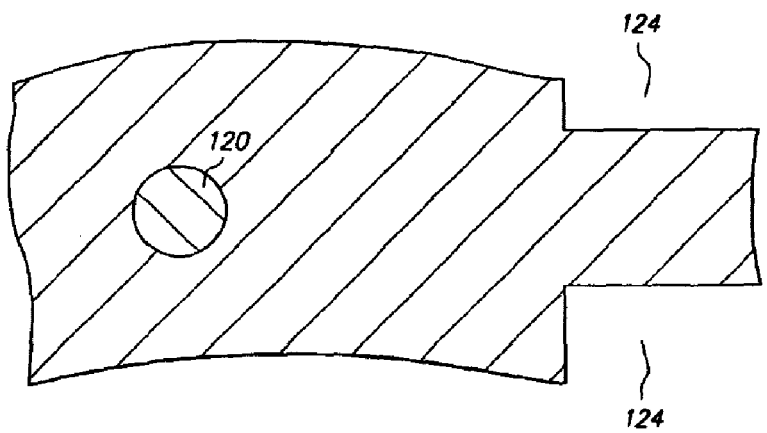
Figure 3C:
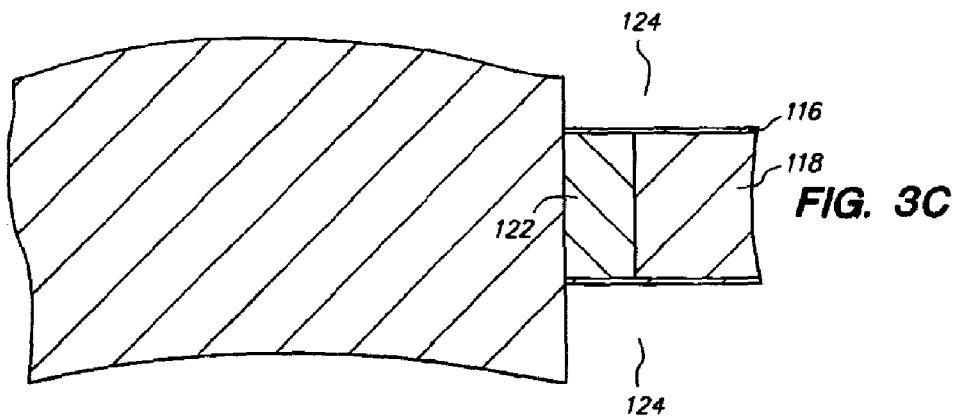
Figure 1D:
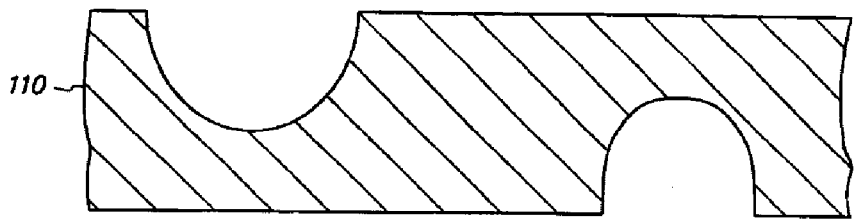
Figure 2D:
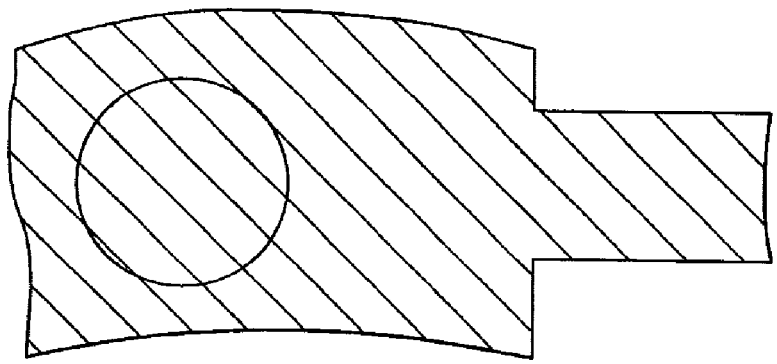
Figure 3D:
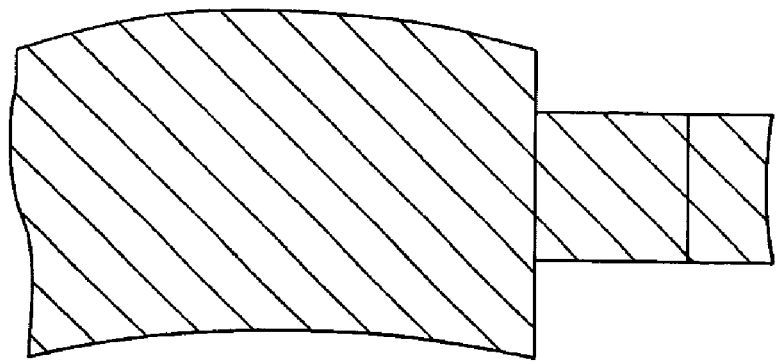
Figure 1E:
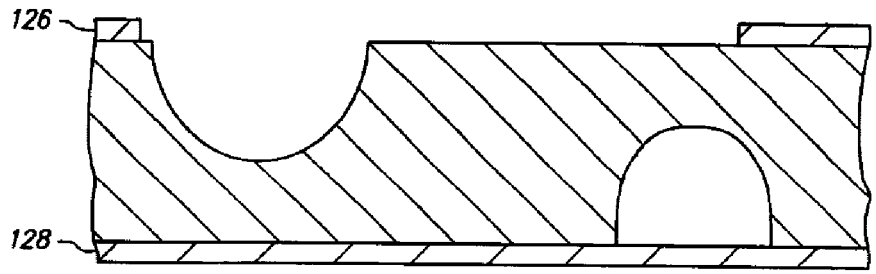
Figure 2E:
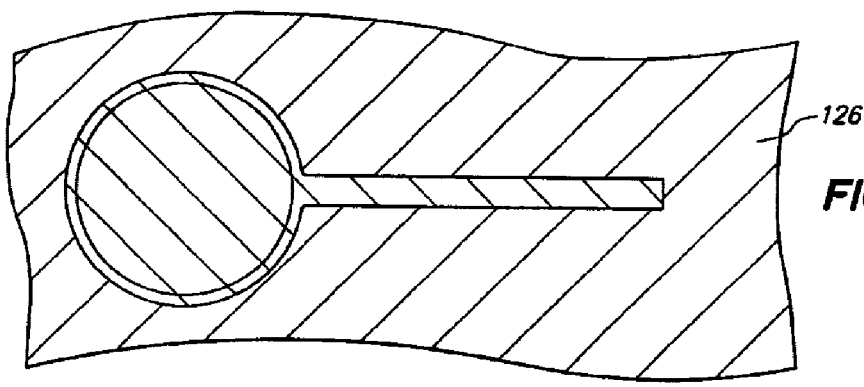
Figure 3E:
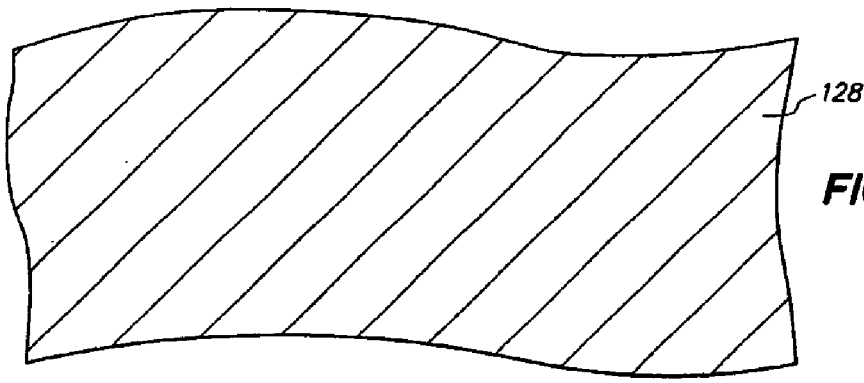
Figure 1F:
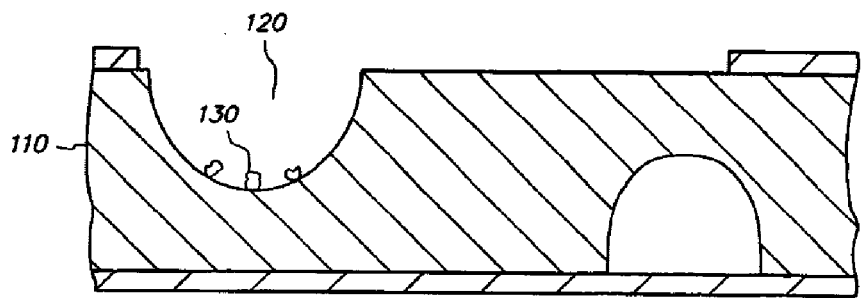
Figure 2F:
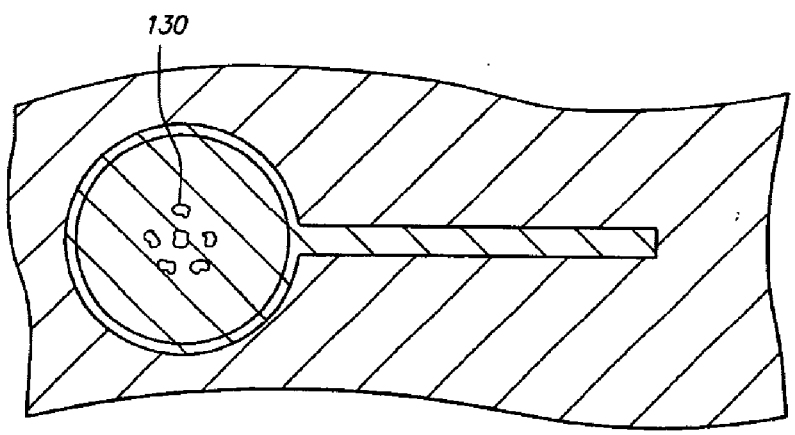
Figure 3F:
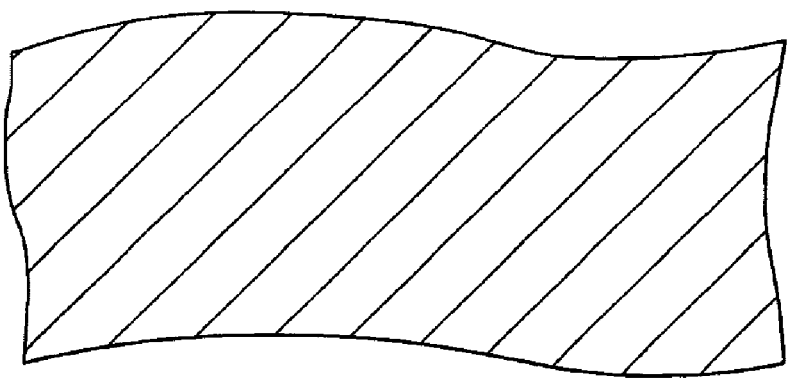
Figure 1G:
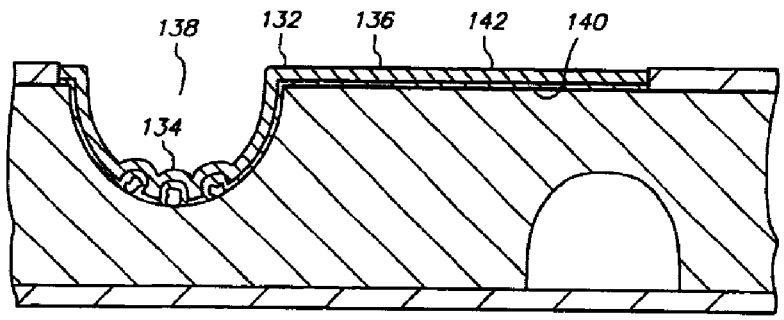
Figure 2G:
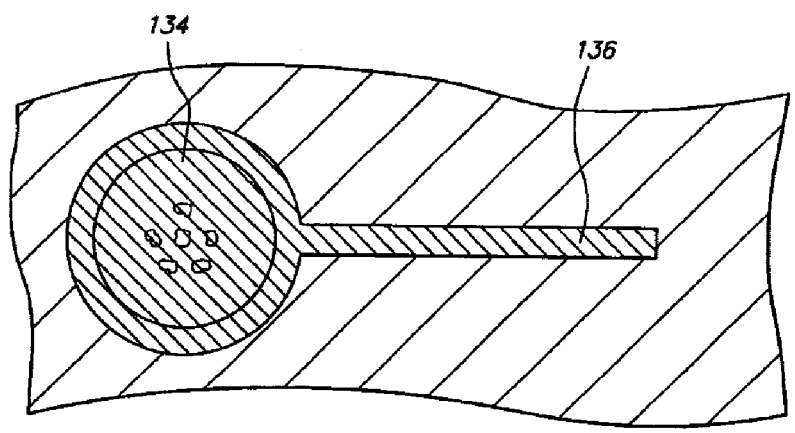
Figure 3G:
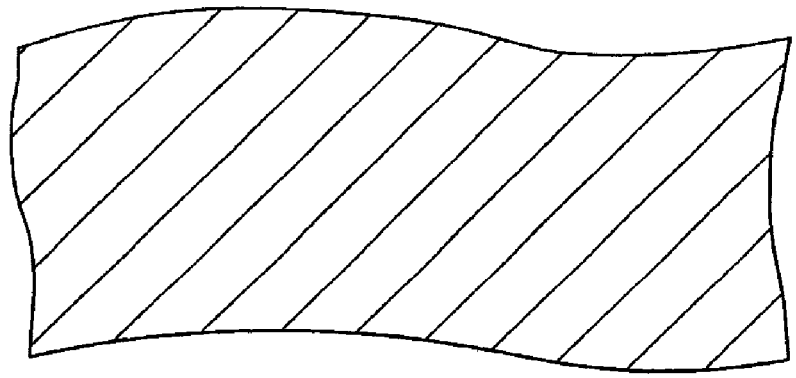
Figure 1H:
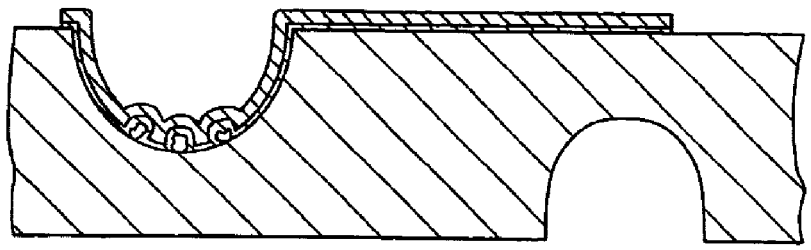
Figure 2H:
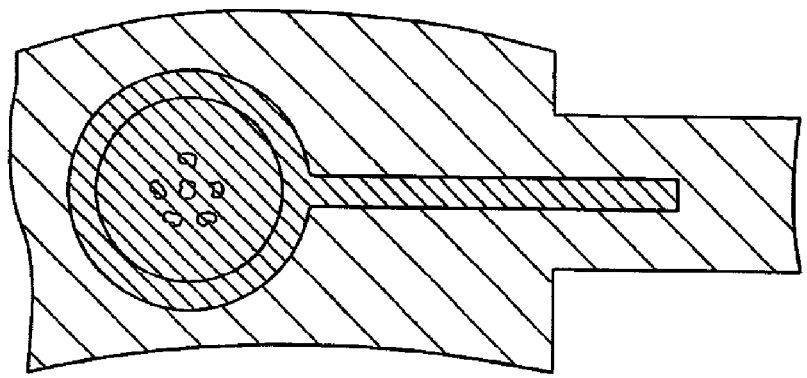
Figure 3H:
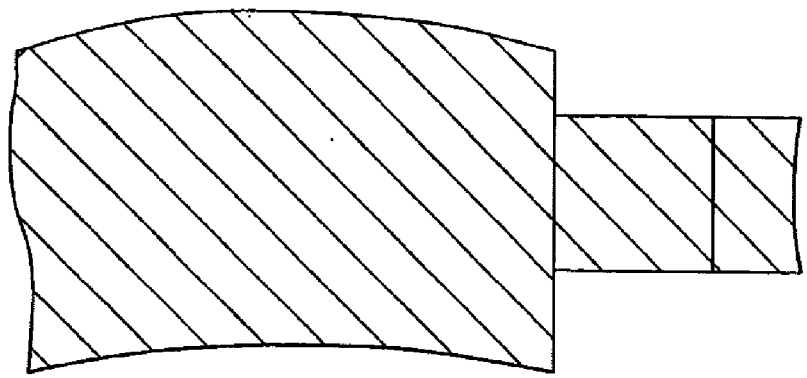
Figure 1I:
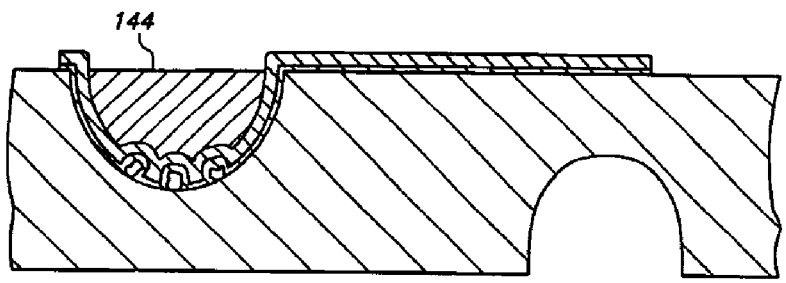
Figure 2I:
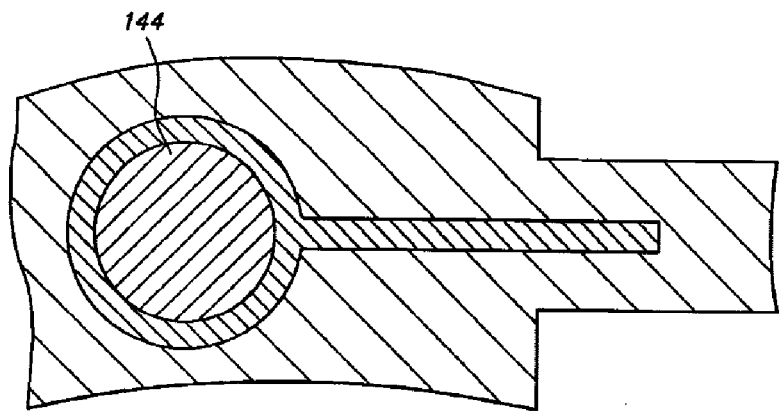
Figure 3I:
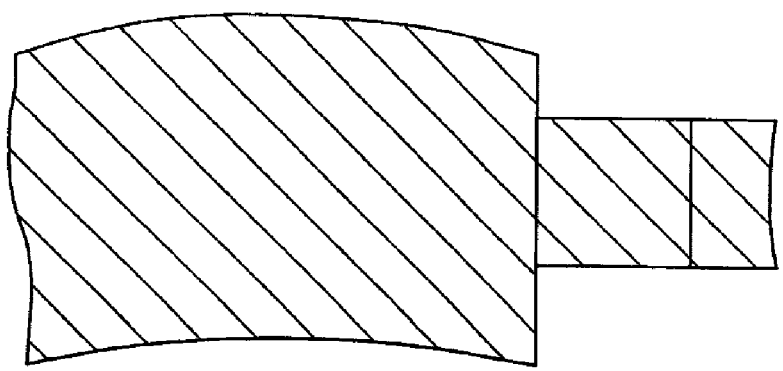
Figure 1J:
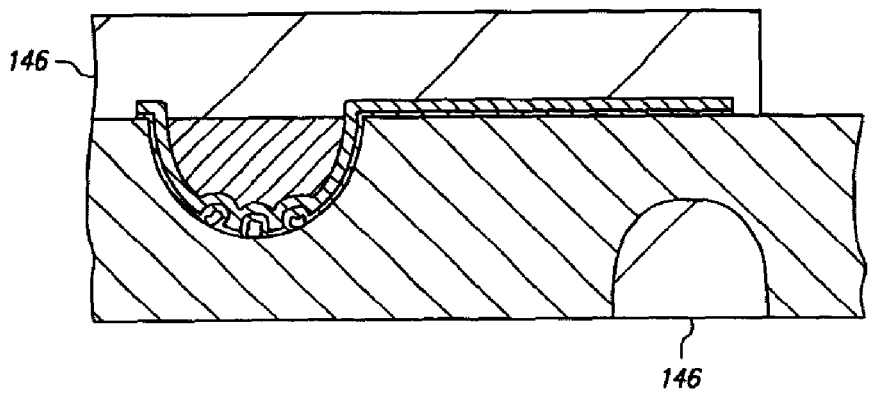
Figure 2J:
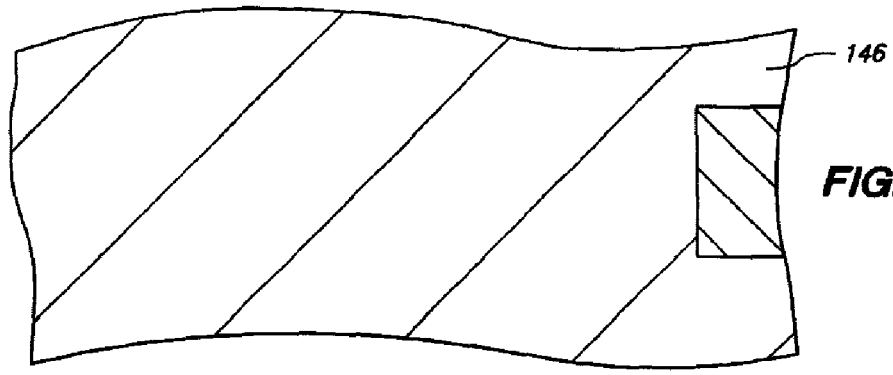
Figure 3J:
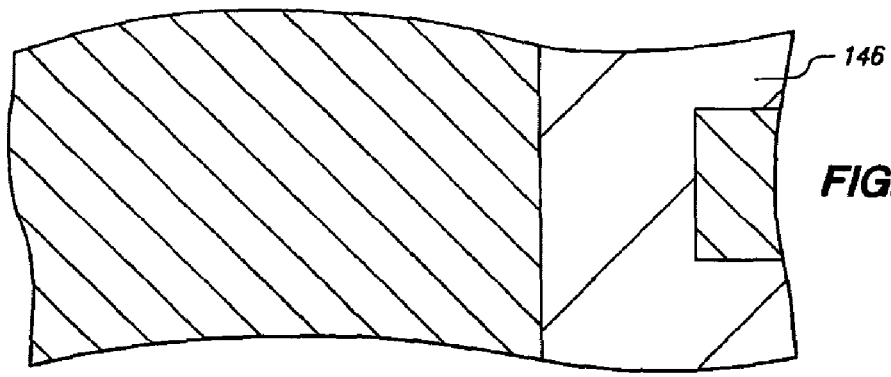
Figure 1K:
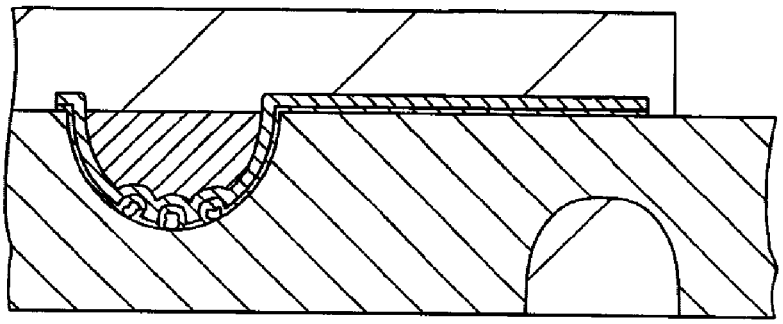
Figure 2K:
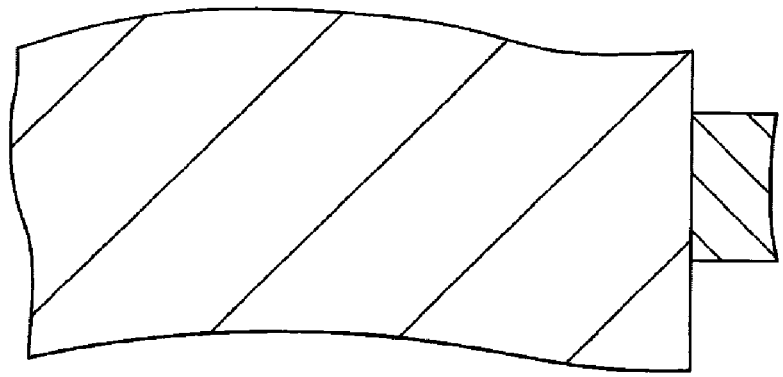
Figure 3K:
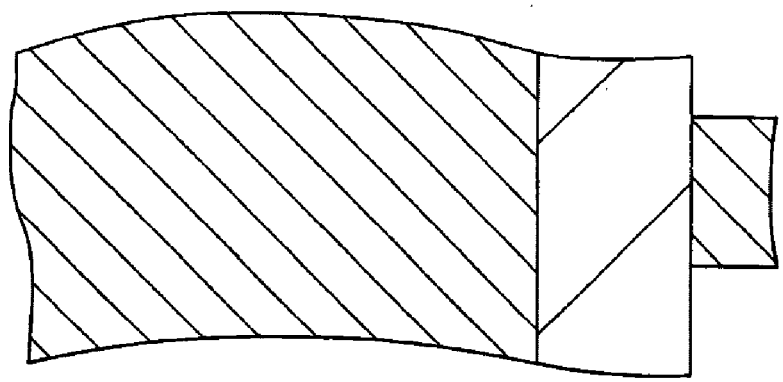
Figure 1L:
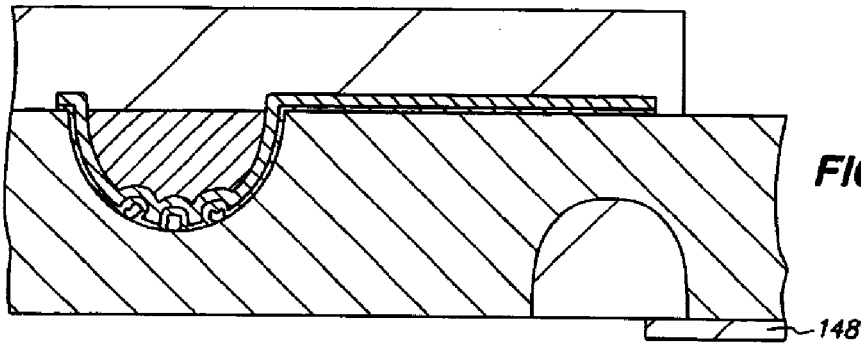
Figure 2L:
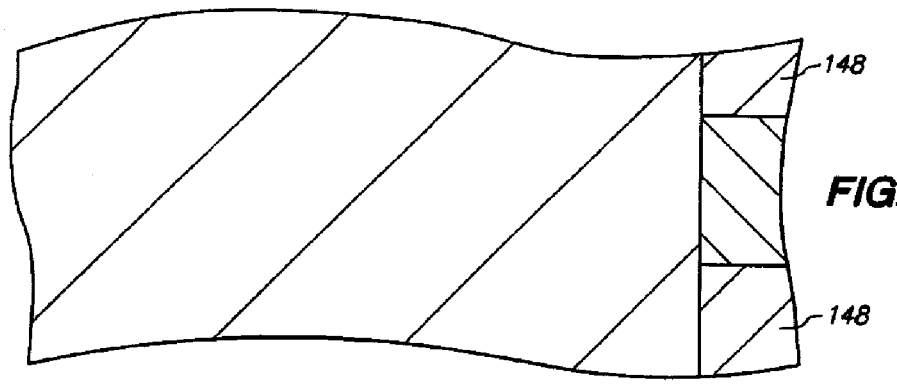
Figure 3L:
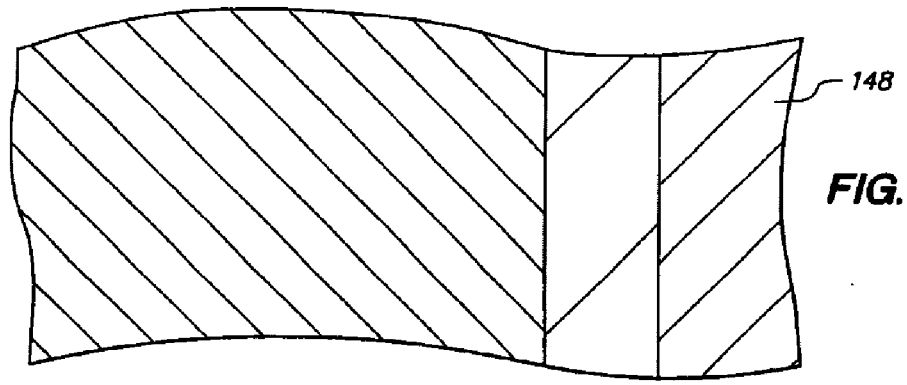
Figure 1M:
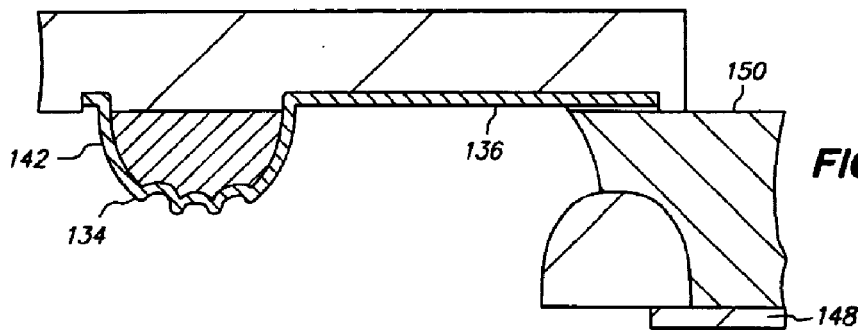
Figure 2M:
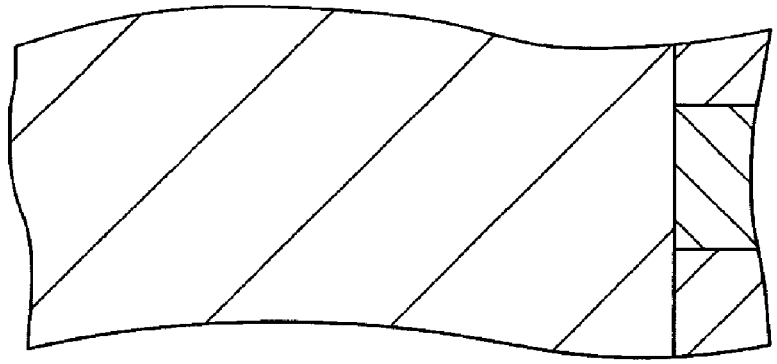
Figure 3M:
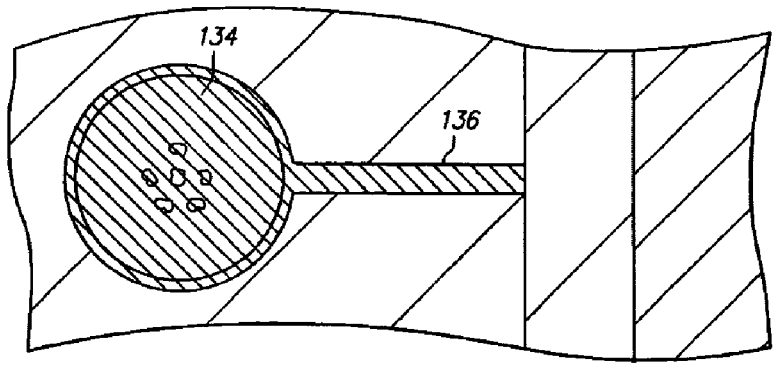
Figure 1N:
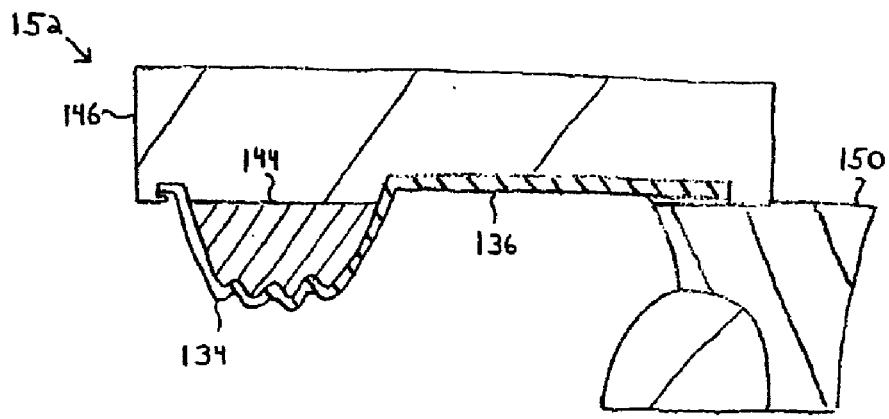
Figure 2N:
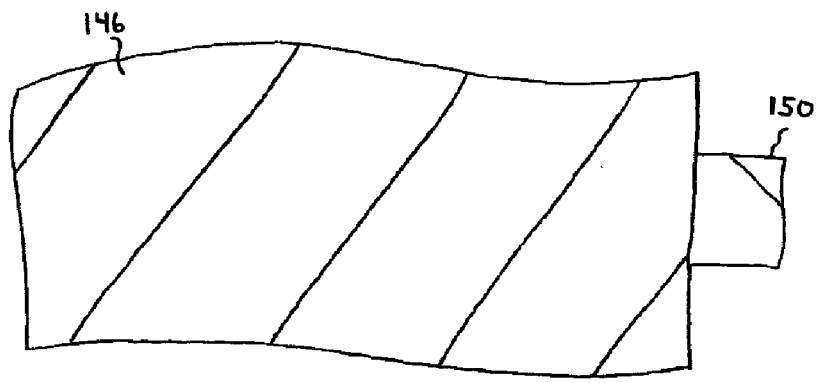
Figure 3N:
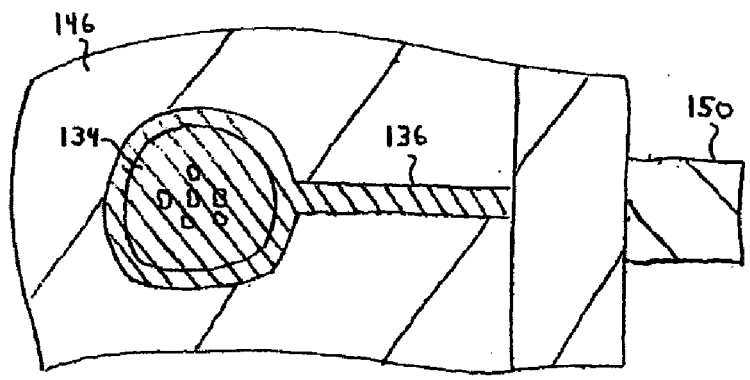
Figure 5A:
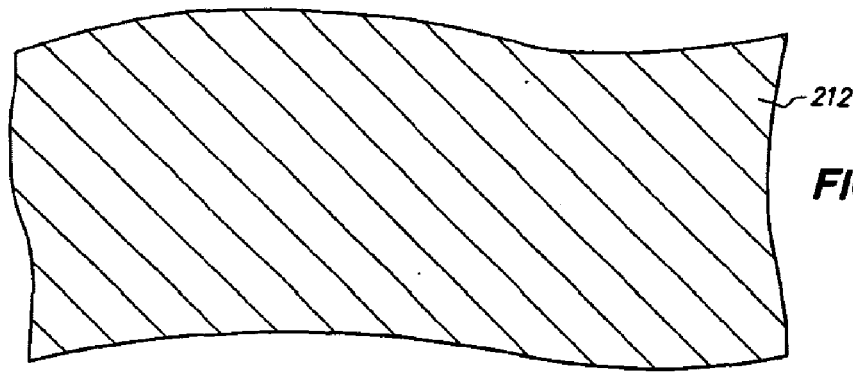
Figure 6A:
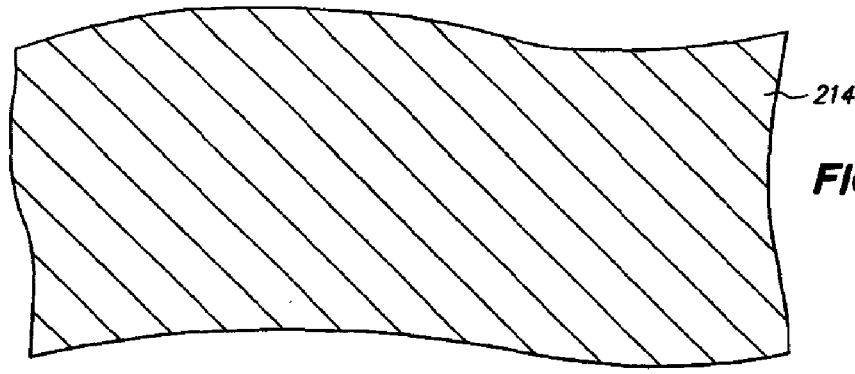
Figure 5B:
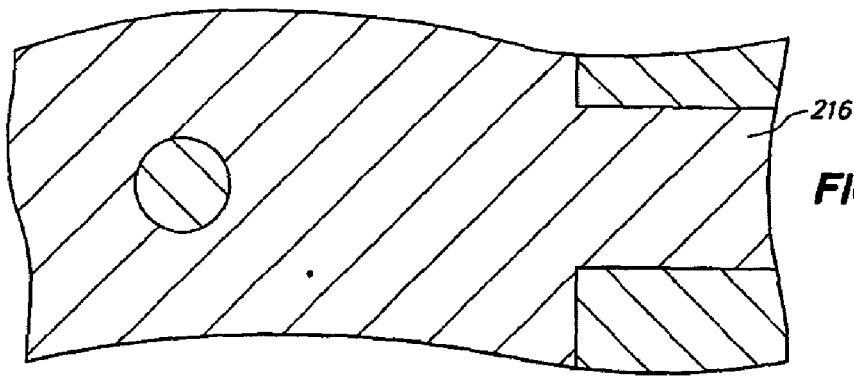
Figure 6B:
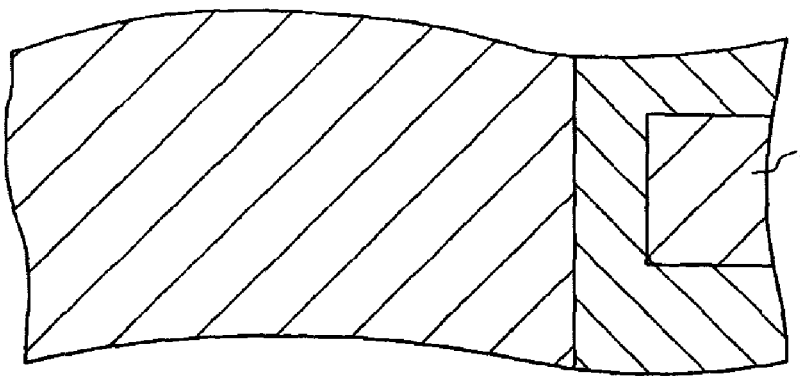
Figure 5C:
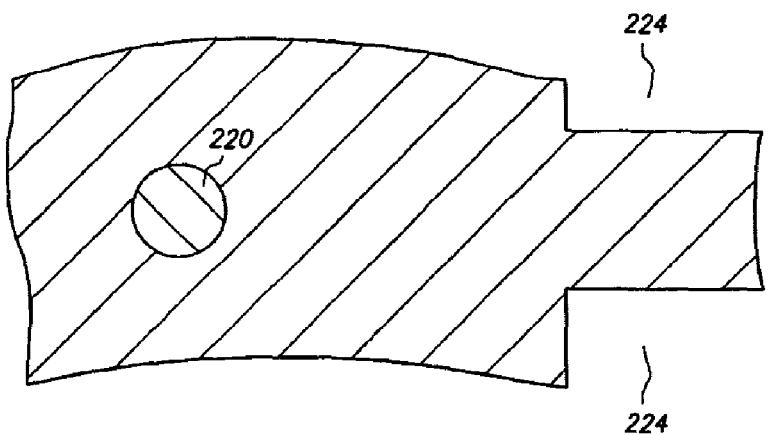
Figure 6C:
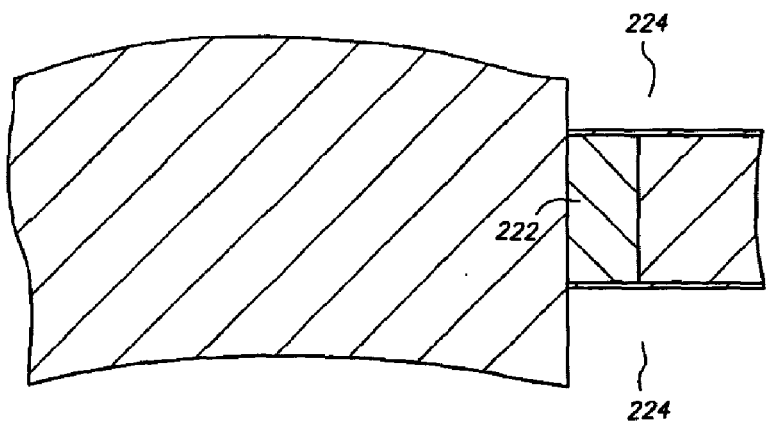
Figure 5D:
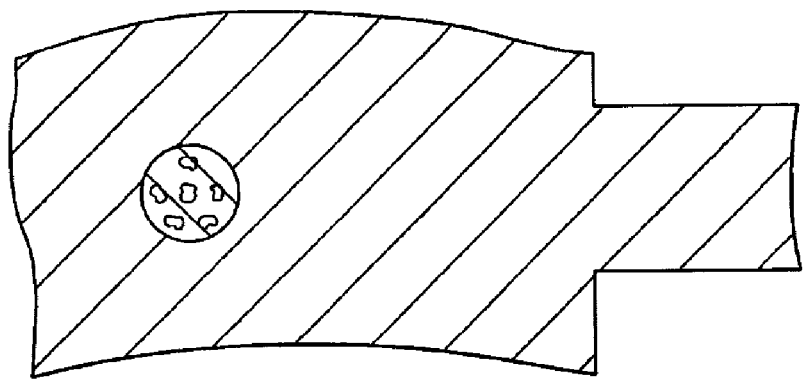
Figure 6D:
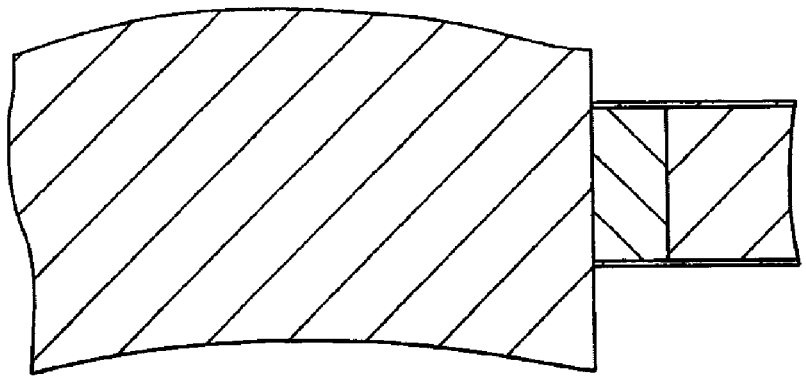
Figure 5E:
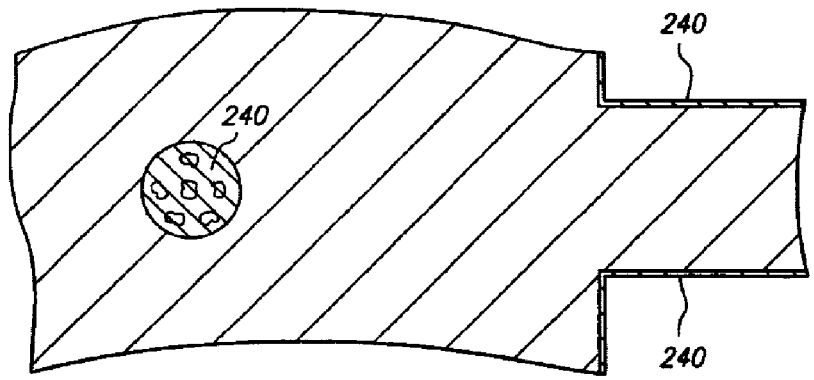
Figure 6E:
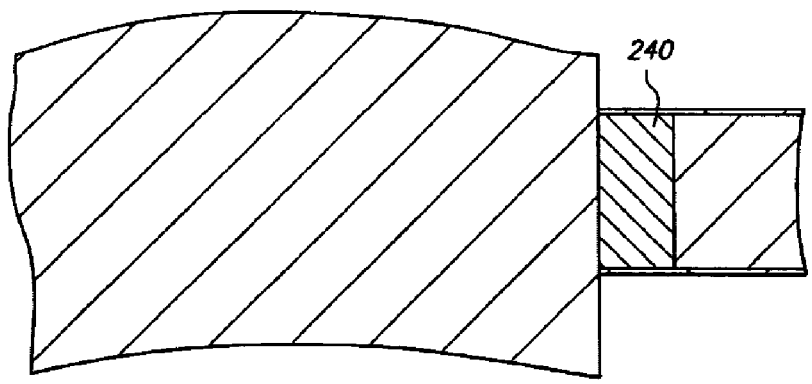
Figure 5F:
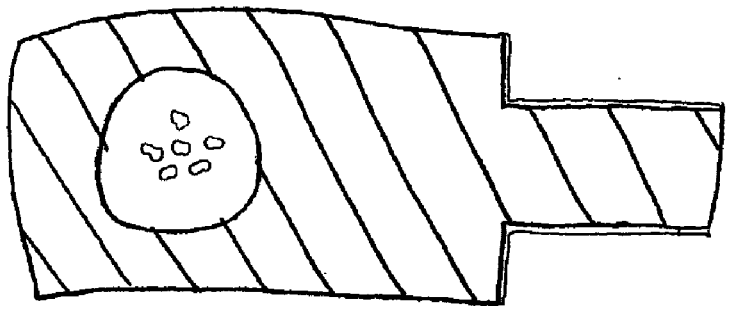
Figure 6F:
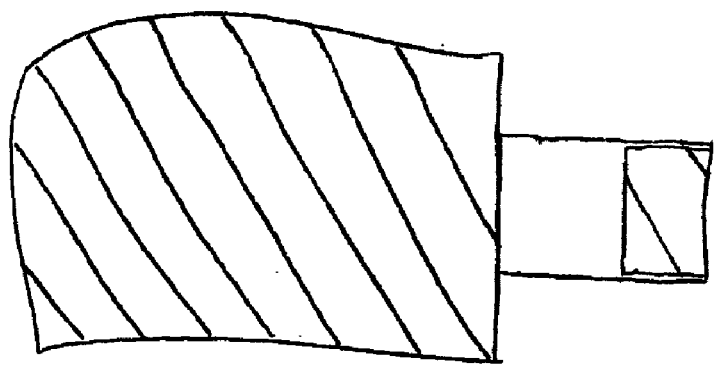
Figure 5G:
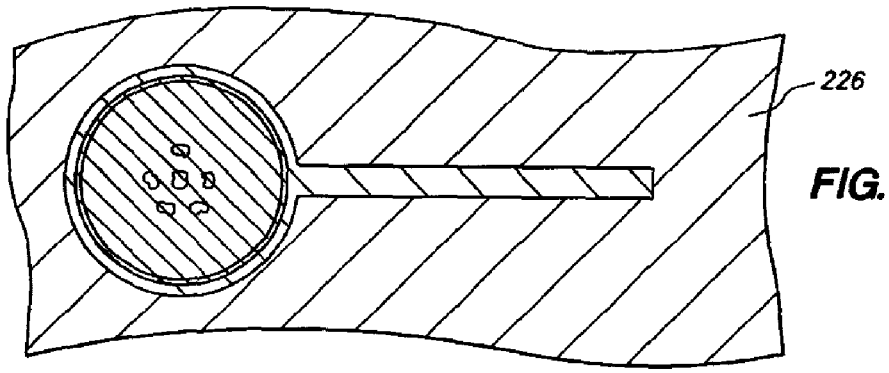
Figure 6G:
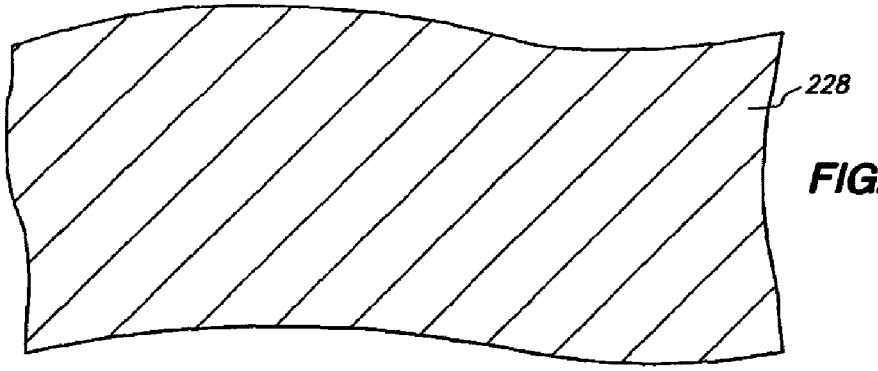
Figure 5H:
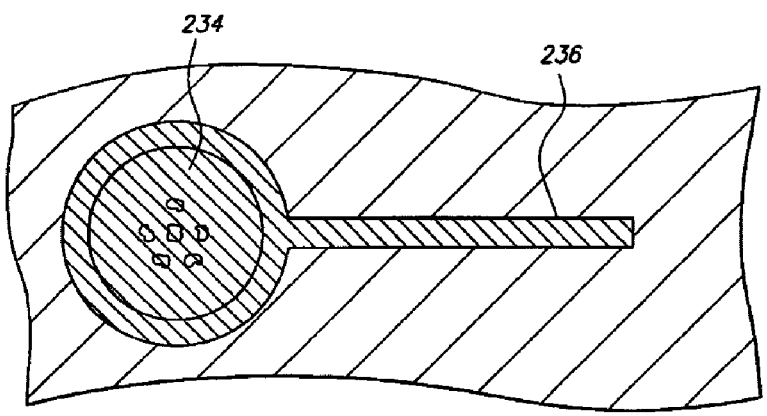
Figure 6H:
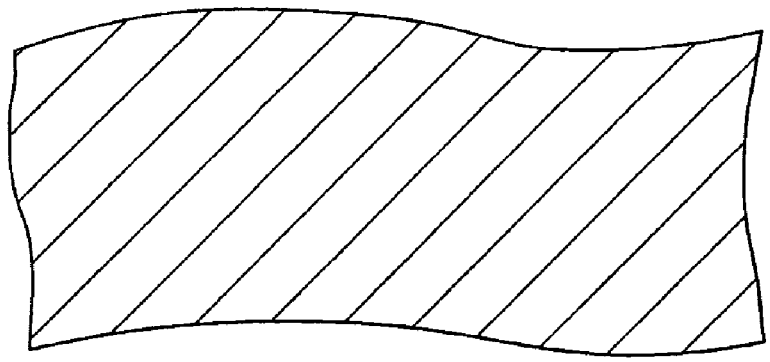
Figure 5I:
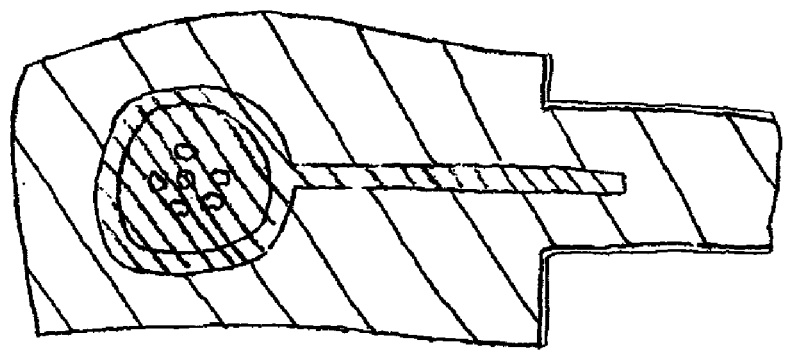
Figure 6I:
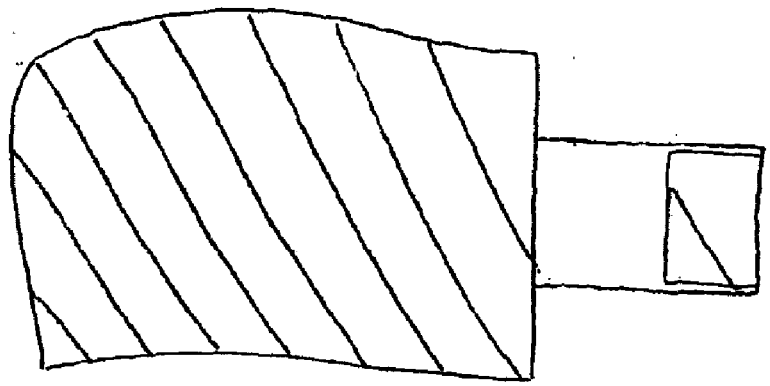
Figure 5J:
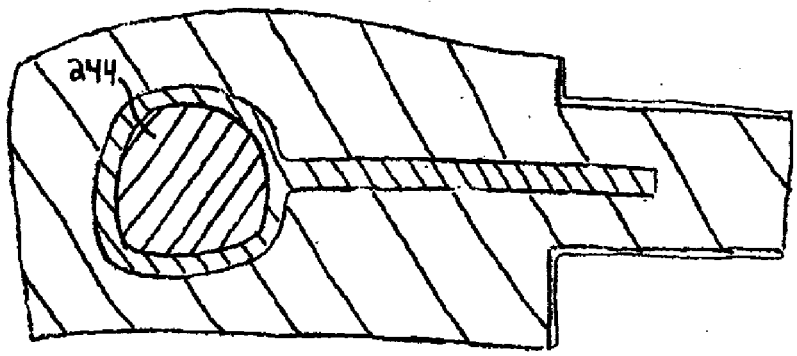
Figure 6J:
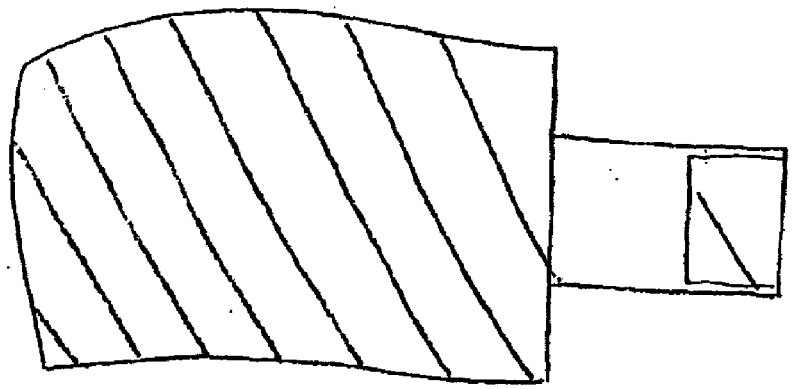
Figure 5K:
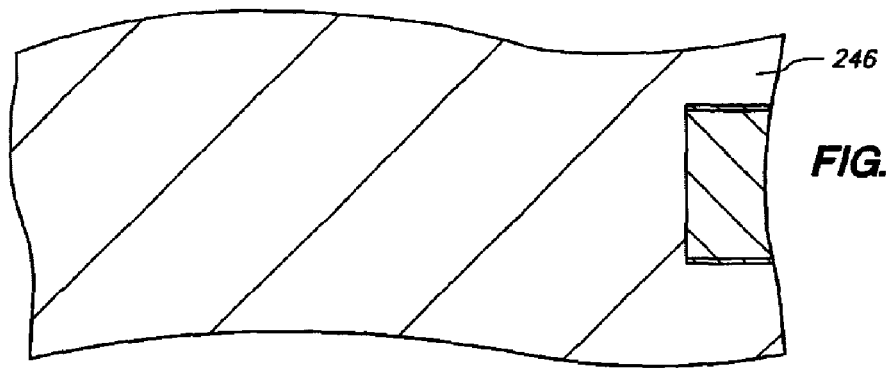
Figure 6K:
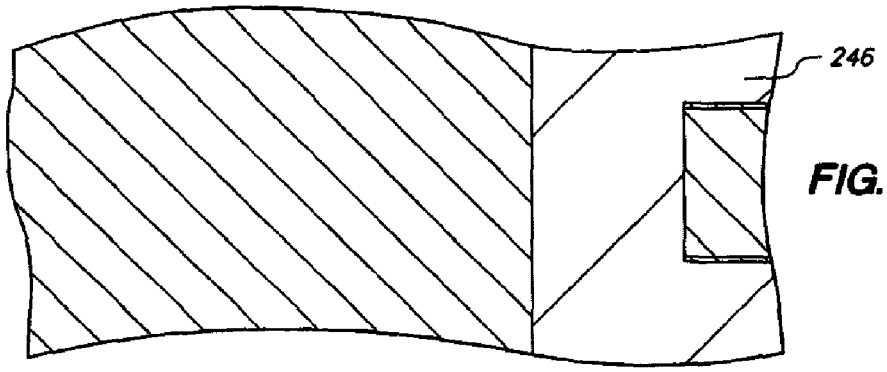
Figure 5L:
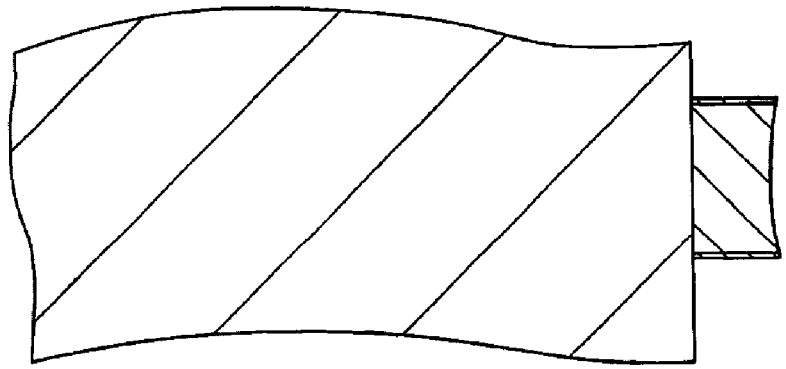
Figure 6L:
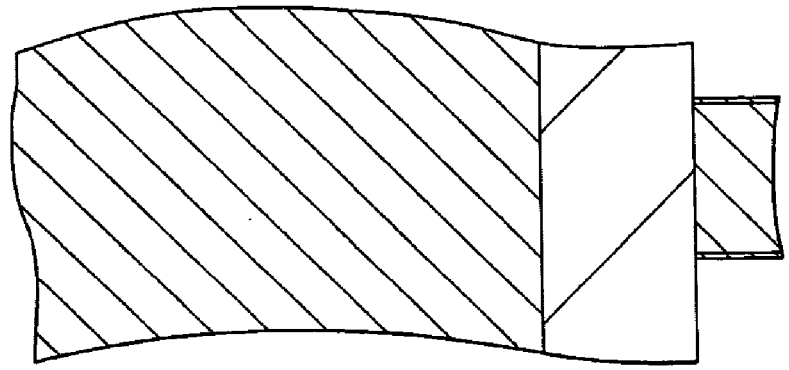
Figure 5M:
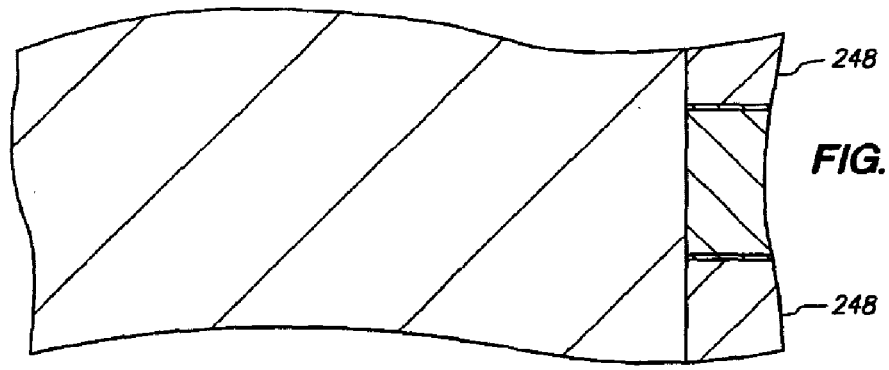
Figure 6M:
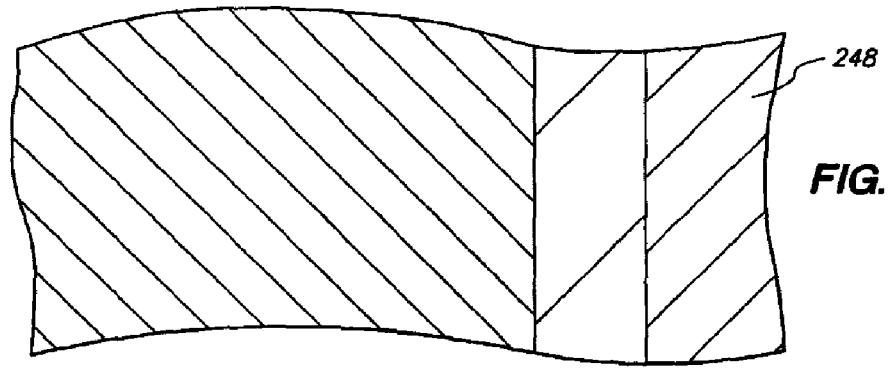
Figure 5N:
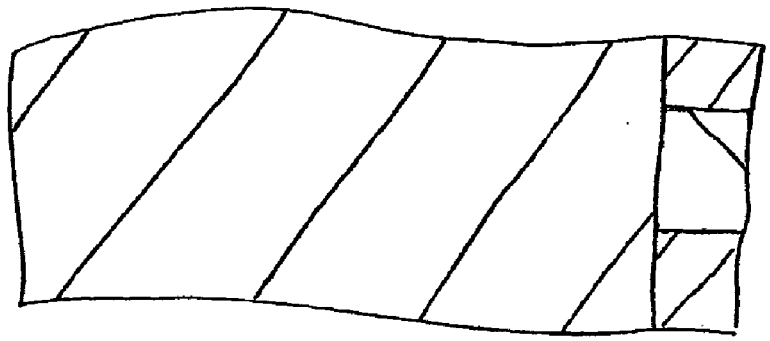
Figure 6N:
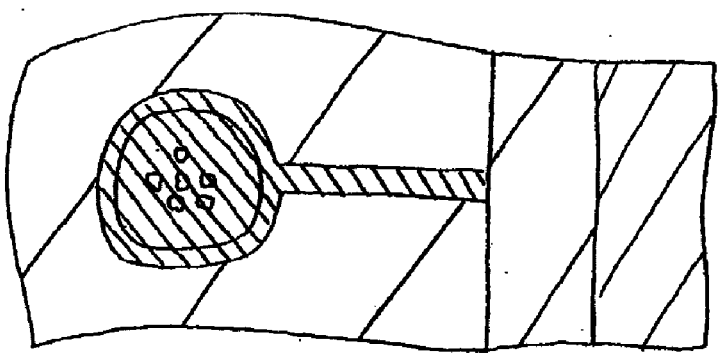

FIG. 16 is an expanded top plan view of test probe 152 in accordance with the first embodiment of the invention. Bumped terminals 134 are arranged as an array configured to positionally match the solder balls on a BGA to be tested, routing lines 136 provide lateral routing from bumped terminals 134, and leads 150 provide lateral routing from routing lines 136. Leads 150 are connected to bumped terminals 134 in one-to-one relation, are relatively thick and rigid, are configured to fan-out, and are configured to be inserted into a quad flat pack (QFP) test socket. In this manner, test probe 152 provides an interposer between a fine pitch BGA and a universal QFP test socket. Insulative support 146 includes peripheral ledge 160 that arises due to base 110 containing recesses 122 and slots 124 as a continuous rectangular channel.

Peripheral ledge 160 includes inner sidewall 160A and outer sidewall 160B. For illustration purposes, peripheral ledge 160 is wider than shown in the previous figures, inner and outer sidewalls 160A and 160B are shown as broken lines, and the portions of routing lines 136 and leads 150 that extend beneath peripheral ledge 160 are shown. Also for illustration purposes, outer profile 162 of a BGA to be tested is shown. The BGA fits within peripheral ledge 160 and overlaps bumped terminals 134.

The test probes described above are merely exemplary. Numerous other embodiments are contemplated. Likewise, various aspects of the embodiments described above can be combined with another. For instance, copper particles can be deposited through the photoresist layer that defines the recess, insulative core particles can be dislodged from the bumped terminal, the overcoat plated metal can be deposited on the undercoat plated metal after the particles are removed, and so on.

The dimensions best suited for a particular application will vary. For instance, if a chip is the test device then particles with a 5 micron average diameter and a bumped terminal with a 50 micron diameter may be preferred. If a BGA chip scale package is the test device then particles with a 20 to 50 micron average diameter and a bumped terminal with a 200 to 500 micron diameter may be preferred.

The conductive trace can be various conductive metals including copper, gold, nickel, silver, palladium, tin, combinations thereof, and alloys thereof. The preferred composition of the conductive trace will depend on the nature of the connection joint as well as design and reliability factors. Furthermore, those skilled in the art will understand that in the context of microelectronics, a copper material is typically a copper alloy that is mostly copper but not pure elemental copper, such copper-zirconium (99.9% copper), copper-silver-phosphorus-magnesium (99.7% copper), or copper-tin-iron-phosphorus (99.7% copper).

The conductive trace can be formed on the base by numerous deposition techniques including electroplating and electroless plating.

The conductive trace can be deposited as a single layer or multiple layers. For instance, the conductive trace can be a 15 micron layer of nickel electroplated on a copper base, or alternatively a 10 micron layer of copper electroplated on a 5 micron layer of nickel electroplated on a copper base to increase conductivity, or alternatively a 0.5 micron layer of gold electroplated on a 14 micron layer of nickel electroplated on a 0.5 micron layer of tin electroplated on a copper base to avoid nickel oxidation and gold-copper alloys that may be difficult to remove when the copper base is etched.

As another example, the conductive trace can consist of a non-copper layer electroplated on a copper base and a copper layer electroplated on the non-copper layer. Suitable non-copper layers include nickel, gold, palladium and silver. After the conductive trace is attached to the base, a wet chemical etch can be applied that is highly selective of copper with respect to the non-copper layer to etch the copper base without etching the copper or non-copper layers. The non-copper layer provides an etch stop that prevents the wet chemical etch from removing the copper layer. Furthermore, it is understood that in the context of the present invention, the conductive trace and the base are different metals (or metallic materials) even if a multi-layer conductive trace includes a single layer that is similar to the metal base (such as the example described above).

The base can be various metals including copper, copper alloys, iron-nickel alloys, aluminum, and so on. The base can entirely removed or selectively etched to expose the bumped terminal and the particles.

The base can be a single metal layer. Alternatively, the base can be a laminated structure formed with a wide variety of materials through a wide variety of techniques. For instance, laminated structures that consist of a metal base, an insulative base and a metal layer (with the insulative base sandwiched between the metal base and the metal layer) are generally preferred, and laminated structures in which the metal base and the metal layer are copper are generally more preferred due to their widespread availability and tendency to remain flat without warpage. Commercially available laminates such as NEOFLEX™ diclad by Mitsui Chemicals of Tokyo, Japan are suitable. Resin-coated copper foil (RCC) laminates are also suitable. However, other laminated structures such as single clad laminates and dual-insulator laminates can also be employed.

The particles can be various conductive metals such as nickel, iron, gold, tin, lead, platinum, palladium, alloys thereof and combinations thereof, various insulators such as diamond, quartz, glass, ceramics, oxides, silicates, nitrides and combinations thereof, and various composite materials including conductive surface layers such as immersion palladium, platinum or gold coated over insulative cores such as diamond, quartz, glass, ceramics, oxides, silicates, nitrides and combinations thereof. Preferably, the particles are hard and resilient to repeated pressure contact if they are permanently embedded in the undercoat plated metal.

The particles can have various shapes and sizes. For instance, the particles can be spheres, cones or right circular cylinders with uniform shapes and sizes, or the particles can have irregular shapes with sharp corners and tips and random shapes and sizes. The particles can also be uniformly or randomly distributed. Thus, the particles can have a wide variety of shapes, sizes, numbers, densities and distributions and still cause the contact surface to be sufficiently jagged.

The particles can be deposited in the recess in numerous manners. For instance, the particles can be sprinkled or dropped in the recess, or the particles can be mixed in a solution or flux that is deposited in the recess by screen printing, dispensing and the like and then the solution or flux can be evaporated or decomposed.

The particles can be deposited in the recess before the sacrificial or undercoat plated metal is deposited in the recess, or the particles can be co-deposited in the recess with the sacrificial or undercoat plated metal. A modified composite electroless nickel plating method to co-deposit nickel and hard insulative particles is described in Zou et al., "A New Electrical Surface Joining Technology For Flip Chip Application," 2001 *International Symposium on Microelectronics*, pp. 565–570, which is incorporated by reference.

The overcoat plated metal can be various conductive metals such as copper, nickel, gold, tin, chromium, platinum, palladium, alloys thereof and combinations thereof.

The elastomer is adapted for permitting the bumped terminal to provide a compressible, compliant contact probe. As used herein, the elastomer refers to an elastic material that is resilient, flexible, stretches or expands under low stress and quickly recovers its original shape once the stress is released.

The elastomer can be a wide variety of materials including epoxy, phenolic, polyester, polyimide, polycarbonate, fluoropolymer, nylon, silicone, thermosetting and thermoplastic plastic, and natural and synthetic rubber and can be deposited on the structure using a wide variety of techniques. Furthermore, the elastomer can be conductive or insulative. For instance, the elastomer can be rendered conductive by blending conductive particles (or fillers) into an insulative elastomeric material mentioned above. Suitable conductive particles include conductive metals such as copper, nickel, gold, silver, alloys thereof and combinations thereof, and various composite materials such as metal coated over a plastic core. A conductive elastomer provides an electrically conductive channel to a tip at the contact surface that may be critical if the bumped terminal cracks after repeated contact testing. Preferably, the elastomer occupies most or all of the cavity in the bumped terminal.

The insulative support can be rigid or flexible, can be a wide variety of organic or inorganic insulators such as tape (polyimide), epoxy, silicone, glass, aramid and ceramic, and can be deposited on the structure using a wide variety of techniques including printing and transfer molding. For instance, the insulative support can be printed on the structure as an epoxy paste and then cured or hardened to form a solid adherent protective layer. Furthermore, the insulative support can be separate from the elastomer or a single-piece insulative elastomeric material that provides the elastomer.

The contact surface can consist of the undercoat plated metal after the particles are removed, for instance by being dislodged or etched. The contact surface can also consist of the undercoat plated metal and the particles protruding therefrom, in which case the particles are preferably a conductive metal. The contact surface can also consist of an overcoat plated metal that overlays the undercoat plated metal and the particles protruding therefrom, in which case the particles can be conductive, insulative or combinations thereof. In each case, the contact surface is both jagged due to the particles and proximate to the bumped terminal.

The contact surface can be jagged in a random or uneven fashion with randomly distributed tips that vary in size, shape and height. Only the tip with the greatest height need make contact with the corresponding electrode of the electronic device being tested. As that tip wears out after repeated contact testing, another tip that was previously unutilized will contact the electronic device being tested, as these tips wear out other tips that were previously unutilized will contact the electronic device being tested, and so on.

The contact surface is adapted for pressure contact with an electronic device. As used herein, pressure contact refers to an electrical connection between two elements wherein electrical continuity is maintained by pressing the conductive elements against one another and maintaining the pressure force so long as the connection is maintained. Although pressure contact may involve some metallurgical bonding and/or mutual flow of the connecting elements into one another on a microscopic scale, pressure contact normally is not regarded as involving substantial metallurgical bonding between the mating conductive elements. In this respect it differs significantly from wiring bonding, TAB, flip-chip bonding and other commonly used connection techniques.

The lead can include an unetched portion of the base or be provided in another manner. The lead can be configured to mate with a test socket. Alternatively, the lead can include an enlarged rectangular pad at its distal end that can be manually probed to provide simple convenient access to an electronic device on the bumped terminal.

The conductive trace, the lead and the insulative support can be designed such that the lead protrudes laterally from the insulative support and the insulative support interlocks the conductive trace and the lead. Further details regarding this arrangement are disclosed in U.S. application Ser. No. 10/042,812 filed Jan. 9, 2002 by Cheng-Lien Chiang entitled "Semiconductor Package Device" which is incorporated by reference.

The top and bottom surfaces of the conductive trace do not depend on the orientation of the structure, as will be readily apparent to those skilled in the art. For instance, the top surface of the bumped terminal faces away from the elastomer, regardless of whether the test probe is inverted, slanted or rotated. Likewise, the base is shown below the conductive trace with a single orientation throughout the drawings for ease of comparison between the figures, although the structure may be inverted at various manufacturing stages.

The working format for the test probe can be a single probe, a strip or a panel based on the manufacturing design.

The test probe is well-suited for contacting a wide variety of electronic devices including semiconductor chips, chip scale packages, chip size packages and BGAs. For instance, the test probe can be configured for a semiconductor chip to determine whether the chip is a known-good-die (KGD) suitable for being packaged in a BGA. Likewise, the test probe can be configured for a BGA to determine whether the package is suitable for being soldered to a printed circuit board. Moreover, the contact surface is sufficiently jagged to penetrate the oxide layer on the corresponding electrode of the electronic device being tested, and the corresponding electrode can be an aluminum chip pad, a BGA solder ball and so on.

Advantageously, the test probe of the present invention is reliable and inexpensive. The contact surface is small due to the bumped terminal, is jagged due to the particles, is compliant due to the elastomer, and is accessible due to the routing line. As a result, the test probe of the present invention significantly enhances throughput, yield and performance characteristics compared to conventional test sockets and contact probes, and is particularly well-suited for BGAs with a solder ball pitch of 0.5 mm or less.

Various changes and modifications to the presently preferred embodiments described herein will be apparent to those skilled in the art. For instance, the materials, dimensions and shapes described above are merely exemplary. Such changes and modifications may be made without departing from the spirit and scope of the present invention as defined in the appended claims.

We claim:

1. A method of making a test probe, comprising:
providing a conductive trace, particles and a base, wherein the conductive trace includes a bumped terminal, the bumped terminal includes an undercoat plated metal, the base includes a recess, the bumped terminal and the particles are disposed in the recess, the particles are embedded in the bumped terminal, and the base and the undercoat plated metal are different materials; then
removing a portion of the base, thereby exposing the bumped terminal; and
providing an exposed contact surface that is jagged due to the particles and proximate to the bumped terminal.

2. The method of claim 1, including forming the recess and then depositing the bumped terminal and the particles into the recess.

3. The method of claim 1, including depositing the particles into the recess and then depositing the undercoat plated metal into the recess.

4. The method of claim 1, wherein the bumped terminal includes a cavity that extends into the recess before removing the portion of the base.

5. The method of claim 1, wherein removing the portion of the base includes applying a wet chemical etch that is selective of the base with respect to the particles and the undercoat plated metal.

6. The method of claim 1, wherein removing the portion of the base includes applying a wet chemical etch that is selective of the base and the particles with respect to the undercoat plated metal.

7. The method of claim 1, wherein removing the portion of the base includes selectively etching the base such that a remaining portion of the base is electrically connected to and extends laterally from the undercoat plated metal.

8. The method of claim 1, including forming the recess, then forming the bumped terminal with a sacrificial plated metal in the recess and on the particles and the base and with the undercoat plated metal on the sacrificial plated metal, and then removing a portion of the sacrificial plated metal on the particles thereby dislodging the particles from the bumped terminal.

9. The method of claim 1, including forming an elastomer on a side of the conductive trace opposite the base before removing the portion of the base.

10. The method of claim 1, including forming an overcoat plated metal over the particles and the undercoat plated metal after removing the portion of the base, wherein the overcoat plated metal provides the contact surface.

11. A method of making a test probe, comprising:
attaching a conductive trace and particles to a base, wherein the conductive trace includes a bumped terminal and a routing line, the bumped terminal includes an undercoat plated metal, the base includes a recess, the bumped terminal is in the recess, the routing line is outside the recess, the particles are embedded in the bumped terminal, and the base and the undercoat plated metal are different metals; then
etching the base, thereby exposing the bumped terminal; and
providing an exposed contact surface that is jagged due to the particles and proximate to the bumped terminal.

12. The method of claim 11, wherein attaching the conductive trace to the base includes plating the undercoat plated metal in the recess and on the particles and the base such that the particles are embedded in the undercoat plated metal.

13. The method of claim 12, including etching partially but not completely through the undercoat plated metal such that the particles protrude from the undercoat plated metal after etching the base.

14. The method of claim 12, including etching the base by applying a wet chemical etch that is selective of the base and the particles with respect to the undercoat plated metal such that the particles are removed and the undercoat plated metal includes exposed tips.

15. The method of claim 11, wherein attaching the conductive trace to the base includes plating a sacrificial plated metal in the recess and on the base such that the particles are embedded in the sacrificial plated metal, and then plating the undercoat plated metal in the recess and on the sacrificial plated metal.

16. The method of claim 15, including etching the sacrificial plated metal thereby dislodging the particles and exposing the undercoat plated metal.

17. The method of claim 16, wherein etching the base and the sacrificial plated metal includes applying a wet chemical etch that is selective of the base and the sacrificial plated metal with respect to the particles and the undercoat plated metal.

18. The method of claim 11, including forming the recess by selectively etching the base, then depositing the particles into the recess, and then depositing the bumped terminal into the recess.

19. The method of claim 11, wherein the bumped terminal includes a cavity that extends into the recess.

20. The method of claim 11, wherein the particles are a conductive metal.

21. The method of claim 20, wherein the conductive metal is selected from the group consisting of nickel, iron, gold, tin, lead, platinum, palladium, alloys thereof and combinations thereof.

22. The method of claim 11, wherein the particles include an insulative core.

23. The method of claim 22, wherein the insulative core is selected from the group consisting of diamond, quartz, glass, ceramics, oxides, silicates, nitrides and combinations thereof.

24. The method of claim 11, including forming an elastomer on a side of the conductive trace opposite the base after attaching the conductive trace to the base.

25. The method of claim 11, wherein etching the base includes applying a wet chemical etch to the base that is selective of the base with respect to the particles and the undercoat plated metal and contacts the particles and the undercoat plated metal.

26. The method of claim 11, wherein etching the base includes applying a wet chemical etch to the base that is selective of the base and the particles with respect to the undercoat plated metal and contacts the particles and the undercoat plated metal.

27. The method of claim 11, wherein etching the base includes selectively etching the base such that a remaining portion of the base overlaps and is electrically connected to and extends laterally from the routing line.

28. The method of claim 11, wherein the particles and the undercoat plated metal provide the contact surface.

29. The method of claim 11, wherein the undercoat plated metal provides the contact surface.

30. The method of claim 11, including forming an overcoat plated metal over the particles and the undercoat plated metal after etching the base, wherein the overcoat plated metal provides the contact surface, and the particles and the undercoat plated metal are spaced from the contact surface.

31. A method of making a test probe, comprising the following steps in the sequence set forth:
    forming a recess in a metal base;
    depositing particles into the recess;
    attaching a conductive trace to the base and the particles, wherein the conductive trace includes a bumped terminal in the recess and a routing line outside the recess, the bumped terminal and the routing line include an undercoat plated metal, the particles are embedded in the bumped terminal and disposed in the recess and contact the base, and the base and the undercoat plated metal are different metallic materials;
    forming an elastomer on a side of the conductive trace opposite the base;
    applying an etch to the base that is selective of the base with respect to the undercoat plated metal, thereby removing a portion of the base that overlaps the bumped terminal and the particles; and
    providing an exposed contact surface that is jagged due to the particles and proximate to the bumped terminal.

32. The method of claim 31, wherein forming the recess includes forming a photoresist layer on the base that selectively exposes the base and then etching the base.

33. The method of claim 31, wherein attaching the conductive trace to the base includes forming a photoresist layer over the base and then plating the undercoat plated metal over selected portions of the base.

34. The method of claim 31, wherein forming the elastomer includes contacting the elastomer to the conductive trace and then hardening the elastomer.

35. The method of claim 31, wherein forming the elastomer includes filling the elastomer into a cavity in the bumped terminal that extends into the recess.

36. The method of claim 31, wherein applying the etch to the base includes selectively etching the base such that a remaining portion of the base overlaps and is electrically connected to and extends laterally from the routing line.

37. The method of claim 31, including forming the bumped terminal with a sacrificial plated metal in the recess, then forming the undercoat plated metal on the sacrificial plated metal, and then removing the sacrificial plated metal from the bumped terminal thereby dislodging the particles from the bumped terminal.

38. The method of claim 31, wherein the contact surface consists of the particles and the undercoat plated metal.

39. The method of claim 31, wherein the contact surface consists of the undercoat plated metal.

40. The method of claim 31, wherein the contact surface consists of an overcoat plated metal over the particles and the undercoat plated metal.

41. A method of making a test probe, comprising:
    providing a metal base;
    providing a first mask over the base, wherein the first mask includes an opening over a first portion of the base;
    applying an etch to the first portion of the base through the opening in the first mask, thereby etching partially through the base and forming a recess in the base;
    removing the first mask;
    providing a second mask over the base, wherein the second mask includes an opening over a second portion of the base;
    depositing particles into the recess;
    depositing an undercoat plated metal over the second portion of the base and into the recess through the opening in the second mask;
    removing the second mask;
    forming an elastomer on a side of a conductive trace opposite the base, wherein the conductive trace includes a bumped terminal and a routing line, the bumped terminal and the routing line include the undercoat plated metal, the bumped terminal is disposed in the recess, the routing line is disposed outside the recess, the particles are disposed in the recess and embedded in the bumped terminal, and the undercoat plated metal extends between the particles;
    applying an etch that is selective of the base with respect to the undercoat plated metal, thereby removing a portion of the base that overlaps the bumped terminal and the particles; and
    providing an exposed contact surface that is jagged due to the particles and proximate to the bumped terminal.

42. The method of claim 41, wherein the first and second masks are photoresist.

43. The method of claim 41, wherein the particles have an average diameter in the range of about 5 to 50 microns.

44. The method of claim 41, wherein the bumped terminal includes a cavity that extends into the recess and faces away from the base, and the elastomer extends into the cavity.

45. The method of claim 41, wherein the etch is selective of the base with respect to the particles and the undercoat plated metal, contacts the particles and the undercoat plated metal and dislodges the particles from the bumped terminal such that the undercoat plated metal includes exposed tips and provides the contact surface.

46. The method of claim 41, wherein the etch is selective of the base and the particles with respect to the undercoat plated metal, contacts the particles and the undercoat plated metal and etches and removes the particles from the bumped terminal such that the undercoat plated metal includes exposed tips and provides the contact surface.

47. The method of claim 41, wherein the etch is selective of the base with respect to the particles and the undercoat plated metal and contacts the particles and the undercoat plated metal, and then a second etch is applied that is selective of the undercoat plated metal with respect to the particles and etches partially but not completely through the undercoat plated metal such that the particles protrude from the undercoat plated metal.

48. The method of claim 47, wherein the particles are a conductive metal, and the particles and the undercoat plated metal provide the contact surface.

49. The method of claim 47, wherein the particles include an insulative core, and an overcoat plated metal is deposited on the particles and the undercoat plated metal after applying the second etch and provides the contact surface.

50. The method of claim 41, wherein the steps are performed in the sequence set forth.

51. A method of making a test probe, comprising:
providing a metal base;
providing a first mask over the base, wherein the first mask includes an opening over a first portion of the base;
applying an etch to the first portion of the base through the opening in the first mask, thereby etching partially through the base and forming a recess in the base;
removing the first mask;
providing a second mask over the base, wherein the second mask includes an opening over a second portion of the base;
depositing particles into the recess;
depositing a sacrificial plated metal into the recess and on the base and the particles;
depositing an undercoat plated metal over the second portion of the base and into the recess and on the sacrificial plated metal through the opening in the second mask;
removing the second mask;
forming an elastomer on a side of a conductive trace opposite the base, wherein the conductive trace includes a bumped terminal and a routing line, the bumped terminal includes the sacrificial plated metal and the undercoat plated metal, the bumped terminal is disposed in the recess, the routing line is disposed outside the recess, the particles are disposed in the recess and embedded in the sacrificial plated metal and contact the base, and the undercoat plated metal extends between and is spaced from the particles; and
applying an etch that is selective of the base and the sacrificial plated metal with respect to the particles and the undercoat plated metal, thereby removing portions of the base and the sacrificial plated metal that contact the particles and dislodging the particles from the bumped terminal such that the undercoat plated metal provides an exposed contact surface that is jagged due to the particles and located at the bumped terminal.

52. The method of claim 51, wherein the first and second masks are photoresist.

53. The method of claim 51, wherein the particles have an average diameter in the range of about 5 to 50 microns.

54. The method of claim 51, wherein the bumped terminal includes a cavity that extends into the recess and faces away from the base, and the elastomer extends into the cavity.

55. The method of claim 51, wherein the base and the sacrificial plated metal are the same material.

56. The method of claim 51, wherein the base and the sacrificial plated metal are copper, and the undercoat plated metal is nickel.

57. The method of claim 51, including depositing the sacrificial plated metal through the opening in the first mask.

58. The method of claim 51, including depositing the sacrificial plated metal through the opening in the second mask.

59. The method of claim 51, wherein the etch selectively etches the base such that a remaining portion of the base overlaps and is electrically connected to and extends laterally from the routing line.

60. The method of claim 51, wherein the steps are performed in the sequence set forth.

61. A method of making a test probe, comprising:
providing a metal base;
providing a first mask over the base, wherein the first mask includes an opening over a first portion of the base;
applying an etch to the first portion of the base through the opening in the first mask, thereby etching partially through the base and forming a recess in the base;
removing the first mask;
providing a second mask over the base, wherein the second mask includes an opening over a second portion of the base;
depositing particles into the recess;
depositing an undercoat plated metal over the second portion of the base and into the recess through the opening in the second mask;
removing the second mask;
forming an elastomer on a side of a conductive trace opposite the base, wherein the conductive trace includes a bumped terminal and a routing line, the bumped terminal and the routing line include the undercoat plated metal, the bumped terminal is disposed in the recess, the routing line is disposed outside the recess, the particles are disposed in the recess and embedded in the bumped terminal, and the undercoat plated metal extends between and contacts the particles; and
applying an etch that is selective of the base and the particles with respect to the undercoat plated metal, thereby removing a portion of the base that overlaps the bumped terminal and removing the particles such that the undercoat plated metal provides an exposed contact surface that is jagged due to the particles and located at the bumped terminal.

62. The method of claim 61, wherein the first and second masks are photoresist.

63. The method of claim 61, wherein the particles have an average diameter in the range of about 5 to 50 microns.

64. The method of claim 61, wherein the bumped terminal includes a cavity that extends into the recess and faces away from the base, and the elastomer extends into the cavity.

65. The method of claim 61, wherein the base and the particles are the same material.

66. The method of claim 61, wherein the base and the particles are copper, and the undercoat plated metal is nickel.

67. The method of claim 61, including depositing the particles through the opening in the first mask.

68. The method of claim 61, including depositing the particles through the opening in the second mask.

69. The method of claim 61, wherein the etch selectively etches the base such that a remaining portion of the base overlaps and is electrically connected to and extends laterally from the routing line.

70. The method of claim 61, wherein the steps are performed in the sequence set forth.

71. A test probe, comprising:
a conductive trace that includes a bumped terminal, wherein the bumped terminal includes a jagged contact surface and a cavity that face in opposite directions, and the contact surface includes a plated metal; and
an elastomer disposed in the cavity.

72. The test probe of claim 71, wherein the contact surface consists of the plated metal.

73. The test probe of claim 72, wherein the bumped terminal includes particles that are covered by the plated metal, the particles and the plated metal have a different composition, and the plated metal is jagged due to the particles.

74. The test probe of claim 72, wherein the bumped terminal excludes particles that are covered by the plated metal and have a different composition than the plated metal and result in the plated metal being jagged.

75. The test probe of claim 71, wherein the contact surface consists of the plated metal and particles that protrude from the plated metal, the particles and the plated metal have a different composition, and the contact surface is jagged due to the particles.

76. The test probe of claim 71, wherein the bumped terminal consists of the plated metal.

77. The test probe of claim 71, wherein the contact surface includes and is jagged due to randomly distributed tips.

78. The test probe of claim 71, wherein the contact surface includes and is jagged due to randomly sized tips.

79. The test probe of claim 71, wherein the conductive trace includes a flat planar routing line that extends laterally from and is integral with the bumped terminal.

80. The test probe of claim 71, wherein the test probe is adapted for pressure contact with solder balls on a BGA package.

81. A method of making a test probe, comprising:
providing a conductive trace that includes a bumped terminal, wherein the bumped terminal includes a jagged contact surface and a cavity that face in opposite directions, and the contact surface includes a plated metal; and
forming an elastomer in the cavity after providing the cavity.

82. The method of claim 81, wherein the contact surface consists of the plated metal.

83. The method of claim 82, wherein the bumped terminal includes particles that are covered by the plated metal, and the plated metal is jagged due to the particles.

84. The method of claim 82, wherein the bumped terminal includes particles and an undercoat plated metal, the particles contact and are embedded in and protrude from the undercoat plated metal, and the plated metal contacts the particles and the undercoat plated metal and is jagged due to the particles protruding from the undercoat plated metal.

85. The method of claim 84, wherein the plated metal is spaced from the cavity, and the undercoat plated metal is adjacent to the cavity.

86. The method of claim 84, wherein the bumped terminal consists of the plated metal, the undercoat plated metal and the particles.

87. The method of claim 82, wherein the bumped terminal includes an undercoat plated metal, and the plated metal contacts the undercoat plated metal and is jagged due to the undercoat plated metal.

88. The method of claim 87, wherein the plated metal is spaced from the cavity, and the undercoat plated metal is adjacent to the cavity.

89. The method of claim 87, wherein the bumped terminal consists of the plated metal and the undercoat plated metal.

90. The method of claim 82, wherein the bumped terminal excludes particles that are covered by the plated metal and result in the plated metal being jagged.

91. The method of claim 81, wherein the contact surface consists of the plated metal and particles that contact and are embedded in and protrude from the plated metal, and the contact surface is jagged due to the particles.

92. The method of claim 91, wherein the plated metal is adjacent to the cavity.

93. The method of claim 91, wherein the particles are spaced from the cavity.

94. The method of claim 91, wherein the plated metal is adjacent to the cavity and the particles are spaced from the cavity.

95. The method of claim 91, wherein the particles are randomly distributed.

96. The method of claim 81, including forming the elastomer in the cavity before providing the plated metal.

97. The method of claim 96, wherein the contact surface consists of the plated metal.

98. The method of claim 97, wherein the bumped terminal includes particles and an undercoat plated metal, the particles contact and are embedded in and protrude from the undercoat plated metal, and the plated metal contacts the particles and the undercoat plated metal and is jagged due to the particles protruding from the undercoat plated metal.

99. The method of claim 97, wherein the bumped terminal includes an undercoat plated metal, and the plated metal contacts the undercoat plated metal and is jagged due to the undercoat plated metal.

100. The method of claim 97, wherein the bumped terminal excludes particles that are covered by the plated metal and result in the plated metal being jagged.

101. The method of claim 81, including forming the elastomer in the cavity after providing the plated metal.

102. The method of claim 101, wherein the contact surface consists of the plated metal.

103. The method of claim 102, wherein the bumped terminal excludes particles that are covered by the plated metal and result in the plated metal being jagged.

104. The method of claim 101, wherein the contact surface consists of the plated metal and particles that contact and are embedded in and protrude from the plated metal, and the contact surface is jagged due to the particles.

105. The method of claim 104, wherein the plated metal is adjacent to the cavity and the particles are spaced from the cavity.

106. The method of claim 81, wherein the contact surface includes and is jagged due to randomly distributed tips.

107. The method of claim 81, wherein the contact surface includes and is jagged due to randomly sized tips.

108. The method of claim 81, wherein the contact surface includes and is jagged due to randomly distributed and sized tips.

109. The method of claim 81, wherein the conductive trace includes a flat planar routing line that extends laterally from and is integral with the bumped terminal.

110. The method of claim 81, wherein the test probe is adapted for pressure contact with solder balls on a BGA package.

111. A method of making a test probe, comprising:
depositing particles on a base; then performing an electroplating operation on the base, thereby providing an undercoat plated metal, sealing the particles and locking the particles to the base; and then
etching the base, thereby exposing the particles;
wherein the test probe includes a contact surface and the undercoat plated metal, and the contact surface is jagged due to the particles.

112. The method of claim 111, wherein the contact surface excludes the particles.

113. The method of claim 112, wherein the contact surface is an overcoat plated metal.

114. The method of claim 113, wherein the particles contact and are embedded in and protrude from the undercoat plated metal, and the overcoat plated metal contacts the particles and the undercoat plated metal and is jagged due to the particles protruding from the undercoat plated metal.

115. The method of claim 113, wherein the overcoat plated metal contacts the undercoat plated metal and is jagged due to the undercoat plated metal, the undercoat plated metal is jagged due to the particles, and the test probe excludes the particles.

116. The method of claim 112, wherein the contact surface is the undercoat plated metal.

117. The method of claim 116, wherein the undercoat plated metal and is jagged due to the particles, and the test probe excludes the particles.

118. The method of claim 111, wherein the contact surface includes the particles.

119. The method of claim 118, wherein the contact surface consists of the undercoat plated metal and the particles.

120. The method of claim 118, wherein the contact surface includes the undercoat plated metal and the particles, the particles contact and are embedded in and protrude from the undercoat plated metal, and the contact surface is jagged due to the particles protruding from the undercoat plated metal.

121. The method of claim 111, including removing the particles during or after etching the base.

122. The method of claim 121, wherein the contact surface consists of the undercoat plated metal.

123. The method of claim 121, wherein the contact surface consists of an overcoat plated metal that contacts the undercoat plated metal.

124. The method of claim 111, including leaving the particles attached to the undercoat plated metal after etching the base.

125. The method of claim 124, wherein the contact surface consists of the undercoat plated metal and the particles.

126. The method of claim 111, wherein depositing the particles on the base include sprinkling the particles on the base.

127. The method of claim 111, wherein depositing the particles on the base includes dropping the particles on the base.

128. The method of claim 111, wherein depositing the particles on the base includes depositing a solution that contains the particles on the base, and then evaporating or decomposing the solution.

129. The method of claim 111, wherein depositing the particles on the base includes depositing a flux that contains the particles on the base, and then evaporating or decomposing the flux.

130. The method of claim 111, wherein depositing the particles on the base includes depositing a solution or flux that contains the particles on the base, and then evaporating the solution or flux.

131. The method of claim 111, wherein depositing the particles on the base includes depositing a solution or flux that contains the particles on the base, and then decomposing the solution or flux.

132. The method of claim 111, wherein the particles are a conductive metal.

133. The method of claim 111, wherein the particles are an insulator.

134. The method of claim 111, wherein the particles are a composite material.

135. The method of claim 111, wherein the particles include a conductive surface layer and an insulative core.

136. The method of claim 111, wherein performing the electroplating operation on the base includes electroplating the undercoat plated metal on and in contact with the particles and the base such that the particles are embedded in the undercoat plated metal.

137. The method of claim 136, including etching partially but not completely through the undercoat plated metal such that the particles protrude from the undercoat plated metal.

138. The method of claim 137, wherein etching the base includes applying a wet chemical etch that is selective of the base with respect to the particles and the undercoat plated metal, and etching the undercoat plated metal includes applying a wet chemical etch that is selective of the undercoat plated metal with respect to the particles.

139. The method of claim 136, including etching the particles such that the particles are removed from the undercoat plated metal.

140. The method of claim 139, wherein etching the base and the particles includes applying a wet chemical etch that is selective of the base and the particles with respect to the undercoat plated metal.

141. The method of claim 111, wherein performing the electroplating operation on the base includes electroplating a sacrificial plated metal on and in contact with the particles and the base, and then electroplating the undercoat plated metal on and in contact with the sacrificial plated metal and spaced from the particles and the base such that the particles are embedded in the sacrificial plated metal and attached to the undercoat plated metal.

142. The method of claim 141, including etching the sacrificial plated metal thereby dislodging the particles from the undercoat plated metal.

143. The method of claim 142, wherein etching the base and the sacrificial plated metal includes applying a wet chemical etch that is selective of the base and the sacrificial plated metal with respect to the particles and the undercoat plated metal.

144. The method of claim 111, wherein the contact surface includes the undercoat plated metal.

145. The method of claim 111, wherein the contact surface excludes the undercoat plated metal.

146. The method of claim 111, wherein the contact surface includes and is jagged due to randomly distributed tips.

147. The method of claim 111, wherein the contact surface includes and is jagged due to randomly sized tips.

148. The method of claim 111, wherein the contact surface includes and is jagged due to randomly distributed and sized tips.

149. The method of claim 111, wherein the test probe includes a conductive trace, the conductive trace includes a bumped terminal and a flat planar routing line, the bumped terminal includes the contact surface and the undercoat plated metal, and the flat planar routing line extends laterally from the bumped terminal.

150. The method of claim 111, wherein the test probe is adapted for pressure contact with solder balls on a BGA package.

151. The method of claims 1, 11, 31, 41, 51, 61, 81 or 111, including testing an electronic device using pressure contact between the contact surface and the electronic device.

152. The method of claim 151, wherein the electronic device is a chip.

153. The method of claim 151, wherein the electronic device is a chip package.

154. The method of claim 151, including testing the device using pressure contact between the contact surface and a solder ball on the electronic device.

155. The method of claim 151, including making the electronic device by a process that includes the testing.

\* \* \* \* \*

UNITED STATES PATENT AND TRADEMARK OFFICE
CERTIFICATE OF CORRECTION

PATENT NO. : 6,846,735 B1
DATED : January 25, 2005
INVENTOR(S) : Charles W.C. Lin et al.

It is certified that error appears in the above-identified patent and that said Letters Patent is hereby corrected as shown below:

Drawings,
Replace the 75 drawing sheets with the attached 75 drawing sheets.

Column 4,
Line 56, change "40" to -- 4O --.

Column 28,
Lines 46-49, "performing an electroplating operation . . . to the base; and then" is a subparagraph.

Signed and Sealed this

Fourteenth Day of June, 2005

JON W. DUDAS
*Director of the United States Patent and Trademark Office*